US011721709B2

(12) United States Patent
Wang et al.

(10) Patent No.: US 11,721,709 B2
(45) Date of Patent: Aug. 8, 2023

(54) CIRCUIT BOARD ASSEMBLY WITH PHOTOSENSITIVE ELEMENT MOUNTED TO BACK SIDE OF CIRCUIT BOARD

(71) Applicant: NINGBO SUNNY OPOTECH CO., LTD., Zhejiang (CN)

(72) Inventors: Mingzhu Wang, Yuyao (CN); Nan Guo, Yuyao (CN); Zhenyu Chen, Yuyao (CN); Takehiko Tanaka, Nara (JP); Jingfei He, Yuyao (CN); Zhen Huang, Yuyao (CN); Zhongyu Luan, Yuyao (CN); Feifan Chen, Yuyao (CN)

(73) Assignee: NINGBO SUNNY OPOTECH CO., LTD., Yuyao (CN)

( * ) Notice: Subject to any disclaimer, the term of this patent is extended or adjusted under 35 U.S.C. 154(b) by 0 days.

(21) Appl. No.: 17/550,733

(22) Filed: Dec. 14, 2021

(65) Prior Publication Data

US 2022/0109018 A1 Apr. 7, 2022

Related U.S. Application Data

(62) Division of application No. 16/613,571, filed as application No. PCT/CN2018/087488 on May 18, 2018, now Pat. No. 11,233,079.

(30) Foreign Application Priority Data

May 18, 2017 (CN) ......................... 201710353630.0
May 18, 2017 (CN) ......................... 201710353700.2
(Continued)

(51) Int. Cl.
*H01L 27/146* (2006.01)
*H04M 1/02* (2006.01)
(Continued)

(52) U.S. Cl.
CPC .. *H01L 27/14618* (2013.01); *H01L 27/14627* (2013.01); *H01L 27/14683* (2013.01);
(Continued)

(58) Field of Classification Search
CPC ......... H01L 27/14618; H01L 27/14627; H01L 27/14683; H01L 27/14625; H04M 1/0264;
(Continued)

(56) References Cited

U.S. PATENT DOCUMENTS

2004/0223072 A1* 11/2004 Maeda .............. H01L 27/14625 257/E31.127
2007/0236596 A1 10/2007 Sekine et al.
(Continued)

FOREIGN PATENT DOCUMENTS

CN 1957464 A 5/2007
CN 101051635 A 10/2007
(Continued)

OTHER PUBLICATIONS

European Office Action for European Application No. 18 801 348.6, dated Mar. 9, 2021.
(Continued)

*Primary Examiner* — John P. Dulka
(74) *Attorney, Agent, or Firm* — Birch, Stewart, Kolasch & Birch, LLP

(57) ABSTRACT

A camera module and a molded circuit board assembly thereof, a semi-finished product of the molded circuit board assembly, and an array camera module and a molded circuit board assembly thereof, as well as a manufacturing method and an electronic device, wherein the camera module comprises at least one optical lens, at least one back surface molded portion, at least one photosensitive element and a circuit board. The circuit board comprises at least one
(Continued)

substrate and at least one electronic component that is conductively connected to the substrate; a part of the non-photosensitive area of the photosensitive element is attached to the substrate back surface of the substrate, and the photosensitive area and another part of the non-photosensitive area of the photosensitive element correspond to a substrate channel of the substrate; the back surface molded portion is integrally bonded to at least one part of the area of the substrate back surface of the substrate; and the optical lens is held in the photosensitive path of the photosensitive element.

18 Claims, 67 Drawing Sheets

(30) Foreign Application Priority Data

May 18, 2017 (CN) ........................ 201720557098.X
May 18, 2017 (CN) ........................ 201720557138.0
May 18, 2017 (CN) ........................ 201720557146.5
May 18, 2017 (CN) ........................ 201720557166.2
May 18, 2017 (CN) ........................ 201720557307.0
May 18, 2017 (CN) ........................ 201720557324.4
May 18, 2017 (CN) ........................ 201720559207.1

(51) Int. Cl.
*H05K 1/18* (2006.01)
*H04N 23/51* (2023.01)
*H04N 23/54* (2023.01)
*H04N 23/57* (2023.01)

(52) U.S. Cl.
CPC .......... *H04M 1/0264* (2013.01); *H04N 23/51* (2023.01); *H04N 23/54* (2023.01); *H04N 23/57* (2023.01); *H05K 1/181* (2013.01); *H05K 2201/10121* (2013.01)

(58) Field of Classification Search
CPC .. H04N 5/2252; H04N 5/2253; H04N 5/2257; H04N 5/2254; H05K 1/181; H05K 2201/10121
See application file for complete search history.

(56) References Cited

U.S. PATENT DOCUMENTS

2011/0194023 A1 8/2011 Tam
2015/0138436 A1 5/2015 Wong
2017/0104022 A1 4/2017 Okamura et al.
2017/0245370 A1 8/2017 Wang et al.
2020/0021720 A1 1/2020 Wang et al.

FOREIGN PATENT DOCUMENTS

CN 105611134 A 5/2016
CN 105702635 A 6/2016
CN 105827916 A 8/2016
CN 106206674 A 12/2016
CN 205959984 U 2/2017
CN 206894759 U 1/2018
CN 207340003 U 5/2018
CN 207382409 U 5/2018
CN 207382410 U 5/2018
CN 207382411 U 5/2018
CN 108243298 A 7/2018
CN 207652536 U 7/2018
JP 2000-252320 A 9/2000
JP 2006-148473 A 6/2006
JP 2007-141989 A 6/2007
JP 2009-188828 A 8/2009
JP 4650896 B2 3/2011

OTHER PUBLICATIONS

Extended European Search Report, dated Apr. 14, 2020, for European Application No. 18801348.6.
International Search Report for PCT/CN2018/087488 dated Aug. 2, 2018.
Extended European Search Report for European Application No. 22169710.5, dated Jan. 20, 2023.

* cited by examiner

CIRCUIT BOARD ASSEMBLY WITH PHOTOSENSITIVE ELEMENT MOUNTED TO BACK SIDE OF CIRCUIT BOARD

CROSS-REFERENCE TO RELATED APPLICATIONS

This application is a Divisional of copending application Ser. No. 16/613,571, filed on Nov. 14, 2019, which is the National Phase under 35 U.S.C. § 371 of International Application No. PCT/CN2018/087488, filed on May 18, 2018, which claims the benefit under 35 U.S.C. § 119(a) to Patent Application No. 201710353700.2, filed in China on May 18, 2017, Patent Application No. 201720557324.4, filed in China on May 18, 2017, Patent Application No. 201720557307.0, filed in China on May 18, 2017, Patent Application No. 201720557138.0, filed in China on May 18, 2017, Patent Application No. 201720557166.2, filed in China on May 18, 2017, Patent Application No. 201720557146.5, filed in China on May 18, 2017, Patent Application No. 201710353630.0, filed in China on May 18, 2017, Patent Application No. 20170557098.X filed in China on May 18, 2017, Patent Application No. 20170559207.1, filed in China on May 18, 2017, all of which are hereby expressly incorporated by reference into the present application.

TECHNICAL FIELD

The present disclosure relates to the field of optical imaging, and particularly relates to a camera module and a molded circuit board assembly thereof, a semi-finished product of the molded circuit board assembly, an array camera module and a molded circuit board assembly thereof, a manufacturing method and an electronic device.

TECHNICAL BACKGROUND

At present, portable electronic devices become thinner, which causes a lens end of a camera module configured in a portable electronic device to be forced to protrude from the surface of the portable electronic device. For example, for a rear camera module, a lens end of the camera module is forced to protrude from a back surface of the portable electronic device, and the longer the focal length of the camera module is and the larger the zoom range is, the more prominent the lens end protrudes. Since the portable electronic devices such as smart phones and tablets each adopt a flat-type design now, the lens end projecting from the surface of the portable electronic device may not only affect the appearance of the portable electronic device, but also lead to the lens end of the camera module easy to be touched, so that the camera module is easily damaged. Especially in recent years, dual lens camera modules have become popular. The dual lens camera module is larger in size than a single lens camera module. When the dual lens camera module is applied to a portable electronic device that is increasingly light and thin, the large-sized dual lens camera module not only occupies more space inside the portable electronic device in the length and width directions, and the lens end of the dual lens camera module is forced to protrude more from the surface of the portable electronic device.

Now the camera module includes a circuit board, a photosensitive element attached to the circuit board and a bearing, and an optical lens held by the bearing in the photosensitive path of the photosensitive element. Further, the camera module further includes passive components attached to the circuit board, such as a resistor, a capacitor, a driver, a relay, a processor, a memory and a sensor. The current camera module has a lot of disadvantages.

Firstly, the passive components, the photosensitive element and the bearing are attached to the same side of the circuit board, and either in a horizontal direction or in a height direction, it is necessary to reserve safety distances between adjacent ones of the passive components, between the passive component and the photosensitive element, between the photosensitive element and the bearing, and between the passive component and the bearing, which causes both the size in the horizontal direction and the size in the height direction of the camera module not to be reduced.

Secondly, after the photosensitive element is attached to the circuit board, it is necessary to form a set of gold wires on at least one side of the photosensitive element by a wire bonding process, to conductively connect the photosensitive element and the circuit board, and in order to ensure good electrical properties of the gold wires, it is necessary to reserve a safety distance between the passive component and the gold wire, which further causes the length and width sizes of the camera module not to be reduced.

Thirdly, the passive components and the photosensitive element are located in the same space, which causes shedding produced due to oxidation of the surface of the passive component or shedding produced at the connecting position of the passive component and the circuit board, to be easily adhered to the photosensitive area of the photosensitive element, or to be adhered to a filter element held in the photosensitive path of the photosensitive element, resulting in the occurrence of undesirable phenomena of stain spots.

Fourthly, the bearing is attached to the circuit board by a fluid state binder such as an adhesive applied on the circuit board, and in this process, the fluid state adhesive may flow to the photosensitive area of the photosensitive element, thereby causing the photosensitive area of the photosensitive element to be contaminated.

Further, in the current camera module, the photosensitive element is attached to the surface of the substrate, which causes a distance between the photosensitive element and the optical lens to be limited to a small range. In order to reduce the height size of the camera module, the current camera module can only be achieved by way of reducing the distance between the photosensitive element and the optical lens, which causes the focal length and zoom range of the camera module to be reduced, so that the performance and development room of the camera module are seriously affected.

SUMMARY

An object of the present disclosure is to provide a camera module and a molded circuit board assembly thereof, an array camera module, a manufacturing method and an electronic device, wherein a photosensitive element of the camera module is attached to the substrate back surface of a substrate, and the photosensitive area of the photosensitive element corresponds to a substrate channel of the substrate. By this way, the camera module can have a smaller back focal length and a larger zoom range while reducing the height size of the camera module.

An object of the present disclosure is to provide a camera module and a molded circuit board assembly thereof, an array camera module, a manufacturing method and an electronic device, wherein by way of attaching a photosensitive element to the substrate back surface of a substrate, the height size of the camera module can be further reduced while ensuring a focal length and a zoom range of the camera module.

An object of the present disclosure is to provide a camera module and a molded circuit board assembly thereof, an array camera module, a manufacturing method and an electronic device, wherein the substrate front surface of the substrate may be used only for attaching the bearing. By this way, it is advantageous to reduce length and width sizes of the camera module, so that the camera module is particularly suitable for being applied to electronic devices that are pursuing thinner and lighter.

An object of the present disclosure is to provide a camera module and a molded circuit board assembly thereof, an array camera module, a manufacturing method and an electronic device, wherein an electronic component of the camera module is conductively connected to the substrate on the substrate back surface of the substrate.

An object of the present disclosure is to provide a camera module and a molded circuit board assembly thereof, an array camera module, a manufacturing method and an electronic device, wherein at least one of the electronic components is conductively connected to the substrate on the substrate front surface of the substrate. In this way, it is advantageous to improve the flexibility of the layout of the electronic components.

An object of the present disclosure is to provide a camera module and a molded circuit board assembly thereof, an array camera module, a manufacturing method and an electronic device, wherein at least one part of the non-photosensitive area of the photosensitive element can correspond to at least one part of at least one of the electronic components located on the substrate front surface of the substrate. By this way, the layout of various components of the camera module can become more compact to facilitate further reducing the volume of the camera module, in particular, further decreasing the length and width sizes of the camera module.

An object of the present disclosure is to provide a camera module and a molded circuit board assembly thereof, an array camera module, a manufacturing method and an electronic device, wherein the photosensitive element and the substrate need not be conductively connected therebetween by a wire bonding process, but at the same time when the photosensitive element is attached to the substrate back surface of the substrate, the photosensitive element and the substrate are conductively connected. By this way, not only can the manufacturing steps of the camera module and the manufacturing cost be reduced, but also it is advantageous to reduce the volume of the camera module, in particular to reduce the length and width dimensions of the camera module.

An object of the present disclosure is to provide a camera module and a molded circuit board assembly thereof, an array camera module, a manufacturing method and an electronic device, wherein the attaching position of the photosensitive element and the substrate is filled with a filler to prevent a gap from being formed at the attaching position of the photosensitive element and the substrate by means of the filler, thereby avoiding contamination of the photosensitive area of the photosensitive element by the fluid medium in a molding process.

An object of the present disclosure is to provide a camera module and a molded circuit board assembly thereof, an array camera module, a manufacturing method and an electronic device, wherein the substrate can isolate the photosensitive area of the photosensitive element and at least one part of the electronic component, to avoid the occurrence of undesirable phenomena such as stain spots due to contamination of the photosensitive area of the photosensitive element by shedding of the surface of the electronic component, so that it is advantageous to ensure the production yield of the camera module.

An object of the present disclosure is to provide a camera module and a molded circuit board assembly thereof, an array camera module, a manufacturing method and an electronic device, wherein the camera module provides a sealed space, and the photosensitive area of the photosensitive element is located in the sealed space, thereby avoiding contamination of the photosensitive area of the photosensitive element by shedding of the surface of the electronic component.

An object of the present disclosure is to provide a camera module and a molded circuit board assembly thereof, an array camera module, a manufacturing method and an electronic device, wherein in the molding process, the fluid medium is prevented from entering the sealed space to avoid the occurrence of an undesirable phenomenon that the photosensitive area of the photosensitive element is contaminated.

An object of the present disclosure is to provide a camera module and a molded circuit board assembly thereof, an array camera module, a manufacturing method and an electronic device, wherein a back surface molded portion of the camera module is integrally bonded to at least one part of the area of the substrate back surface of the substrate, and the back surface molded portion embeds at least one part of the area of the photosensitive element, so that the back surface molded portion, the substrate and the photosensitive element are integrally bonded.

An object of the present disclosure is to provide a camera module and a molded circuit board assembly thereof, a molded circuit board assembly and a semi-finished product of the molded circuit board assembly, an array camera module and a molded circuit board assembly thereof, a manufacturing method and an electronic device, wherein the back surface molded portion embeds at least one part of the attaching position of the photosensitive element and the substrate, to prevent the photosensitive element from falling off from the substrate back surface of the substrate.

An object of the present disclosure is to provide a camera module and a molded circuit board assembly thereof, an array camera module, a manufacturing method and an electronic device, wherein the back surface molded portion embeds at least one part of the attaching position of the photosensitive element and the substrate, to prevent a chip connecting member of the photosensitive element and a substrate connecting member of the substrate from being oxidized, thereby ensuring the reliability of the conductive position of the photosensitive element and the substrate.

An object of the present disclosure is to provide a camera module and a molded circuit board assembly thereof, an array camera module, a manufacturing method and an electronic device, wherein the back surface molded portion embeds at least one part of the attaching position of the photosensitive element and the substrate, to reinforce the strength of the substrate and ensure the flatness of the substrate by means of the back surface molded portion.

An object of the present disclosure is to provide a camera module and a molded circuit board assembly thereof, an array camera module, a manufacturing method and an electronic device, wherein the back surface molded portion embeds at least one part of the attaching position of the photosensitive element and the substrate to ensure the flatness of the photosensitive element by means of the back surface molded portion, so that the flatness of the photosensitive element is not limited to the substrate to enable the substrate to be selected as a thinner sheet, thereby further reducing the height size of the camera module.

An object of the present disclosure is to provide a camera module and a molded circuit board assembly thereof, an array camera module, a manufacturing method and an electronic device, wherein the back surface molded portion can isolate the surface of the electronic component and the external environment by way of embedding the electronic component, to prevent the surface of the electronic component from being oxidized, thereby ensuring good electrical properties of the electronic component.

An object of the present disclosure is to provide a camera module and a molded circuit board assembly thereof, an array camera module, a manufacturing method and an electronic device, wherein the back surface molded portion isolates adjacent ones of the electronic components by way of embedding the electronic components, thereby avoiding the occurrence of undesirable phenomena such as mutual interference of the electronic components.

An object of the present disclosure is to provide a camera module and a molded circuit board assembly thereof, an array camera module, a manufacturing method and an electronic device, wherein the back surface molded portion isolates adjacent ones of the electronic components, which enables the distance between the adjacent electronic components to be further reduced, so as to attach a larger number and larger size of the electronic components on a limited attaching area.

An object of the present disclosure is to provide a camera module and a molded circuit board assembly thereof, an array camera module, a manufacturing method and an electronic device, wherein a module connecting side of a connecting plate of the camera module is connected to the substrate back surface of the substrate, and the back surface molded portion can embed the module connecting side of the connecting plate, to avoid the connecting plate from falling off from the substrate by way of integrally bonding the substrate and the connecting plate, thereby ensuring the reliability of the camera module.

An object of the present disclosure is to provide a camera module and a molded circuit board assembly thereof, an array camera module, a manufacturing method and an electronic device, wherein the back surface molded portion does not deform when heated, so as to facilitate ensuring the flatness of the photosensitive element.

An object of the present disclosure is to provide a camera module and a molded circuit board assembly thereof, an array camera module, a manufacturing method and an electronic device, wherein the back surface molded portion has a good heat dissipation capability to rapidly radiate heat generated by the photosensitive element to the external environment of the camera module, thereby ensuring the reliability of the camera module when used for a long time.

An object of the present disclosure is to provide a camera module and a molded circuit board assembly thereof, an array camera module, a manufacturing method and an electronic device, wherein in the process of assembling the camera module to the electronic device, there is no need to worry that the electronic component is scratched or the electronic component is caused to fall off from the substrate due to the collision of the electronic component with assembled members of the electronic device, to ensure the reliability of the camera module when used.

An object of the present disclosure is to provide a camera module and a molded circuit board assembly thereof, an array camera module, a manufacturing method and an electronic device, wherein the back surface molded portion covers the substrate back surface of the substrate, thereby avoiding exposure of the substrate back surface of the substrate, to prevent the substrate back surface from being scratched in the process of assembling the camera module to the electronic device, thereby ensuring the electrical properties of the substrate.

An object of the present disclosure is to provide a camera module and a molded circuit board assembly thereof, an array camera module, a manufacturing method and an electronic device, wherein the back surface molded portion has at least one assembling space for accommodating an assembled member of the electronic device. In this way, the camera module and the assembled member of the electronic device can correspond to each other in the circumferential direction of the camera module.

An object of the present disclosure is to provide a camera module and a molded circuit board assembly thereof, an array camera module, a manufacturing method and an electronic device, wherein the number, sizes and positions of the assembling spaces of the back surface molded portion can be provided as needed to increase the flexibility of the camera module when assembled.

An object of the present disclosure is to provide a camera module and a molded circuit board assembly thereof, an array camera module, a manufacturing method and an electronic device, wherein the back surface molded portion can embed the electronic component after being bonded to the substrate back surface of the substrate, so that when the camera module is inadvertently vibrated, the electronic component can prevent the back surface molded portion from falling off from the substrate back surface of the substrate.

An object of the present disclosure is to provide a camera module and a molded circuit board assembly thereof, an array camera module, a manufacturing method and an electronic device, wherein a molded base of the camera module can be integrally bonded to at least one part of the area of the substrate front surface of the substrate, so that there is no need to apply glue between the molded base and the substrate front surface of the substrate, to reduce the manufacturing steps of the camera module and reducing the height size of the camera module.

An object of the present disclosure is to provide a camera module and a molded circuit board assembly thereof, an array camera module, a manufacturing method and an electronic device, wherein the molded base can embed an non-photosensitive area of the photosensitive element, to cause the molded base to be integrally bonded to the substrate and the photosensitive element.

An object of the present disclosure is to provide a camera module and a molded circuit board assembly thereof, an array camera module, a manufacturing method and an electronic device, wherein the molded base can embed the electronic components located on the substrate front surface of the substrate, so that there is no need to reserve a safety distance between the electronic components and the molded base. By this way, the size of the camera module can be further reduced.

An object of the present disclosure is to provide a camera module and a molded circuit board assembly thereof, an array camera module, a manufacturing method and an electronic device, wherein the molded base and the back surface molded portion are simultaneously bonded to the substrate front surface and the substrate back surface of the substrate, respectively.

An object of the present disclosure is to provide a camera module and a molded circuit board assembly thereof, an array camera module, a manufacturing method and an electronic device, wherein the molded base and the back surface molded portion are bonded to the substrate front surface and the substrate back surface of the substrate by two molding processes, respectively.

An object of the present disclosure is to provide a camera module and a molded circuit board assembly thereof, an array camera module, a manufacturing method and an electronic device, wherein a filter element of the camera module is attached to the substrate front surface of the substrate to form a sealed space between the filter element, the substrate and the photosensitive element, and prevent the fluid medium from entering the sealed space in a subsequent molding process.

An object of the present disclosure is to provide a camera module and a molded circuit board assembly thereof, an array camera module, a manufacturing method and an electronic device, wherein a transparent protective element of the camera module is overlappedly disposed on the substrate front surface of the substrate to form a sealed space between the protective element, the substrate and the photosensitive element, and prevent the fluid medium from entering the sealed space in a subsequent molding process.

An object of the present disclosure is to provide a camera module and a molded circuit board assembly thereof, an array camera module, a manufacturing method and an electronic device, wherein the protective element can isolate the substrate front surface of the substrate and a substrate molding die, so that the protective element can avoid the substrate front surface of the substrate from being scratched in the molding process, to ensure the product yield of the camera module.

An object of the present disclosure is to provide a camera module and a molded circuit board assembly thereof, an array camera module, a manufacturing method and an electronic device, wherein the protective element has elasticity to absorb an impact force produced by the molding die when clamped and avoid the impact force from directly acting on the substrate. By this way, the product yield of the camera module can be further ensured. An object of the present disclosure is to provide a camera module and a molded circuit board assembly thereof, an array camera module, a manufacturing method and an electronic device, wherein at least one of the photosensitive elements of the array camera module is attached to the substrate back surface of a substrate, and the photosensitive area of the photosensitive element corresponds to a substrate channel of the substrate. By this way, the array camera module can have a smaller back focal length and a larger zoom range while reducing the height size of the array camera module.

An object of the present disclosure is to provide a camera module and a molded circuit board assembly thereof, an array camera module, a manufacturing method and an electronic device, wherein at least one electronic component of the array camera module can be conductively connected to the substrate on the substrate back surface of the substrate. By this way, less position for connecting the electronic component may be reserved on the substrate front surface of the substrate, and it may even be unnecessary to reserve a position for connecting the electronic component on the substrate front surface of the substrate, to facilitate reducing the length and width sizes of the array camera module.

An object of the present disclosure is to provide a camera module and a molded circuit board assembly thereof, an array camera module, a manufacturing method and an electronic device, wherein at least one electronic component of the array camera module can be conductively connected to the substrate on the substrate back surface of the substrate. By this way, less position for connecting the electronic component may be reserved on the substrate front surface of the substrate, and it may even be unnecessary to reserve a position for connecting the electronic component on the substrate front surface of the substrate, to facilitate reducing the length and width sizes of the array camera module.

An object of the present disclosure is to provide a camera module and a molded circuit board assembly thereof, an array camera module, a manufacturing method and an electronic device, wherein the array camera module provides at least one connecting plate, a module connecting side of the connecting plate is electrically connected to the substrate front surface of the substrate, and the molded base can embed the module connecting side of the connecting plate, to avoid the connecting plate from falling off from the substrate front surface of the substrate.

An object of the present disclosure is to provide a camera module and a molded circuit board assembly thereof, an array camera module, a manufacturing method and an electronic device, wherein the module connecting side of the connecting plate is connected to the substrate on the substrate back surface of the substrate, and the back surface molded portion can embed the module connecting side of the connecting plate, to avoid the connecting plate from falling off from the substrate back surface of the substrate.

An object of the present disclosure is to provide a camera module and a molded circuit board assembly thereof, an array camera module, a manufacturing method and an electronic device, wherein the attaching position of the photosensitive element and the substrate is filled with a filler, that is, the filler is held between the non-photosensitive area of the photosensitive element and the substrate back surface of the substrate, to fill the gap formed between the non-photosensitive area of the photosensitive element and the substrate back surface of the substrate by means of the filler, thereby avoiding contamination of the photosensitive area of the photosensitive element by the fluid medium in a subsequent molding process.

An object of the present disclosure is to provide a camera module and a molded circuit board assembly thereof, an array camera module, a manufacturing method and an electronic device, wherein the filler embeds a chip connecting member of the photosensitive element and a substrate connecting member of the substrate, to prevent the chip connecting member of the photosensitive element from contacting with the external environment and prevent the substrate connecting member of the substrate from contacting with the external environment, thereby ensuring the reliability after the chip connecting member of the photosensitive element and the substrate connecting member of the substrate are conductively connected, by way of avoiding the chip connecting member of the photosensitive element and the substrate connecting member of the substrate from being oxidized.

An object of the present disclosure is to provide a camera module and a molded circuit board assembly thereof, an array camera module, a manufacturing method and an electronic device, wherein the filler has elasticity so that in the molding process the filler prevents the substrate and the photosensitive element by way of deformation from being damaged by an impact force produced by a molding die when clamped.

An object of the present disclosure is to provide a camera module and a molded circuit board assembly thereof, an array camera module, a manufacturing method and an electronic device, wherein the filler has elasticity, so that the filler can compensate for a difference of a deformation magnitude of the substrate, and a deformation magnitude of the photosensitive element, to ensure the flatness of the substrate and the photosensitive element.

An object of the present disclosure is to provide a camera module and a molded circuit board assembly thereof, an array camera module, a manufacturing method and an electronic device, wherein the back surface molded portion of the array camera module is integrally bonded to at least one part of the area of the substrate back surface of the substrate, to reinforce the strength of the substrate and cause the substrate to kept flat.

An object of the present disclosure is to provide a camera module and a molded circuit board assembly thereof, an array camera module, a manufacturing method and an electronic device, wherein by way of the back surface molded portion causing the substrate and the substrate back surface to be integrally bonded, the photosensitive element falling off from the substrate back surface of the substrate can be avoided.

An object of the present disclosure is to provide a camera module and a molded circuit board assembly thereof, an array camera module, a manufacturing method and an electronic device, wherein the back surface molded portion does not deform when heated. In this way, the back surface molded portion can be avoided from being affected by heat generated by the photosensitive element when performing photoelectric conversion, to facilitate ensuring the flatness of the photosensitive element.

An object of the present disclosure is to provide a camera module and a molded circuit board assembly thereof, an array camera module, a manufacturing method and an electronic device, wherein the back surface molded portion and the substrate are integrally bonded, so that even when the heat generated by the photosensitive element is conducted to the substrate, the back surface molded portion can ensure the flatness of the substrate.

An object of the present disclosure is to provide a camera module and a molded circuit board assembly thereof, an array camera module, a manufacturing method and an electronic device, wherein the back surface molded portion only surrounds around the photosensitive element, so that most of the area of the back surface of the chip of the photosensitive element is exposed. By this way, it is advantageous for the photosensitive element to dissipate heat quickly.

An object of the present disclosure is to provide a camera module and a molded circuit board assembly thereof, an array camera module, a manufacturing method and an electronic device, wherein the protective element is a metal element, to further improve the heat dissipation capability of the array camera module.

An object of the present disclosure is to provide a camera module and a molded circuit board assembly thereof, an array camera module, a manufacturing method and an electronic device, wherein in the process of assembling the array camera module to the electronic device, there is no need to worry that the electronic component is scratched or the electronic component is caused to fall off from the substrate due to the electronic component touching with assembled members of the electronic device, to ensure the reliability of the array camera module when used.

An object of the present disclosure is to provide a camera module and a molded circuit board assembly thereof, an array camera module, a manufacturing method and an electronic device, wherein the molded base embeds at least one part of at least one of the electronic components protruded from the substrate front surface of the substrate, so that there is no need to reserve a safety distance between the electronic component and the molded base. By this way, it is advantageous to reduce the length and width sizes of the array camera module and reduce the height size of the array camera module.

According to one aspect of the present disclosure, the present disclosure provides a camera module, comprising:

at least one optical lens;

at least one molded unit, wherein the molded unit comprises at least one back surface molded portion;

at least one photosensitive element, wherein the photosensitive element has a photosensitive area and a non-photosensitive area surrounding around the photosensitive area; and a circuit board, wherein the circuit board comprises at least one substrate and at least one electronic component, the substrate has a substrate front surface, a substrate back surface and at least one substrate channel, the substrate front surface and the substrate back surface correspond to each other, and the substrate channel extends from the substrate front surface to the substrate back surface; wherein the electronic component is conductively connected to the substrate; wherein a part of the non-photosensitive area of the photosensitive element is attached to the substrate back surface of the substrate, and the photosensitive element is conductively connected with the substrate, the photosensitive area and another part of the non-photosensitive area of the photosensitive element correspond to the substrate channel of the substrate, and the optical lens is held in the photosensitive path of the photosensitive element; and wherein the back surface molded portion is integrally bonded to at least one part of the area of the substrate back surface of the substrate.

According to another aspect of the present disclosure, the present disclosure further provides an electronic device, comprising:

a device body; and at least one camera module, wherein the camera module is disposed in the device body, wherein the camera module further comprises: at least one optical lens; at least one molded unit, wherein the molded unit comprises:

at least one back surface molded portion;

at least one photosensitive element, wherein the photosensitive element has a photosensitive area and a non-photosensitive area surrounding around the photosensitive area; and a circuit board, wherein the circuit board comprises at least one substrate and at least one electronic component, the substrate has a substrate front surface, a substrate back surface and at least one substrate channel, the substrate front surface and the substrate back surface correspond to each other, and the substrate channel extends from the substrate front surface to the substrate back surface; wherein the electronic component is conductively connected to the substrate; wherein a part of the non-photosensitive area of the photosensitive element is attached to the substrate back surface of the substrate, and the photosensitive element is conductively connected with the substrate, the photosensitive area and another part of the non-photosensitive area of the photosensitive element correspond to the substrate channel of the substrate, and the optical lens is held in the photosensitive path of the photosensitive element; and wherein the back surface molded portion is integrally bonded to at least one part of the area of the substrate back surface of the substrate.

According to another aspect of the present disclosure, the present disclosure further provides a molded circuit board assembly, comprising:

at least one molded unit, wherein the molded unit comprises a back surface molded portion;

at least one photosensitive element, wherein the photosensitive element has a photosensitive area and a non-photosensitive area surrounding around the photosensitive area; and a circuit board, wherein the circuit board comprises at least one substrate and at least one electronic component, the substrate has a substrate front surface, a substrate back surface and at least one substrate channel, the substrate front surface and the substrate back surface correspond to each other, and the substrate channel extends from the substrate front surface to the substrate back surface; wherein the electronic component is conductively connected to the substrate; wherein a part of the non-photosensitive area of the photosensitive element is attached to the substrate back surface of the substrate, and the photosensitive element is conductively connected with the substrate, and the photosensitive area and another part of the non-photosensitive area of the photosensitive element correspond to the substrate channel of the substrate; and wherein the back surface molded portion is integrally bonded to at least one part of the area of the substrate back surface of the substrate.

According to another aspect of the present disclosure, the present disclosure further provides a manufacturing method for a camera module, wherein the manufacturing method comprises steps of:

(a) attaching a part of the non-photosensitive area of at least one photosensitive element to the substrate back surface of a substrate, and bringing the photosensitive area of the photosensitive element and another part of the non-photosensitive area surrounding the photosensitive area to correspond to a substrate channel of the substrate, wherein the photosensitive element and the substrate are conductively connected to each other;

(b) conductively connecting at least one electronic component to the substrate;

(c) integrally bonding a back surface molded portion to at least one part of the area of the substrate back surface of the substrate by a molding process; and (d) holding an optical lens in the photosensitive path of the photosensitive element to obtain the camera module.

According to another aspect of the present disclosure, the present disclosure further provides a semi-finished product of a molded circuit board assembly, comprising:

at least one protective element;

at least one molded unit, wherein the molded unit comprises a back surface molded portion;

at least one photosensitive element, wherein the photosensitive element has a photosensitive area and a non-photosensitive area surrounding around the photosensitive area; and a circuit board, wherein the circuit board comprises at least one substrate; wherein the substrate has a substrate front surface, a substrate back surface and at least one substrate channel, the substrate front surface and the substrate back surface correspond to each other, and the substrate channel extends from the substrate front surface to the substrate back surface; wherein the protective element is overlappedly attached to the substrate front surface of the substrate to close the opening of the substrate channel on the substrate front surface by means of the protective element; wherein the non-photosensitive area of the photosensitive element is attached to the substrate back surface of the substrate, so that the photosensitive element is conductively connected to the substrate, and the photosensitive element closes the opening of the substrate channel on the substrate back surface, to form at least one sealed space among the substrate, the photosensitive element, and the protective element; wherein the photosensitive area of the photosensitive element is held in the sealed space; and wherein the back surface molded portion is integrally bonded to at least one part of the area of the substrate back surface of the substrate.

According to another aspect of the present disclosure, the present disclosure further provides an array camera module, comprising:

at least one molded unit, wherein the molded unit comprises at least one back surface molded portion;

at least two imaging units, wherein each of the image forming units comprises an optical lens and a photosensitive element, wherein the photosensitive element has a photosensitive area and a non-photosensitive area surrounding around the photosensitive area, and wherein the optical lens is held in the photosensitive path of the photosensitive element; and at least one circuit board, wherein the circuit board comprises at least one substrate and at least one electronic component, each of the electronic components is conductively connected to each of the substrates, respectively, wherein each of the substrates has a substrate front surface, a substrate back surface and at least one substrate channel, the substrate front surface and the substrate back surface correspond to each other, and each of the substrate channels extends from the substrate front surface to the substrate back surface; wherein a part of the non-photosensitive area of the photosensitive element of each of the imaging units is attached to the substrate back surface of each of the substrates, respectively, so that the photosensitive area and a part of the non-photosensitive area of the photosensitive element correspond to the substrate channel; wherein each of the photosensitive elements is conductively connected to each of the substrates, and the photosensitive element and the optical lens of each of the imaging units are held at the side where the substrate back surface of the substrate is located and the side where the substrate front surface of the substrate is located, respectively; and wherein the back surface molded portion is integrally bonded to at least one part of the area of the substrate back surface of the substrate.

According to another aspect of the present disclosure, the present disclosure further provides an electronic device, comprising:

a device body; and at least one array camera module, wherein the array camera module is disposed in the device body, and wherein the array camera module further comprises:

at least one molded unit, wherein the molded unit comprises at least one back surface molded portion;

at least two imaging units, wherein each of the image forming units comprises an optical lens and a photosensitive element, wherein the photosensitive element has a photosensitive area and a non-photosensitive area surrounding around the photosensitive area, and wherein the optical lens is held in the photosensitive path of the photosensitive element; and at least one circuit board, wherein the circuit board comprises at least one substrate and at least one electronic component, each of the electronic components is conductively connected to each of the substrates, respectively, wherein each of the substrates has a substrate front surface, a substrate back surface and at least one substrate channel, the substrate front surface and the substrate back surface correspond to each other, and each of the substrate channels extends from the substrate front surface to the substrate back surface; wherein a part of the non-photosensitive area of the photosensitive element of each of the imaging units is attached to the substrate back surface of each of the substrates, respectively, so that the photosensitive area and a part of the non-photosensitive area of the photosensitive element correspond to the substrate channel; wherein each of the photosensitive elements is conductively connected to each of the substrates, and the photosensitive element and the optical lens of each of the imaging units are held at the side where the substrate back surface of the substrate is located and the side where the substrate front surface of the substrate is located, respectively; and wherein the back surface molded portion is integrally bonded to at least one part of the area of the substrate back surface of the substrate.

According to another aspect of the present disclosure, the present disclosure further provides a molded circuit board assembly, comprising:

at least one molded unit, wherein the molded unit comprises at least one back surface molded portion;

at least two photosensitive elements, wherein each of the photosensitive elements has a photosensitive area and a non-photosensitive area surrounding around the photosensitive area; and at least one circuit board, wherein the circuit board each comprises at least one substrate and at least one electronic component; wherein each of the electronic components is conductively connected to each of the substrates, respectively; wherein each of the substrates has a substrate front surface, a substrate back surface and at least one substrate channel, the substrate front surface and the substrate back surface correspond to each other, and each of the substrate channels extends from the substrate front surface to the substrate back surface; wherein each of the photosensitive elements is conductively connected to each of the substrates, respectively, and a part of the non-photosensitive area of at least one of the photosensitive elements is attached to the substrate back surface of the substrate, so that the photosensitive area and another part of the non-photosensitive area of the photosensitive element correspond to the substrate channel of the substrate; wherein each of the photosensitive elements is conductively connected to each of the substrates; and wherein the back surface molded portion is integrally bonded to at least one part of the area of the substrate back surface of the substrate.

According to another aspect of the present disclosure, the present disclosure further provides an array camera module, comprising:

at least two optical lenses; and at least one molded circuit board assembly, wherein each of the optical lenses is held in the photosensitive path of each of the photosensitive elements, respectively, and wherein the molded circuit board assembly comprises:

at least one molded unit, wherein the molded unit comprises at least one back surface molded portion;

at least two photosensitive elements, wherein each of the photosensitive elements has a photosensitive area and a non-photosensitive area surrounding around the photosensitive area; and at least one circuit board, wherein the circuit board each comprises at least one substrate and at least one electronic component; wherein each of the electronic components is conductively connected to each of the substrates, respectively; wherein each of the substrates has a substrate front surface, a substrate back surface and at least one substrate channel, the substrate front surface and the substrate back surface correspond to each other, and each of the substrate channels extends from the substrate front surface to the substrate back surface; wherein each of the photosensitive elements is conductively connected to each of the substrates, respectively, and a part of the non-photosensitive area of at least one of the photosensitive elements is attached to the substrate back surface of the substrate, so that the photosensitive area and another part of the non-photosensitive area of the photosensitive element correspond to the substrate channel of the substrate; wherein each of the photosensitive elements is conductively connected to each of the substrates; and wherein the back surface molded portion is integrally bonded to at least one part of the area of the substrate back surface of the substrate.

According to another aspect of the present disclosure, the present disclosure further provides an electronic device, comprising:

a device body; and at least one array camera module, wherein the array camera module is disposed in the device body, and wherein the array camera module further comprises:

at least two optical lenses; and at least one molded circuit board assembly, wherein each of the optical lenses are held in the photosensitive path of each of the photosensitive elements, respectively, and wherein the molded circuit board assembly comprises:

at least one molded unit, wherein the molded unit comprises at least one back surface molded portion;

at least two photosensitive elements, wherein each of the photosensitive elements has a photosensitive area and a non-photosensitive area surrounding around the photosensitive area; and at least one circuit board, wherein the circuit board each comprises at least one substrate and at least one electronic component; wherein each of the electronic components is conductively connected to each of the substrates, respectively; wherein each of the substrates has a substrate front surface, a substrate back surface and at least one substrate channel, the substrate front surface and the substrate back surface correspond to each other, and each of the substrate channels extends from the substrate front surface to the substrate back surface; wherein each of the photosensitive elements is conductively connected to each of the substrates, respectively, and a part of the non-photosensitive area of at least one of the photosensitive elements is attached to the substrate back surface of the substrate, so that the photosensitive area and another part of the non-photosensitive area of the photosensitive element correspond to the substrate channel of the substrate; and wherein the back surface molded portion is integrally bonded to at least one part of the area of the substrate back surface of the substrate.

BRIEF DESCRIPTION OF THE DRAWINGS

FIG. 40 is a schematic view of the internal structure cut along the intermediate position of another modified implementation of the camera module according to the above preferred embodiment of the present disclosure.

FIG. 105 is a schematic view of the internal structure cut along the intermediate position of another modified implementation of the camera module according to the above preferred embodiment of the present disclosure.

FIG. 106 is a schematic view of the internal structure cut along the intermediate position of another modified implementation of the camera module according to the above preferred embodiment of the present disclosure.

FIG. 107 is a schematic view of the internal structure cut along the intermediate position of another modified implementation of the camera module according to the above preferred embodiment of the present disclosure.

FIG. 108 is a schematic view of the internal structure cut along the intermediate position of another modified implementation of the camera module according to the above preferred embodiment of the present disclosure.

DETAILED DESCRIPTION OF THE EMBODIMENTS

The following description is presented to disclose the present disclosure to enable those skilled in the art to practice the present disclosure. Preferred embodiments in the following description are by way of example only, and other obvious modifications are conceivable to those skilled in the art. The basic principles of the present disclosure as defined in the following description may be applied to other embodiments, modifications, improvements, equivalents, and other embodiments without departing from the spirit and scope of the present disclosure.

With reference to FIGS. 1 to 13 in the accompanying drawings of the present disclosure, a camera module 100 according to a preferred embodiment of the present disclosure and an application of the camera module 100 are set forth in the following description, wherein at least one camera module 100 can be assembled on a device body 200, so that the camera module 100 and the device body 200 can form an electronic device 13 with reference to FIG. 13.

In other words, the electronic device includes the device body 200 and at least one camera module 100 disposed in the device body 200, wherein the camera module 100 can be used to obtain a photographed product (e.g. a video or an image).

Figure 13:
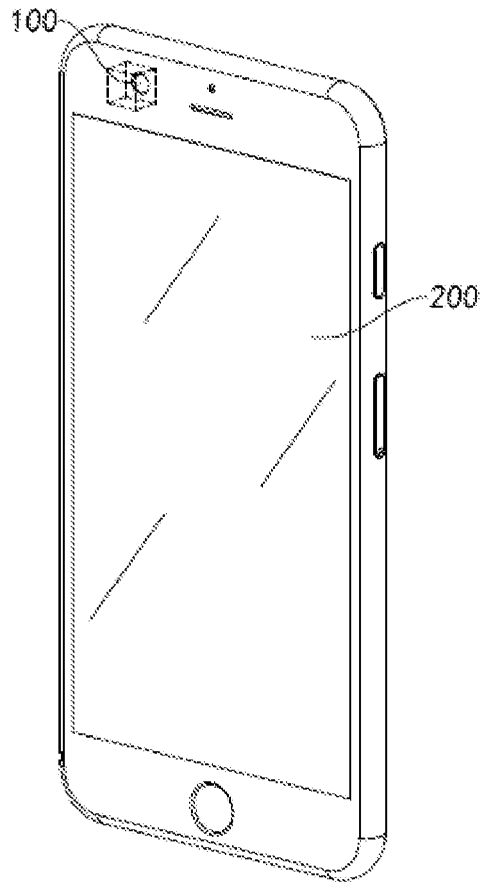
FIG. 13 is a schematic view of an application state of the camera module according to the above preferred embodiment of the present disclosure.

It is worth mentioning that, although in an example of the electronic device shown in FIG. 13, the camera module 100 is disposed on the back side of the device body 200 (a side facing away from the display screen of the device body 200), it will be understood that the camera module 100 may also be disposed on the front side (the side where the display screen of the device body 200 is located) of the device body 200, or at least one camera module 100 is disposed on the back side of the device body 200 and at least one camera module 100 is disposed on the back side of the device body 200, that is, the front side and the back side of the device body 200 are each provided with at least one camera module 100. Nevertheless, it will be understood by those skilled in the art that in other examples of the electronic device, it is also possible that one or more camera module 100 is disposed on the side surface of the device body 200.

Further, although the device body 200 of the electronic device shown in FIG. 13 is a smart phone, in other examples, the device body 200 may also be implemented as but not limited to, a tablet, a electronic book, an MP3/4/5, a personal digital assistant, a camera, a television set, a washing machine, a refrigerator, or any electronic product that can be configured with the camera module 100.

Figure 11:
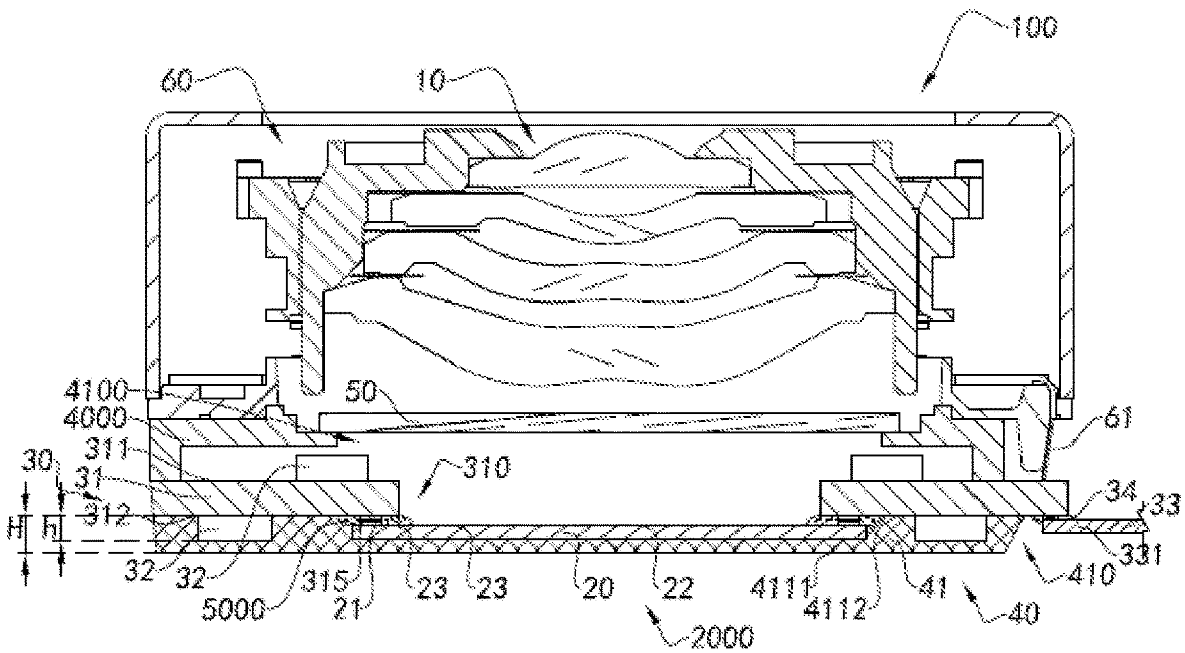
FIG. 11 is a schematic view of the internal structure cut along the intermediate position of the camera module according to the above preferred embodiment of the present disclosure.
Figure 12:
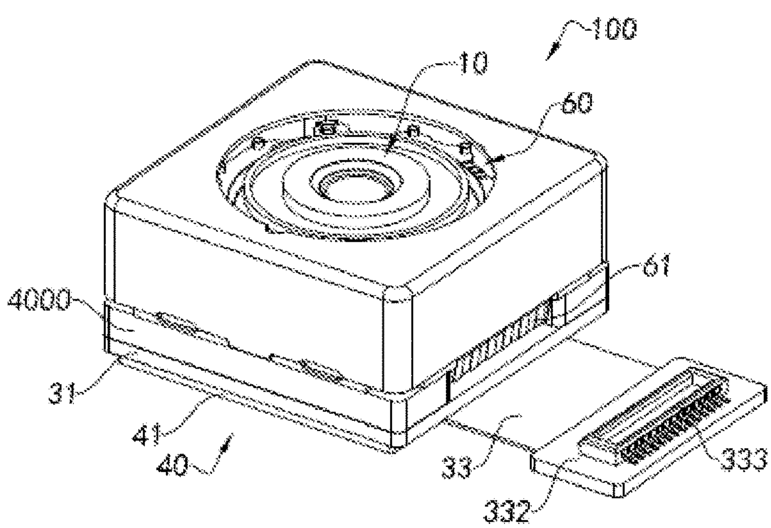
FIG. 12 is a perspective schematic view of the camera module according to the above preferred embodiment of the present disclosure.

FIG. 11 shows a schematic view of an internal structure cut along an intermediate position of the camera module 100, and FIG. 12 shows a perspective state of the camera module 100. Specifically, the camera module 100 includes at least one optical lens 10, at least one photosensitive element 20 and a circuit board 30, wherein the photosensitive element 20 is conductively connected to the circuit board 30, and the optical lens 10 is held in the photosensitive path of the photosensitive element 20.

Light reflected by an object enters the interior of the camera module 100 from the optical lens 10, and then is received by the photosensitive element 20 and forms an image by photoelectric conversion. An electrical signal associated with the image of the object obtained by photoelectric conversion of the photosensitive element 20 can be transmitted by the circuit board 30. For example, the circuit board 30 may transmit the electric signal associated with the image of the object to the device body 200 connected to the circuit board 30. That is, the circuit board 30 can be conductively connected to the device body 200 to assemble the camera module 100 on the device body 200 to form the electronic device.

Further, with reference to FIG. 11, the circuit board 30 includes at least one substrate 31 and at least one electronic component 32, wherein each of the electronic components 32 is conductively connected to the substrate 31, respectively.

Specifically, the substrate 31 has a substrate front substrate 311, a substrate back surface 312 and at least one substrate channel 310, wherein the substrate front surface 311 and the substrate back surface 312 correspond to each other, and the substrate channel 310 extends from the substrate front surface 311 to the substrate back surface 312 of the substrate 31. That is, the substrate channel 310 can communicate with the substrate front surface 311 and the substrate back surface 312 of the substrate 31. In other words, the substrate channel 310 is one perforation. For example, the substrate channel 310 may be but not limited to one central perforation.

In general, the substrate 31 is plate-like, and the substrate front surface 311 and the substrate back surface 312 of the substrate 31 are parallel to each other, so that a distance between the substrate front surface 311 and the substrate back surface 312 of the substrate 31 can be used to define the thickness of the substrate 31. Nevertheless, it will be understood by those skilled in the art that in other examples of the camera module 100 of the present disclosure, at least one of the substrate front surface 311 and the substrate back surface 312 of the substrate 31 may be provided with a raised structure or a groove, and the camera module 100 of the present disclosure is not limited in this regard.

Further, the substrate channel 310 of the substrate 31 is generally square-shaped, e.g. square or rectangular. However, it will be understood by those skilled in the art that in other examples of the camera module 100, the substrate channel 310 of the substrate 31 may also have any other possible shape, such as but not limited to a circular shape or an oval shape. Nevertheless, in order to reduce the length and width sizes of the camera module 100, the shape and size of the substrate channel 310 of the substrate 31 are set to correspond to the shape and size of the photosensitive element 20.

It is worth mentioning that the type of the substrate 31 is not limited in the camera module 100 of the present disclosure. For example, the substrate 31 may be selected as but not limited to, a rigid board, a flex board, a rigid-flex board, a ceramic plate or the like.

In this example of the camera module 100 shown in FIG. 11, at least one electronic component 32 is conductively connected to the substrate 31 on the substrate front surface 311 of the substrate 31, and a further electronic component 32 is conductively connected to the substrate 31 on the substrate back surface 312 of the substrate 31. By this way, the layout of the electronic components 32 can become more flexible.

Figure 23:
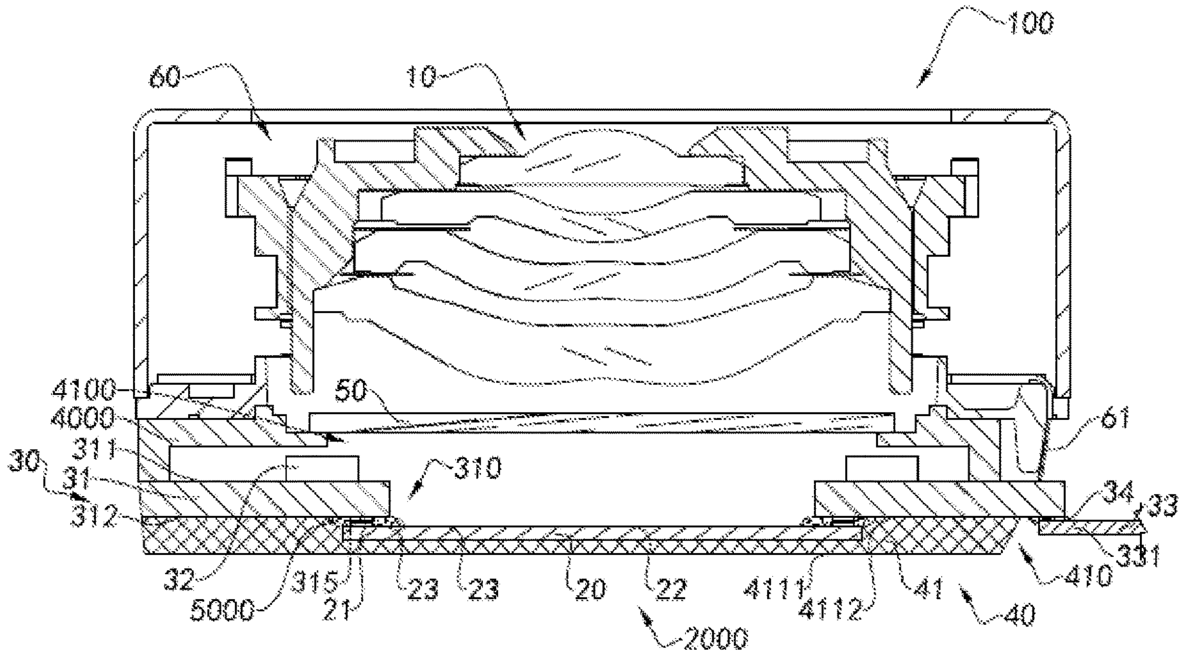
FIG. 23 is a schematic view of the internal structure cut along the intermediate position of a modified implementation of the camera module according to the above preferred embodiment of the present disclosure.
Figure 24:
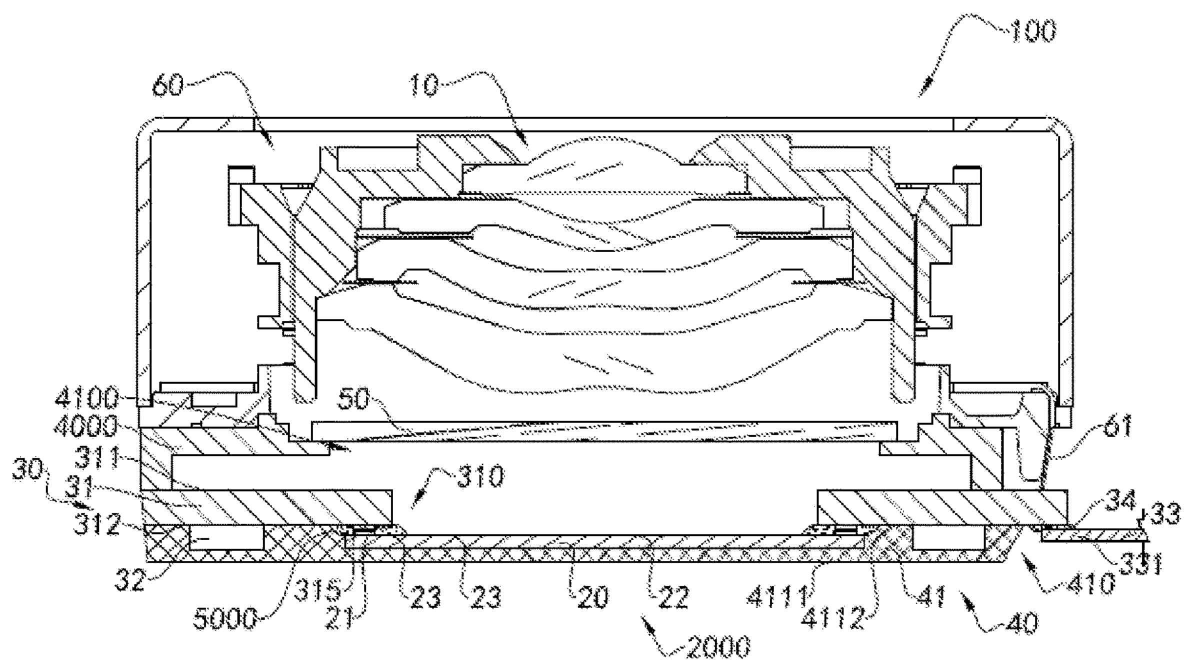
FIG. 24 is a schematic view of the internal structure cut along the intermediate position of another modified implementation of the camera module according to the above preferred embodiment of the present disclosure.

Nevertheless, in another example of the camera module 100 shown in FIG. 23, all the electronic components 32 may be conductively connected to the substrate 31 on the substrate front surface 311 of the substrate 31, or in another example of the camera module 100 shown in FIG. 24, all the electronic components 32 may also be conductively connected to the substrate 31 on the substrate back surface 312 of the substrate 31.

It is worth mentioning that the type of the electronic component 32 is not limited in the camera module 100 of the present disclosure. For example, the electronic component 32 may be implemented as but not limited to, a processor, a relay, a memory, a driver, an inductor, a resistor, a capacitor or the like.

Further, in one specific example of the camera module 100 of the present disclosure, the electronic component 32 may be attached to the substrate front surface 311 and/or the substrate back surface 312 of the substrate 31 in such a manner that the electronic component 32 is conductively connected to the substrate 31 on the substrate front surface 311 and/or the substrate back surface 312 of the substrate 31.

In another specific example of the camera module 100 of the present disclosure, the electronic component 32 may also be half buried in the substrate on the substrate front surface 311 and/or the substrate back surface 312 of the substrate 31, and the electronic component 32 is conductively connected to the substrate 31, that is, a part of the electronic component 32 is protruded from the substrate front surface 311 and/or the substrate back surface 312 of the substrate 31. By this way, the height size of the camera module 100 can be further reduced. Optionally, the electronic components 32 may also be completely buried inside the substrate 31.

With continued reference to FIG. 11, the circuit board 30 further includes a connecting plate 33, wherein the connecting plate 33 has a module connecting side 331 and a device connecting side 332, and wherein the module connecting side 331 of the connecting plate 33 is connected to the substrate back surface 312 of the substrate 31. For example, the module connecting side 331 of the connecting plate 33 may be conductively connected to the substrate back surface 312 of the substrate 31 via a connecting portion 34, wherein the connecting portion 34 may be but not limited to anisotropic conductive glue or an anisotropic conductive glue tape. Further, the device connecting side 332 of the connecting plate 33 can be connected to the device body 200. For example, the device connecting side 332 of the connecting plate 33 may be provided or formed with a connector 333 of the connecting plate 33 for connecting the device body 200.

Nevertheless, it will be understood by those skilled in the art that in other examples of the camera module 100, it is also possible that the module connecting side 331 of the connecting plate 33 is conductively connected to the substrate 31 on the substrate front surface 311 of the substrate 31. In further other examples of the camera module 100, it is also possible that the module connecting side 331 of the connecting plate 33 is connected to a side surface of the substrate 31, or the module connecting side 331 of the connecting plate 33 and the substrate 31 are integrally formed.

It is worth mentioning that the connecting plate 33 is deformable so that the connecting plate 33 may buffer the displacement of the camera module 100 caused by the vibration of the electronic device in the process of being used, thereby ensuring the reliability of the electronic device when used.

Further, the substrate 31 has at least one group of substrate connecting members 315, wherein the substrate connecting member 315 of the substrate 31 is provided on and protruded from the substrate back surface 312 of the substrate 31. Preferably, the substrate connecting member 315 of the substrate 31 surrounds around the substrate channel 310. Optionally, the substrate connecting member 315 of the substrate 31 may be arranged on one side or two sides or three sides of the substrate channel 310. For example, when the substrate connecting member 315 of the substrate 31 is arranged at two sides of the substrate channel 310, the substrate connecting member 315 may be arranged on two adjacent sides of the substrate channel 310, or may be arranged on two opposite sides of the substrate channel 310.

The photosensitive element 20 has at least one group of chip connecting members 21 and a photosensitive area 22, and a non-photosensitive area 23 surrounding around the photosensitive area 22, wherein the chip connecting member 21 is provided on and protruded above the non-photosensitive area 23 of the photosensitive element 20. The chip connecting member 21 of the photosensitive element 20 may surround around the photosensitive area 22. Optionally, the chip connecting member 21 of the photosensitive element 20 may be provided on one side or two sides or three sides of the photosensitive area 22. For example, when the chip connecting member 21 of the photosensitive element 20 is located on two sides of the photosensitive area 22, the chip connecting member 21 may be located on two adjacent sides of the photosensitive area 22, or may be located on two opposite sides of the photosensitive area 22.

At least one part of the non-photosensitive area 23 of the photosensitive element 20 is attached to the substrate back surface 312 of the substrate 31, so that the chip connecting member 21 of the photosensitive element 20 is conductively connected to the substrate connecting member 315 of the substrate 31, and the photosensitive area 22 of the photosensitive element 20 corresponds to the substrate channel 310 of the substrate 31. Preferably, a part of the non-photosensitive area of the photosensitive element 20 also corresponds to the substrate channel 310 of the substrate 31.

It is worth mentioning that, in the camera module 100 of the present disclosure, at the same time when the photosensitive element 20 is attached to the substrate back surface 312 of the substrate 31, the chip connecting member 21 of the photosensitive element 20 is conductively connected to the substrate connecting member 315 of the substrate 31. By this way, the manufacturing steps of the camera module 100 can be reduced to facilitate reducing the manufacturing cost of the camera module 100 and improving the productivity of the camera module 100. Further, in the present disclosure, the photosensitive element 20 is attached to the substrate back surface 312 of the substrate 31, which is advantageous to cause the camera module 100 to have a greater focal length and a larger zoom range while the height size of the camera module 100 is controlled, or to cause the height size of the camera module 100 to be lower while the focal length and zoom range of the camera module 100 are controlled.

It is also worth mentioning that the shape and arrangement of the chip connecting member 21 of the photosensitive element 20 and the shape and arrangement of the substrate connecting member 315 of the substrate 31 are not limited in the camera module 100 of the present disclosure. For example, the chip connecting member 21 of the photosensitive element 20 may be disk-shaped, spherical or the like, and accordingly, the substrate connecting member 315 of the substrate 31 may be disk-shaped, spherical or the like.

Preferably, in a thickness direction of the substrate 31, at least one part of at least one of the electronic components 32 located on the substrate front surface 311 of the substrate 31 can correspond to the non-photosensitive area 23 of the photosensitive element 20. That is to say, from a top view perspective, at least one part of at least one electronic component 32 located on the substrate front surface 311 of the substrate 31 and the non-photosensitive area 23 of the photosensitive element 20 can be overlapped with each other. By this way, the length and width sizes of the camera module 100 can be reduced.

It will be understood by those skilled in the art that the substrate connecting member 315 of the substrate 31 is protruded above the substrate back surface 312 of the substrate 31, and the chip connecting member 21 of the photosensitive element 20 is protruded above the non-photosensitive area 23 of the photosensitive element 20, so that after one part of the non-photosensitive area 23 of the photosensitive element 20 is attached to the substrate back surface 312 of the substrate 31 and the chip connecting member 21 of the photosensitive element 20 is conductively connected to the substrate connecting member 315 of the substrate 31, at least one gap 24 is formed between the non-photosensitive area 23 of the photosensitive element 20 and the substrate back surface 312 of the substrate 31.

In the camera module 100 of the present disclosure, after one part of the photosensitive element 20 is attached to the substrate back surface 312 of the substrate 31, and the chip connecting member 21 of the photosensitive element 20 is conductively connected to the substrate connecting member 315 of the substrate 31, a filler 5000 is filled in the gap 24 formed between the non-photosensitive area 23 of the photosensitive element 20 and the substrate back surface 312 of the substrate 31 to fill the gap 24.

Preferably, the filler 5000 is in a fluid state before it is filled in the gap 24 formed between the non-photosensitive area 23 of the photosensitive element 20 and the substrate back surface 312 of the substrate 31 and when it is being filled in the gap 24 formed between the non-photosensitive area 23 of the photosensitive element 20 and the substrate back surface 312 of the substrate 31, and the filler 500 is cured after the filler 5000 is filled in the gap 24 formed between the non-photosensitive area 23 of the photosensitive element 20 and the substrate back surface 312 of the substrate 31 to seal the gap 24.

It is worth mentioning that the material of the filler 5000 is not limited in the camera module 100 of the present disclosure. For example, the filler 5000 may be implemented as but not limited to glue, resin or the like.

In the camera module 100 of the present disclosure, in an aspect, the filler 5000 can be used to connect the substrate 31 and the photosensitive element 20, so that the photosensitive element 20 is firmly attached to the substrate back surface 312 of the substrate 31. In another aspect, by way of being held between the substrate back surface 312 of the substrate 31 and the non-photosensitive area 23 of the photosensitive element 20, the filler 5000 is filled in the gap 24 formed between the substrate back surface 312 of the substrate 31 and the non-photosensitive area 23 of the photosensitive element 20. In further another aspect, the filler 5000 can prevent the chip connecting member 21 of the photosensitive element 20 and the substrate connecting member 32 of the substrate 31 from contacting with the external environment, so that by way of avoiding the chip connecting member 21 of the photosensitive element 20 and the substrate connecting member 31 of the substrate 31 from being oxidized, the reliability of the connection relationship of the chip connecting member 21 of the photosensitive element 20 and the substrate connecting member 31 of the substrate 31 can be ensured. The camera module 100 includes a molded unit 40, wherein the molded unit 40 includes a back surface molded portion 41, and wherein the back surface molded portion 41 is integrally bonded to at least one part of the area of the substrate back surface 312 of the substrate 31. For example, in this preferred example of the camera module 100 shown in FIGS. 11 and 12, the back surface molded portion 41 is integrally bonded to at least one part of the area of the substrate back surface 312 of the substrate 31, the photosensitive element 20 further has a chip back surface 25, and the back surface molded portion 41 embeds the entire area of the chip back surface 25 of the photosensitive element 20, so that the back surface molded portion 41, the photosensitive element 20 and the substrate 31 are integrally bonded to form a molded circuit board assembly 2000. Of course, it will be understood that in other examples of the camera module 100, the back surface molded portion 41 may also embed only at least one part of the area of the chip back surface 25 of the photosensitive element 20.

That is to say, according to this another aspect of the present disclosure, the present disclosure further provides the molded circuit board assembly 2000, wherein the molded circuit board assembly 2000 includes the substrate 31, the electronic component 32, the photosensitive element 20 and the back surface molded portion 41; wherein the electronic component 32 is conductively connected to the substrate front surface 311 and/or the substrate back surface 312 of the substrate 31; wherein the photosensitive element 20 is conductively connected to the substrate back surface 312 of the substrate 31, and the photosensitive area 22 and a part of the non-photosensitive area 23 of the photosensitive element 20 correspond to the substrate channel 310 of the substrate 31; and wherein the back surface molded portion 41 is integrally bonded to at least one part of the area of the substrate back surface 312 of the substrate 31 and embeds at least one part of the area of the chip back surface 25 of the photosensitive element 20.

In other words, the back surface molded portion 41 can embed at least one part of the attaching position of the photosensitive element 20 and the substrate 31 to prevent the photosensitive element 20 from falling off from the substrate 31, thereby ensuring the reliability of the camera module 100. Also, by way of embedding at least one part of the attaching position of the photosensitive element 20 and the substrate 31, the back surface molded portion 41 can further isolate the chip connecting member 21 of the photosensitive element 20 from the external environment, isolate the substrate connecting member 315 of the substrate 31 from the external environment and isolate the connecting position of the chip connecting member 21 and the substrate connecting member 315 from the external environment, to ensure the reliability of the conductive position of the photosensitive element 20 and the substrate 31 by way of avoiding the chip connecting member 21, the substrate connecting member 315, and the connecting position of the chip connecting member 21 and the substrate connecting member 315 from being oxidized.

It will be understood that the filler 5000 can also isolate the chip connecting member 21 of the photosensitive element 20 from the external environment, isolate the substrate connecting member 315 of the substrate 31 from the external environment and isolate the connecting position of the chip connecting member 21 and the substrate connecting member 315 from the external environment, to avoid the chip connecting member 21, the substrate connecting member 315, and the connecting position of the chip connecting member 21 and the substrate connecting member 315 from being oxidized, thereby ensuring the reliability of the conductive position of the photosensitive element 20 and the substrate 31.

Further, the back surface molded portion 41 embeds at least one part of the attaching position of the photosensitive element 20 and the substrate 31, and by means of the back surface molded portion 41, the strength of the substrate 31 can also be reinforced and the flatness of the substrate 31 can also be ensured. Preferably, by way of causing the back surface molded portion 41 to embed at least one part of the chip back surface 25 of the photosensitive element 20, the flatness of the photosensitive element 20 can also be ensured by means of the back surface molded portion 41, so that the flatness of the photosensitive element 20 is limited to the back surface molded portion 41. In this way, on the one hand, the flatness of the photosensitive element 20 can be ensured, and on the other hand, the substrate 31 may be selected as a thinner sheet, to facilitate reducing the height size of the camera module 100.

The back surface molded portion 41 is not deformed when heated, so that when the camera module 100 is used for a long time, the heat generated by the photosensitive element 20 acts on the back surface molded portion 41, and the back surface molded portion 41 is not deformed, to facilitate ensuring the flatness of the photosensitive element 20. Preferably, the back surface molded portion 41 has a good heat dissipation capacity, wherein the back surface molded portion 41 can quickly radiate the heat generated by the photosensitive element 20 to the external environment of the camera module 100, thereby ensuring the reliability of the camera module 100 when used for a long time.

Further, the back surface molded portion 41 can avoid the substrate back surface 312 of the substrate 31 from being exposed by way of being integrally bonded to the substrate back surface 312 of the substrate 31, so that when the back surface molded portion 41 is assembled on the device body 200 to form the electronic device, other assembled members of the device body 200 may not scratch the substrate 31 due to touching with the substrate back surface 312 of the substrate 31, thereby facilitating ensuring good electrical properties of the substrate 31.

With continued reference to FIG. 11, the back surface molded portion 41 can embed at least one part of at least one electronic component 32 protruded from the substrate back surface 312 of the substrate 31. By this way, in an aspect, the back surface molded portion 41 can isolate the surface of the electronic component 32 from the external environment, and by way of avoiding the surface of the electronic component 32 from being oxidized, the good electrical properties of the electronic components 32 can be ensured. In another aspect, the back surface molded portion 41 can prevent the occurrence of undesirable phenomena such as mutual interference of adjacent electronic components 32 by way of isolating the adjacent electronic components 32, so that a larger number and larger size of the electronic components 32 can be attached to a limited attaching area of the substrate back surface 312 of the substrate 31, to facilitate improving the performance and imaging quality of the camera module 100. In further another aspect, the back surface molded portion 41 avoids the electronic component 32 from being exposed by way of embedding the electronic component 32, so that in the process of assembling the camera module 100 to the device body 200, there is no need to worry that the electronic component 32 is scratched or the electronic component 32 is caused to fall off from the substrate 31 due to the electronic component 32 touching with other assembled members of the device body 200, to ensure the reliability of the camera module 100 when assembled and used, and the electronic component 32 can also prevent the back surface molded portion 41 from falling off from the substrate back surface 312 of the substrate 31, to ensure that the back surface molded portion 41 is firmly bonded to the substrate back surface 312 of the substrate 31.

With further reference to FIG. 11, in this preferred example of the camera module 100 of the present disclosure, the height size parameter of the back surface molded portion 41 protruded from the substrate back surface 312 of the substrate 31 is greater than or equal to the height of the electronic component 32 protruded from the substrate back surface 312 of the substrate 31. Specifically, the back surface molded portion 41 has a free side surface 4111 and a bonding side surface 4112, wherein the free side surface 4111 and the bonding side surface 4112 of the back surface molded portion 41 correspond to each other, and the bonding side surface 4112 of the back surface molded portion 41 is integrally bonded to at least one part of the area of the substrate back surface 312 of the substrate 31 and at least one part of the area of the chip back surface 25 of the photosensitive element 20.

It is assumed that the height size parameter of the back surface molded portion 41 protruded from the substrate back surface 312 of the substrate 31 is H, that is, the distance parameter between the free side surface 4111 and the bonding side surface 4112 of the back surface molded portion 41 is H, and it is assumed that the height size parameter of the electronic component 32 protruded from the substrate back surface 312 of the substrate 31 is h, where the value of the parameter H is greater than or equal to the value of the parameter h. In this way, when the camera module 100 is assembled to the device body 200, other assembled members of the device body 200 can be prevented from touching the electronic component 32, to ensure the reliability of the camera module 100.

Figure 25:
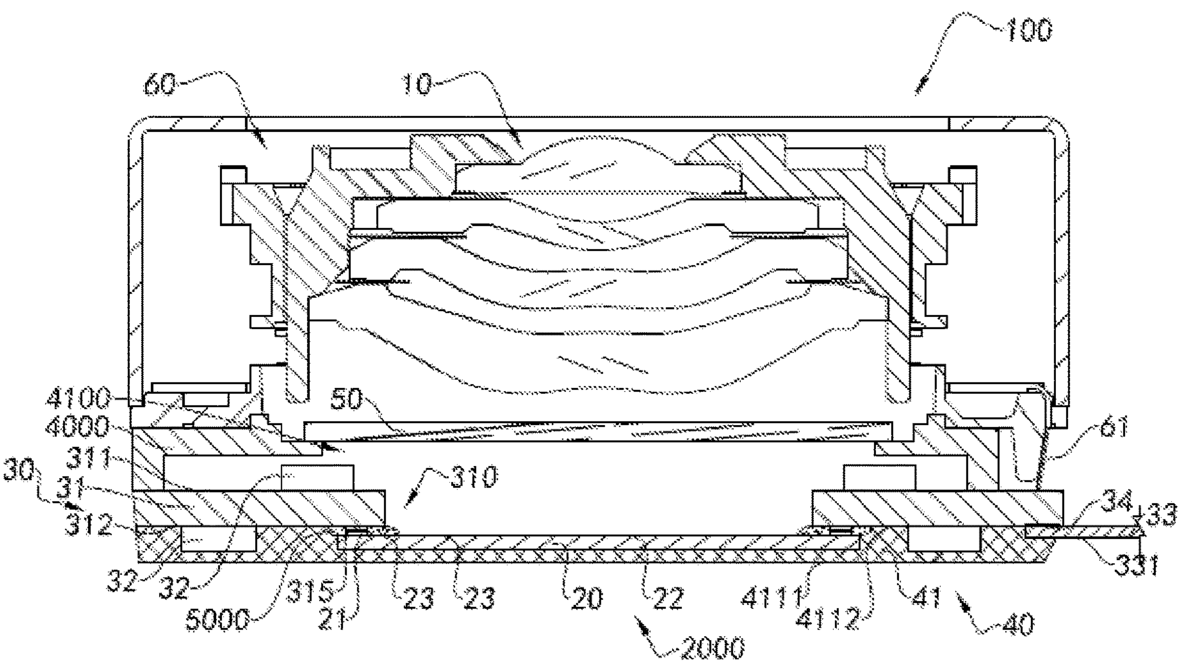
FIG. 25 is a schematic view of the internal structure cut along the intermediate position of another modified implementation of the camera module according to the above preferred embodiment of the present disclosure.

FIG. 25 shows a modified implementation of the camera module 100, wherein the back surface molded portion 41 further embeds the module connecting side 331 of the connecting plate 33, so that the back surface molded portion 41, the substrate 31, the electronic component 32, the connecting plate 33 and the photosensitive element 20 are integrally bonded to form the molded circuit board assembly 2000. It will be understood that, by way of the back surface molded portion 41 further embedding the module connecting side 331 of the connecting plate 33, the connecting plate 33 falling off from the substrate back surface 312 of the substrate 31 can be avoided, to ensure the reliability of the connecting position of the module connecting member 331 of the connecting plate 33 and the substrate back surface 312 of the substrate 31.

Figure 14:
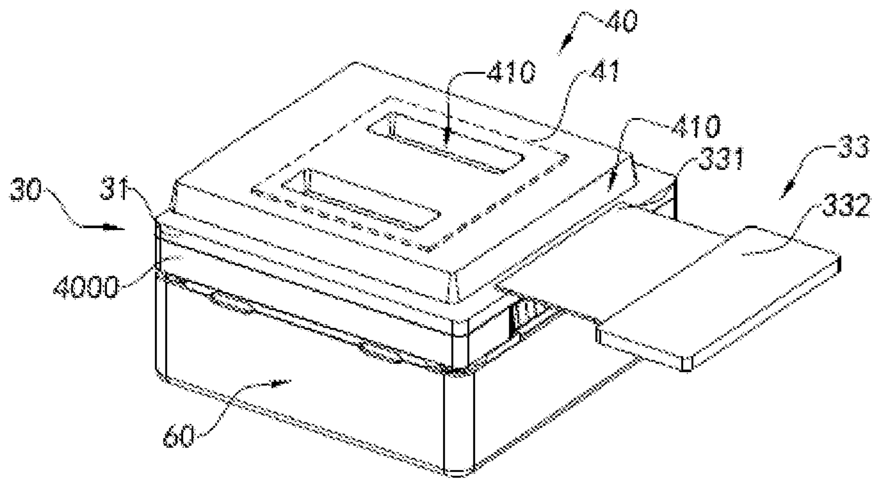
FIG. 14 is a perspective schematic view of a modified implementation of the camera module according to the above preferred embodiment of the present disclosure.

FIG. 14 shows a schematic cross-sectional view of a modified implementation of the camera module 100, wherein the back surface molded portion 41 has at least one assembling space 410, and wherein the module connecting member 331 of the connecting plate 33 can be accommodated in the assembling space 410 of the back surface molded portion 41 after it is connected to the substrate 31 on the substrate back surface 312 of the substrate 31. By this way, the protrusion of the module connecting member 331 of the connecting plate 33 can be avoided, to ensure the reliability of the connecting position of the module connecting member 331 of the connecting plate 33 and the substrate back surface 312 of the substrate 31.

It will be understood that the assembling space 410 of the back surface molded portion 41 may be in the middle of the back surface molded portion 41, or may be around the back surface molded portion 41.

In some further feasible examples of the camera module 100, the electronic component 32 not embedded by the back surface molded portion 41 may also be accommodated in the assembling space 410 of the back surface molded portion 41. By this way, when moving or assembling the camera module 100, the electronic component 32 can be avoided from being touched, thereby preventing the surface of the electronic component 32 or the conductive position of the electronic component 32 and the substrate 31 from being damaged, to further ensure the reliability of the camera module 100. Optionally, a part of the surface of the electronic component 32 may be exposed to the assembling space 410 of the back surface molded portion 41.

Further, when the camera module 100 is assembled to the electronic device, a protruded assembled member of the device body 200 may also be accommodated in the assembling space 410 of the back surface molded portion 41. By this way, the interior space of the device body 200 can be effectively used, to facilitate the lightening, thinning and miniaturization of the electronic device.

It is worth mentioning that the number, size and position of the assembling space 410 can be selected as needed to improve the flexibility of the camera module 100 when assembled.

Figure 15:
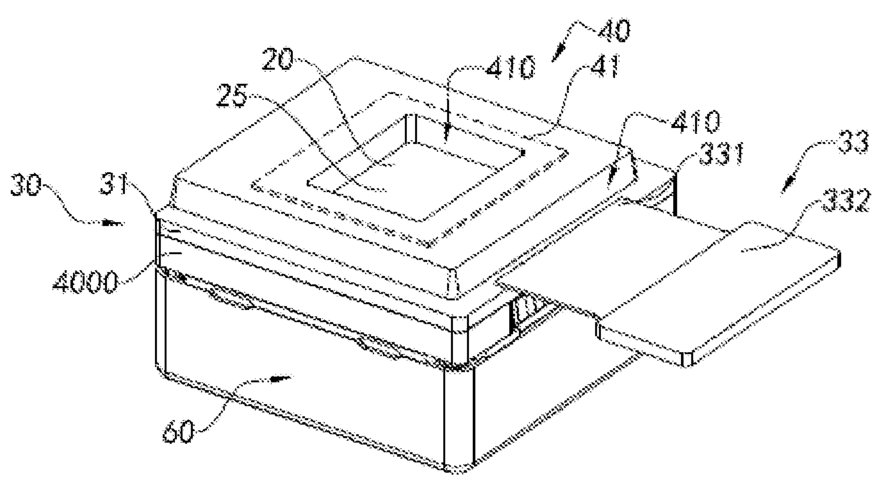
FIG. 15 is a perspective schematic view of another modified implementation of the camera module according to the above preferred embodiment of the present disclosure.
Figure 16:
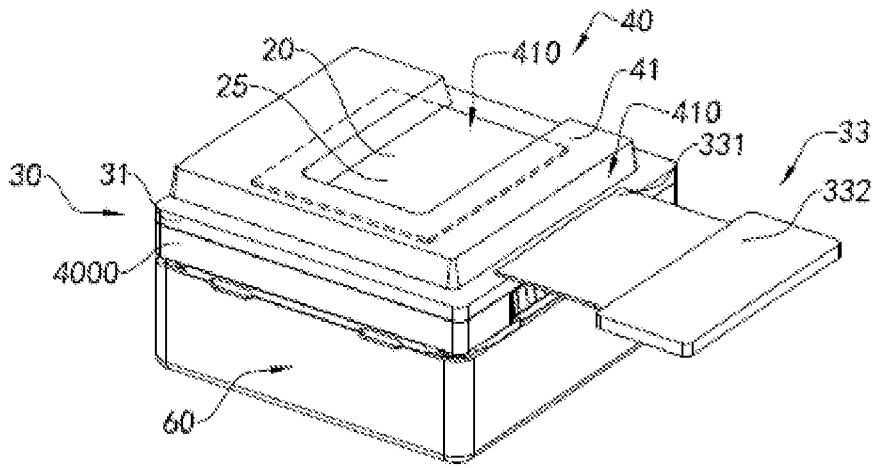
FIG. 16 is a perspective schematic view of another modified implementation of the camera module according to the above preferred embodiment of the present disclosure.
Figure 17:
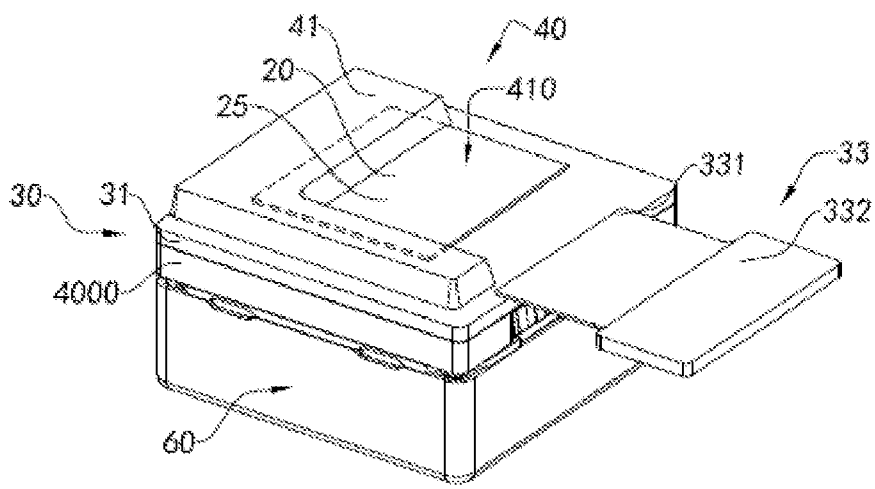
FIG. 17 is a perspective schematic view of another modified implementation of the camera module according to the above preferred embodiment of the present disclosure.
Figure 18:
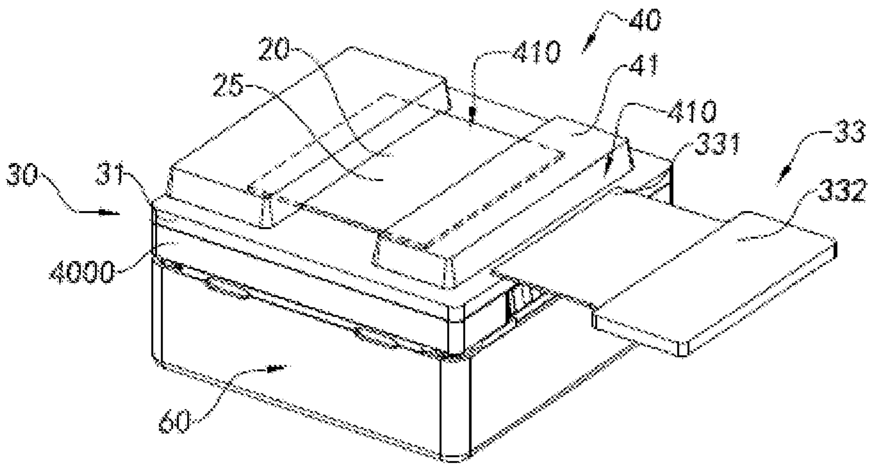
FIG. 18 is a perspective schematic view of another modified implementation of the camera module according to the above preferred embodiment of the present disclosure.
Figure 19:
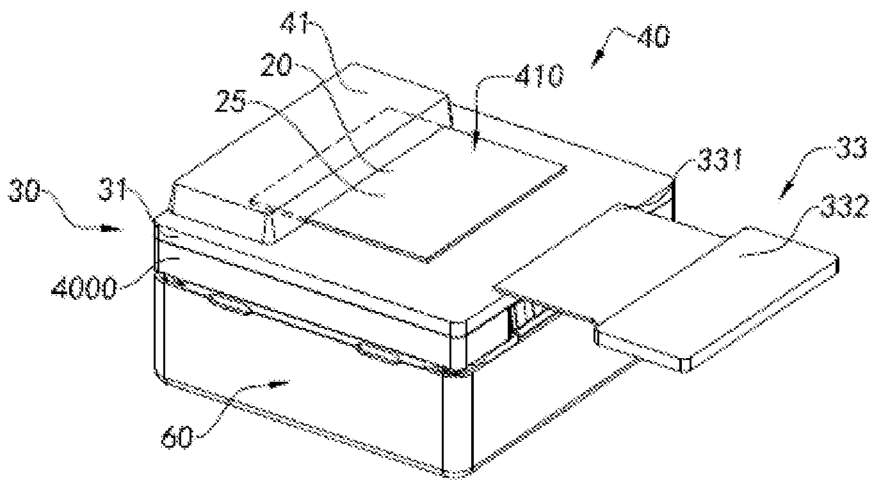
FIG. 19 is a perspective schematic view of another modified implementation of the camera module according to the above preferred embodiment of the present disclosure.

FIG. 15 shows another modified implementation of the camera module 100, wherein the back surface molded portion 41 of the molded unit 40 is integrally bonded to at least one side portion of the substrate back surface 312 of the substrate 31, that is to say, the back surface molded portion 41 may be not bonded in the middle of the substrate back surface 312 of the substrate 31. For example, in this specific example of the camera module 100 shown in FIG. 15, the back surface molded portion 41 may be integrally bonded to four side portions of the substrate back surface 312 of the substrate 31, so that the back surface molded portion 41 is "□"-shaped. In another modified implementation of the camera module 100 shown in FIG. 16, the back surface molded portion 41 may be integrally bonded to three side portions of the substrate back surface 312 of the substrate 31, so that the back surface molded portion 41 is "Π"-shaped or "C"-shaped. In another modified implementation of the camera module 100 shown in FIG. 17, the back surface molded portion 41 may be integrally bonded to two side portions of the substrate back surface 312 of the substrate 31, so that the back surface molded portion 41 is "Γ"-shaped or "L"-shaped. In another modified implementation of the camera module 100 shown in FIG. 18, the number of the back surface molded portions 41 may be two, and each of the back surface molded portions 41 is integrally bonded to a side portion of the substrate back surface 312 of the substrate 31, respectively, wherein the two back surface molded portion 41 are symmetrical to each other, or the two back surface molded portion 41 parallel to each other. For example, the two back surface molded portions 41 may be "II"-shaped. In another modified implementation of the camera module 100 shown in FIG. 19, the back surface molded portions 41 may be only integrally bonded to a side portion of the substrate back surface 312 of the substrate 31. For example, the back surface molded portion 41 may be "I"-shaped.

It is worth mentioning that, it will be understood by those skilled in the art that the back surface molded portion 41 may also be in other shapes, for example, "X"-shaped, or "井"-shaped.

Figure 20:
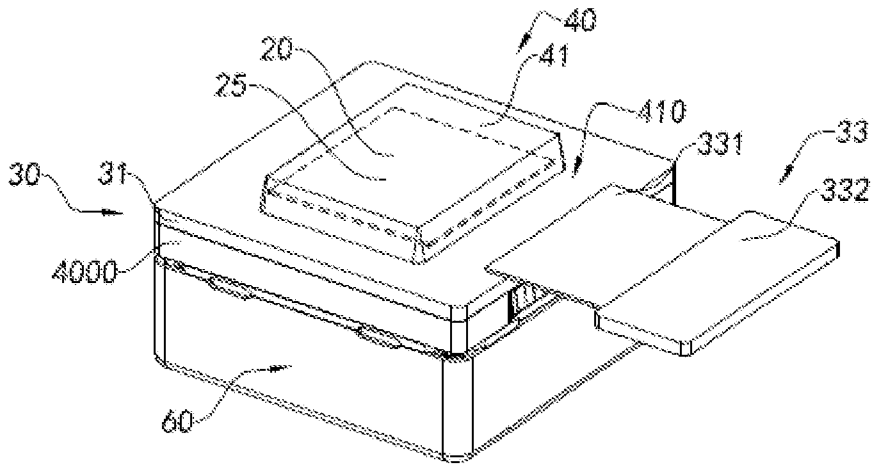
FIG. 20 is a perspective schematic view of another modified implementation of the camera module according to the above preferred embodiment of the present disclosure.

FIG. 20 shows another modified implementation of the camera module 100, wherein the back surface molded portion 41 of the molded unit 40 is only integrally bonded to the middle of the substrate back surface 312 of the substrate 31. At this time, the back surface molded portion 41 and the photosensitive element 20 correspond to each other and are held at two sides of the substrate 31, and the substrate 31 further has an attaching area 313. On the one hand, the back surface molded portion 41 can reinforce the strength of the substrate 31 in the attaching area 313 to ensure the flatness of the photosensitive element 20 attached to the attaching area 313 of the substrate 31, and on the other hand, the heat generated by the photosensitive element 20 can be radiated to the external environment to help dissipate the heat.

It is worth mentioning that the shape of the back surface molded portion 41 is not limited in the camera module 100 of the present disclosure. For example, the back surface molded portion 41 may be square, rectangular, trapezoidal, circular, elliptical or any other irregular shape in shape.

Figure 21:
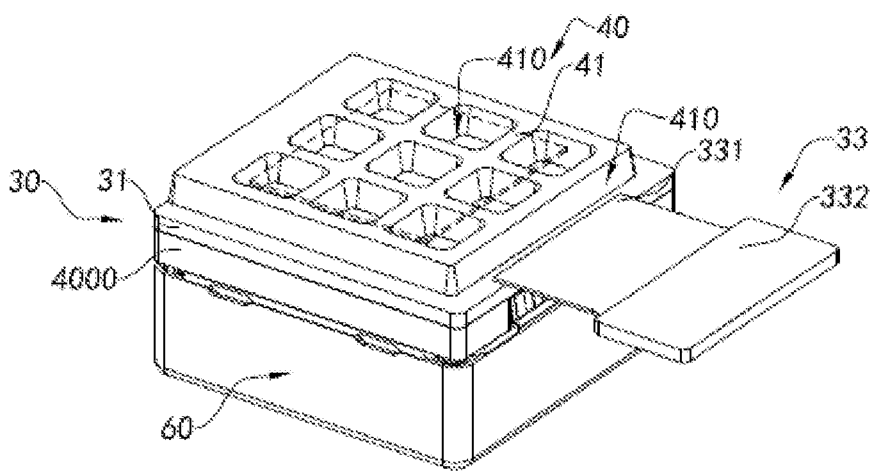
FIG. 21 is a perspective schematic view of another modified implementation of the camera module according to the above preferred embodiment of the present disclosure.

FIG. 21 shows another modified implementation of the camera module 100, wherein the back surface molded portion 41 of the molded unit 40 may be provided or formed with a plurality of assembling spaces 410, so that the back surface molded portion 41 is grid-shaped, or the back surface molded portion 41 is "田"-shaped, or the back surface molded portion 41 is "井"-shaped.

Figure 22:
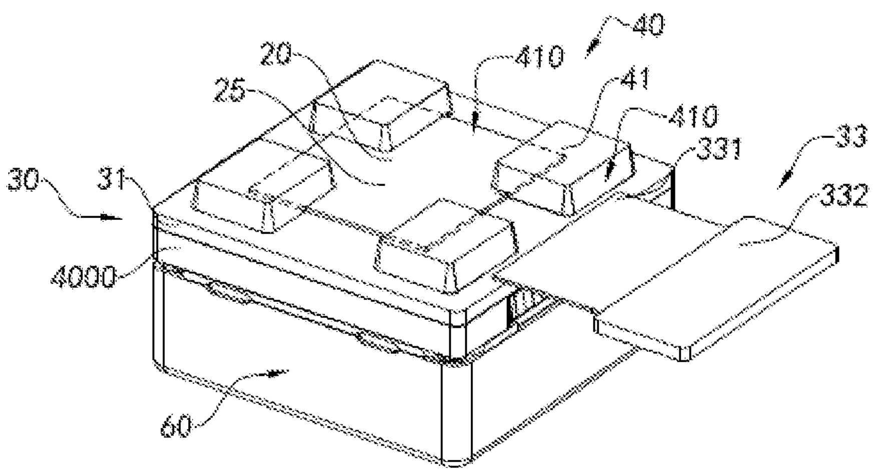
FIG. 22 is a perspective schematic view of another modified implementation of the camera module according to the above preferred embodiment of the present disclosure.

FIG. 22 shows another modified implementation of the camera module 100, wherein the number of the back surface molded portions 41 of the molded unit 40 may also be implemented as four, and each of the back surface molded portions 41 is integrally bonded to four corners of the substrate back surface 312 of the substrate 31, respectively. Nevertheless, it is also possible that each of the back surface molded portions 41 is integrally bonded to the middle of four side edges of the substrate back surface 312 of the substrate 31, respectively. Further, it will be understood by those skilled in the art that the number of the back surface molded portions 41 may also be implemented as more or less, and the camera module 100 of the present disclosure is not limited in this regard.

It is worth mentioning that, it will be understood by those skilled in the art that the back surface molded portions 41 of the molded unit 40 may also have any other possible shape, and the present disclosure will not be exemplified again in the following description.

With further reference to FIG. 11, the camera module 100 includes at least one bearing 4000, wherein the bearing 4000 has at least one light passing hole 4100, and wherein the bearing 4000 is attached to the substrate front surface 311 of the substrate 31, so that the bearing 4000 surrounds around the photosensitive area 22 of the photosensitive element 20, and the photosensitive area 22 of the photosensitive element 20 corresponds to the light passing hole 4100 of the bearing 4000. The bearing 4000 is used for holding the optical lens 10 in the photosensitive path of the photosensitive element 20, so that the light passing hole 4100 of the bearing 4000 forms a light passing path of the optical lens 10 and the photosensitive element 20.

It will be understood that, in this example of the camera module 100 shown in FIG. 11, at least one part of the at least one electronic component 312 located on the substrate back surface 312 of the substrate 31 may correspond to the bearing 4000 attached to the substrate front surface 311 of the substrate 31. That is to say, from a top view perspective, the bearing 4000 and at least one part of the at least one electronic component 312 located on the substrate back surface 312 of the substrate 31 may coincide with each other, to facilitate reducing the length and width sizes of the camera module 100.

In this example of the camera module 100 shown in FIG. 23, the substrate front surface 311 of the substrate 31 may be used only for attaching the bearing 4000. By this way, the length and width sizes of the camera module 100 can be further reduced.

With further reference to FIG. 11, the camera module 100 further includes at least one filter element 50, wherein the filter element 50 is attached to the bearing 4000, so that the filter element 50 is held between the optical lens 10 and the photosensitive element 20 by means of the bearing 4000, and light entering the interior of the camera module 100 from the optical lens 10 passes through the filter element 50 and then is received by the photosensitive area 22 of the photosensitive element 20. By this way, the imaging quality of the camera module 100 can be ensured.

Specifically, the filter element 50 can filter stray light in the light entering the interior of the camera module 100 from the optical lens 10. By this way, the imaging quality of the camera module 100 can be improved. It is worth mentioning that the type of the filter element 50 is not limited in the camera module 100 of the present disclosure. For example, the filter element 50 may be but not limited to, an infrared cut filter element, a visible spectrum filter element or the like.

With further reference to FIG. 11, the camera module 100 includes at least one driver 60, wherein the optical lens 10 is drivably disposed on the driver 60, and the driver 60 is attached to the top surface of the bearing 4000 so that the optical lens 10 is held in the photosensitive path of the photosensitive element 20 by means of the driver 60. Moreover, the driver 60 can drive the optical lens 10 to move relative to the photosensitive element 20 along the photosensitive path of the photosensitive element 20, so that the camera module 100 achieves the autofocus and the automatic zoom of the camera module 100 by way of adjusting the relative position of the optical lens 10 and the photosensitive element 20.

It is worth mentioning that the type of the driver 60 is not limited in the camera module 100 of the present disclosure, as long as it can drive the optical lens 10 to move relative to the photosensitive element 20 along the photosensitive path of the photosensitive element 20. For example, in a specific example of the present disclosure, the driver 60 may be implemented as but not limited to a voice coil motor.

Preferably, the driver 60 has a driving pin 61, wherein the driving pin 61 extends from a top surface of the bearing 4000 to a bonding surface, and the driving pins 61 of the driver 60 can be conductively connected to the substrate 31.

Figure 26:
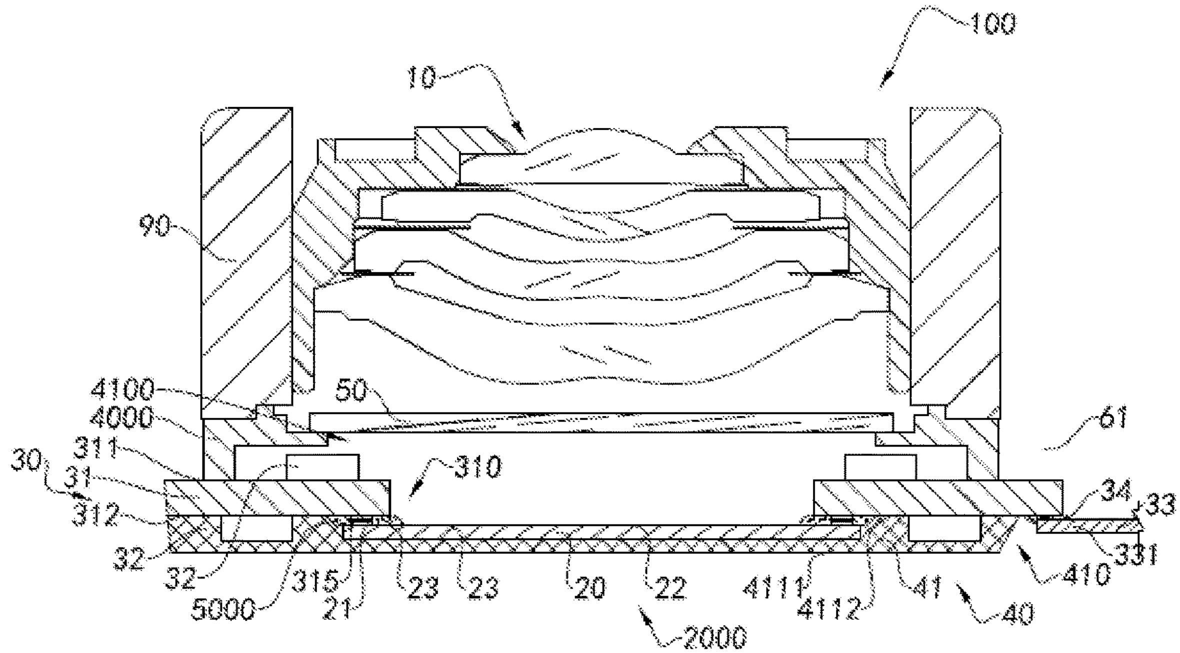
FIG. 26 is a schematic view of the internal structure cut along the intermediate position of another modified implementation of the camera module according to the above preferred embodiment of the present disclosure.

In another modified implementation of the camera module 100 shown in FIG. 26, the camera module 100 may be a fixed focus camera module. Specifically, the camera module 100 includes at least one lens barrel 90, wherein the optical lens 10 is disposed in the lens barrel 90, and the lens barrel

90 is attached to the bearing 4000, so that the optical lens 10 is held in the photosensitive path of the photosensitive element 20 by means of the lens barrel 90. In another modified implementation of the camera module 100 shown in FIG. 27A, the barrel 90 may also be integrally formed with the bearing 4000.

With reference to FIGS. 1 to 10 in the accompanying drawings of the present disclosure, a manufacturing process of the camera module 100 is set forth in the following description.

Figure 1:
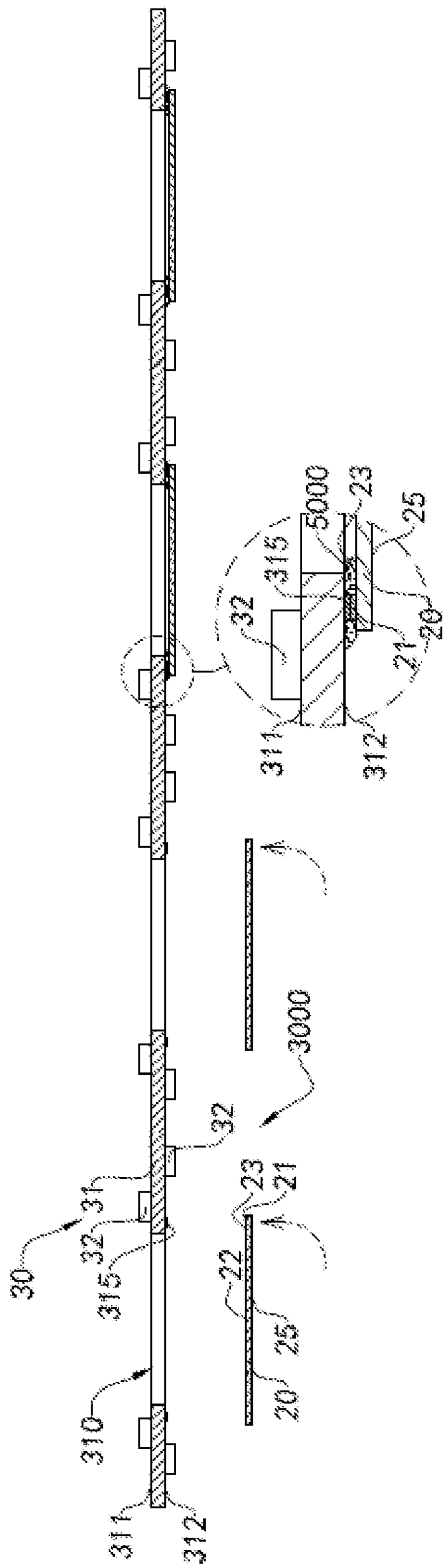
FIG. 1 is a schematic cross-sectional view of the first one of the manufacturing steps of a camera module according to a preferred embodiment of the present disclosure.

At a stage shown in FIG. 1, at least one electronic component 32 is conductively connected to the substrate 31 on the substrate front surface 311 of the substrate 31, and a further electronic component 32 is conductively connected to the substrate 31 on the substrate back surface 312 of the substrate 31, wherein two or more substrates 31 are arranged to form a splicing unit 3000. It is worth mentioning that the arrangement of a plurality of substrates 31 forming the splicing unit 3000 is not limited in the camera module 100 of the present disclosure, and it is selected as needed.

For example, in this specific example of the camera module 100 of the present disclosure, after the substrate 31 is provided or made, at least one electronic component 32 may be attached to the substrate front surface 311 of the substrate 31 by way of attaching, so that these electronic components 32 are conductively connected to the substrate 31 on the substrate front surface 311 of the substrate 31, and the further electronic components 32 are attached to the substrate back surface 312 of the substrate 31 by way of attaching, so that these electronic components 32 are conductively connected to the substrate 31 on the substrate back surface 312 of the substrate 31.

Further, the positions of the electronic components 32 attached to the substrate front surface 311 and the substrate back surface 312 of the substrate 31 may also be not limited, and they are adjusted according to a specific application of the camera module 100. For example, in further other examples of the camera module 100 of the present disclosure, a plurality of electronic components 32 may be arranged on the entire area of the substrate front surface 311 and/or the substrate back surface 312 of the substrate 31, whereas in further other examples of the camera module 100 of the present disclosure, the plurality of electronic components 32 may also be arranged on a specific area such as a corner or one side or both sides of the substrate front surface 311 and/or the substrate back surface 312 of the substrate 31. The camera module 100 of the present disclosure is not limited in this regard.

It is worth mentioning that, in further other examples of the camera module 100 of the present disclosure, the electronic component 32 may be conductively connected to the substrate 31 only on the substrate front surface 311 of the substrate 31, so that the camera module 100 as shown in FIG. 23 is obtained after the molding process and subsequent processes are performed. In further other examples of the camera module 100 of the present disclosure, the electronic component 32 may be conductively connected to the substrate 31 only on the substrate back surface 312 of the substrate 31, so that the camera module 100 as shown in FIG. 24 is obtained after the molding process and subsequent processes are performed.

Further, with continued reference to FIG. 1, the photosensitive element 20 is attached to the substrate 31 on the substrate back surface 312 of the substrate 31, so that the chip connecting member 21 located on the non-photosensitive area 23 of the photosensitive element 20 and the substrate connecting member 315 located on the substrate back surface 312 of the substrate 31 are conductively connected, and the photosensitive area 22 and a part of the non-photosensitive area 23 of the photosensitive element 20 correspond to the substrate channel 310 of the substrate 31, so that the photosensitive element 20 is conductively connected to the substrate 31.

It will be understood by those skilled in the art that, after one part of the non-photosensitive area 23 of the photosensitive element 20 is attached to the substrate back surface 312 of the substrate 31 and the chip connecting member 21 of the photosensitive element 20 is conductively connected to the substrate connecting member 315 of the substrate 31, a gap 24 is formed between the non-photosensitive area 23 of the photosensitive element 20 and the substrate back surface 312 of the substrate 31. Then, a filler 5000 is used to be filled in the gap 24 to prevent the photosensitive area 22 of the photosensitive element 20 and the substrate back surface 312 of the substrate 31 from communicating via the gap 24, so that in a subsequent molding process, the filler 5000 can prevent a fluid medium 400 from entering the photosensitive area 22 of the photosensitive element 20 from the substrate back surface 312 of the substrate 31 via the gap 24, to avoid the photosensitive area 22 of the photosensitive element 20 from being contaminated.

It will be understood that the substrate 31 can isolate at least one of the electronic components 32 from the photosensitive area 22 of the photosensitive element 20, to avoid shedding of the surface of the electronic component 32 and shedding of the connecting position of the electronic component 32 and the substrate 31 from contaminating the photosensitive area 22 of the photosensitive element 20. For example, in an example where all of the electronic components 32 are arranged on the substrate back surface 312 of the substrate 31, the substrate 31 can isolate all of the electronic components 32 from the photosensitive area 22 of the photosensitive element 20, so that in the process of manufacturing the camera module 100, the shedding of the surface of the electronic component 32 and the shedding of the connecting position of the electronic component 32 and the substrate 31 can be avoided from contaminating the photosensitive area 22 of the photosensitive element 20.

It is worth mentioning that, in some examples of the camera module 100 of the present disclosure, the electronic component 32 may be first conductively connected to the substrate 31, and then the photosensitive element 20 is conductively connected to the substrate 31. In other examples of the camera module 100 of the present disclosure, it is also possible that the photosensitive element 20 is first conductively connected to the substrate 31, and then the electronic component 32 is conductively connected to the substrate 31. Nevertheless, it will be understood by those skilled in the art that, in further other examples of the camera module 100 of the present disclosure, it is also possible that the electronic component 32 located on the substrate back surface 312 of the substrate 31 is first conductively connected to the substrate 31 and the photosensitive element 20 is conductively connected to the substrate 31, and then the electronic component 32 located on the substrate front surface 311 of the substrate 31 is conductively connected to the substrate 31; or the electronic component 32 located on the substrate front surface 311 of the substrate 31 is first conductively connected to the substrate 31, and then the electronic component 32 located on the substrate back surface 312 of the substrate 31 is conductively connected to the substrate 31 and the photosensitive element 20 is conductively connected to the substrate 31. The camera module 100 of the present disclosure is not limited in this regard.

Figure 2A:
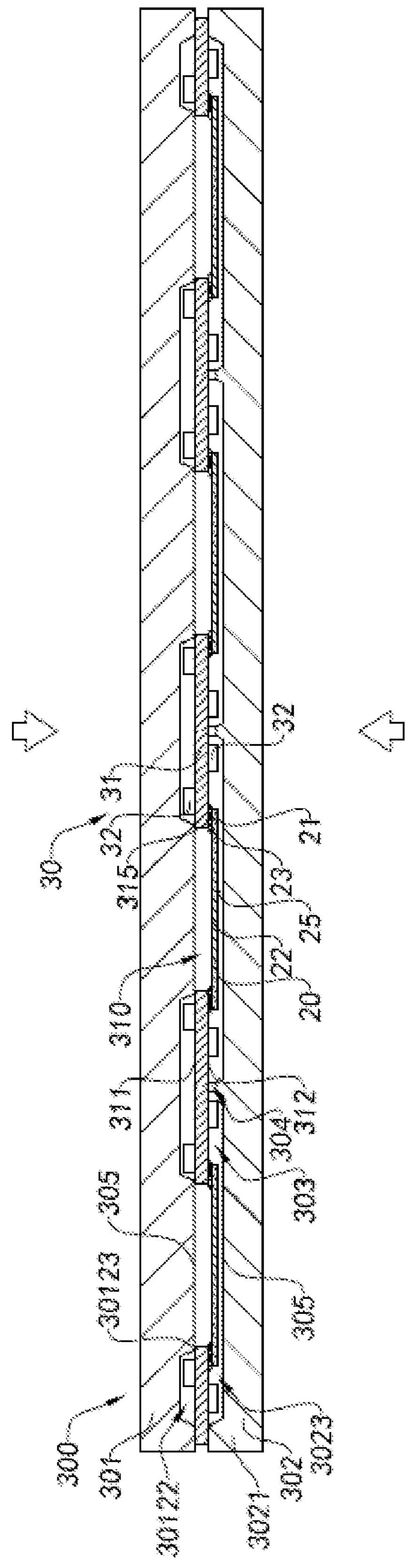
FIGS. 2A and 2B are schematic cross-sectional views of the second one of the manufacturing steps of the camera module according to the above preferred embodiment of the present disclosure.
Figure 2B:
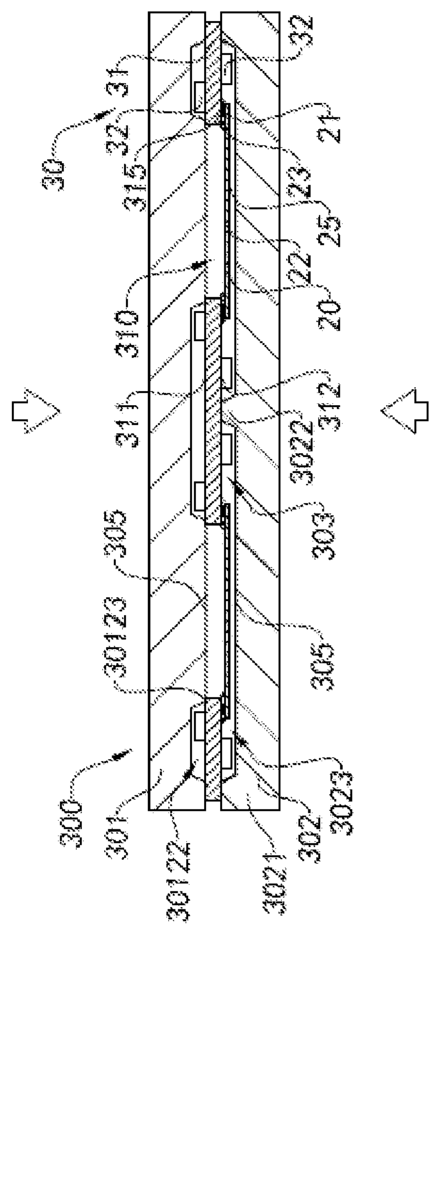

At a stage shown in FIGS. 2A and 2B, the splicing unit 3000 is placed into a molding die 300 to perform a molding process by means of the molding die 300.

Specifically, the molding die 300 includes an upper die 301 and a lower die 302, wherein at least one die of the upper die 301 and the lower die 302 can be operated, so that clamping and drafting operations are performed on the molding die 300. For example, in one example, after the splicing unit 3000 may be placed in the lower die 302 and the clamping operation is performed on the molding die 300, at least one molding space 303 is formed between the lower die 302 and the substrate back surface 312 of the substrate 31.

Preferably, when the number of the molding spaces 303 is two or more than two, at least one communication channel 304 may also be formed between the lower die 302 and the substrate back surface 312 of the substrate 31, wherein the communication channel 304 is used for adjacent molding spaces 303 to communicate. In this way, the fluid medium 400 added to one of the molding spaces 303 can pass through the communication channel 304 to fill up all of the molding spaces 303.

It is worth mentioning that a pressing surface of the upper die 301 may be a planar surface, wherein after the clamping operation is performed on the molding die 300, the pressing surface of the upper die 301 can be directly pressed to the substrate front surface 311 of the substrate 31.

Preferably, the upper die 301 may form at least one safety space 30122 by way of being recessed inwardly and an upper die pressing portion 30123 is formed around the molding space 30122, wherein when the clamping operation is performed on the molding die 300, the upper die pressing portion 30123 of the upper die 301 can press against the substrate front surface 311 of the substrate 31, for example, the upper die pressing portion 30123 of the upper die 301 can press against an area without traces of the substrate front surface 311 of the substrate 31, or the upper die pressing portion 30123 of the upper die 301 can press against an area or a member for supporting the substrate 31 of the splicing unit 3000, so that the trace area of the substrate front surface 311 of the substrate 31 corresponds to the safety space 30122 of the upper die 301. In this way, the upper die pressing portion 30123 of the upper die 301 can be avoided from scratching or crushing the substrate 31, to ensure the good electrical properties of the substrate 31.

It will be understood by those skilled in the art that, by way of providing the safety space 30122, the upper die 301 is particularly advantageous to protect the electronic component 32 protruded from the substrate front surface 311 of the substrate 31. That is to say, when the clamping operation is performed on the molding die 300, the electronic component 32 conductively connected to the substrate 31 on the substrate front surface 311 of the substrate 31 is accommodated in the safety space 30122 of the upper die 301, to avoid the electronic component 32 from being touched or pressed by the upper die pressing portion 30123 of the upper die 301, thereby ensuring the reliability of the electronic component 32 and the connecting position of the electronic component 32 and the substrate 31.

With continued reference to FIGS. 2A and 2B, the lower die 302 further includes a lower molding guide portion 3021 and at least one support portion 3022, and has at least one lower molding guide groove 3023, wherein the support portion 3022 integrally extends to the molding guide portion 3021, to form the lower molding guide groove 3023 between the support portion 3022 and the lower molding guide portion 3021 or form the lower molding guide groove 3023 between adjacent support portions 3022.

When the clamping operation is performed on the molding die 300, the molding space 303 is formed at a position of the lower die 302 corresponding to the lower molding guide groove 3023. Moreover, the lower molding guide portion 3021 of the lower die 302 can press against the substrate back surface 312 of the substrate 31, and the support portion 3022 of the lower die 302 can press against the substrate back surface 312 of the substrate 31.

Preferably, the height size of the support portion 3022 of the lower die 302 is larger than the height size of the electronic component 32 protruded from the substrate back surface 312 of the substrate 31. By this way, when the lower die 302 presses against the substrate back surface 312 of the substrate 31, there is a safety distance between the surface of the electronic component 32 and an inner surface of the lower die 302, to protect the surface of the electronic components 32 from scratching by way of avoiding the surface of the electronic components 32 from contacting with the inner surface of the lower die 302. Further, by way of having the safety distance between the surface of the electronic component 32 and the inner surface of the lower die 302, the back surface molded portion 41 integrally bonded to the substrate back surface 312 of the substrate 31 can also be subsequently caused to embed the electronic component 32.

With reference to FIGS. 2A and 2B, the molding die 300 further includes at least one film layer 305. For example, in this specific example of the present disclosure, the number of film layers 305 may be implemented as two, wherein one of the film layers 305 is overlappedly disposed on the inner surface of the upper die 301, and the other film layer 305 is overlappedly disposed on the inner surface of the lower die 301. For example, in one feasible example, the film layer 305 may be attached to the inner surface of the upper die 301 in such a manner that the film layer 305 is overlappedly disposed on the inner surface of the upper die 301, and the film layer 305 may be attached to the inner surface of the lower die 302 in such a manner that the film layer 305 is overlappedly disposed on the inner surface of the lower die 301.

It will be understood by those skilled in the art that, when the clamping operation is performed on the molding die 300, the film layer 305 is held between the upper die pressing portion 30123 of the upper die 301 and the substrate front surface 311 of the substrate 31. In this way, on the one hand, the film layer 305 can absorb an impact force generated when the molding die 300 is clamped by way of deformation to avoid the impact force from directly acting on the substrate 31, and on the other hand, the film layer 305 can further isolate the upper die pressing portion 30123 of the upper die 301 from the substrate front surface 311 of the substrate 31 to avoid the upper die 301 from scratching the substrate front surface 311 of the substrate 31, thereby ensuring the good electrical properties of the substrate 31. It will be understood that the film layer 305 can also isolate the inner surface of the upper die 301 and the electronic component 32 located on the substrate front surface 311 of the substrate 31.

Accordingly, after the clamping operation is performed on the molding die 300, the lower molding guide portion 3021 and the support portion 3022 of the lower die 302 press against different positions of the substrate back surface 312 of the substrate 31, respectively, so that the film layer 305 held between the lower molding guide portion 3021 and the substrate back surface 312 of the substrate 31, and the film layer 305 held between the support portion 3022 and the substrate back surface 312 of the substrate 31, on the one hand, can absorb the impact force generated when the molding die 300 is clamped to avoid the impact force from directly acting on the substrate back surface 312 of the substrate 31, and on the other hand, the film layer 305 can further isolate the lower molding guide portion 3021 from the substrate back surface 312 of the substrate 31 and isolate the support portion 3022 from the substrate back surface 312 of the substrate 31, thereby preventing the substrate back surface 312 of the substrate 31 from being scratched to ensure the good electrical properties of the substrate 31. Further, the film layer 305 can also prevent a gap from forming between the lower molding guide portion 3021 and the substrate back surface 312 of the substrate 31 and prevent a gap from forming between the support portion 3022 and the substrate back surface 312 of the substrate 31 by way of deformation.

Figure 3:
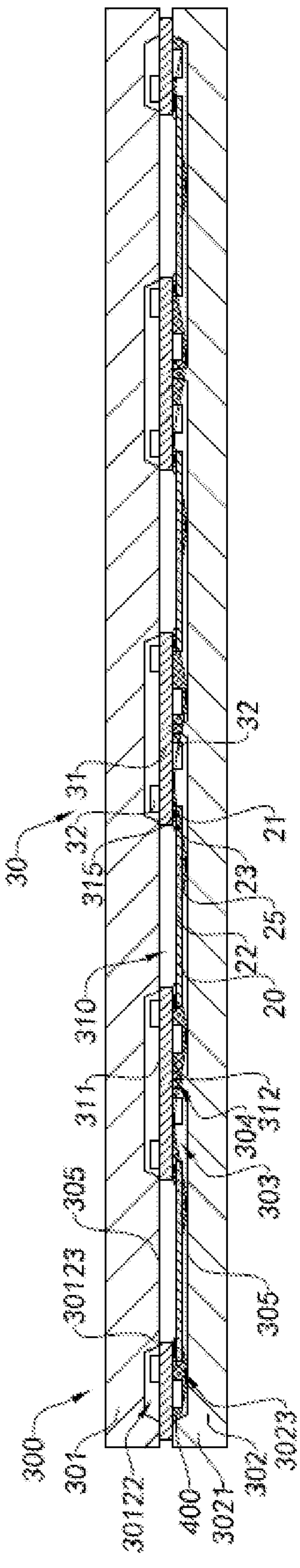
FIG. 3 is a schematic cross-sectional view of the third one of the manufacturing steps of the camera module according to the above preferred embodiment of the present disclosure.
Figure 4:
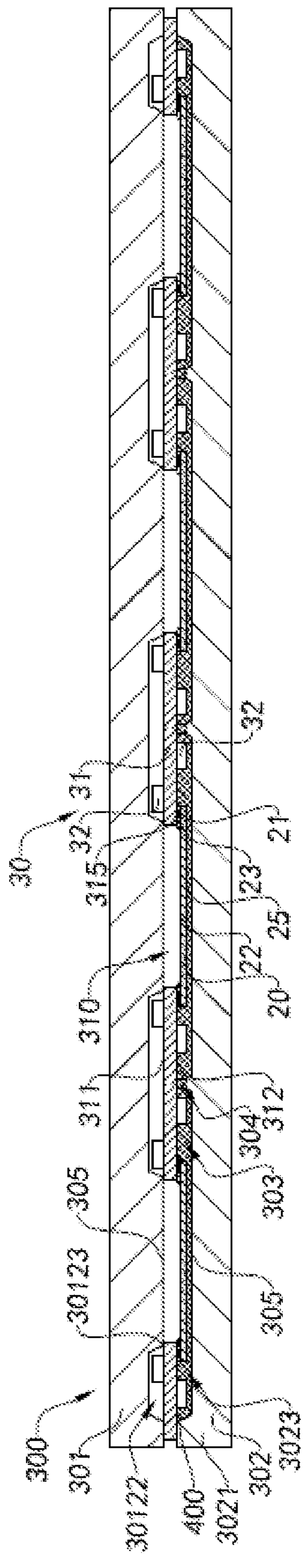
FIG. 4 is a schematic cross-sectional view of the fourth one of the manufacturing steps of the camera module according to the above preferred embodiment of the present disclosure.

At this stage shown in FIGS. 3 and 4, the fluid medium 400 is added to at least one of the molding spaces 303, and since the adjacent molding spaces 303 communicate with each other through the communication channels 304, the fluid medium 400 may fill up all of the molding spaces 303.

It is worth mentioning that the fluid medium 400 may be a liquid, a solid, a mixture of a solid and a liquid, or the like, so that the fluid medium 400 can flow. Further, the fluid medium 400 may be implemented as but not limited to a thermoset material. Of course, it will be understood by those skilled in the art that, in other possible examples, it is also possible that the fluid medium 400 is implemented as a light-curable material or a self-curable material.

Figure 5:
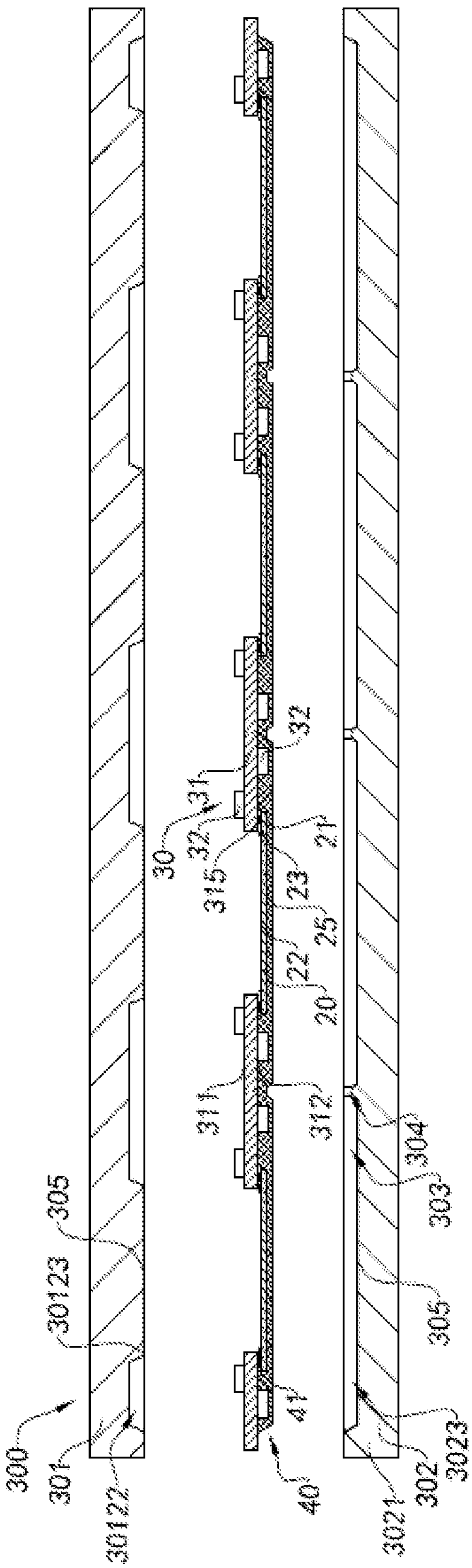
FIG. 5 is a schematic cross-sectional view of the fifth one of the manufacturing steps of the camera module according to the above preferred embodiment of the present disclosure.

After the fluid medium 400 fills up the molding space 303, the fluid medium 400 may be cured within the molding space 303 by way of heating, and the drafting operation may be performed on the molding die 300, with reference to the stage shown in FIG. 5, wherein the fluid medium 400 cured within the molding space 303 can form the back surface molded portion 41 integrally bonded to the substrate back surface 312 of the substrate 31. Moreover, the back surface molded portion 41 may embed at least one part of the at least one electronic component 32 protruded from the substrate back surface 312 of the substrate 31, and the assembling space 410 of the back surface molded portion 41 may be formed at a position of the lower die 302 corresponding to the support portion 3022. Preferably, the back surface molded portion 41 can embed all of the electronic components 32 protruded from the substrate back surface 312 of the substrate 31.

Figure 6:
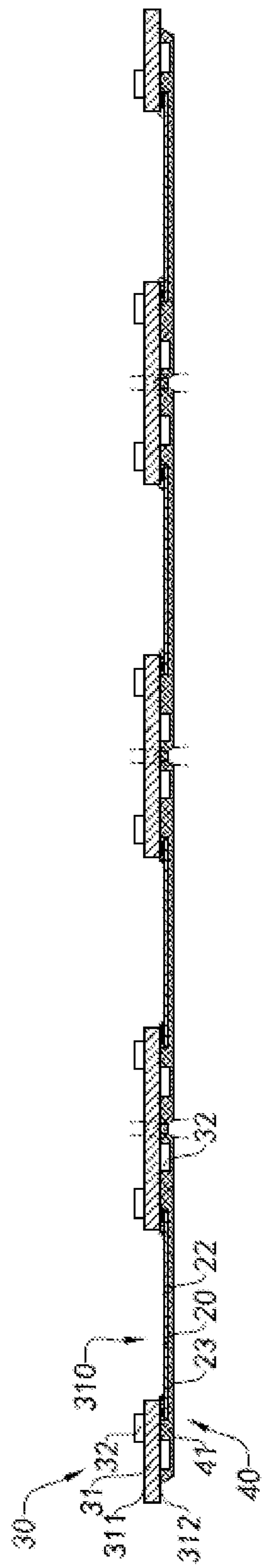
FIG. 6 is a schematic cross-sectional view of the sixth one of the manufacturing steps of the camera module according to the above preferred embodiment of the present disclosure.

At this stage shown in FIG. 6, after the drafting operation is performed on the molding die 300, a semi-finished product of the molded circuit board assembly 2000 may be formed. It will be understood that, after the drafting operation is performed on the molding die 300, a plurality of molded circuit board assemblies 2000 are in a state of being connected to each other, to form the semi-finished product of the molded circuit board assembly 2000. Then, at this stage shown in FIGS. 7A and 7B, the semi-finished product of the molded circuit board assembly 2000 may be divided to form the molded circuit board assembly 2000. A way of dividing the semi-finished product of the molded circuit board assembly 2000 is not limited in the camera module 100 of the present disclosure. For example, the semi-finished product of the molded circuit board assembly 2000 may be divided by way of cutting to form the molded circuit board assembly 2000, or the semi-finished product of the molded circuit board assembly 2000 may be divided by way of etching to form the molded circuit board assembly 2000.

Figure 7A:
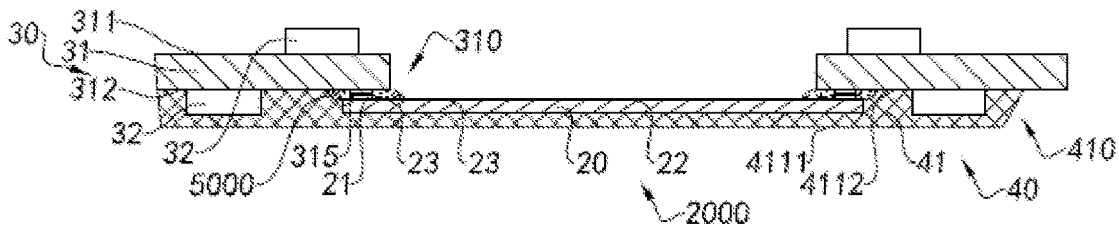
FIGS. 7A and 7B are schematic cross-sectional views of the seventh one of the manufacturing steps of the camera module according to the above preferred embodiment of the present disclosure.

Further, in some examples of the camera module 100 of the present disclosure, as shown in FIG. 7A, when the semi-finished product of the molded circuit board assembly 2000 is divided, a dividing direction may be from a direction where the substrate front surface 311 of the substrate 31 is located to a direction where the substrate back surface 312 is located. In other examples of the camera module 100 of the present disclosure, as shown in FIG. 7B, when the semi-finished product of the molded circuit board assembly 2000 is divided, the dividing direction may also be from a direction where the substrate back surface 312 of the substrate 31 is located to a direction where the substrate front surface 311 is located.

Figure 8:
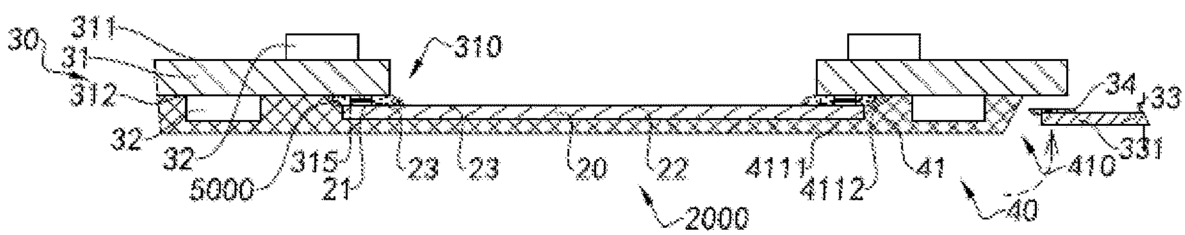
FIG. 8 is a schematic cross-sectional view of the eighth one of the manufacturing steps of the camera module according to the above preferred embodiment of the present disclosure.

At this stage shown in FIG. 8, the module connecting side 331 of the connecting plate 33 is attached to the substrate back surface 312 of the substrate 31 via the connecting portion 34 to conductively connect the connecting plate 33 and the substrate 31. Preferably, the module connecting side 331 of the connecting plate 33 is accommodated in the assembling space 410 of the back surface molded portion 41, to avoid the module connecting side 331 of the connecting plate 33 from being protruded. It will be understood that in other examples of the camera module 100, the module connecting side 331 of the connecting plate 33 may also be attached to the substrate front surface 311 of the substrate 31 via the connecting portion 34.

Figure 7B:
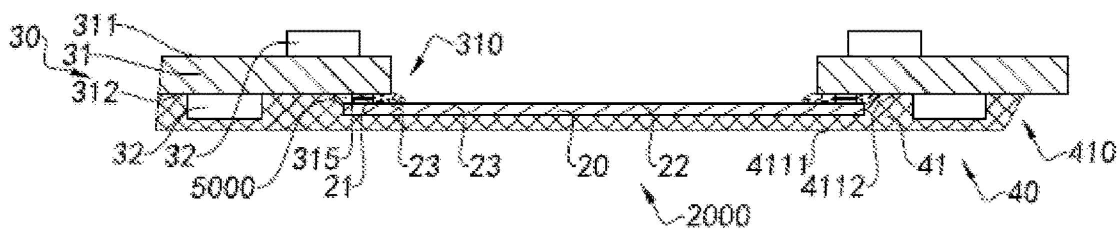

Optionally, the stage shown FIG. 8 may also before the stage shown in FIGS. 7A and 7B, so that the module connecting side 331 of the connecting plate 33 is first attached to the substrate back surface 312 of the substrate 31 via the connecting portion 34, and then the semi-finished product of the molded circuit board assembly 2000 is divided to form the molded circuit board assembly 2000.

Still Optionally, the stage shown FIG. 8 may also before the stage shown in FIGS. 2A and 2B, so that when the molding process is performed, the molding die 300 may press against the connecting position of the module connecting side 331 of the connecting plate 33 and the substrate 31, to ensure the reliability of the connecting position of the module connecting side 331 of the connecting plate 33 and the substrate 31, or the connecting position of the module connecting side 331 of the connecting plate 33 and the substrate 31 is accommodated in the molding space 303, so that after the molding process is performed to form the back surface molded portion 41, the back surface molded portion 41 can embed the module connecting side 331 of the connecting plate 33 to form the camera module 100 shown in FIG. 25.

Figure 9:
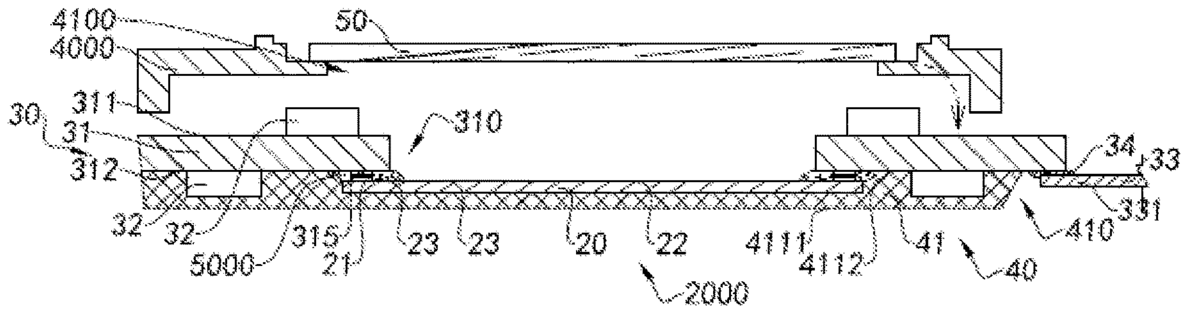
FIG. 9 is a schematic cross-sectional view of the ninth one of the manufacturing steps of the camera module according to the above preferred embodiment of the present disclosure.
Figure 10:
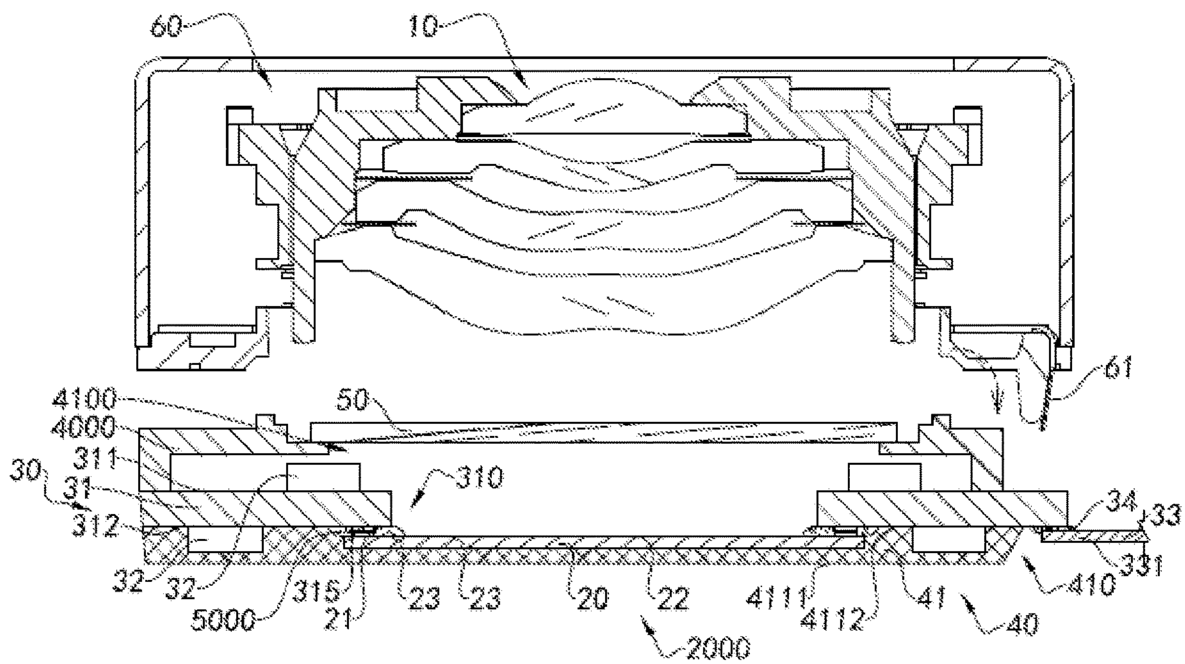
FIG. 10 is a schematic cross-sectional view of the tenth one of the manufacturing steps of the camera module according to the above preferred embodiment of the present disclosure.

At the stage shown in FIG. 9, the bearing 4000 attached with the filter elements 50 is attached to the substrate front surface 311 of the substrate 31, and the photosensitive area 22 and a part of the non-photosensitive area 23 of the photosensitive element 20 correspond to the light passing hole 4100 of the bearing 4000, and the filter element 50 is located in the photosensitive path of the photosensitive element 20. Optionally, the bearing 4000 may also be first attached to the substrate front surface 311 of the substrate 31, and then the filter element 50 is attached to the bearing 4000.

Then, the driver 60 assembled with the optical lens 10 is attached to the bearing 4000, so that the optical lens 10 is held in the photosensitive path of the photosensitive element 20, and the filter element 50 is held between the optical lens 10 and the photosensitive element 20, and the driving pins 61 of the driver 60 is conductively connected to the substrate 31 to form the camera module 100.

Optionally, the lens barrel 90 assembled with the optical lens 10 is attached to the bearing 4000, to form the camera module 100 as shown in FIG. 26.

Figure 27A:
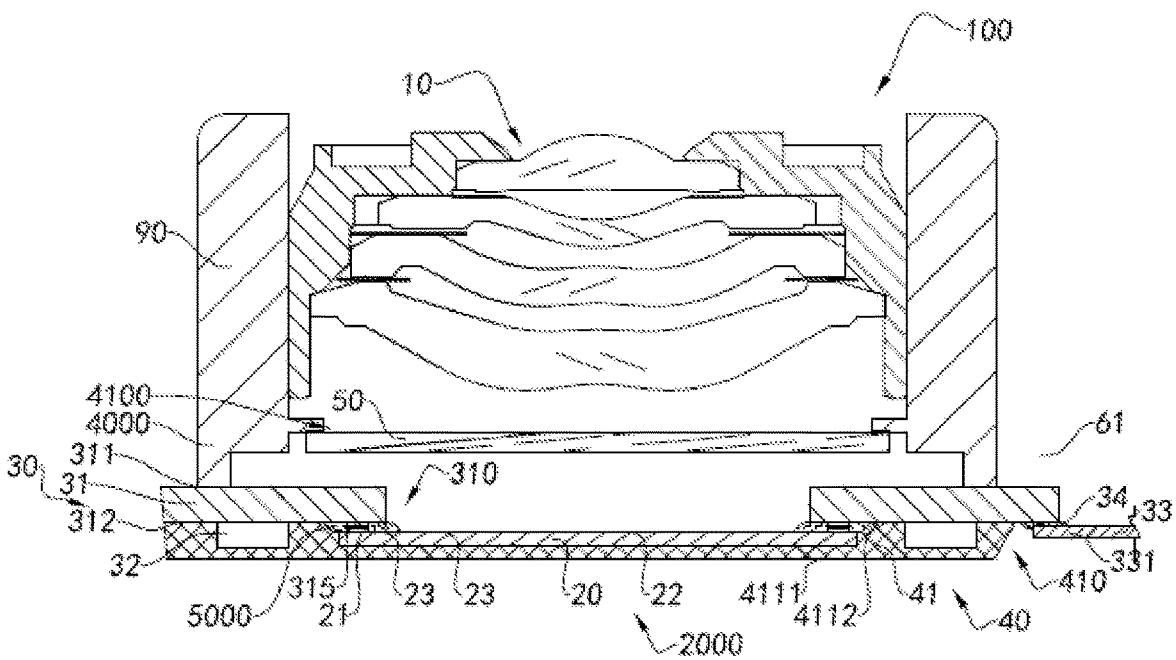
FIG. 27A is a schematic view of the internal structure cut along the intermediate position of another modified implementation of the camera module according to the above preferred embodiment of the present disclosure.

Still Optionally, the bearing 4000 and the lens barrel 90 may also be integrally formed, wherein the filter element 50 is first attached to the bearing 4000 and the optical lens 10 is assembled to the lens barrel 90, and then the bearing 4000 is attached to the substrate front surface 311 of the substrate 31; or the bearing 4000 is attached to the substrate front surface 311 of the substrate 31, and then the filter element 50 is attached to the bearing 4000 and the optical lens 10 is assembled to the lens barrel 90, to form the camera module 100 as shown in FIG. 27A.

With reference to FIGS. 27B to 27N in the accompanying drawings of the present disclosure, another manufacturing process of the camera module 100 is set forth in the following description.

Figure 27B:
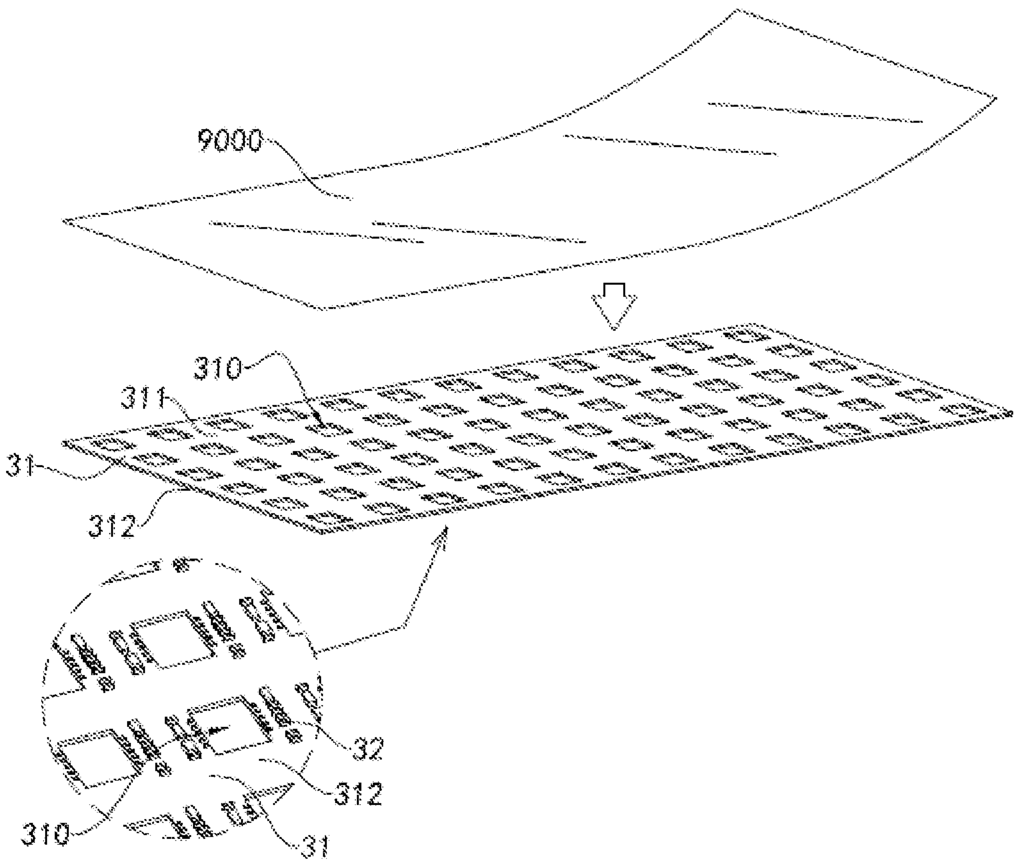
FIG. 27B is a perspective schematic view of the first one of the manufacturing steps of another modified implementation of the camera module according to the above preferred embodiment of the present disclosure, which illustrates a process of overlappedly attaching a protective element to a substrate.
Figure 27C:
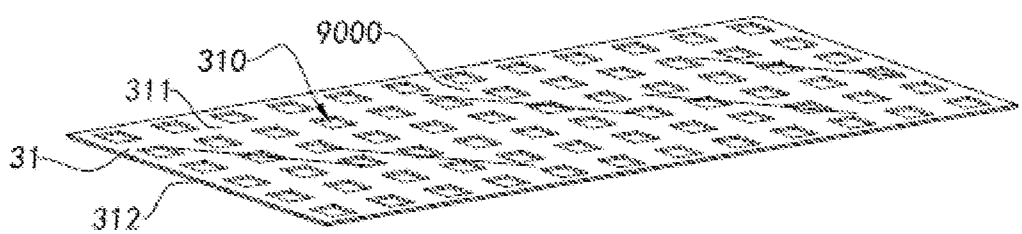
FIG. 27C is a perspective schematic view of the first one of the manufacturing steps of another modified implementation of the camera module according to the above preferred embodiment of the present disclosure, which illustrates a state of overlappedly attaching the protective element to the substrate.

At a stage shown in FIGS. 27B and 27C, the at least one electronic component 32 is conductively connected to the substrate 31 on the substrate back surface 312 of the substrate 31, wherein two or more substrates 31 are arranged to form the splicing unit 3000. It is worth mentioning that the arrangement of a plurality of substrates 31 forming the splicing unit 3000 is not limited in the camera module 100 of the present disclosure, and it is selected as needed.

Further, a protective element 9000 is overlappedly attached to the substrate front surface 311 of the substrate 31, so that the protective element substrate 9000 closes the opening of the substrate channel 310 of the substrate 31 on the substrate front surface 311.

It is worth mentioning that, in another example of the camera module 100 of the present disclosure, the protective element 9000 may be first overlappedly attached to the substrate front surface 311 of the substrate 31, and then the substrate back surface 312 of the substrate 31 is conductively connected to the at least one electronic component 32.

Further, the type of the protective element 9000 is not limited. For example, the protective element 9000 may be a transparent element, or may be an opaque element, as long as it can be overlappedly attached to the substrate front surface 311 of the substrate 31, and close the opening of the substrate channel 310 on the substrate front surface 311. By way of example and without limitation, the protective element 9000 may be implemented as a high temperature glue tape.

It will be understood that after the protective element 9000 is overlappedly attached to the substrate front surface 311 of the substrate 31, the protective element 9000 may also form one part of the splicing unit 3000. Then, the splicing unit 3000 may be cleaned to avoid dust, solid particles and other contaminants from adhering to the splicing unit 3000.

Figure 27D:
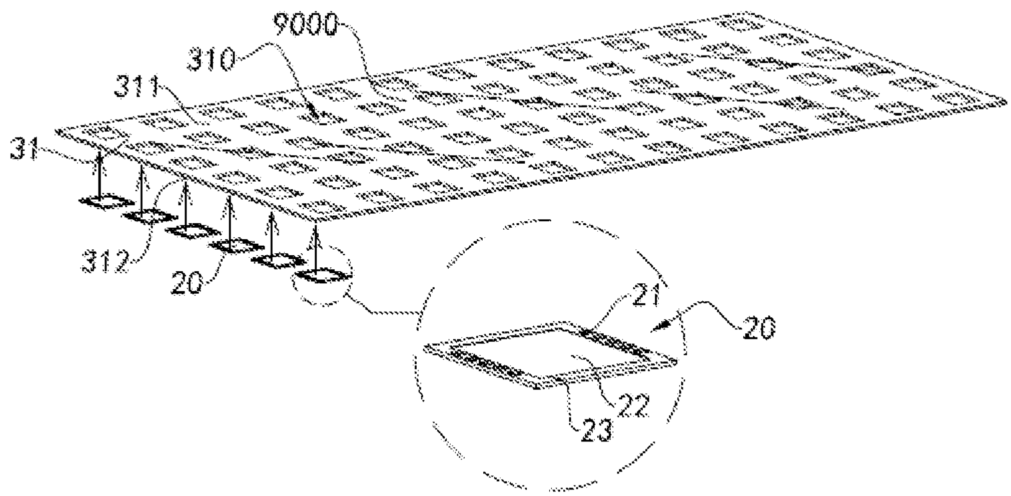
FIG. 27D is a perspective schematic view of the second one of the manufacturing steps of another modified implementation of the camera module according to the above preferred embodiment of the present disclosure, which illustrates a process of attaching a photosensitive element to the substrate.
Figure 27E:
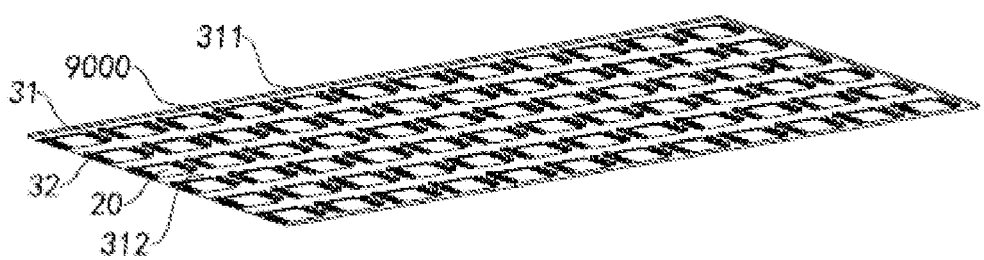
FIG. 27E is a perspective schematic view of the second one of the manufacturing steps of another modified implementation of the camera module according to the above preferred embodiment of the present disclosure, which illustrates a state of attaching the photosensitive element to the substrate.
Figure 27F:
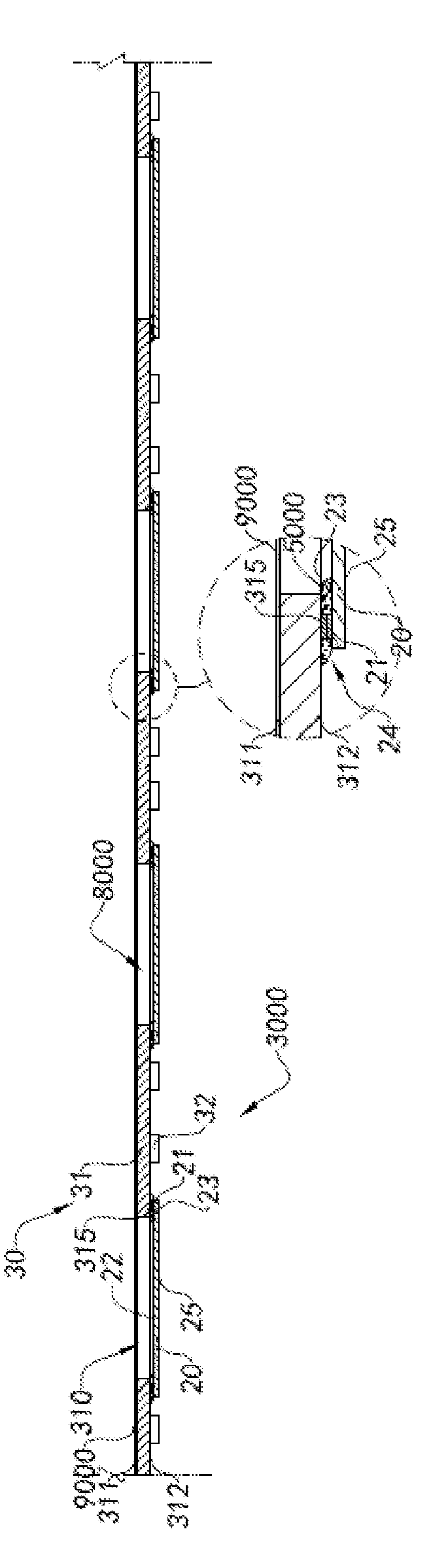
FIG. 27F is a schematic cross-sectional view of the second one of the manufacturing steps of the above modified implementation of the camera module according to the above preferred embodiment of the present disclosure.
Figure 27G:
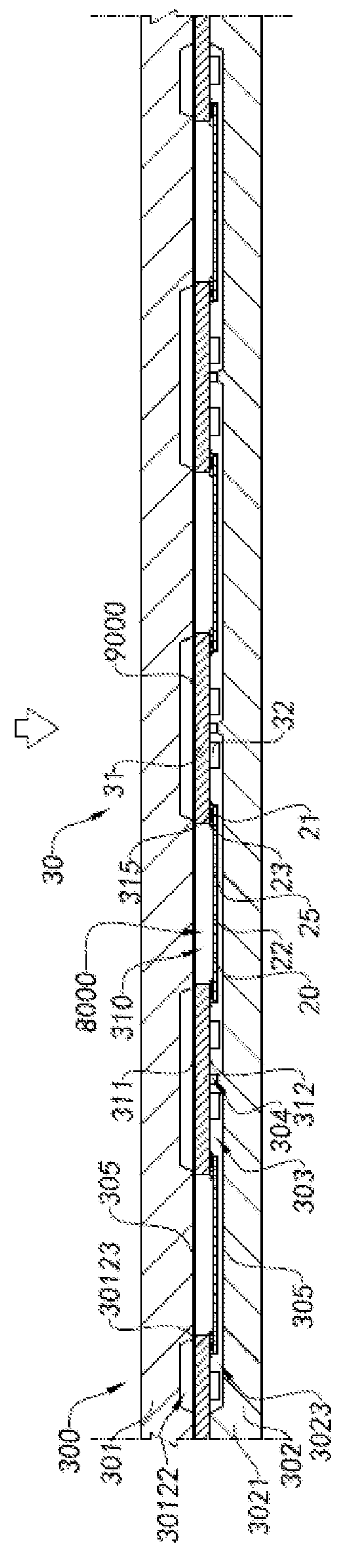
FIG. 27G is a schematic cross-sectional view of the third one of the manufacturing steps of the above modified implementation of the camera module according to the above preferred embodiment of the present disclosure.
Figure 27H:
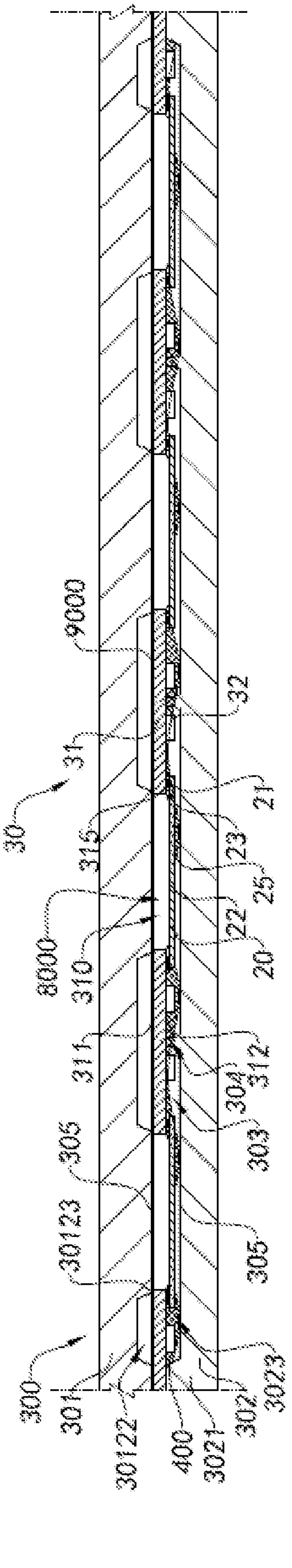
FIG. 27H is a schematic cross-sectional view of the fourth one of the manufacturing steps of the above modified implementation of the camera module according to the above preferred embodiment of the present disclosure.
Figure 27I:
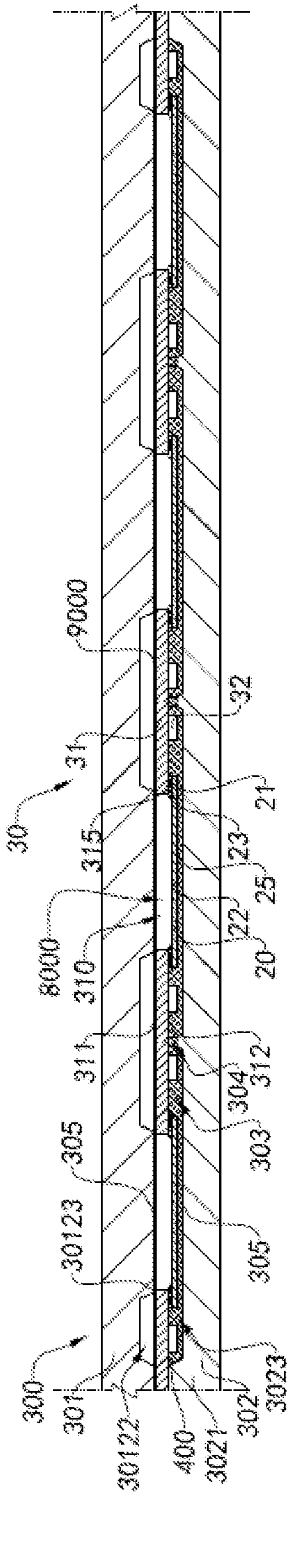
FIG. 27I is a schematic cross-sectional view of the fifth one of the manufacturing steps of the above modified implementation of the camera module according to the above preferred embodiment of the present disclosure.

At the stage shown in FIGS. 27D, 27E and 27F, the photosensitive element 20 is attached to the substrate 31 on the substrate back surface 312 of the substrate 31, so that the chip connecting member 21 located on the non-photosensitive area 23 of the photosensitive element 20 and the substrate connecting member 315 located on the substrate back surface 312 of the substrate 31 are conductively connected, and the photosensitive area 22 and a part of the non-photosensitive area 23 of the photosensitive element 20 correspond to the substrate channel 310 of the substrate 31, so that the photosensitive element 20 is conductively connected to the substrate 31.

Specifically, a bump may be implanted in the non-photosensitive area 23 of the photosensitive element 20 by a bumping process to form the chip connecting member 21 located on the non-photosensitive area 23 of photosensitive element 20, and then the photosensitive element 20 is attached to the substrate back surface 312 of the substrate 31, so that the chip connecting member 21 located on the non-photosensitive area 23 of photosensitive element 20 and the substrate connecting member 315 located on the substrate back surface 312 of the substrate 31 are conductively connected. It will be understood by those skilled in the art that the chip connecting member 21 of the photosensitive element 20 may also be formed in other ways, and the camera module 100 of the present disclosure is not limited in this regard.

Further, after the photosensitive element 20 is attached to the substrate back surface 312 of the substrate 31, the photosensitive element 20 can close the opening of the substrate channel 310 of the substrate 31 on the substrate back surface 312, so that a sealed space 8000 is formed between the photosensitive element 20, the substrate 31 and the protective element 9000, wherein the photosensitive area 22 of the photosensitive element 20 is located in the sealed space 8000. By this way, the photosensitive area 22 of the photosensitive element 20 can be avoided from being contaminated by dust, solid particles and other contaminants, thereby ensuring the product yield of the camera module 100. Preferably, a part of the non-photosensitive area 23 of the photosensitive element 20 may also be located in the sealed space 8000.

It will be understood by those skilled in the art that, after one part of the non-photosensitive area 23 of the photosensitive element 20 is attached to the substrate back surface 312 of the substrate 31 and the chip connecting member 21 of the photosensitive element 20 is conductively connected to the substrate connecting member 315 of the substrate 31, a gap 24 is formed between the non-photosensitive area 23 of the photosensitive element 20 and the substrate back surface 312 of the substrate 31. Then, a filler 5000 is used to be filled in the gap 24 to prevent the photosensitive area 22 of the photosensitive element 20 and the substrate back surface 312 of the substrate 31 from communicating via the gap 24, so that in a subsequent molding process, the filler 5000 can prevent the fluid medium 400 from entering the sealed space 8000 from the substrate back surface 312 of the substrate 31 via the gap 24, to avoid the photosensitive area 22 of the photosensitive element 20 held in the sealed space 8000 from being contaminated, thereby avoiding the occurrence of undesirable phenomena such as stain spots of the camera module 100.

It is worth mentioning that, after the photosensitive element 20 is attached to the substrate back surface 312 of the substrate 31, the photosensitive element 20 may form one part of the splicing unit 3000.

Nevertheless, it will be understood by those skilled in the art that the stage shown in FIGS. 27D to 27F may also before the stage shown in FIGS. 27B and 27C, that is, the photosensitive element 20 is first attached to the substrate back surface 312 of the substrate 31, and then the protective element 9000 is attached to the substrate front surface 311 of the substrate 31 to obtain the splicing unit 3000. Then, the splicing unit 3000 may also be cleaned. The camera module 100 of the present disclosure is not limited in this regard.

At a stage shown in FIGS. 27G, 27H, 27I and 27J, the splicing unit 3000 is placed into the molding die 300 to perform a molding process by means of the molding die 300. After the molding process is completed, a drafting process is performed on the molding die 300 to obtain a semi-finished product of the molded circuit board assembly 2000 shown in FIG. 27K. It will be understood that, after the drafting operation is performed on the molding die 300, a plurality of molded circuit board assemblies 2000 are in a state of being connected to each other, to form the semi-finished product of the molded circuit board assembly 2000. It is worth mentioning that, in the molding process, the protective element 9000 can also isolate the upper die 301 of the molding die 300 from the substrate front surface 311 of the substrate 31, thereby avoiding the substrate front surface 311 of the substrate 31 from being scratched by the upper die 301, to protect the good electrical properties of the substrate 31. Preferably, the protective element 9000 may also be deformable so that when the upper die 301 and the lower die 302 of the molding die 300 are clamped, the protective element 9000 can absorb an impact force acting on the substrate 31 by the upper die 301 by way of elastic deformation, to avoid the substrate 31 from being damaged.

Figures 27J, 27K, 27L:
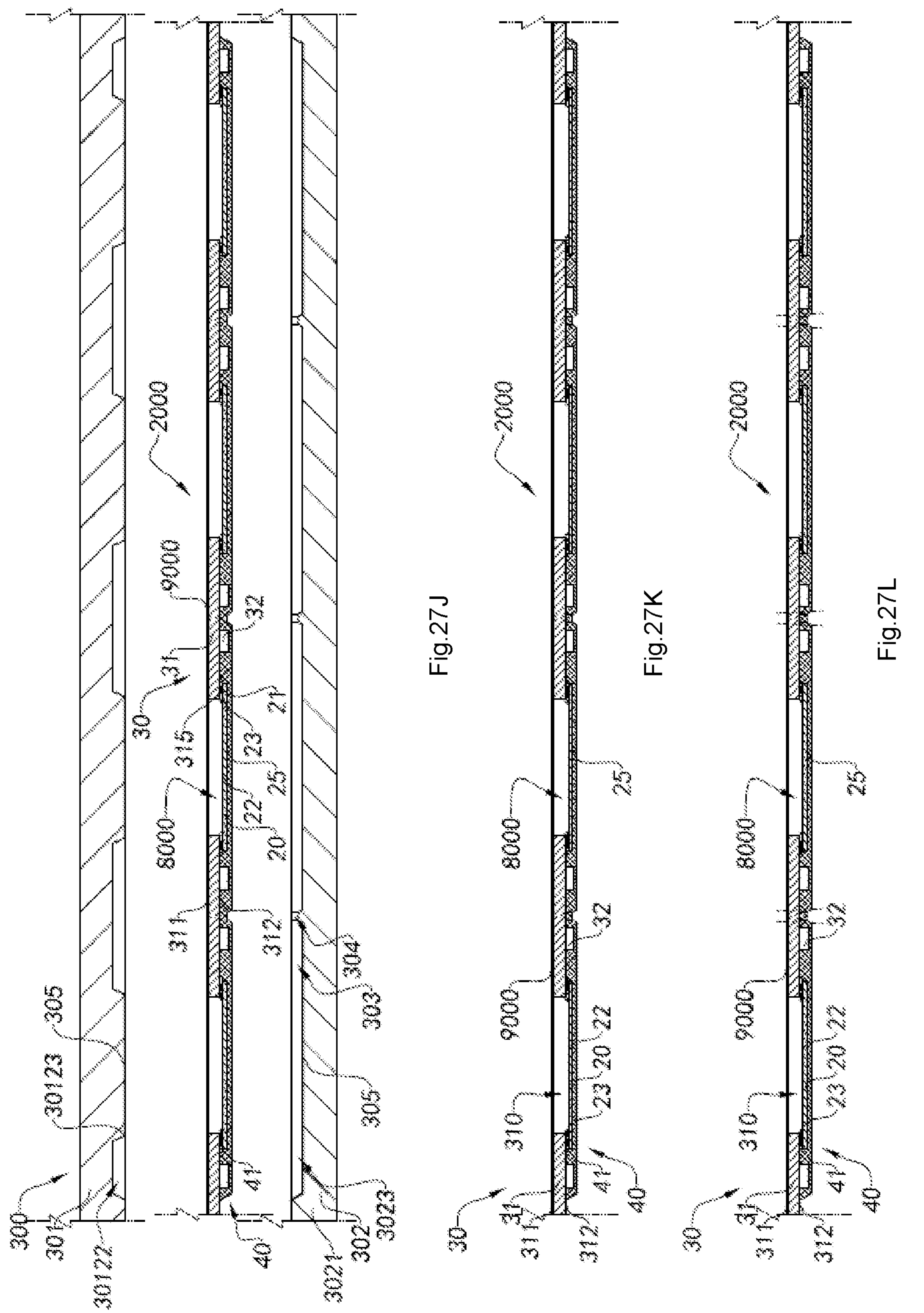
FIG. 27J is a schematic cross-sectional view of the sixth one of the manufacturing steps of the above modified implementation of the camera module according to the above preferred embodiment of the present disclosure.
FIG. 27K is a schematic cross-sectional view of the seventh one of the manufacturing steps of the above modified implementation of the camera module according to the above preferred embodiment of the present disclosure.
FIG. 27L is a schematic cross-sectional view of the eighth one of the manufacturing steps of the above modified implementation of the camera module according to the above preferred embodiment of the present disclosure.
Figure 27M:
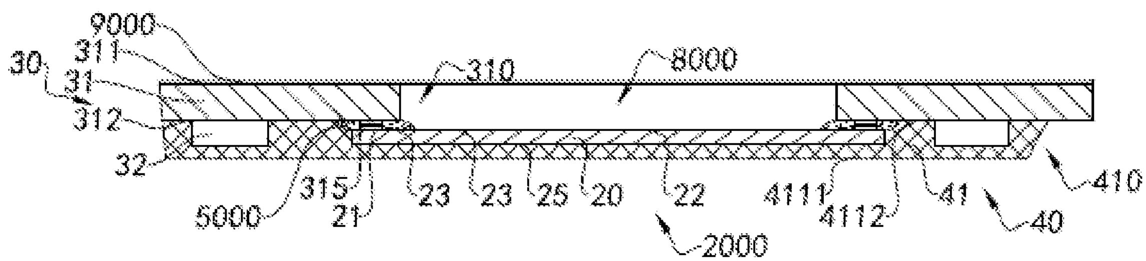
FIG. 27M is a schematic cross-sectional view of the ninth one of the manufacturing steps of the above modified implementation of the camera module according to the above preferred embodiment of the present disclosure.

At a stage shown in FIGS. 27L and 27M, the semi-finished product of the molded circuit board assembly 2000 may be divided, and the division way is not limited in the camera module 100 of the present disclosure. For example, the semi-finished product of the molded circuit board assembly 2000 may be divided by way of cutting, or the semi-finished product of the molded circuit board assembly 2000 may be divided by way of etching.

Further, the way of dividing the semi-finished product of the molded circuit board assembly 2000 may also be not limited in the camera module 100 of the present disclosure. For example, in an example shown in FIG. 27L, when the semi-finished product of the molded circuit board assembly 2000 is divided, a dividing direction may be from a direction where the substrate front surface 311 of the substrate 31 is located to a direction where the substrate back surface 312 is located. In an example shown in FIG. 27M, when the semi-finished product of the molded circuit board assembly 2000 is divided, the dividing direction may also be from a direction where the substrate back surface 312 of the substrate 31 is located to a direction where the substrate front surface 311 is located.

Figure 27N:
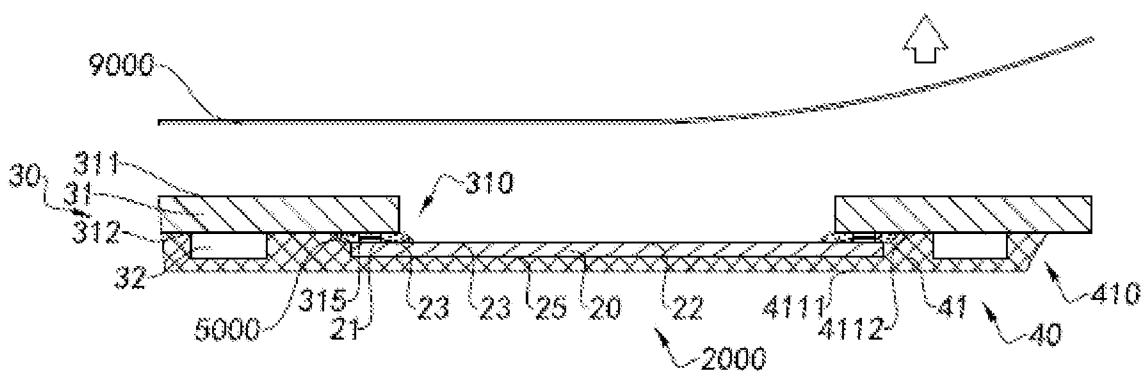
FIG. 27N is a schematic cross-sectional view of the tenth one of the manufacturing steps of the above modified implementation of the camera module according to the above preferred embodiment of the present disclosure.

At a stage shown in FIG. 27N, the protective element 9000 is removed from the substrate front surface 311 of the substrate 31 to obtain the molded circuit board assembly 2000.

It is worth mentioning that the stage shown in FIG. 27N may also before the stage shown in FIGS. 27L and 27M, so that the protective element 9000 is first removed from the substrate front surface 311 of the substrate 31, and then the semi-finished product of the molded circuit board assembly 2000 is divided to obtain the molded circuit board assembly 2000. The camera module 100 of the present disclosure is not limited in this regard.

In a subsequent step, it is possible that the connecting plate 33 and the substrate 31 is conductively connected, the optical lens 10 is held in the photosensitive path of the photosensitive element 20, and the filter element 50 is held between the optical lens 10 and the photosensitive element 20, to obtain the camera module 100 shown in FIG. 27A.

With reference to FIGS. 28 to 39 in the accompanying drawings of the present disclosure, a camera module 100 according to another preferred embodiment of the present disclosure is set forth in the following description, wherein the camera module 100 includes at least one optical lens 10', at least one photosensitive element 20', and a circuit board 30', wherein the photosensitive element 20' is conductively connected to the circuit board 30', and the optical lens 10' is held in the photosensitive path of the photosensitive element 20'.

Light reflected by an object enters the interior of the camera module 100 from the optical lens 10', and then is received by the photosensitive element 20' and forms an image by photoelectric conversion. An electrical signal associated with the image of the object obtained by photoelectric conversion of the photosensitive element 20' can be transmitted by the circuit board 30'. For example, the circuit board 30' may transmit the electric signal associated with the image of the object to the device body 200 connected to the circuit board 30'. That is, the circuit board 30' can be conductively connected to the device body 200 to assemble the camera module 100 on the device body 200 to form the electronic device.

Figure 38:
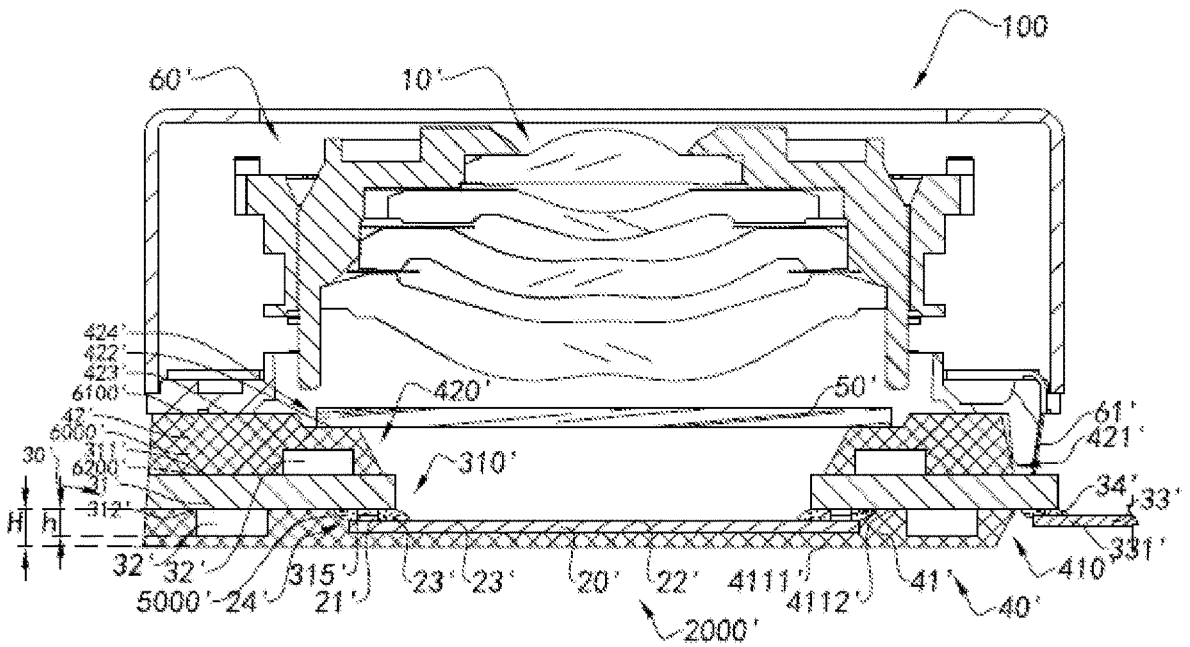
FIG. 38 is a schematic view of the internal structure cut along the intermediate position of the camera module according to the above preferred embodiment of the present disclosure.
Figure 39:
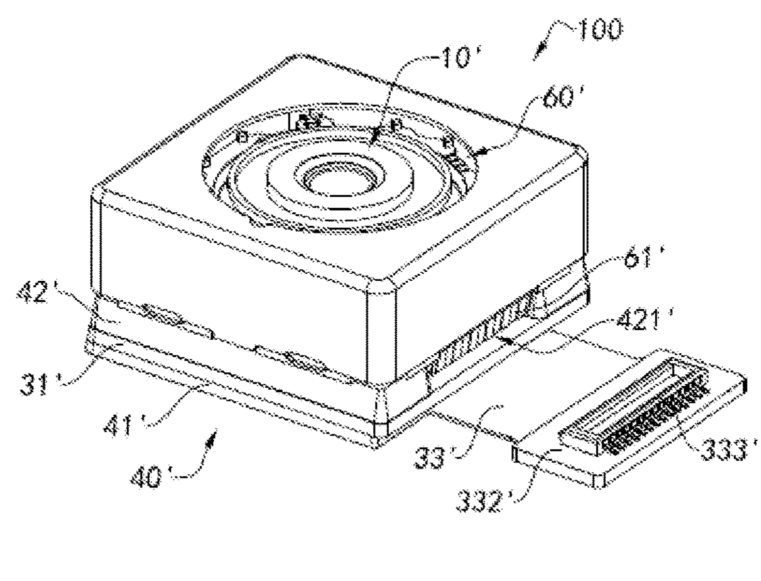
FIG. 39 is a perspective schematic view of the camera module according to the above preferred embodiment of the present disclosure.

Further, with reference to FIG. 38, the circuit board 30' includes at least one substrate 31' and at least one electronic component 32', wherein each of the electronic components 32' is conductively connected to the substrate 31', respectively.

Specifically, the substrate 31' has a substrate front substrate 311', a substrate back surface 312' and at least one substrate channel 310', wherein the substrate front surface 311' and the substrate back surface 312' correspond to each other, and the substrate channel 310' extends from the substrate front surface 311' to the substrate back surface 312' of the substrate 31'. That is, the substrate channel 310' can communicate with the substrate front surface 311' and the substrate back surface 312' of the substrate 31'. In other words, the substrate channel 310' may be implemented as one perforation so that the substrate channel 310' can communicate with the substrate front surface 311' and the substrate back surface 312' of the substrate 31'. For example, the substrate channel 310' may be one central perforation.

In general, the substrate 31' is plate-like, and the substrate front surface 311' and the substrate back surface 312' of the substrate 31' are parallel to each other, so that a distance between the substrate front surface 311' and the substrate back surface 312' of the substrate 31' can be used to define the thickness of the substrate 31'. Nevertheless, it will be understood by those skilled in the art that in other examples of the camera module 100 of the present disclosure, at least one of the substrate front surface 311' and the substrate back surface 312' of the substrate 31' may be provided with a raised structure or a groove, and the camera module 100 of the present disclosure is not limited in this regard.

In addition, the substrate channel 310' of the substrate 31' is generally square-shaped, e.g. square or rectangular. However, it will be understood by those skilled in the art that in other examples of the camera module 100, the substrate channel 310' of the substrate 31' may also have any other possible shape, such as but not limited to a circular shape. Nevertheless, in order to reduce the length and width sizes of the camera module 100, the shape and size of the substrate channel 310' of the substrate 31' are set to correspond to the shape and size of the photosensitive element 20'.

It is worth mentioning that the type of the substrate 31' is not limited in the camera module 100 of the present disclosure. For example, the substrate 31' may be selected as but not limited to, a rigid board, a flex board, a rigid-flex board, a ceramic plate or the like.

In this example of the camera module 100 shown in FIG. 38, at least one electronic component 32' is conductively connected to the substrate 31' on the substrate front surface 311' of the substrate 31', and a further electronic component 32' is conductively connected to the substrate 31 on the substrate back surface 312' of the substrate 31'. By this way, the layout of the electronic components 32' can become more flexible.

Nevertheless, it will be understood by those skilled in the art that in other examples of the camera module 100, all the electronic components 32' may also be conductively connected to the substrate 31' on the substrate front surface 311' of the substrate 31', or in other examples of the camera module 100, all the electronic components 32' may also be conductively connected to the substrate 31' on the substrate back surface 312' of the substrate 31'. The camera module 100 of the present disclosure is not limited in this regard.

It is worth mentioning that the type of the electronic component 32' is not limited in the camera module 100 of the present disclosure. For example, the electronic component 32' may be implemented as but not limited to, a processor, a relay, a memory, a driver, an inductor, a resistor, a capacitor or the like.

Further, in one specific example of the camera module 100 of the present disclosure, the electronic component 32' may be attached to the substrate front surface 311' and/or the substrate back surface 312' of the substrate 31' in such a manner that the electronic component 32' is conductively connected to the substrate 31 on the substrate front surface 311' and/or the substrate back surface 312' of the substrate 31'. It will be understood that after the electronic component 32' is attached to the substrate front surface 311' and/or the substrate back surface 312' of the substrate 31', the electronic component 32' is protruded from the substrate front surface 311' and/or the substrate back surface 312' of the substrate 31'.

In another specific example of the camera module 100 of the present disclosure, the electronic component 32' may also be half buried in the substrate on the substrate front surface 311' and/or the substrate back surface 312' of the substrate 31', and the electronic component 32' is conductively connected to the substrate 31', that is, a part of the electronic component 32' is protruded from the substrate front surface 311' and/or the substrate back surface 312' of the substrate 31'. By this way, the height size of the camera module 100 can be further reduced. Optionally, the electronic components 32' may also be completely buried inside the substrate 31'.

With continued reference to FIG. 38, the circuit board 30' further includes a connecting plate 33', wherein the connecting plate 33' has a module connecting side 331' and a device connecting side 332', and wherein the module connecting side 331' of the connecting plate 33' is connected to the substrate back surface 312' of the substrate 31'. For example, the module connecting side 331' of the connecting plate 33' may be conductively connected to the substrate back surface 312' of the substrate 31' via a connecting portion 34', wherein the connecting portion 34' may be but not limited to anisotropic conductive glue or an anisotropic conductive glue tape.

Nevertheless, it will be understood by those skilled in the art that in other examples of the camera module 100, it is also possible that the module connecting side 331' of the connecting plate 33' is conductively connected to the substrate 31 on the substrate front surface 31' of the substrate 31'. In further other examples of the camera module 100, it is also possible that the module connecting side 331' of the connecting plate 33' is connected to a side surface of the substrate 31', or the module connecting side 331' of the connecting plate 33' and the substrate 31' are integrally formed.

Further, the device connecting side 332' of the connecting plate 33' can be connected to the device body 200. For example, the device connecting side 332' of the connecting plate 33' may be provided or formed with a connector 333' of the connecting plate 33' for connecting the device body 200.

It is worth mentioning that the connecting plate 33' is deformable so that the connecting plate 33' may buffer the displacement of the camera module 100 caused by the vibration of the electronic device in the process of being used, thereby ensuring the reliability of the electronic device when used.

Further, the substrate 31' has at least one group of substrate connecting members 315', wherein the substrate connecting member 315' of the substrate 31' is provided on and protruded from the substrate back surface 312' of the substrate 31'. Preferably, the substrate connecting member 315' of the substrate 31' surrounds at the edges of the substrate channel 310'.

The photosensitive element 20' has at least one group of chip connecting members 21' and a photosensitive area 22', and a non-photosensitive area 23' surrounding around the photosensitive area 22', wherein the chip connecting member 21' is provided on and protruded from the non-photosensitive area 23' of the photosensitive element 20'.

The photosensitive element 20' is attached to the substrate back surface 312' of the substrate 31', so that the chip connecting member 21' of the photosensitive element 20' is conductively connected to the substrate connecting member 315' of the substrate 31', and the photosensitive area of the photosensitive element 20' corresponds to the substrate channel 310' of the substrate 31'. Preferably, a part of the non-photosensitive area of the photosensitive element 20' also corresponds to the substrate channel 310' of the substrate 31'. For example, in this specific example of the camera module 100 of the present disclosure, a part of the non-photosensitive area 23' of the photosensitive element 20' is attached to the substrate back surface 312' of the substrate 31', and the photosensitive area 22' and another part of the non-photosensitive area 23' of the photosensitive element 20' correspond to the substrate channel 310' of the substrate 31'.

It is worth mentioning that, in the camera module 100 of the present disclosure, at the same time when the photosensitive element 20' is attached to the substrate back surface 312' of the substrate 31', the chip connecting member 21 of the photosensitive element 20' is conductively connected to the substrate connecting member 315' of the substrate 31'. By this way, the manufacturing steps of the camera module 100 can be reduced, thereby facilitating reducing the manufacturing cost of the camera module 100 and improving the productivity of the camera module 100.

It is also worth mentioning that the shape and arrangement of the chip connecting member 21' of the photosensitive element 20' and the shape and arrangement of the substrate connecting member 315' of the substrate 31' are not limited in the camera module 100 of the present disclosure. For example, the chip connecting member 21' of the photosensitive element 20' may be disk-shaped, spherical or the like, and accordingly, the substrate connecting member 315' of the substrate 31' may be disk-shaped, spherical or the like.

Preferably, in a thickness direction of the substrate 31', at least one part of at least one of the electronic components 32' located on the substrate front surface 311' of the substrate 31' can correspond to a part of the non-photosensitive area 23' of the photosensitive element 20'. That is to say, from a top view perspective, at least one part of at least one of the electronic components 32' located on the substrate front surface 311' of the substrate 31' and a part of the non-photosensitive area 23' of the photosensitive element 20' can be overlapped with each other. By this way, the length and width sizes of the camera module 100 can be reduced, so that the camera module 100 is particularly suitable for the electronic device that is seeking for lightening and thinning.

It will be understood by those skilled in the art that the substrate connecting member 315' of the substrate 31' is protruded from the substrate back surface 312' of the substrate 31', and the chip connecting member 21' of the photosensitive element 20' is protruded from the non-photosensitive area 23' of the photosensitive element 20', so that after the photosensitive element 20' is attached to the substrate back surface 312' of the substrate 31' and the chip connecting member 21' of the photosensitive element 20' is conductively connected to the substrate connecting member 315' of the substrate 31', at least one gap 24' is formed between the non-photosensitive area 23' of the photosensitive element 20' and the substrate back surface 312' of the substrate 31'. In the camera module 100 of the present disclosure, after the photosensitive element 20' is attached to the substrate back surface 312' of the substrate 31', and the chip connecting member 21' of the photosensitive element 20' is conductively connected to the substrate connecting member 315' of the substrate 31', a filler 5000' is filled in the gap 24' formed between the non-photosensitive area 23' of the photosensitive element 20' and the substrate back surface 312' of the substrate 31' to fill the gap 24'.

It will be understood that in other examples of the camera module 100, it is also possible that the filler 5000' is first disposed on the substrate back surface 312' of the substrate 31' and/or at least one part of the non-photosensitive area 23' of the photosensitive element 20', and then a part of the non-photosensitive area 23' of the photosensitive element 20' is attached to the substrate back surface 312' of the substrate 31'. Thereafter, the filler 5000' disposed on the substrate back surface 312' of the substrate 31' and/or the non-photosensitive area 23' of the photosensitive element 20' can be held between the substrate back surface 312' of the substrate 31' and the non-photosensitive area 23' of the photosensitive element 20', to fill the gap 24' formed between the substrate back surface 312' of the substrate 31' and the non-photosensitive area 23' of the photosensitive element 20' by means of the filler 5000'. For example, the filler 5000' may be applied on the substrate back surface 312' of the substrate 31' and/or the non-photosensitive area 23' of the photosensitive element 20' in such a manner that the filler 5000' is disposed on the substrate back surface 312' of the substrate 31' and/or the non-photosensitive area 23' of the photosensitive element 20'.

Preferably, the filler 5000' is in a fluid state before it is filled in the gap 24' formed between the non-photosensitive area 23' of the photosensitive element 20' and the substrate back surface 312' of the substrate 31' and when it is being filled in the gap 24' formed between the non-photosensitive area 23' of the photosensitive element 20' and the substrate back surface 312' of the substrate 31', and the filler 5000' is cured after the filler 5000' is filled in the gap 24' formed between the non-photosensitive area 23' of the photosensitive element 20' and the substrate back surface 312' of the substrate 31' to seal the gap 24'.

The camera module 100 includes a molded unit 40', wherein the molded unit 40' includes a back surface molded portion 41' and a molded base 42', and wherein the back surface molded portion 41' is integrally bonded to at least one part of the area of the substrate back surface 312' of the substrate 31', and the molded base 42' is integrally bonded to at least one part of the area of the substrate front surface 311' of the substrate 31'. For example, in this preferred example of the camera module 100 shown in FIGS. 38 and 39, the back surface molded portion 41' is integrally bonded to the substrate back surface 312' of the substrate 31', the photosensitive element 20' has a chip back surface 25', and the back surface molded portion 41' embeds the entire area of the chip back surface 25' of the photosensitive element 20', wherein the molded base 42' has at least one light window 420', the molded base 42' is integrally bonded to at least one part of the area of the substrate front surface 311' of the substrate 31', and the molded base 42' surrounds around the photosensitive area 22' of the photosensitive element 20' so that the photosensitive area 22' and a part of the non-photosensitive area 23' of the photosensitive element 20' correspond to the light window 420' of the molded base 42', wherein the light window 420' forms a light passage between the optical lens 10' and the photosensitive element 20'. The back surface molded portion 41', the molded base 42', the photosensitive element 20', the substrate 31' and the electronic component 32' are integrally bonded to form a molded circuit board assembly 2000'.

That is, according to another aspect of the present disclosure, the present disclosure further provides the molded circuit board assembly 2000', wherein the molded circuit board assembly 2000' includes the substrate 31', the electronic component 32', the photosensitive element 20', the back surface molded portion 41' and the molded base 42'; wherein the electronic component 32' is conductively connected to the substrate front surface 311' and/or the substrate back surface 312' of the substrate 31', the photosensitive element 20' is conductively connected to the substrate back surface 312' of the substrate 31', and the photosensitive area 22' and a part of the non-photosensitive areas 23' of the photosensitive element 20' correspond to the substrate channels 310' of the substrate 31'; wherein the back surface molded portion 41' is integrally bonded to at least one part of the area of the substrate back surface 312' of the substrate 31' and embeds at least one part of the area of the chip back surface 25' of the photosensitive element 20'; and wherein the molded base 42' is integrally bonded to at least one part of the area of the substrate front surface 311' of the substrate 31', and the molded base 42' surrounds around the photosensitive area 22' of the photosensitive element 20', so that the photosensitive area 22' and a part of the non-photosensitive areas 23' of the photosensitive element 20' correspond to the light window 420' of the molded base 42'.

In other words, the back surface molded portion 41' can embed at least one part of the attaching position of the photosensitive element 20' and the substrate 31' to prevent the photosensitive element 20' from falling off from the substrate 31', thereby ensuring the reliability of the camera module 100. Also, by way of embedding at least one part of the attaching position of the photosensitive element 20' and the substrate 31', the back surface molded portion 41' can further isolate the chip connecting member 21' of the photosensitive element 20' from the external environment, isolate the substrate connecting member 315' of the substrate 31' from the external environment and isolate the connecting position of the chip connecting member 21' and the substrate connecting member 315' from the external environment, to avoid the chip connecting member 21', the substrate connecting member 315', and the connecting position of the chip connecting member 315' and the substrate connecting member 21' from being oxidized, thereby ensuring the reliability of the conductive position of the photosensitive element 20' and the substrate 31'.

It will be understood that the filler 5000' can also isolate the chip connecting member 21' of the photosensitive element 20' from the external environment, isolate the substrate connecting member 315' of the substrate 31' from the external environment, and isolate the connecting position of the chip connecting member 21' and the substrate connecting member 315' from the external environment.

Further, the back surface molded portion 41' embeds at least one part of the attaching position of the photosensitive element 20' and the substrate 31', and by means of the back surface molded portion 41', the strength of the substrate 31' can also be reinforced and the flatness of the substrate 31' can also be ensured. Preferably, by way of causing the back surface molded portion 41' to embed at least one part of the chip back surface 25' of the photosensitive element 20', the flatness of the photosensitive element 20' can also be ensured by means of the back surface molded portion 41', so that the flatness of the photosensitive element 20' is limited to the back surface molded portion 41'. In this way, on the one hand, the flatness of the photosensitive element 20' can be ensured, and on the other hand, the substrate 31' may be selected as a thinner sheet, to facilitate reducing the height size of the camera module 100.

The back surface molded portion 41' is not deformed when heated, so that when the camera module 100 is used for a long time, the heat generated by the photosensitive element 20' acts on the back surface molded portion 41', and the back surface molded portion 41' is not deformed, to facilitate ensuring the flatness of the photosensitive element 20'. Preferably, the back surface molded portion 41' has a good heat dissipation capacity, wherein the back surface molded portion 41' can quickly radiate the heat generated by the photosensitive element 20' to the external environment of the camera module 100, thereby ensuring the reliability of the camera module 100 when used for a long time.

Further, the back surface molded portion 41' can avoid the substrate back surface 312' of the substrate 31' from being exposed by way of being integrally bonded to the substrate back surface 312' of the substrate 31', so that when the camera module 100 is assembled on the device body 200 to form the electronic device, other assembled members of the device body 200 may not scratch the substrate 31' due to touching with the substrate back surface 312' of the substrate 31', thereby facilitating ensuring the good electrical properties of the substrate 31'.

With continued reference to FIG. 38, the back surface molded portion 41' can embed at least one part of at least one electronic component 32' protruded from the substrate back surface 312' of the substrate 31'. By this way, in an aspect, the back surface molded portion 41' can isolate the surface of the electronic component 32' from the external environment, and by way of avoiding the surface of the electronic component 32' from being oxidized, the good electrical properties of the electronic components 32' can be ensured. In another aspect, the back surface molded portion 41' can prevent the occurrence of undesirable phenomena such as mutual interference of adjacent electronic components 32' by way of isolating the adjacent electronic components 32', so that a larger number and larger size of the electronic components 32' can be attached to a limited attaching area, to facilitate improving the performance and imaging quality of the camera module 100. In further another aspect, the back surface molded portion 41' avoids the electronic component 32' from being exposed by way of embedding the electronic component 32', so that in the process of assembling the camera module 100 to the device body 200, there is no need to worry that the electronic component 32' is scratched or the electronic component 32' is caused to fall off from the substrate 31' due to the electronic component 32' touching with other assembled members of the device body 200, to ensure the reliability of the camera module 100 when assembled and used, and the electronic component 32' can also prevent the back surface molded portion 41 from falling off from the substrate back surface 312' of the substrate 31', to ensure that the back surface molded portion 41 is firmly bonded to the substrate back surface 312' of the substrate 31'.

With further reference to FIG. 38, in this preferred example of the camera module 100 of the present disclosure, the height size parameter of the back surface molded portion 41' protruded from the substrate back surface 312' of the substrate 31' is greater than or equal to the height of the electronic component 32' protruded from the substrate back surface 312' of the substrate 31'. Specifically, the back surface molded portion 41' has a free side surface 4111' and a bonding side surface 4112', wherein the free side surface 4111' and the bonding side surface 4112' of the back surface molded portion 41' correspond to each other, and the bonding side surface 4112' of the back surface molded portion 41' is integrally bonded to at least one part of the area of the substrate back surface 312' of the substrate 31 and at least one part of the chip back surface 25' of the photosensitive element 20'.

It is assumed that the height size parameter of the back surface molded portion 41' protruded from the substrate back surface 312' of the substrate 31' is H, that is, the distance parameter between the free side surface 4111' and the bonding side surface 4112' of the back surface molded portion 41' is H, and it is assumed that the height size parameter of the electronic component 32' protruded from the substrate back surface 312' of the substrate 31' is h, where the value of the parameter H is greater than or equal to the value of the parameter h. In this way, when the camera module 100 is assembled to the device body 200, other assembled members of the device body 200 can be prevented from touching the electronic component 32', to ensure the reliability of the camera module 100.

With continued reference to FIG. 38, the molded base 42' embeds at least one part of the at least one electronic component 32' located on the substrate front surface 311' of the substrate 31'. Preferably, the molded base 42' embeds all of the electronic components 32' located on the substrate front surface 311' of the substrate 31'.

The molded base 42' can isolate the surface of the electronic component 32' from the external environment by way of embedding the electronic component 32' and ensure the good electrical properties of electronic components 32' by way of avoiding the surface of the electronic component 32' from being oxidized. Moreover, the molded base 42' can prevent the occurrence of shedding on the surface of the electronic component 32', and prevent the occurrence of shedding on the surfaces of the electronic component 32' and the substrate front surface 311' of the substrate 31', to avoid the shedding from contaminating the photosensitive area 22' of the photosensitive element 20', thereby ensuring the product yield and reliability of the camera module 100.

Further, the molded base 42' causes adjacent electronic components 32' to be isolated from each other by way of embedding the electronic components 32', thereby avoiding an undesirable phenomenon that the adjacent electronic components 32' are interfered with each other. Moreover, a larger number and larger size of electronic components 32' may also be conductively connected on a limited area of the substrate front surface 311' of the substrate 31', to facilitate improving the performance of the camera module 100.

Further, it is unnecessary to reserve a safety distance between the molded base 42' and the electronic component 32', thereby facilitating the reduction of the length and width sizes of the camera module 100 and the reduction of the height size of the camera module 100.

With further reference to FIG. 38, the camera module 100 includes at least one filter element 50', wherein the filter element 50' is attached to the top surface of the molded base 42', so that the filter element 50' is held between the optical lens 10' and the photosensitive element 20' by means of the molded base 42', and light entering the interior of the camera module 100' from the optical lens 10' passes through the filter element 50' and then is received by the photosensitive area 22' of the photosensitive element 20'. By this way, the imaging quality of the camera module 100 can be ensured.

Specifically, the filter element 50' can filter stray light in the light entering the interior of the camera module 100 from the optical lens 10'. By this way, the imaging quality of the camera module 100 can be improved. It is worth mentioning that the type of the filter element 50' is not limited in the camera module 100 of the present disclosure. For example, the filter element 50 may be but not limited to, an infrared cut filter element, a visible spectrum filter element or the like.

With further reference to FIG. 38, the camera module 100 includes at least one driver 60', wherein the optical lens 10' is drivably disposed on the driver 60', and the driver 60' is attached to the top surface of the molded base 42' so that the optical lens 10' is held in the photosensitive path of the photosensitive element 20' by means of the driver 60'. Moreover, the driver 60' can drive the optical lens 10' to move relative to the photosensitive element 20' along the photosensitive path of the photosensitive element 20', so that the camera module 100 achieves the autofocus and the automatic zoom of the camera module 100 by way of adjusting the relative position of the optical lens 10' and the photosensitive element 20'.

It is worth mentioning that the type of the driver 60' is not limited in the camera module 100 of the present disclosure, as long as it can drive the optical lens 10' to move relative to the photosensitive element 20' along the photosensitive path of the photosensitive element 20'. For example, in a specific example of the present disclosure, the driver 60' may be implemented as but not limited to a voice coil motor.

Further, the driver 60' has at least one driving pin 61', wherein the driving pin 61' is electrically connected to the substrate 31'. Preferably, the molded base 42' has at least one pin groove 421', wherein the pin groove 421' of the molded base 42' extends from the top surface of the molded base 42' to the substrate front surface 311' of the substrate 31'. In this way, when the driver 60' is attached to the top surface of the molded base 42', the driving pin 61' of the driver 60' can extends from the top surface of the molded base 42' to the substrate front surface 311' of the substrate 31' in the pin groove 421', and the driving pin 61' of the driver 60' can be electrically connected to the substrate 31'.

Preferably the pin groove 421' extends along an outer surface of the molded base 42' from the surface of the molded base 42' to the substrate front surface 311' of the substrate 31', so that after the driver 60' is attached to the top surface of the molded base 42', the driving pin 61' of the driver 60' is then electrically connected to the substrate 31'. It will be understood that the driving pin 61' of the driver 60' accommodated in the pin groove 421' of the molded base 42' is not protruded from the outer surface of the molded base 42'. In this way, it not only ensures the appearance of the camera module 100, but also prevents occurrence of an undesirable phenomenon that the driving pin 61' of the driver 60' is touched when the camera module 100 is assembled to the device body 200, to ensure the reliability and product yield of the camera module 100.

Further, the top surface of the molded base 42' has at least one inner side surface 422' and at least one outer side surface 423', wherein the driver 60' is attached to the outer side surface 423' of the molded base 42', so that the optical lens 10' is held in the photosensitive path of the photosensitive element 20'; and wherein the filter element 50' is attached to the inner side surface 422' of the molded base 42', so that the filter element 50' is held between the optical lens 10' and the photosensitive element 20'.

In some examples of the camera module 100 of the present disclosure, the plane where the inner side surface 422' of the molded base 42' is located is flush with the plane where the outer side surface 423' is located. In other examples of the camera module 100 of the present disclosure, the plane where the inner side surface 422' of the molded base 42' is located and the plane where the outer side surface 423' is located have a height difference. For example, in this specific example of the camera module 100 shown in FIG. 38, the plane where the inner side surface 422' of the molded base 42' is located is lower than the plane where the outer side surface 423' is located, so that the molded base 42' is formed with at least one attaching groove 424', and the attaching groove 424' of the molded base 42' communicates with the light window 420', wherein the filter element 50' attached to the inner side surface 422' of the molded base 42' is accommodated in the attaching groove 424' to further reduce the height size of the camera module 100.

It will be understood that the molded base 42' may be a holder 6000', wherein the holder 6000' has an upper holding portion 6100' and a lower holding portion 6200'; and wherein the filter element 50' and the driver 60' are each held in the upper holding portion 6100' of the holder 6000', and the substrate 31' is held in the lower holding portion 6200' of the holder 6000', so that the optical lens 10' is held in the photosensitive path of the photosensitive element 20' and the filter element 50' is held between the optical lens 10' and the photosensitive element 20'. It will be understood that the light window 420' of the molded base 42' extends from the upper holding portion 6100' of the holder 6000' to the lower holding portion 6200', so that the light window 420' forms a light passage between the optical lens 10' and the photosensitive element 20'.

The lower holding portion 6200' of the holder 6000' is integrally bonded to the substrate front surface 311' of the substrate 31' in such a manner that the substrate 31' is held in the lower holding portion 6200' of the holder 6000'. The filter element 50' and the driver 60' are respectively attached to the upper holding portion 6100' of the holder 6000' in such a manner that they are each held in the upper holding portion 6100' of the holder 6000'.

With reference to FIGS. 28 to 37 in the accompanying drawings of the present disclosure, a manufacturing process of the camera module 100 is set forth in the following description.

Figure 28:
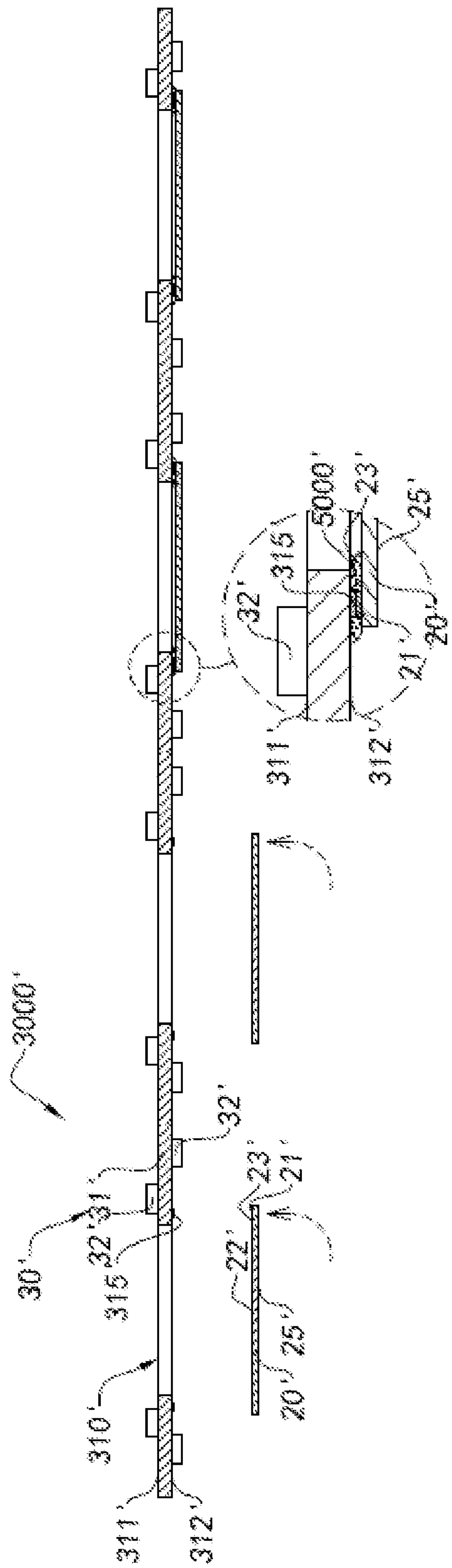
FIG. 28 is a schematic cross-sectional view of the first one of the manufacturing steps of a camera module according to another preferred embodiment of the present disclosure.

At a stage shown in FIG. 28, at least one electronic component 32' is conductively connected to the substrate 31' on the substrate front surface 311' of the substrate 31', and a further electronic component 32' is conductively connected to the substrate 31' on the substrate back surface 312' of the substrate 31', wherein two or more substrates 31' are arranged to form a splicing unit 3000'. It is worth mentioning that the arrangement of a plurality of substrates 31' forming the splicing unit 3000' is not limited in the camera module 100' of the present disclosure, and it is selected as needed.

For example, in this specific example of the camera module 100 of the present disclosure, after the substrate 31' is provided or made, at least one electronic component 32' may be attached to the substrate front surface 311' of the substrate 31' by way of attaching, so that these electronic components 32' are conductively connected to the substrate 31' on the substrate front surface 311' of the substrate 31', and the further electronic components 32' are attached to the substrate back surface 312' of the substrate 31' by way of attaching, so that these electronic components 32' are conductively connected to the substrate 31' on the substrate back surface 312' of the substrate 31'.

Further, the positions of the electronic components 32' attached to the substrate front surface 311' and the substrate back surface 312' of the substrate 31' may also be not limited, and they are adjusted according to a specific application of the camera module 100. For example, in further other examples of the camera module 100 of the present disclosure, a plurality of electronic components 32' may be arranged on the entire area of the substrate front surface 311' and/or the substrate back surface 312' of the substrate 31', whereas in further other examples of the camera module 100 of the present disclosure, the plurality of electronic components 32' may also be arranged on a specific area such as a corner or one side or both sides of the substrate front surface 311' and/or the substrate back surface 312' of the substrate 31'. The camera module 100 of the present disclosure is not limited in this regard.

It is worth mentioning that, in other examples of the camera module 100 of the present disclosure, the electronic component 32' may also only be conductively connected to the substrate 31' on the substrate front surface 311' of the substrate 31', or the electronic component 32' may also only be conductively connected to the substrate 31' on the substrate back surface 312' of the substrate 31'.

Further, with continued reference to FIG. 28, the photosensitive element 20' is attached to the substrate 31' on the substrate back surface 312' of the substrate 31', so that the chip connecting member 21' located on the non-photosensitive area 23' of the photosensitive element 20' and the substrate connecting member 315' located on the substrate back surface 312' of the substrate 31' are conductively connected, and the photosensitive area 22' and a part of the non-photosensitive area 23' of the photosensitive element 22' correspond to the substrate channel 310' of the substrate 31', so that the photosensitive element 20' is conductively connected to the substrate 31'.

It will be understood by those skilled in the art that, after the photosensitive element 22' is attached to the substrate back surface 312' of the substrate 31' and the chip connecting member 21' of the photosensitive element 20' is conductively connected to the substrate connecting member 315' of the substrate 31', a gap 24' is formed between the non-photosensitive area 23' of the photosensitive element 22' and the substrate back surface 312' of the substrate 31'. Then, a filler 5000' is used to be filled in the gap 24' to prevent the photosensitive area 22' of the photosensitive element 20' and the substrate back surface 312' of the substrate 31' from communicating via the gap 24', so that in a subsequent molding process, the filler 5000' can prevent a fluid medium 400' from entering the photosensitive area 22' of the photosensitive element 20' from the substrate back surface 312' of the substrate 31' via the gap 24', to avoid the photosensitive area 22' of the photosensitive element 20' from being contaminated.

It will be understood that the substrate 31' can isolate at least one of the electronic components 32' from the photosensitive area 22' of the photosensitive element 20', to avoid shedding of the surface of the electronic component 32' and shedding of the connecting position of the electronic component 32' and the substrate 31' from contaminating the photosensitive area 22' of the photosensitive element 20'. For example, in an example where all of the electronic components 32' are arranged on the substrate back surface 312' of the substrate 31', the substrate 31' can isolate all of the electronic components 32' from the photosensitive area 22' of the photosensitive element 20', so that in the process of manufacturing the camera module 100, the shedding of the surface of the electronic component 32' and the shedding of the connecting position of the electronic component 32' and the substrate 31' can be avoided from contaminating the photosensitive area 22' of the photosensitive element 20'.

It is worth mentioning that, in some examples of the camera module 100 of the present disclosure, the electronic component 32' may be first conductively connected to the substrate 31', and then the photosensitive element 20' is conductively connected to the substrate 31'. In other examples of the camera module 100 of the present disclosure, it is also possible that the photosensitive element 20' is first conductively connected to the substrate 31', and then the electronic component 32' is conductively connected to the substrate 31'. Nevertheless, it will be understood by those skilled in the art that, in further other examples of the camera module 100 of the present disclosure, it is also possible that the electronic component 32' located on the substrate back surface 312' of the substrate 31' is first conductively connected to the substrate 31' and the photosensitive element 20' is conductively connected to the substrate 31', and then the electronic component 32 located on the substrate front surface 311' of the substrate 31' is conductively connected to the substrate 31'; or the electronic component 32' located on the substrate front surface 311' of the substrate 31' is first conductively connected to the substrate 31', and then the electronic component 32' located on the substrate back surface 312' of the substrate 31' is conductively connected to the substrate 31' and the photosensitive element 20' is conductively connected to the substrate 31'. The camera module 100 of the present disclosure is not limited in this regard.

Figure 29A:
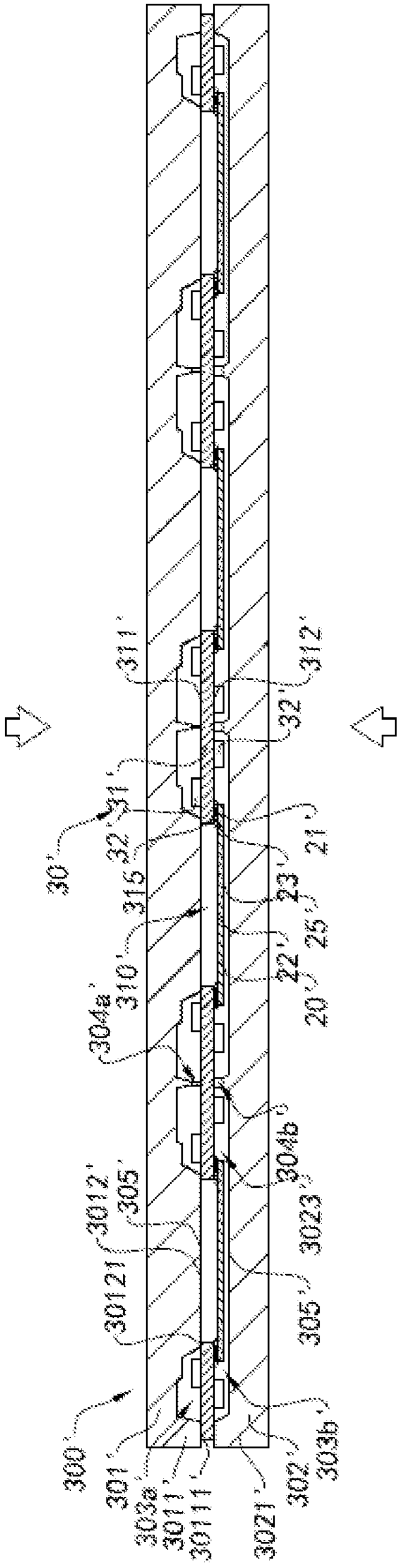
FIGS. 29A and 29B are schematic cross-sectional views of the second one of the manufacturing steps of the camera module according to the above preferred embodiment of the present disclosure.
Figure 29B:
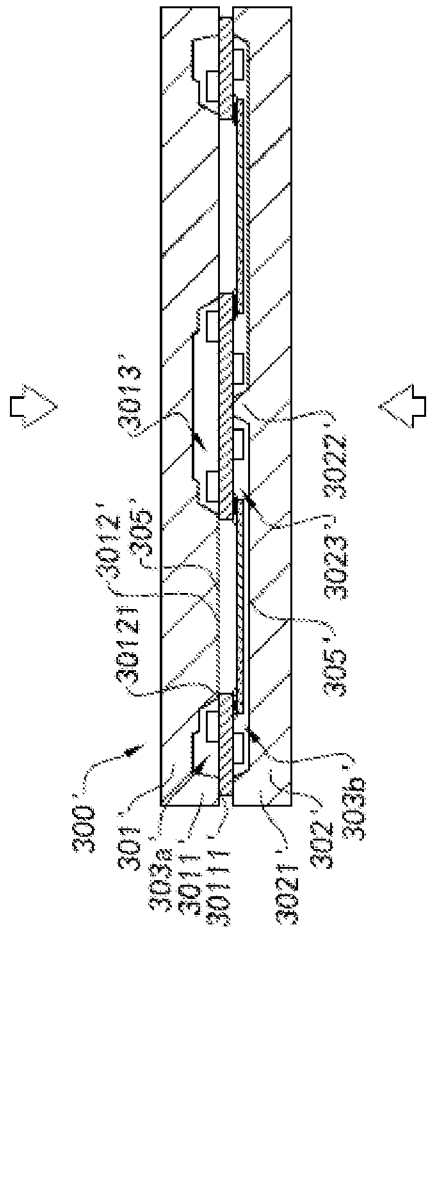

At a stage shown in FIGS. 29A and 29B, the splicing unit 3000' is placed into a molding die 300' to perform a molding process by means of the molding die 300'.

Specifically, the molding die 300' includes an upper die 301' and a lower die 302', wherein at least one die of the upper die 301' and the lower die 302' can be operated, so that clamping and drafting operations can be performed on the molding die 300'. For example, in one example, after the splicing unit 3000' is placed in the lower die 302' and the clamping operation is performed on the molding die 300', at least one first molding space **303*a*' is formed between the upper die 301' and the substrate front surface 311' of the substrate 31', and at least one second molding space 303*b*' is formed between the lower die 302' and the substrate back surface 312' of the substrate 31'**.

In one optional example of the present disclosure, the at least one first molding space **303*a*' and the at least one second molding space 303*b*' communicate with each other, to subsequently allow the fluid medium 400' to fill up the first molding space 303*a*' and the second molding space 303*b*', and simultaneously form the molded base 42' integrally bonded to at least one part of the area of the substrate front surface 311' of the substrate 31' and the back surface molded portion 41' integrally bonded to at least one part of the area of the substrate back surface 312' of the substrate 31', respectively. Preferably, the back surface molded portion 41' further embeds at least one part of the area of the chip back surface 25' of the photosensitive element 20'. Optionally, the first molding space 303*a*' and the second molding space 303*b*' may also not communicate with each other, so that in a subsequent molding process, the fluid medium 400' is separately added to the first molding space 303*a*' and the second molding space 303*b*', to fill up the first molding space 303*a*' and the second molding space 303*b*' by means of the fluid medium 400'**.

Preferably, when the number of the first molding space **303*a*' is two or more than two, at least one first communicating channel 304*a*' may further be formed between the upper die 301' and the substrate front surface 311' of the substrate 31' for adjacent first molding space 303*a*' to communicate. Accordingly, when the number of the second molding space 303*b*' is two or more than two, at least one second communicating channel 304*b*' may further be formed between the lower die 302' and the substrate back surface 312' of the substrate 31' for adjacent second molding space 303*b*'** to communicate.

With continued reference to FIGS. 29A and 29B, the upper die 301' further includes an upper molding guide portion 3011' and at least one light window molding portion 3012', and has at least one upper molding guide groove 3013', wherein the light window molding portion 3012' integrally extends to the upper molding guide portion 3011', to form the upper molding guide groove 3013' between the light window molding portion 3012' and the upper molding guide portion 3011' or form the upper molding guide groove 3013' between adjacent light window molding portion 3012'.

Further, the upper molding guide portion 3011' has a first upper pressing portion 30111', and the light window molding portion 3012' has a second upper pressing portion 30121', so that after a clamping process is performed on the molding die 300', the first upper pressing portion 30111' of the upper molding guide portion 3011' and the second upper pressing portion 30121' of the light window molding portion 3012' press against different positions of the substrate front surface 311' of the substrate 31', respectively, and the first molding space **303*a*' is formed at a position corresponding to the upper molding guide groove 3013'. Preferably, the electronic component 32' located on the substrate front surface 311' of the substrate 31' is accommodated in the first molding space 303*a*', so that after a subsequent molding process is complete, the molded base 42' formed to be integrally bonded to the substrate front surface 311' of the substrate 31' can embed the electronic component 32'. More preferably, the height size of the first molding space 303*a*' is larger than the height size of the electronic component 32' protruded from the substrate front surface 311' of the substrate 31', so that when the molding die 300' is clamped, an inner surface of the upper die 301' is avoided from contacting with the electronic component 32', thereby avoiding the surface of the electronic component 32' from being scratched by the inner surface of the upper die 301' and avoiding the electronic component 32'** from being pressed.

Further, the molding die 300' further includes at least one film layer 305', wherein the film layer 305' is overlappedly disposed on the inner surface of the upper die 301'. For example, the film layer 305' may be overlappedly disposed on the inner surface of the upper die 301' by way of attaching to the inner surface of the upper die 301'. After the molding die 300' is clamped, the film layer 305' is located between the first upper pressing portion 30111' of the upper die 301' and the substrate front surface 311' of the substrate 31', and is located between the second upper pressing portion 30121' of the upper die 301' and the substrate front surface 311' of the substrate 31'. By this way, in an aspect, the film layer 305' can absorb an impact force generated when the molding die 300' is clamped by way of deformation to avoid the impact force from directly acting on the substrate 31'. In another aspect, the film layer 305' can isolate the first upper pressing portion 30111' of the upper die 301' from the substrate front surface 311' of the substrate 31', and isolate the second upper pressing portion 30121' from the substrate front surface 311' of the substrate 31', to avoid the first upper pressing portion 30111' and the second upper pressing portion 30121' of the upper die 301' from scratching the substrate front surface 311' of the substrate 31'. In still another aspect, the film layer 305' can prevent a gap from forming between the first upper pressing portion 30111' of the upper die 301' and the substrate front surface 311' of the substrate 31' and prevent a gap from forming between the second upper pressing portion 30121' and the substrate front surface 311' of the substrate 31' by way of deformation, in particular can prevent a gap from forming between the second upper pressing portion 30121' and the substrate front surface 311' of the substrate 31', so that in a subsequent molding process, it can not only prevent the fluid medium 400' from flowing from the first molding space **303*a*' to the substrate channel 310' of the substrate 31' to contaminate the photosensitive area 22' of the photosensitive element 20'**, but also can prevent the occurrence of undesirable phenomena such as “flash”.

With continued reference to FIGS. 29A and 29B, the lower die 302' further includes a lower molding guide portion 3021' and at least one support portion 3022', and has at least one lower molding guide groove 3023', wherein the support portion 3022' integrally extends to the lower molding guide portion 3021', to form the lower molding guide groove 3023' between the support portion 3022' and the lower molding guide portion 3021' or form the lower molding guide groove 3023' between adjacent support portions 3022'.

When the clamping operation is performed on the molding die 300', the second molding space **303*b*' is formed at a position of the lower die 303' corresponding to the lower molding guide groove 3023'. Moreover, the lower molding guide portion 3021' of the lower die 302' can press against the substrate back surface 312' of the substrate 31', and the support portion 3022' of the lower die 302' can press against the substrate back surface 312' of the substrate 31'. Preferably, the electronic component 32' protruded from the substrate back surface 312' of the substrate 31' is accommodated in the second molding space 303*b*'. It will be understood that at least one part of the connecting position of the photosensitive element 20' and the substrate back surface 312' of the substrate 31' may be accommodated in the second molding space 303*b*'**.

Preferably, the height size of the second molding space **303*b*' of the lower die 302' is larger than the height size of the electronic component 32' protruded from the substrate back surface 312' of the substrate 31'. By this way, when the lower die 302' presses against the substrate back surface 312' of the substrate 31', there is a safety distance between the electronic component 32' protruded from the substrate back surface 312' of the substrate 31' and the inner surface of the lower die 302', to protect the surface of the electronic components 32' from being scratched and avoid the electronic components 32' from being pressed by way of avoiding the surface of the electronic components 32' from contacting with the inner surface of the lower die 302'. Further, by way of having the safety distance between the surface of the electronic component 32' and the inner surface of the lower die 302', the back surface molded portion 41' integrally bonded to the substrate back surface 312' of the substrate 31' can also be subsequently caused to embed the electronic component 32'**.

More preferably, the film layer 305' may be overlappedly disposed on the inner surface of the lower die 302'. For example, the film layer 305' may be overlappedly disposed on the inner surface of the lower die 302' by way of attaching to the inner surface of the lower die 302'. After the molding die 300' is clamped, the film layer 305' is located between the lower molding guide portion 3021' of the lower die 302' and the substrate back surface 312' of the substrate 31', and between the support portion 3022' and the substrate back surface 312' of the substrate 31'. By this way, on the one hand, the film layer 305' can absorb an impact force generated when the molding die 300' is clamped by way of deformation to avoid the impact force from directly acting on the substrate 31', and on the other hand, the film layer 305' can isolate the lower molding guide portion 3021' of the lower die 302' from the substrate back surface 312' of the substrate 31' and isolate the support portion 3022' from the substrate back surface 312' of the substrate 31' to avoid the lower molding guide portion 3021' and the support portion 3022' of the lower die 302' from scratching the substrate back surface 312' of the substrate 31'.

Further, it will be understood that the film layer 305' may also facilitate the drafting of the upper die 301' and the lower die 302' of the molding die 300', and in this process, the molded base 42' and the back surface molded portion 41' are avoided from being damaged, and in particular, the light window 420' of the molded base 42' is avoided from being damaged, thereby ensuring the reliability of the camera module 100.

Figure 30:
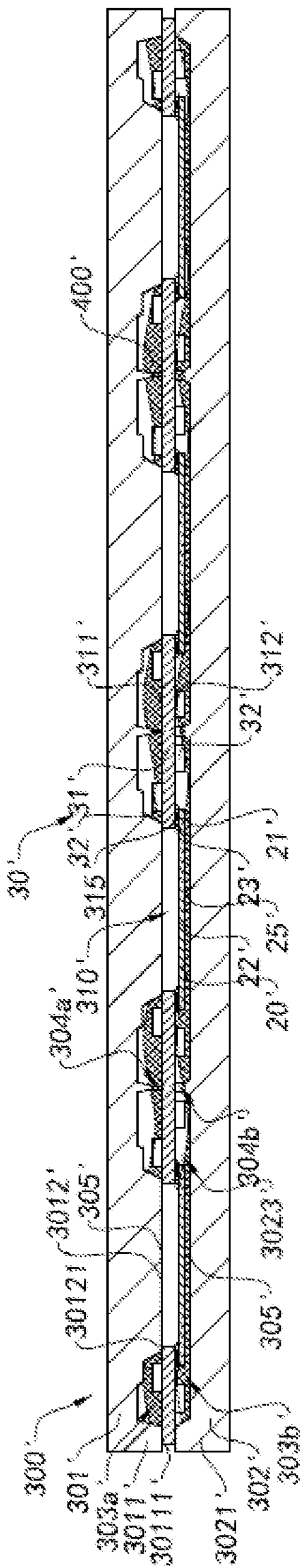
FIG. 30 is a schematic cross-sectional view of the third one of the manufacturing steps of the camera module according to the above preferred embodiment of the present disclosure.
Figure 31:
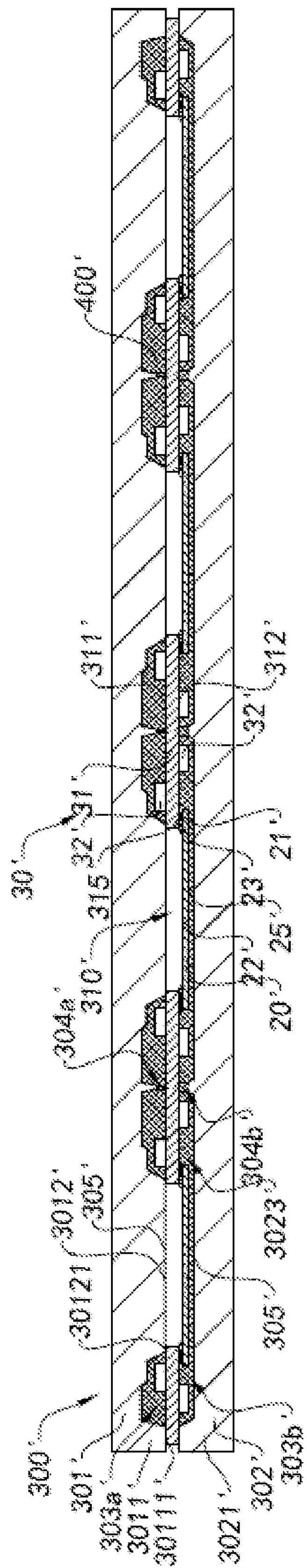
FIG. 31 is a schematic cross-sectional view of the fourth one of the manufacturing steps of the camera module according to the above preferred embodiment of the present disclosure.

At a stage shown in FIGS. 30 and 31, the fluid medium 400' is added to at least one of the first molding spaces 303*a*', or the fluid medium 400' is added to at least one of the second molding spaces 303*b*', or the fluid medium 400' is respectively added to the first molding space 303*a*' and the second molding space 303*b*'. Since adjacent first molding spaces 303*a*' communicate with each other via the first communication channel 304*a*', and adjacent second molding spaces 303*b*' communicate with each other via the second communication channel 304*b*', the fluid medium 400' may fill up all of the first molding spaces 303*a*' and all of the second molding spaces 303*b*'.

It is worth mentioning that the fluid medium 400' may be a liquid, a solid, a mixture of a solid and a liquid, or the like, so that the fluid medium 400' can flow. Further, the fluid medium 400' may be implemented as but not limited to a thermoset material. Of course, it will be understood by those skilled in the art that, in other possible examples, it is also possible that the fluid medium 400' is implemented as a light-curable material or a self-curable material.

Figure 32:
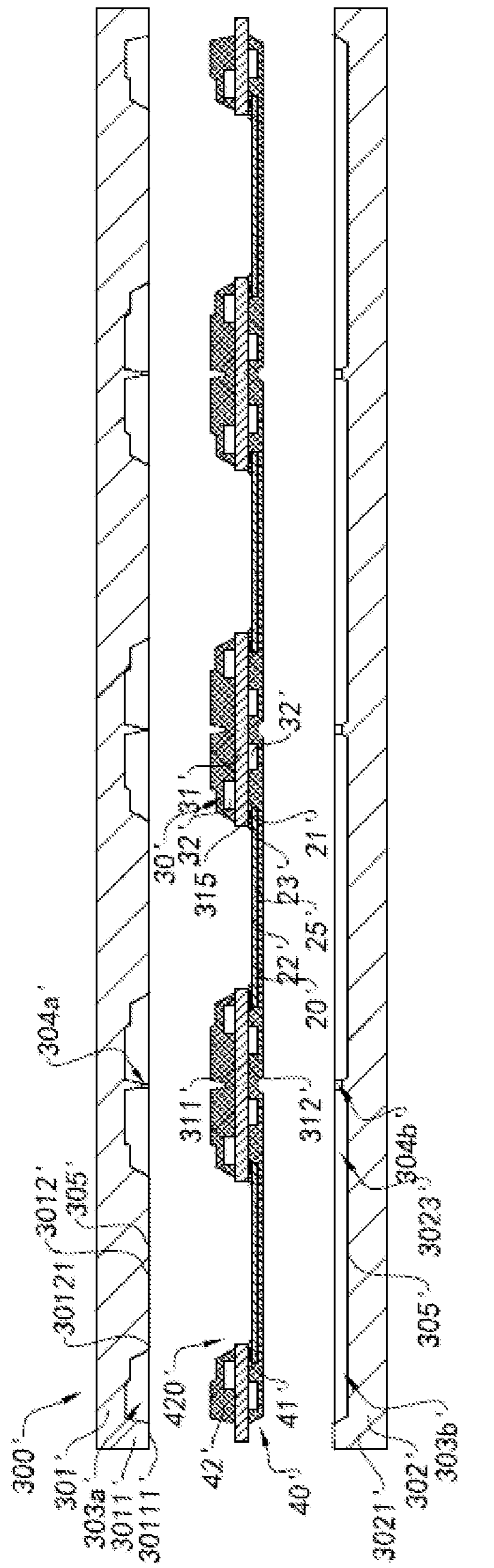
FIG. 32 is a schematic cross-sectional view of the fifth one of the manufacturing steps of the camera module according to the above preferred embodiment of the present disclosure.

After the fluid medium 400' fills up the first molding space 303*a*' and the second molding space 303*b*', the fluid medium 400' may be cured within the first molding space 303*a*' and the second molding space 303*b*' by way of heating, and the drafting operation may be subsequently performed on the molding die 300', with reference to the stage shown in FIG. 32, wherein the fluid medium 400' cured within the first molding space 303*a*' forms the molded base 42' integrally bonded to the substrate front surface 311' of the substrate 31', and forms the light window 420' of the molded base 42' at a position of the upper die 301' corresponding to the light window molding portion 3012', and the photosensitive area 22' and a part of the non-photosensitive area 23' of the photosensitive element 20' correspond to the light window 420' of the molded base 42'; and wherein the fluid medium 400' cured within the second molding space 303*b*' may form the back surface molded portion 41' integrally bonded to the substrate back surface 312' of the substrate 31'. Preferably, the back surface molded portion 41' embeds the electronic component 32' protruded from the substrate back surface 312' of the substrate 31'. More preferably, the back surface molded portion 41' embeds the chip back surface 25' of the photosensitive element 20'. Optionally, at least one assembling space 410' of the back surface molded portion 41' is simultaneously formed at a position of the lower die 302' corresponding to the support portion 3022'.

Figure 33:
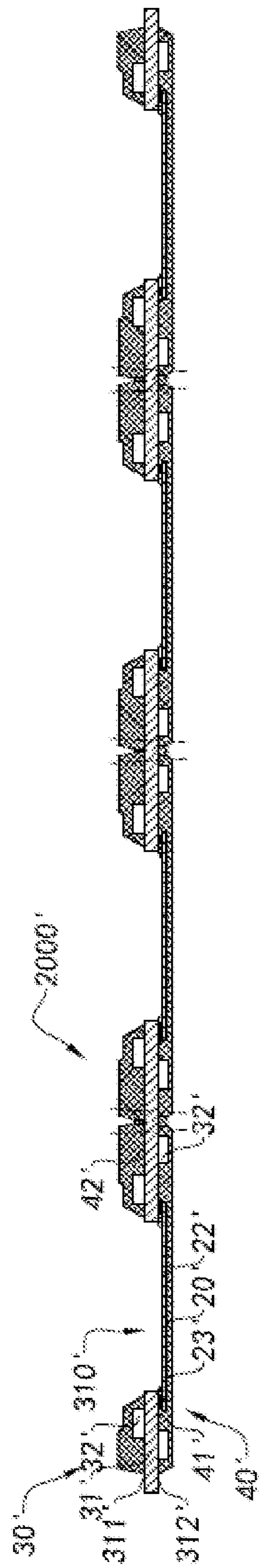
FIG. 33 is a schematic cross-sectional view of the sixth one of the manufacturing steps of the camera module according to the above preferred embodiment of the present disclosure.

At a stage shown in FIG. 33, after the drafting operation is performed on the molding die 300', a semi-finished product of the molded circuit board assembly 2000' may be formed. Then, in FIGS. 34A and 34B, the semi-finished product of the molded circuit board assembly 2000' may be divided to form the molded circuit board assembly 2000'. A way of dividing the semi-finished product of the molded circuit board assembly 2000' is not limited in the camera module 100 of the present disclosure. For example, the semi-finished product of the molded circuit board assembly 2000' may be divided by way of cutting to form the molded circuit board assembly 2000', or the semi-finished product of the molded circuit board assembly 2000' may be divided by way of etching to form the molded circuit board assembly 2000'.

Figure 34A:
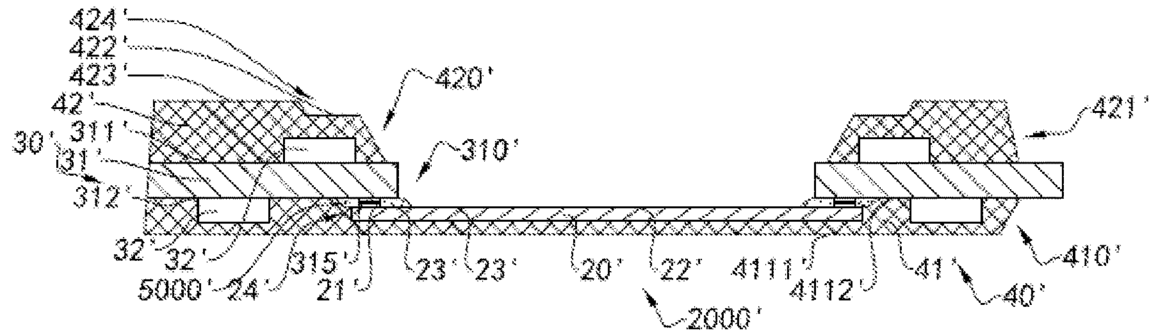
FIGS. 34A and 34B are schematic cross-sectional views of the seventh one of the manufacturing steps of the camera module according to the above preferred embodiment of the present disclosure.

Further, in some examples of the camera module 100 of the present disclosure, as shown in FIG. 34A, when the semi-finished product of the molded circuit board assembly 2000' is divided, a division direction may be from a direction where the substrate front surface 311' of the substrate 31' is located to a direction where the substrate back surface 312' is located. In other examples of the camera module 100 of the present disclosure, as shown in FIG. 34B, when the semi-finished product of the molded circuit board assembly 2000' is divided, the division direction may also be from a direction where the substrate back surface 312' of the substrate 31' is located to a direction where the substrate front surface 311' is located.

Figure 35:
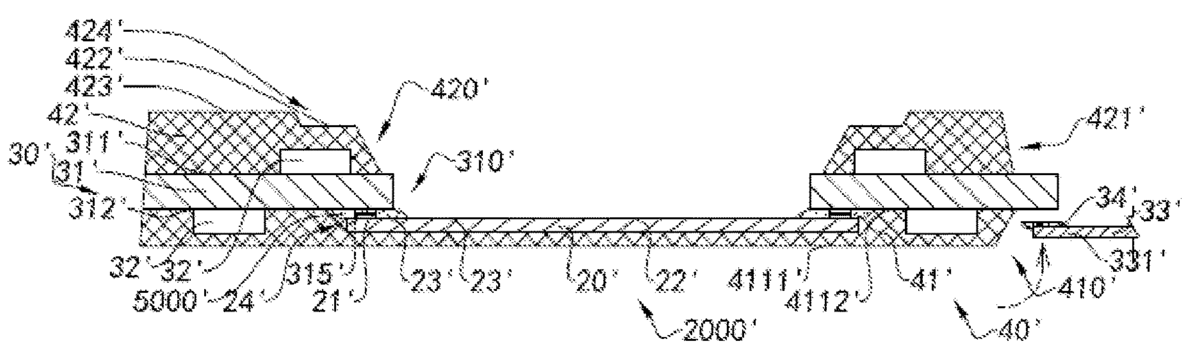
FIG. 35 is a schematic cross-sectional view of the eighth one of the manufacturing steps of the camera module according to the above preferred embodiment of the present disclosure.

At this stage shown in FIG. 35, the module connecting side 331' of the connecting plate 33' is attached to the substrate back surface 312' of the substrate 31' via the connecting portion 34' to conductively connect the connecting plate 33' and the substrate 31'. Preferably, the module connecting side 331' of the connecting plate 33' is accommodated in the assembling space 410' of the back surface molded portion 41', to avoid the module connecting side 331' of the connecting plate 33' from being protruded. It will be understood that in other examples of the camera module 100, the module connecting side 331' of the connecting plate 33' may also be attached to the substrate front surface 311' of the substrate 31' via the connecting portion 34'.

Figure 34B:
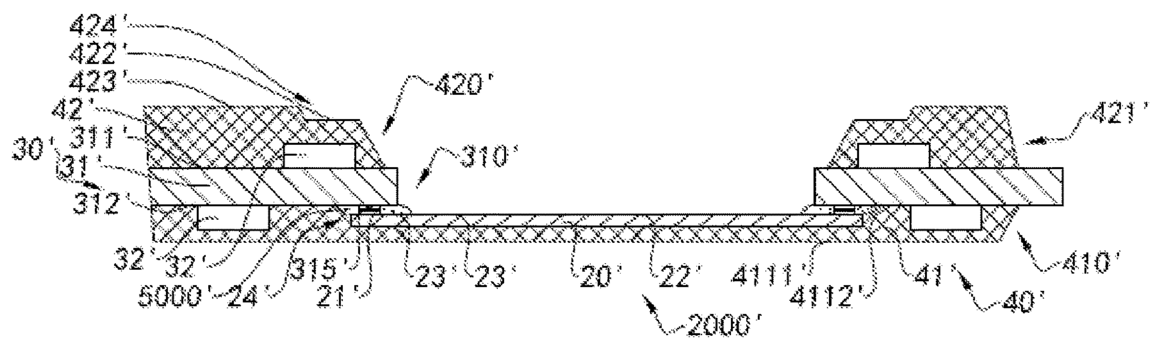

Optionally, the stage shown FIG. 35 may also before the stage shown in FIGS. 34A and 34B, so that the module connecting side 331' of the connecting plate 33' is first attached to the substrate back surface 312' of the substrate 31' via the connecting portion 34', and then the semi-finished product of the molded circuit board assembly 2000' is divided to form the molded circuit board assembly 2000'.

Figure 36:
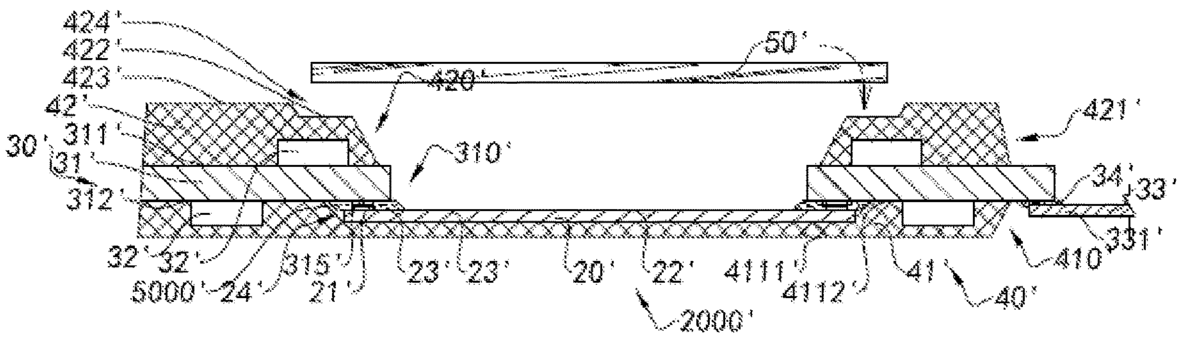
FIG. 36 is a schematic cross-sectional view of the ninth one of the manufacturing steps of the camera module according to the above preferred embodiment of the present disclosure.
Figure 37:
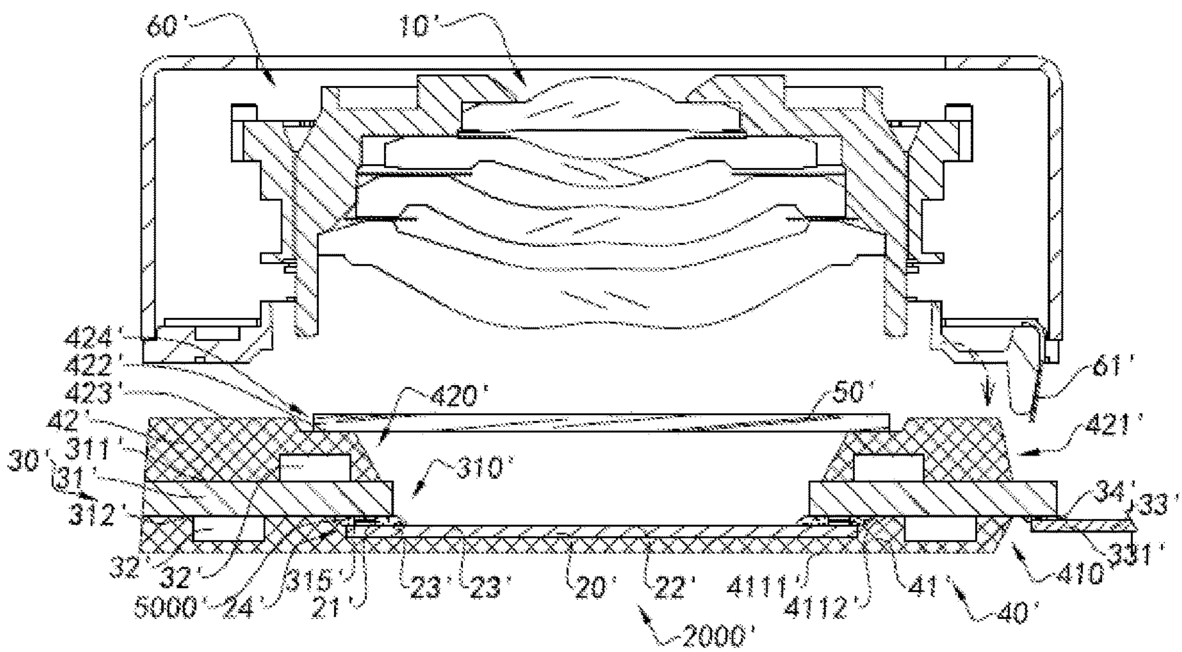
FIG. 37 is a schematic cross-sectional view of the tenth one of the manufacturing steps of the camera module according to the above preferred embodiment of the present disclosure.

At a stage shown in FIG. 36, the filter element 50' is attached to the inner side surface 422' of the molded base 42', and at a stage shown in FIG. 37, the driver 60' assembled with the optical lens 10' is attached to the outer side surface 423' of the molded base 42', and the driving pin 61' of the driver 60' is conductively connected to the substrate 31', so that the optical lens 10' is held in the photosensitive path of the photosensitive element 20', and the filter element 50' is held between the optical lens 10' and the photosensitive element 20', thereby obtaining the camera module 100 shown in FIG. 38.

It is worth mentioning that, although it shown in the above example of the present disclosure that the back surface molded portion 41' and the molded base 42' are simultaneously integrally bonded to the substrate back surface 312' and the substrate front surface 311' of the substrate 31', in other examples of the camera module 100, it is also possible that the back surface molded portion 41' is first integrally bonded to the substrate back surface 312' of the substrate 31', and then the molded base 42' is integrally bonded to the substrate front surface 311' of the substrate 31'; or the molded base 42' is first integrally bonded to the substrate front surface 311' of the substrate 31', and then the back surface molded portion 41' is integrally bonded to the substrate front surface 311' of the substrate 31', that is, the back surface molded portion 41' and the molded base 42' are respectively formed by different molding process. The camera module 100 of the present disclosure is not limited in this regard.

According to another aspect of the present disclosure, the present disclosure further provides a manufacturing method for a camera module 100, wherein the manufacturing method includes steps of:

(a) attaching at least one photosensitive element 20' to the substrate back surface 312' of a substrate 31' and causing a photosensitive area 22' and one part of a non-photosensitive areas 23' surrounding around the photosensitive area 22' of the photosensitive element 20' to correspond to a substrate channel 310' of the substrate 31';

(b) conductively connecting at least one electronic component 32' to the substrate 31';

(c) integrally bonding a back surface molded portion 41' to at least one part of the area of the substrate back surface 312' of the substrate 31' by a molding process; and (d) holding an optical lens 10' in the photosensitive path of the photosensitive element 20' to obtain the camera module 100.

It is worth mentioning that the step (b) may also be performed before the step (a), so that the electronic component 32' is first conductively connected to the substrate 31', and then the photosensitive element 20 is attached to the substrate back surface 312' of the substrate 31'.

Further, in the step (b), the electronic component 32' is conductively connected to the substrate 31' on the substrate front surface 311' of the substrate 31'; or the electronic component 32' is conductively connected to the substrate 31' on the substrate back surface 312' of the substrate 31'; or at least one electronic component 32' is conductively connected to the substrate 31' on the substrate front surface 311' of the substrate 31', and a further electronic component 32' is conductively connected to the substrate 31' on the substrate front surface 311' of the substrate 31'.

Further, after the step (c), the manufacturing method may further include a step of: (e) integrally bonding a molded base 42' to at least one part of the area of the substrate front surface 311' of the substrate 31' by a molding process, so that the molded base 42' surrounds around the photosensitive area 22' of the photosensitive element 20', and the photosensitive area 22' and a part of the non-photosensitive area 23' of the photosensitive element 20' correspond to the light window 420' of the molded base 42'.

Optionally, the step (e) may also be performed before the step (c), so that the molded base 42' is first integrally bonded to at least one part of the area of the substrate front surface 311' of the substrate 31', and then the back surface molded portion 41' is integrally bonded to at least one part of the area of the substrate back surface 312' of the substrate 31'.

Still optionally, the step (c) is completed together with the step (e), that is, the molded base 42' is integrally bonded to at least one part of the area of the substrate front surface 311' of the substrate 31', while the back surface molded portion 41' is integrally bonded to at least one part of the area of the substrate back surface 312' of the substrate 31'.

Figure 40:
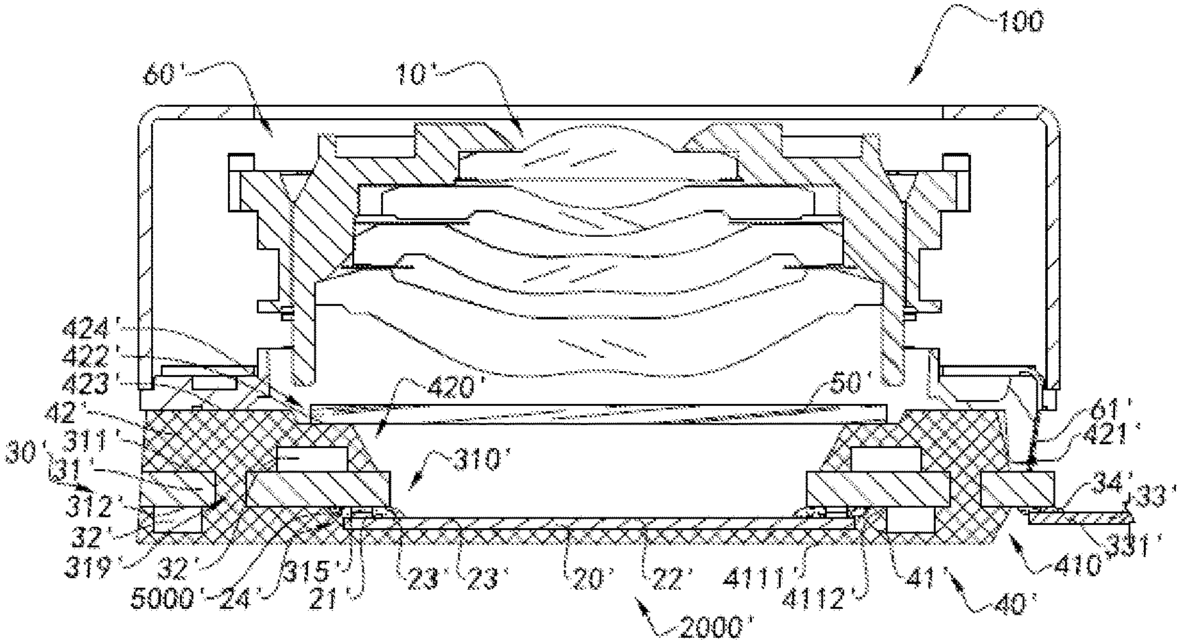
FIG. 40 is a schematic view of the internal structure cut along the intermediate position of a modified implementation of the camera module according to the above preferred embodiment of the present disclosure.

FIG. 40 shows a modified implementation of the camera module 100. The substrate 31' further has at least one molding channel 319', wherein the molding channel 319' extends from the substrate front surface 311' to the substrate back surface 312' of the substrate 31', that is, the molding channel 319' communicates with the substrate front surface 311' and the substrate back surface 312' of the substrate 31'. In the molding process, the molding channel 319' can communicate with the first molding space **303*a*' and the second molding space 303*b*', so that when the fluid medium 400' is added to the first molding space 303*a*' and/or the second molding space 303*b*', the fluid medium 400' may likewise be filled in the molding channel 319', and may be subsequently cured in the molding channel 319'. It will be understood that the molded base 42' and the back surface molded portion 41' may be integrally formed by the molding channel 319' of the substrate 31', to avoid the molded base 42' and/or the back surface molded portion 41' from falling off from the substrate 31', thereby ensuring the reliability of the molded circuit board assembly 2000'**.

Figure 41:
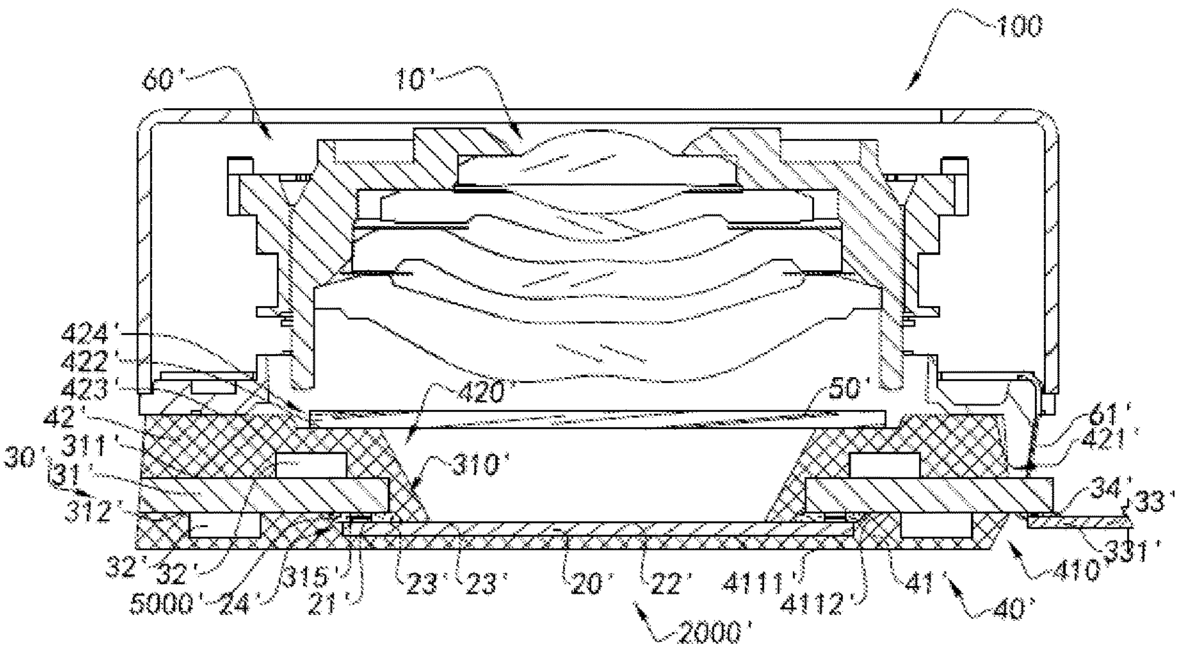
FIG. 41 is a schematic view of the internal structure cut along the intermediate position of another modified implementation of the camera module according to the above preferred embodiment of the present disclosure.

FIG. 41 shows another modified implementation of the camera module 100. The molded base 42' may embed a part of the non-photosensitive area 23' of the photosensitive element 20', that is, the molded base 42' may integrally extend upwardly from the front surface 311' of the substrate 31' and a part of the non-photosensitive area 23' of the photosensitive element 20' to form the inner side surface 422' and the outer side surface 423' on the top surface of the molded base 42', and form the light window 420' of the molded base 42' at a position corresponding to the photosensitive area 23 and a part of the non-photosensitive area 23' of the photosensitive member 20'.

Figure 42:
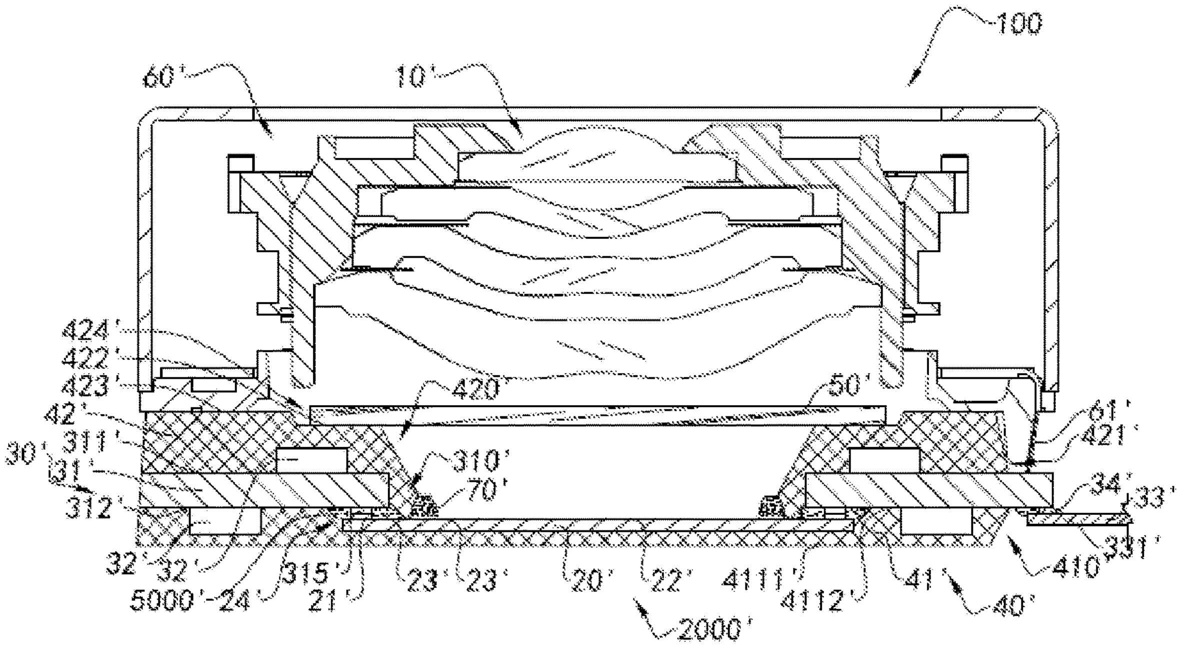
FIG. 42 is a schematic view of the internal structure cut along the intermediate position of another modified implementation of the camera module according to the above preferred embodiment of the present disclosure.

FIG. 42 shows another modified implementation of the camera module 100. The camera module 100 further includes at least one frame-shaped support element 70', wherein the support element 70' is disposed on the non-photosensitive area 23' of the photosensitive member 20', or the support element 70' may be formed on the non-photosensitive area 23' of the photosensitive member 20', and the molded base 42' embeds a part of the support element 70', so that the molded base 42', the support element 70', the photosensitive element 20', the substrate 31' and the back surface molded portion 41' are integrally bonded.

Preferably, the support element 70 is protruded from the substrate front surface 311' of the substrate 31'. In this way, in the molding process, the second upper pressing portion 30121' of the upper die 301' can directly press against the support element 70' to prevent the second upper pressing portion 30121' of the upper die 301' from directly contacting with the substrate front surface 311' of the substrate 31'.

More preferably, the support element 70' has elasticity. For example, the support element 70' may be formed by curing a medium such as glue or resin. In this way, on the one hand, the support element 70' can absorb an impact force generated when the molding die 300' is clamped, and on the other hand, the support element 70' can prevent a gap from forming between the second upper pressing portion 30121' of the upper die 301' and the support element 70' by way of deformation, so that when the fluid medium 400' is added to the first molding space 303*a*', the fluid medium 400' can be prevented from flowing from the first molding space 303*a*' into the substrate channels 310' of the substrate 31', to avoid the photosensitive area 22' of the photosensitive element 20' from being contaminated, and the occurrence of undesirable phenomena such as "flash" can be prevented.

Figure 43:
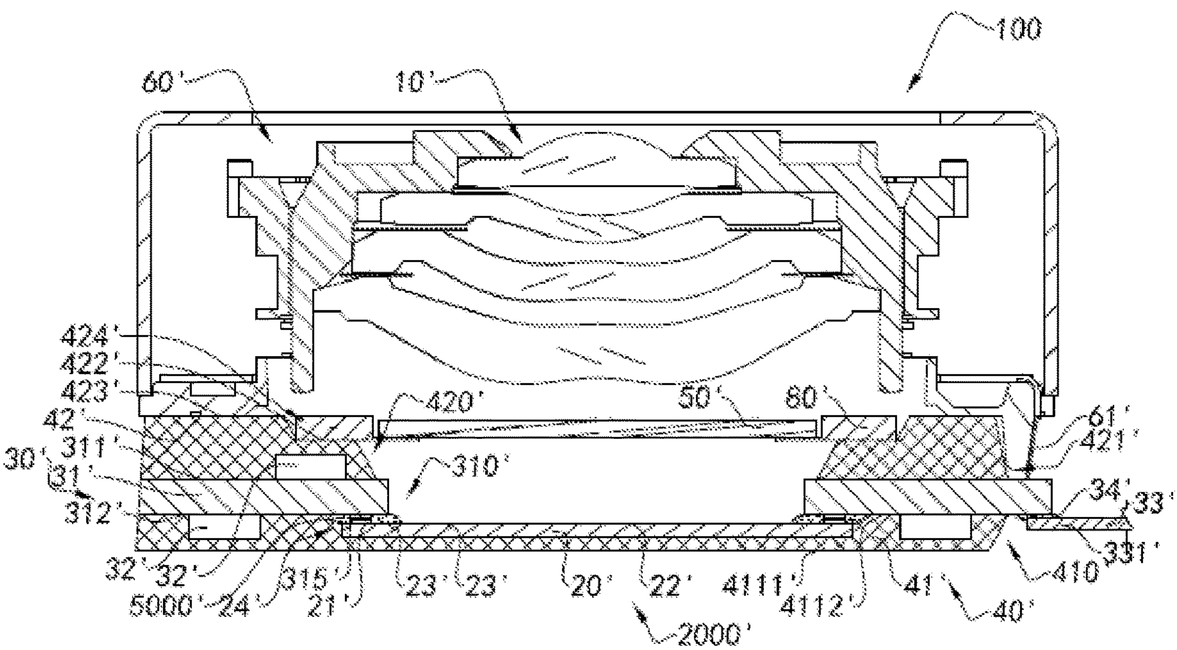
FIG. 43 is a schematic view of the internal structure cut along the intermediate position of another modified implementation of the camera module according to the above preferred embodiment of the present disclosure.

FIG. 43 shows another modified implementation of the camera module 100. The camera module 100 further includes at least one frame-shaped bracket 80', wherein the filter element 50' is attached to the bracket 80', and the bracket 80' is attached to the inner side surface 422' of the molded base 42', so that the filter element 50' is held between the optical lens 10' and the photosensitive element 20'. Preferably, the bracket 80' is held in the attaching groove 424' of the molded base 42'.

The bracket 80' holds the filter element 50' between the optical lens 10' and the photosensitive element 20' in such a manner that the area of the filter element 50' can be reduced, to facilitate reducing the manufacturing cost of the camera module 100.

Figure 44A:
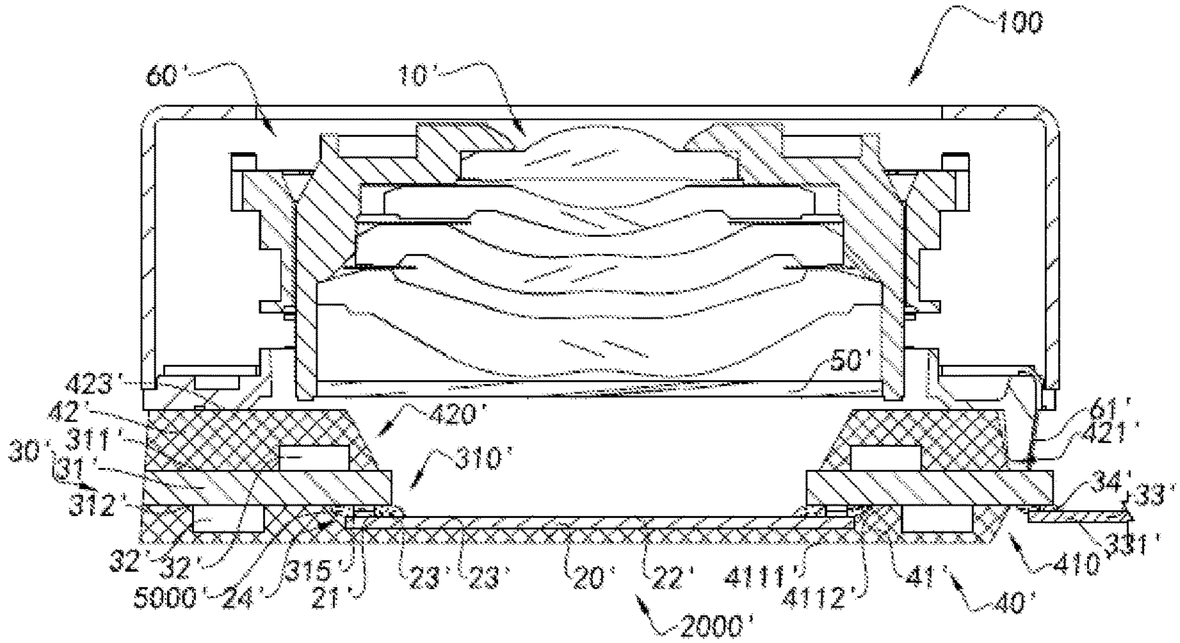
FIG. 44A is a schematic view of the internal structure cut along the intermediate position of another modified implementation of the camera module according to the above preferred embodiment of the present disclosure.

FIG. 44A shows another modified implementation of the camera module 100. The filter element 50' may be directly attached to the optical lens 10', so that the filter element 50' is held between the optical lens 10' and the photosensitive element 20'.

Figure 44B:
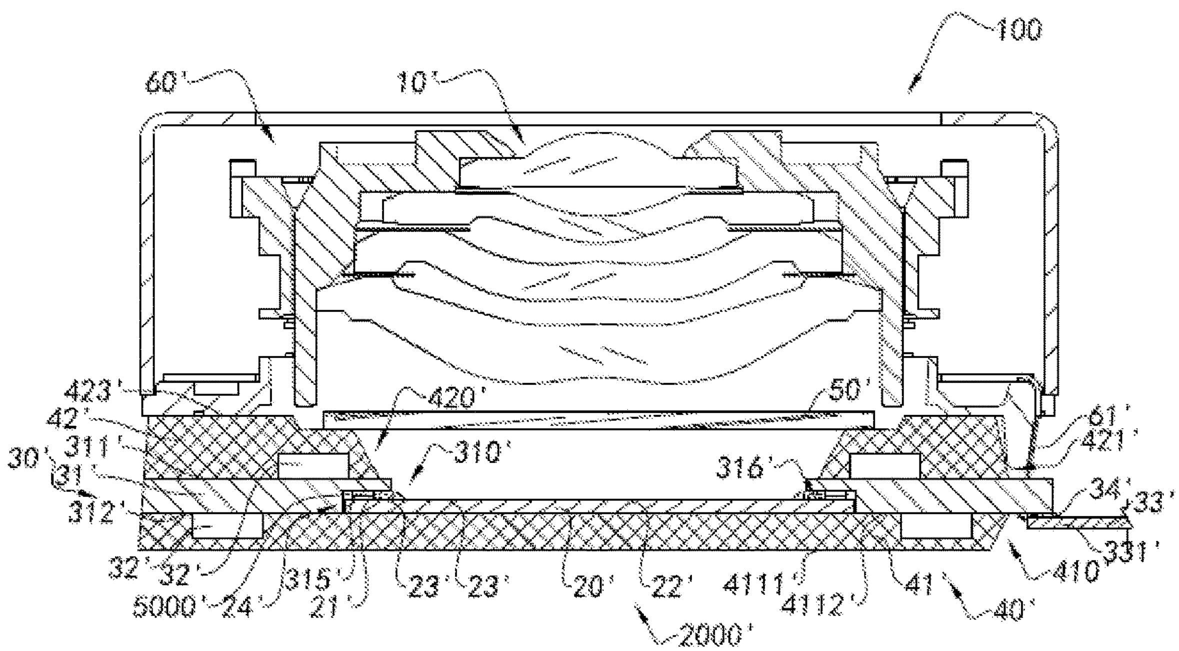
FIG. 44B is a schematic view of the internal structure cut along the intermediate position of another modified implementation of the camera module according to the above preferred embodiment of the present disclosure.

FIG. 44B shows another modified implementation of the camera module 100. The substrate 31' has at least one accommodating space 316', wherein the accommodating space 316' and the substrate channel 310' communicate with each other, and wherein the accommodating space 316' extends from the substrate back surface 312' toward the substrate front surface 311' of the substrate 31'. The photosensitive element 20' attached to the substrate back surface 312' of the substrate 31' can be accommodated on the accommodating space 316' of the substrate 31'. By this way, the height size of the camera module 100 can be further reduced.

Figure 45:
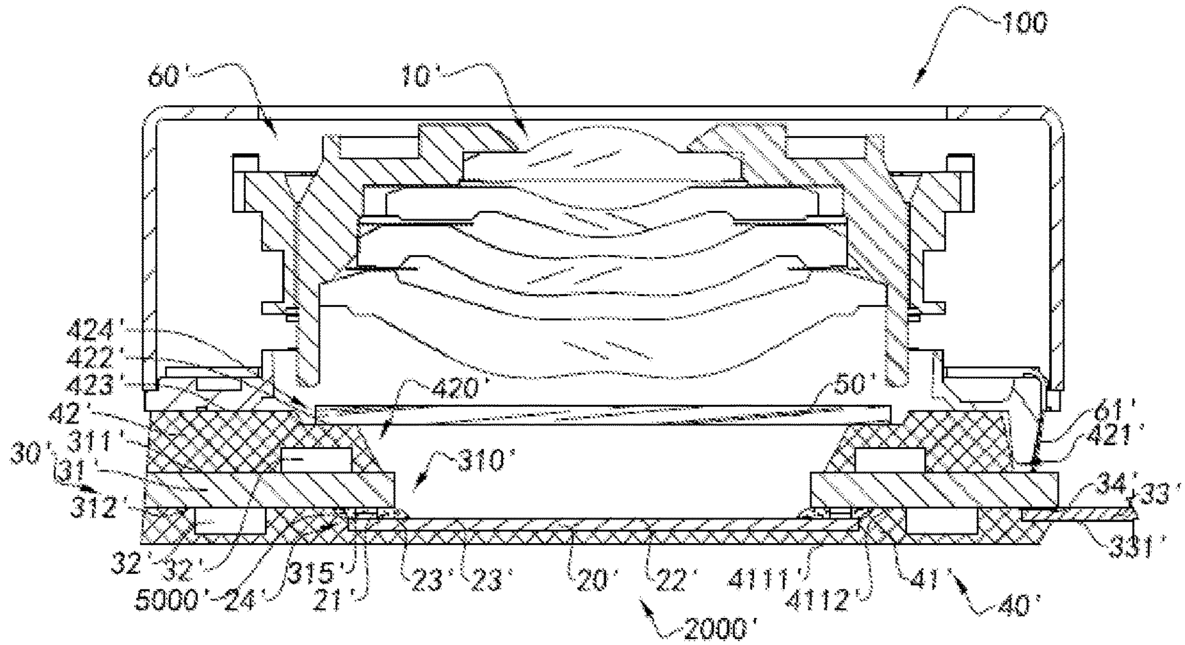
FIG. 45 is a schematic view of the internal structure cut along the intermediate position of another modified implementation of the camera module according to the above preferred embodiment of the present disclosure.

FIG. 45 shows another modified implementation of the camera module 100. The back surface molded portion 41' may also further embed the module connecting side 331' of the connecting plate 33', that is, the back surface molded portion 41' can embed the attaching position of the module connecting side 331' of the connecting plate 33' and the substrate back surface 312' of the substrate 31', to avoid the module connecting side 331' of the connecting plate 33' from falling off from the substrate back surface 312' of the substrate 31', thereby ensuring the reliability of the camera module 100.

Figure 46:
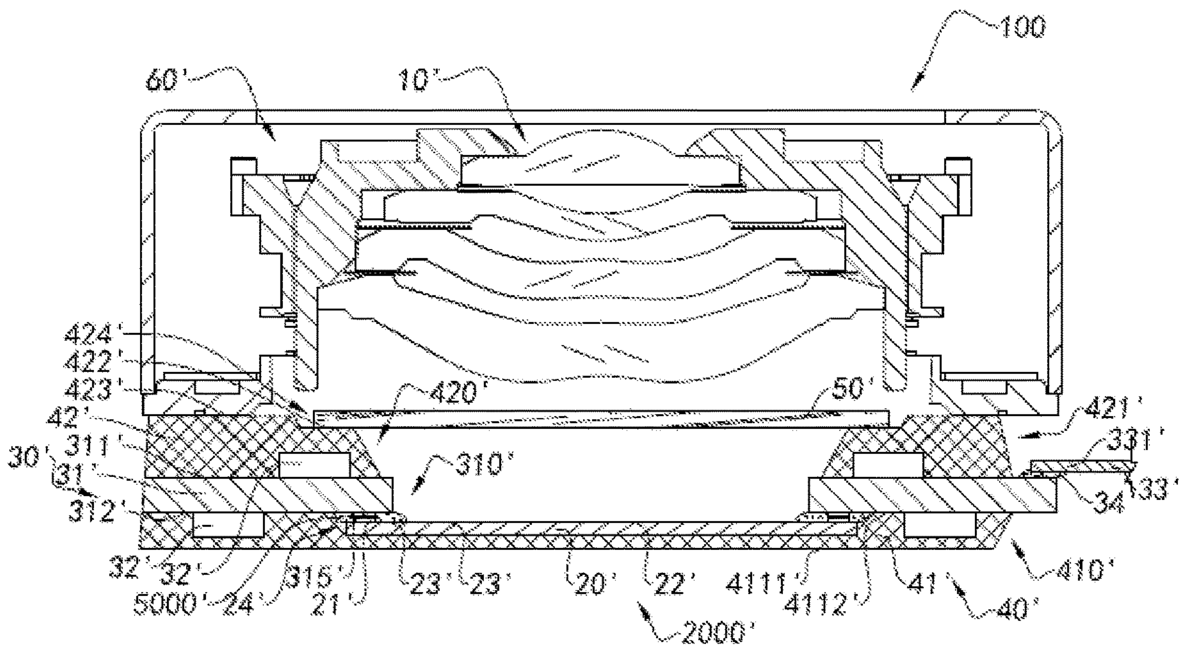
FIG. 46 is a schematic view of the internal structure cut along the intermediate position of another modified implementation of the camera module according to the above preferred embodiment of the present disclosure.

FIG. 46 shows another modified implementation of the camera module 100. The module connecting side 331' of the connecting plate 33' may also be connected to the substrate front surface 311' of the substrate 31' via the connecting portion 34'.

Figure 47:
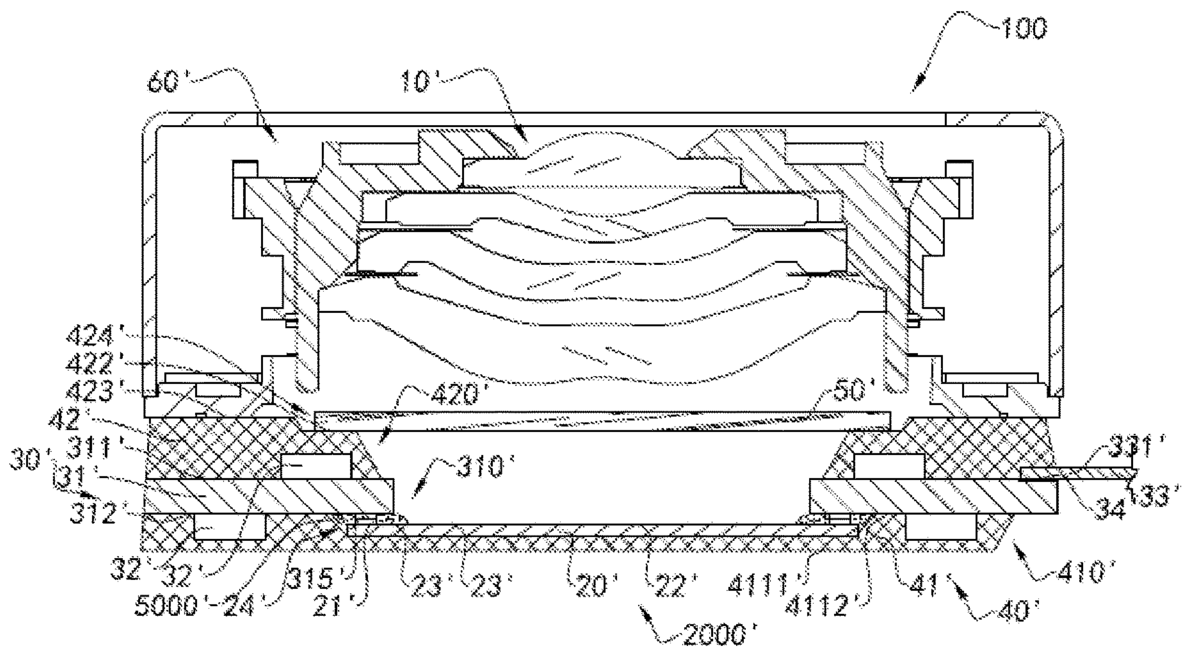
FIG. 47 is a schematic view of the internal structure cut along the intermediate position of another modified implementation of the camera module according to the above preferred embodiment of the present disclosure.

FIG. 47 shows another modified implementation of the camera module 100. The molded base 42' may also further include the module connecting side 331' of the connecting plate 33', that is, the molded base 42' can embed the attaching position of the module connecting side 331' of the connecting plate 33' and the substrate front surface 311' of the substrate 31', to avoid the module connecting side 331' of the connecting plate 33' from falling off from the substrate front surface 311' of the substrate 31'.

Figure 48:
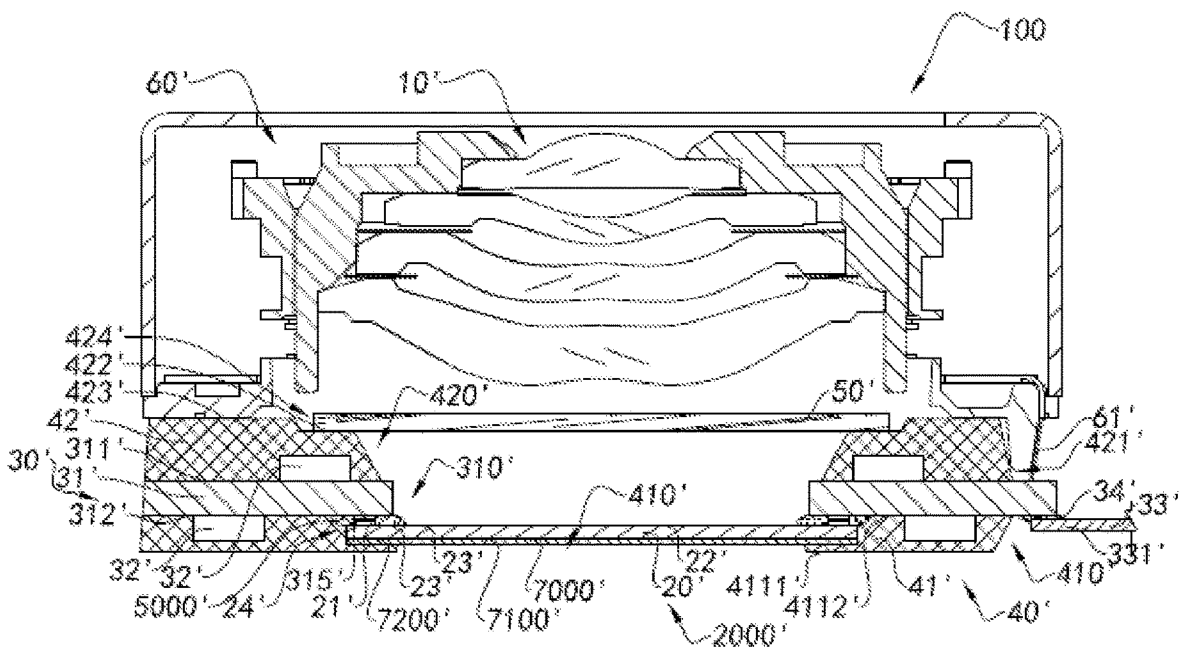
FIG. 48 is a schematic view of the internal structure cut along the intermediate position of another modified implementation of the camera module according to the above preferred embodiment of the present disclosure.

FIG. 48 shows another modified implementation of the camera module 100. The camera module 100 further includes at least one protective element 7000', wherein the protective element 7000' may be overlappedly disposed on the chip back surface 25' of the photosensitive element 20'; wherein the protective element 7000' has an exposed area 7100' and an embedded area 7200' surrounding around the exposed area 7100'; and wherein the back surface molded portion 41 embeds at least one part of the area of the substrate back surface 312' of the substrate 31' and the embedded area 7200' of the protective element 7000', so that the back surface molded portion 41', the substrate 31', the photosensitive element 20' and the protective element 7000' are integrally bonded. That is, the back surface molded portion 41' may be ring-shaped to form the assembling space 410' in the middle of the back surface molded portion 41', wherein the exposed area 7100' of the protective element 7000' corresponds to the assembling space 410' of the back surface molded portion 41'.

In one example of the camera module 100 of the present disclosure, the protective element 7000' may be but not limited to a layer of ink or a layer of a protective film for protecting the chip back surface 25' of the photosensitive element 20'. In another example of the camera module 100 of the present disclosure, the protective element 7000' may be implemented as a heat dissipating element. For example, the protective element 7000' may be implemented as, but not limited to an aluminum sheet, a copper sheet or the like, and it is overlappedly disposed on the chip back surface 25' of the photosensitive element 20. In this way, the heat generated by the photosensitive element 20' can be quickly transferred to the protective element 7000' and is heat dissipated by the protective element 7000', to ensure the reliability of the camera module 100 when used for a long time.

Figure 49:
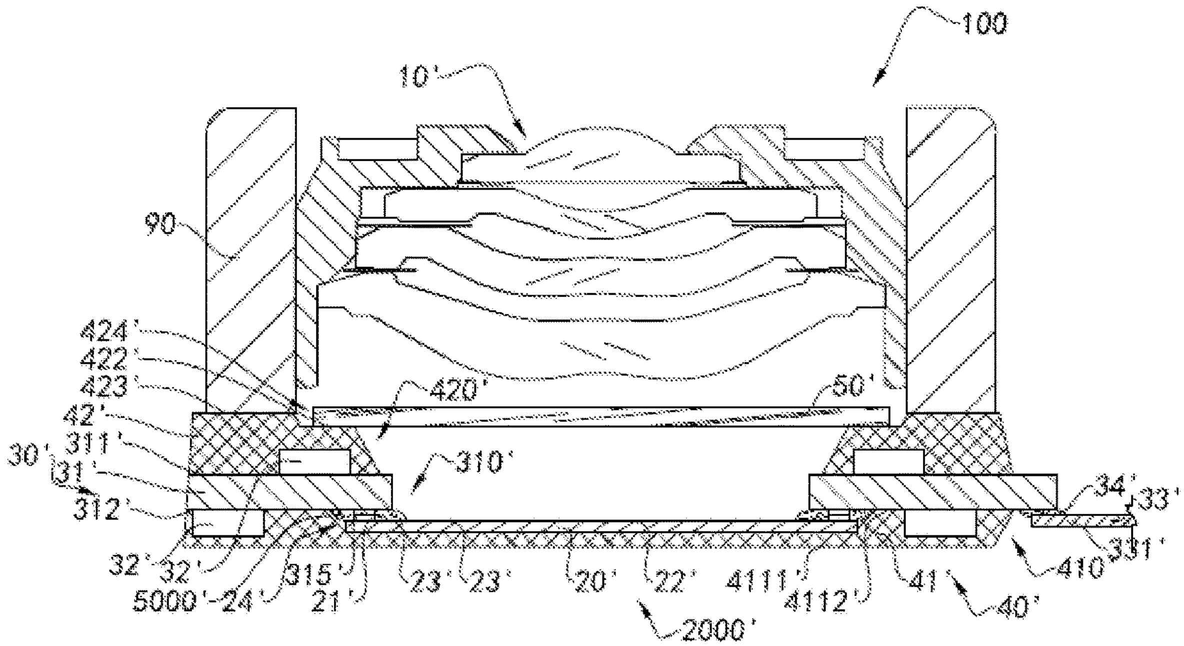
FIG. 49 is a schematic view of the internal structure cut along the intermediate position of another modified implementation of the camera module according to the above preferred embodiment of the present disclosure.

FIG. 49 shows another modified implementation of the camera module 100. The camera module 100 further includes at least one lens barrel 90', wherein the optical lens 10' is assembled to the lens barrel 90', and the lens barrel 90' is attached to the outer surface 423' of the molded base 42', so that the optical lens 10' is held by the lens barrel 90' in the photosensitive path of the photosensitive element 20'.

Figure 50:
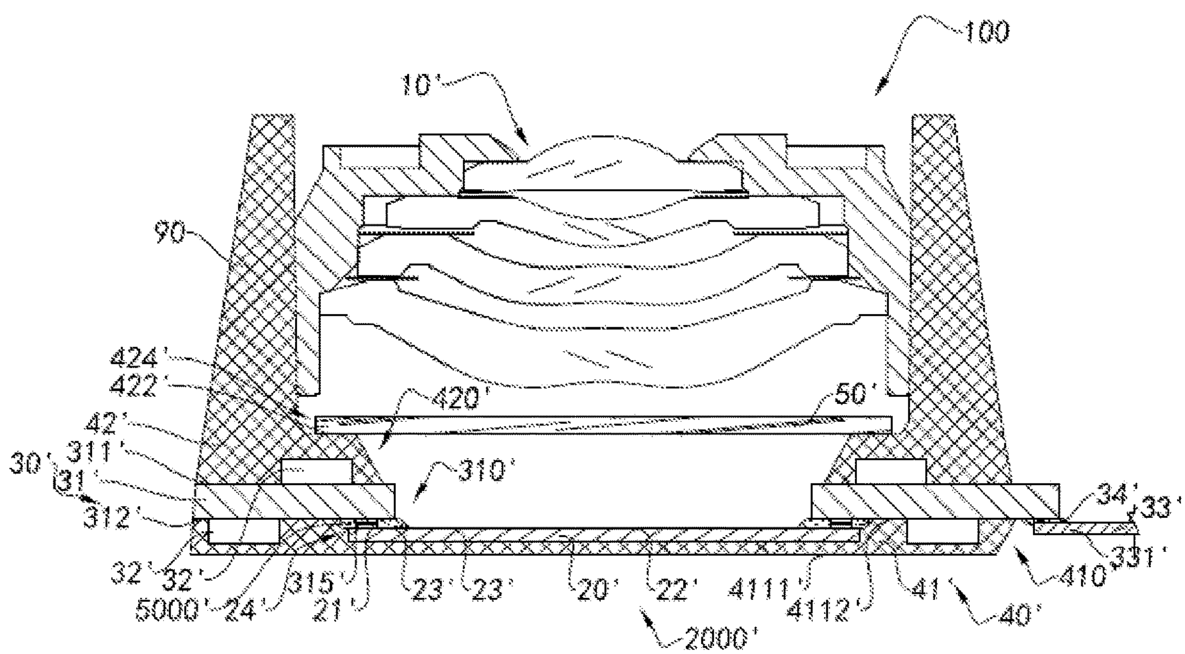
FIG. 50 is a schematic view of the internal structure cut along the intermediate position of another modified implementation of the camera module according to the above preferred embodiment of the present disclosure.

FIG. 50 shows another modified implementation of the camera module 100. The lens barrel 90' may be integrally extended to the top surface of the molded base 42', that is, the lens barrel 90' and the molded base 42' are integrally formed by a molding process.

Figure 51:
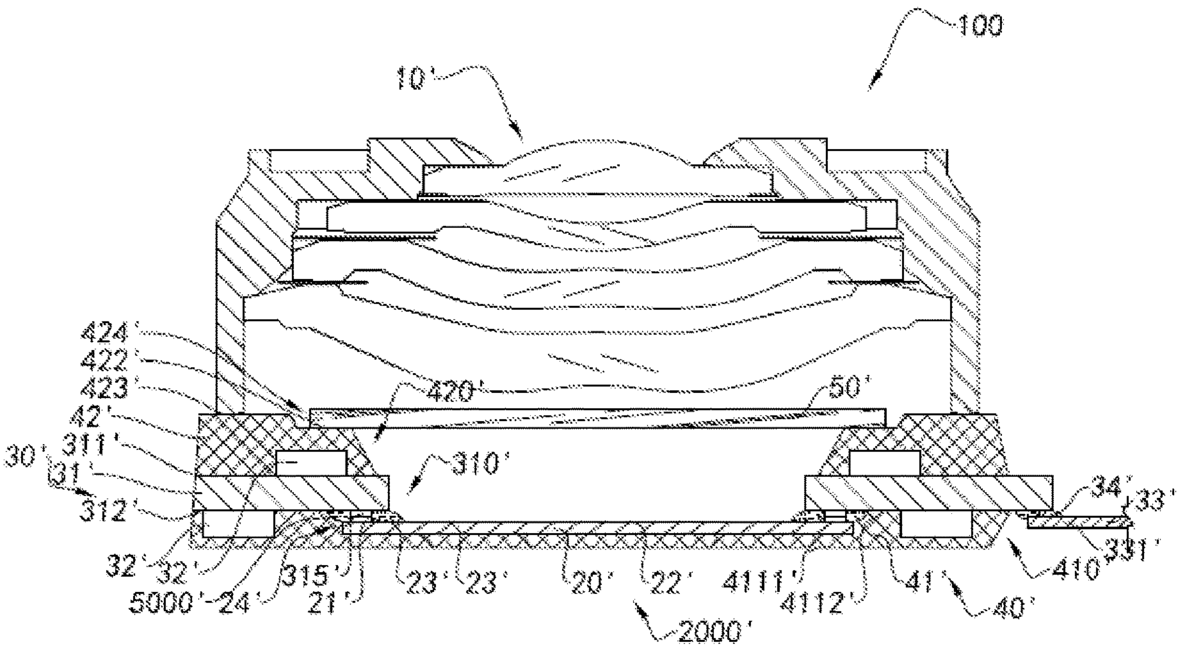
FIG. 51 is a schematic view of the internal structure cut along the intermediate position of another modified implementation of the camera module according to the above preferred embodiment of the present disclosure.

FIG. 51 shows another modified implementation of the camera module 100. The optical lens 10' may also be directly attached to the top surface of the molded base 42', so that the optical lens 10' is held in the photosensitive path of the photosensitive element 20'.

Figure 52:
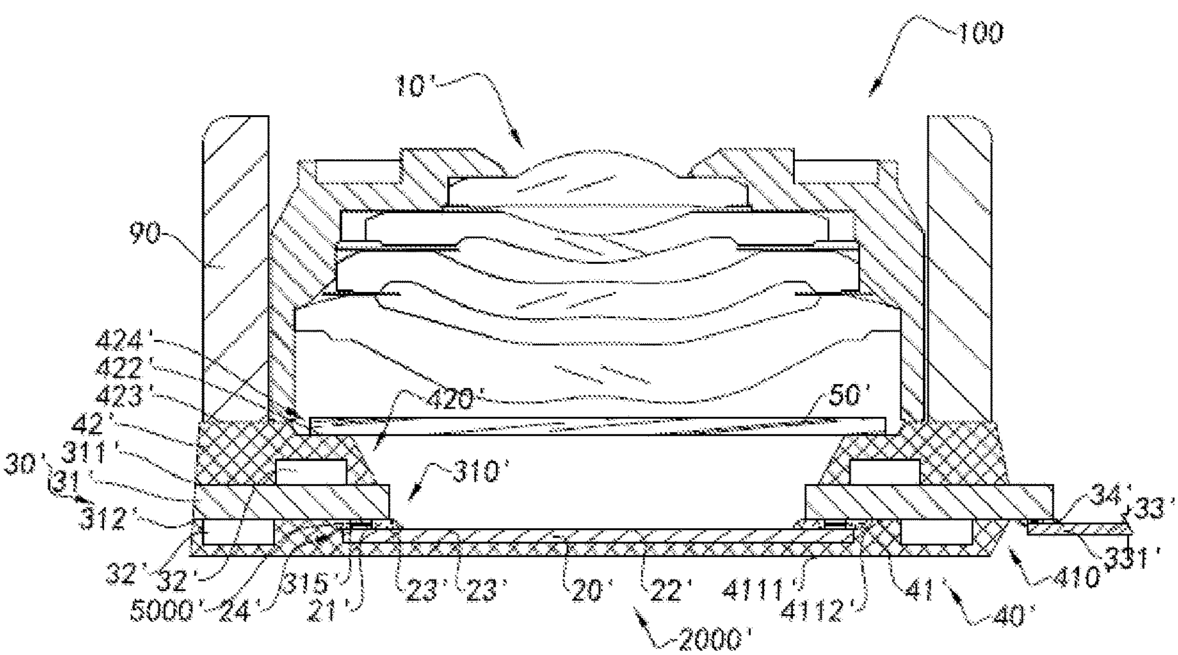
FIG. 52 is a schematic view of the internal structure cut along the intermediate position of another modified implementation of the camera module according to the above preferred embodiment of the present disclosure.

FIG. 52 shows another modified implementation of the camera module 100. After the optical lens 10' is attached to the top surface of the molded base 42', the lens barrel 90' may also be attached to the top surface of the molded base 42', so that the lens barrel 90' surrounds around the optical lens 10', thereby protecting the optical lens 10' by way of avoiding the optical lens 10' from being exposed. Nevertheless, it will be understood by those skilled in the art that the lens barrel 90' may also be integrally extended to the top surface of the molded base 42'.

Figure 53:
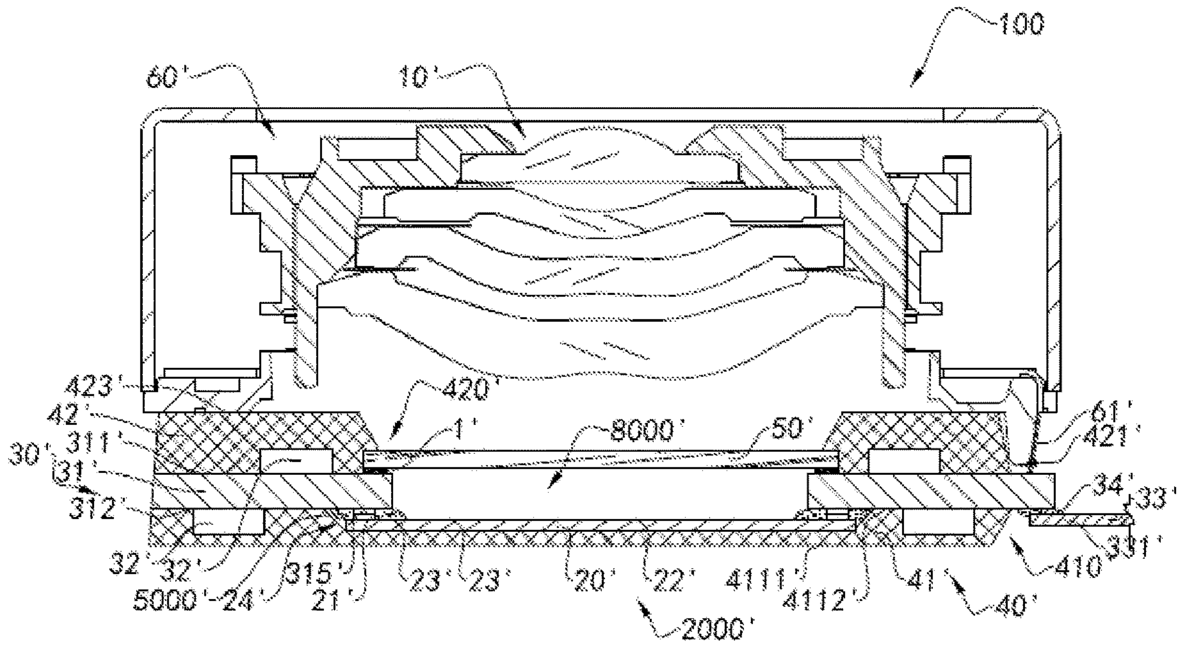
FIG. 53 is a schematic view of the internal structure cut along the intermediate position of another modified implementation of the camera module according to the above preferred embodiment of the present disclosure.

FIG. 53 shows another modified implementation of the camera module 100. Before the molding process, the filter element 50' may also be directly attached to the substrate front surface 311' of the substrate 31', to form a sealed space 8000' among the substrate 31', the photosensitive element 20' and the filter element 50' at a position corresponding to the substrate channel 310' of the substrate 31', wherein the photosensitive area 22' and a part of the non-photosensitive area 23' of the photosensitive element 20' are held in the sealed space 8000'. By this way, in a subsequent molding process, the fluid medium 400' can be avoided from contaminating the photosensitive area 22' of the photosensitive element 20', to improve the product yield of the camera module 100. Preferably, the molded base 42' embeds the outer edge of the filter element 50', so that the molded base 42', the filter element 50', the substrate 31', the photosensitive element 20' and the back surface molded portion 41' are integrally bonded.

Further, the camera module 100 further has a frame-shaped buffer portion 1', wherein the buffer portion 1' is disposed between the filter element 50' and the substrate front surface 311' of the substrate 31', and the buffer portion 1' is used for attaching the filter element 50' to the substrate front surface 311' of the substrate 31', and for isolating the filter element 50' from the substrate front surface 311' of the substrate 31'. Preferably, the buffer portion 1' has elasticity. It is worth mentioning that the way of forming the buffer portion 1' is not limited in the camera module 100 of the present disclosure. For example, it is possible that a substance such as but not limited to resin or glue is first applied on the substrate front surface 311' of the substrate 31', and then the filter element 50' is overlappedly disposed on the substrate front surface 311' of the substrate 31', so that the resin or glue applied on the substrate front surface 311' of the substrate 31' may form the buffer portion 1' held between the filter element 50' and the substrate front surface 311' of the substrate 31'. It will be understood by those skilled in the art that, it is also possible that the buffer portion 1' is first formed on the filter element 50', and then the filter element 50' is attached to the substrate front surface 311' of the substrate 31', so that the buffer portion 1' is held between the filter element 50' and the substrate front surface 311' of the substrate 31'.

Figure 54:
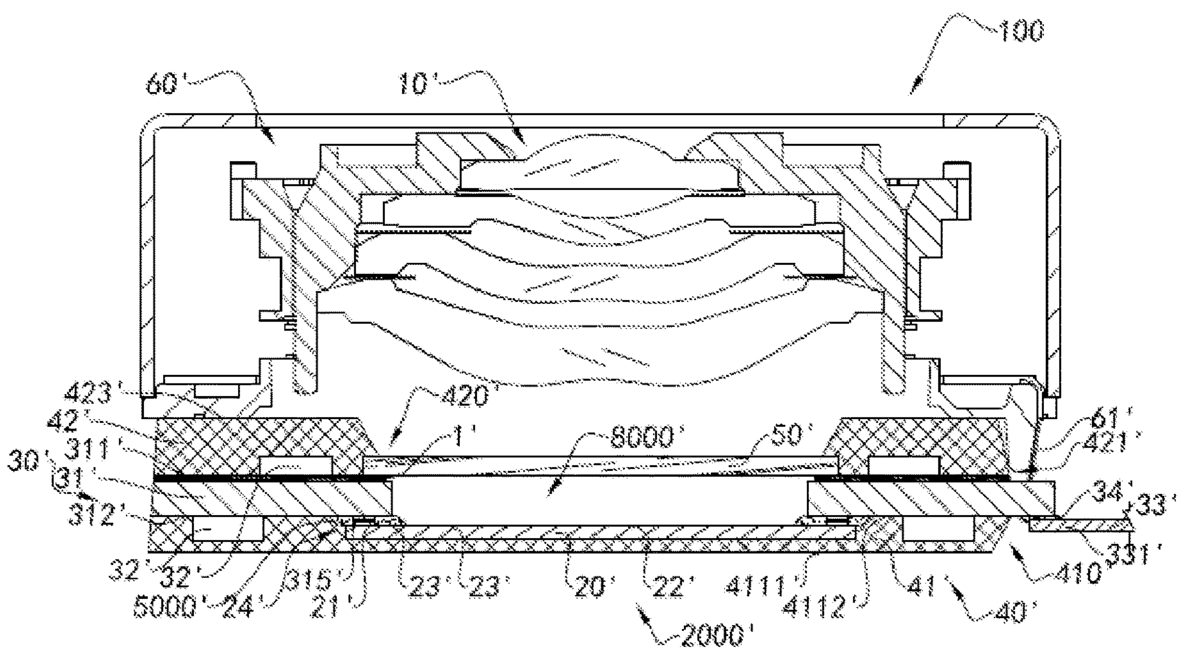
FIG. 54 is a schematic view of the internal structure cut along the intermediate position of another modified implementation of the camera module according to the above preferred embodiment of the present disclosure.

FIG. 54 shows another modified implementation of the camera module 100. The buffer portion 1' may also overlappedly cover at least one part of the area of the substrate front surface 311' of the substrate 31', so that after the molded base 42' is formed, the buffer portion 1' can be held between the molded base 42' and the substrate front surface 311' of the substrate 31'. For example, in one embodiment of the present disclosure, it is possible that the substance such as resin or glue is applied to at least one part of the area of the substrate front surface 311' of the substrate 31', to form the buffer portion 1' overlapped on the at least one part of the area of the substrate front surface 311' of the substrate 31', and then the filter element 50' is attached, so that a part of the buffer portion 1' is held between the filter element 50' and the substrate front surface 311' of the substrate 31', wherein the buffer portion 1' prevents a gap from forming between the filter element 50' and the substrate front surface 311' of the substrate 31', so that the sealed space 8000 is formed among the substrate 31', the photosensitive element 20' and the filter element 50'. The buffer portion 1' overlappedly formed on the substrate front surface 311' of the substrate 31' can protect the substrate front surface 311' of the substrate 31' in the molding process, and in a subsequent baking process, the buffer portion 1' can also compensate for a difference of a deformation magnitude of the molded base 42' and a deformation magnitude of the substrate 31' by way of deformation, to ensure the reliability of the camera module 100.

Figure 55:
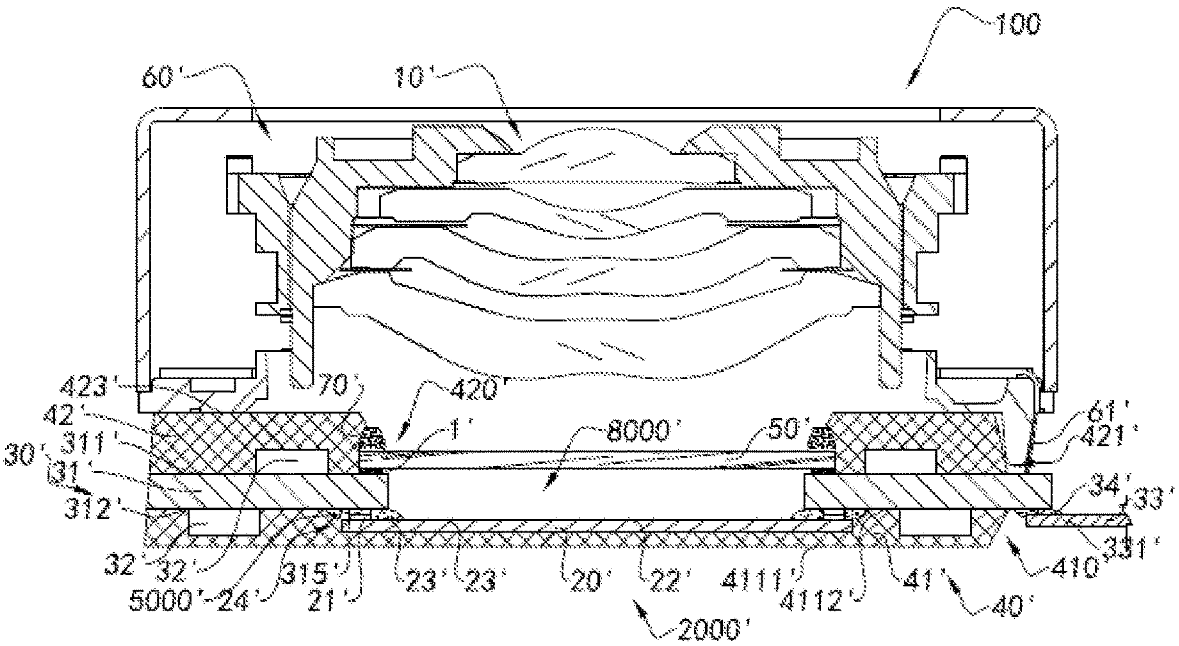
FIG. 55 is a schematic view of the internal structure cut along the intermediate position of another modified implementation of the camera module according to the above preferred embodiment of the present disclosure.

FIG. 55 shows another modified implementation of the camera module 100. The support element 70' may also be formed in the outer edge of the filter element 50', so that after the molding process is completed, the molded base 42' embeds at least one part of the support element 70'.

Figure 56:
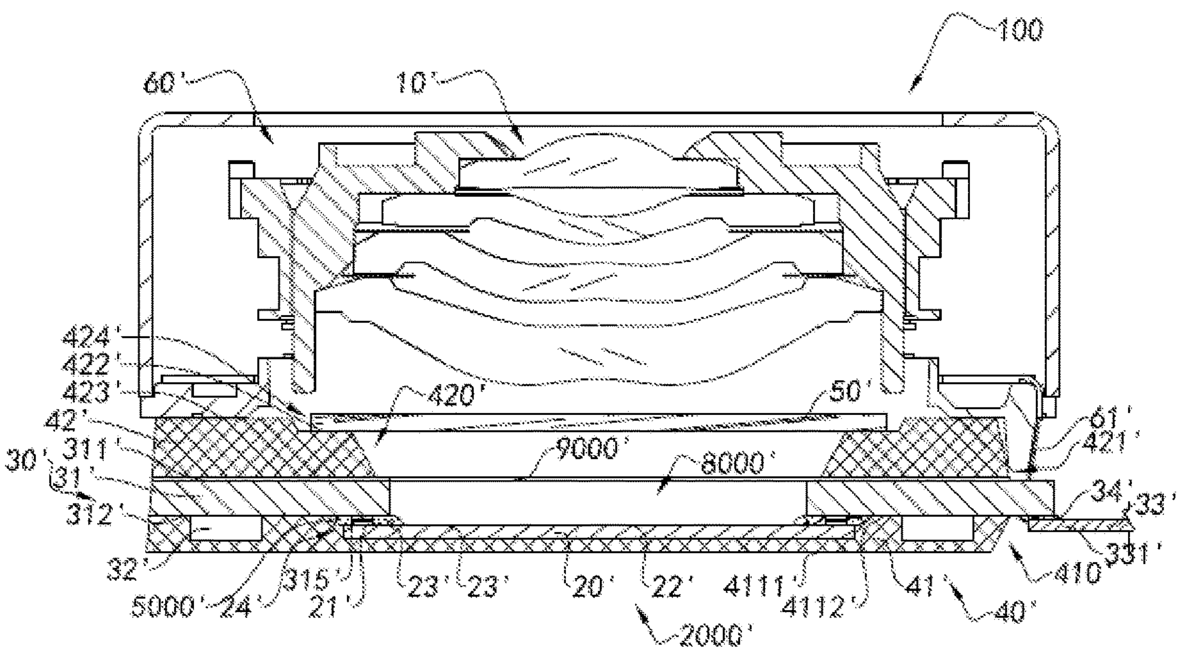
FIG. 56 is a schematic view of the internal structure cut along the intermediate position of another modified implementation of the camera module according to the above preferred embodiment of the present disclosure.

FIG. 56 shows another modified implementation of the camera module 100. The camera module 100 further includes a transparent protective element 9000', and before the molding process, the protective element 9000' is overlappedly disposed on the substrate front surface 311' of the substrate 31', to avoid the substrate front surface 311' of the substrate 31' from being exposed. For example, after the substrate 31' is provided or made, the transparent protective element 9000' is overlappedly disposed on the substrate front surface 311' of the substrate 31'. For example, the protective element 9000' may be but not limited to a transparent film.

When the photosensitive element 20' is attached to the substrate back surface 312' of the substrate 31', a sealed space 8000' is formed among the substrate 31', the photosensitive element 20' and the protective element 9000' at the position corresponding to the substrate channel 310' of the substrate 31', and the photosensitive area 22' and a part of the non-photosensitive area 23' of the photosensitive element 20' are located in the sealed space 8000', to avoid the photosensitive area 22' of the photosensitive element 20' from being contaminated in the subsequent molding process.

Further, the protective element 9000' may also protect the substrate front surface 311' of the substrate 31' from being scratched, thereby ensuring the good electrical properties of the substrate 31', to facilitate improving the product yield of the camera module 100.

Figure 57:
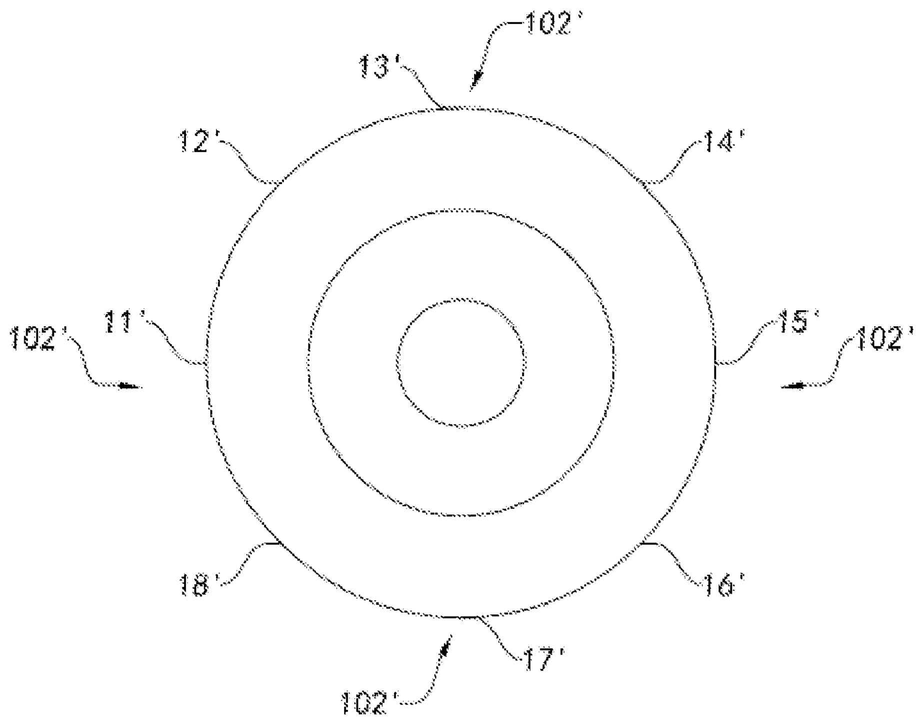
FIG. 57 is a schematic top view of an implementation of an optical lens of the camera module according to the above preferred embodiment of the present disclosure.

FIG. 57 shows a top view state of one implementation of the optical lens 10' of the camera module 100, wherein the top view state of the optical lens 10' has a circular shape. Specifically, the optical lens 10' has a first lens side surface 11', a second lens side surface 12', a third lens side surface 13', a fourth lens side surface 14', a fifth lens side surface 15', a sixth lens side surface 16', a seventh lens side surface 17' and an eighth lens side surface 18', wherein in this example of the optical lens 10' shown in FIG. 57, the first lens side surface 11', the second lens side surface 12', the third lens side surface 13', the fourth lens side surface 14', the fifth lens side surface 15', the sixth lens side surface 16', the seventh lens side surface 17' and the eighth lens side surface 18' are each an arc surface, and are each connected end to end to form a circle. Moreover, the optical lens 10' forms respectively an arc surface side 102' at the corresponding positions of the first lens side surface 11' and the second lens side surface 12', at the corresponding positions of the third lens side surface 13' and the fourth lens side surface 14', at the corresponding positions of the fifth lens side surface 15' and the sixth lens side surface 16', and at the corresponding positions of the seventh lens side surface 17' and the eighth lens side surface 18', respectively. That is, the optical lens 10' has four arc surface sides 102'.

Figure 58:
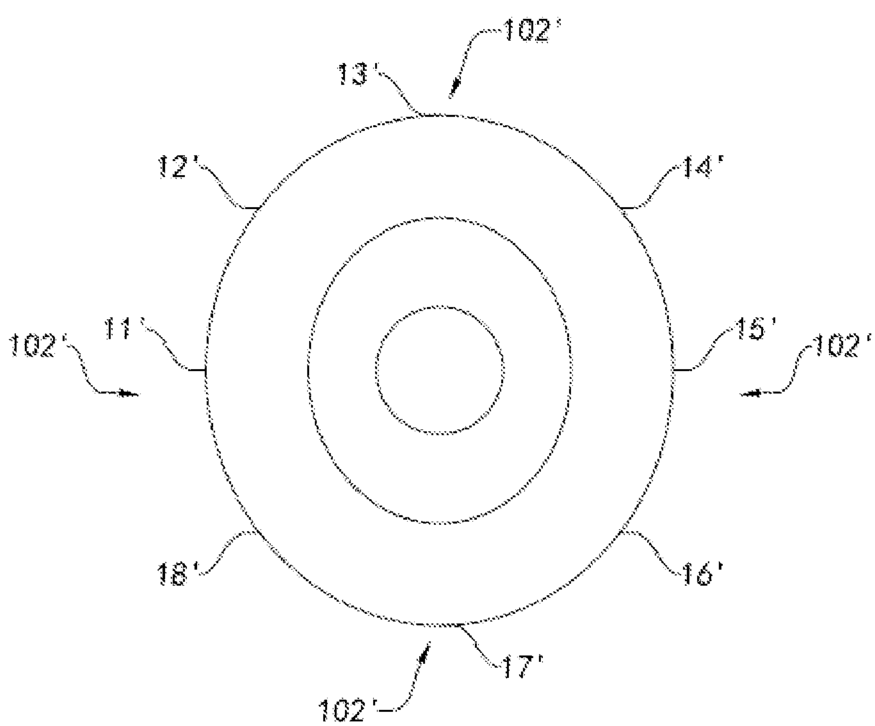
FIG. 58 is a schematic top view of another modified implementation of the optical lens of the camera module according to the above preferred embodiment of the present disclosure.

FIG. 58 shows a top view state of a modified implementation of the optical lens 10' of the camera module 100, wherein the first lens side surface 11', the second lens side surface 12', the third lens side surface 13', the fourth lens side surface 14', the fifth lens side surface 15', the sixth lens side surface 16', the seventh lens side surface 17' and the eighth lens side surface 18' are each an arc surface, and are each connected end to end to form an oval shape. Moreover, the optical lens 10' forms respectively an arc surface side 102' at the corresponding positions of the first lens side surface 11' and the second lens side surface 12', at the corresponding positions of the third lens side surface 13' and the fourth lens side surface 14', at the corresponding positions of the fifth lens side surface 15' and the sixth lens side surface 16', and at the corresponding positions of the seventh lens side surface 17' and the eighth lens side surface 18', respectively. That is, the optical lens 10' has four arc surface sides 102'.

Figure 59:
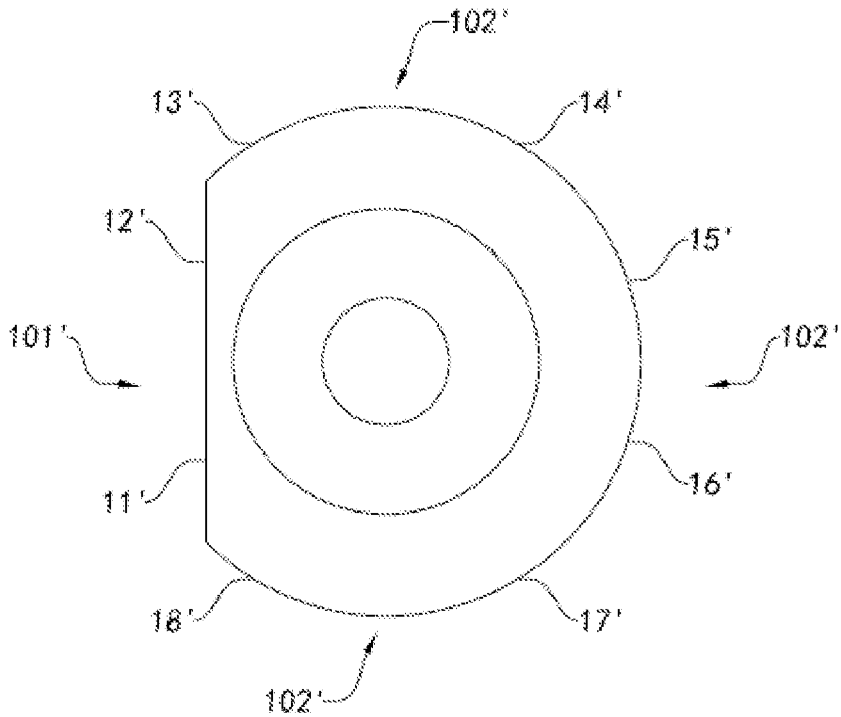
FIG. 59 is a schematic top view of another modified implementation of the optical lens of the camera module according to the above preferred embodiment of the present disclosure.

FIG. 59 shows a top view state of a modified implementation of the optical lens 10' of the camera module 100, wherein the first lens side surface 11' and the second lens side surface 12' are each a planar surface, and the plane where the first lens side surface 11' is located and the plane where the second lens side surface 12' is located are the same plane, so that the optical lens 10' forms a planar surface side 101' at the corresponding positions of the first lens side surface 11' and the second lens side surface 12'; and wherein the third lens side surface 13', the fourth lens side surface 14', the fifth lens side surface 15', the sixth lens side surface 16', the seventh lens side surface 17' and the eighth lens side surface 18' are each an arc surface, so that the optical lens 10' forms respectively an arc surface side 102' at the corresponding positions of the third lens side surface 13' and the fourth lens side surface 14', at the corresponding positions of the fifth lens side surface 15' and the sixth lens side surface 16', and at the corresponding positions of the seventh lens side surface 17' and the eighth lens side surface 18'. That is, the optical lens 10' has one planar surface side 101' and three arc surface sides 102'.

Figure 60:
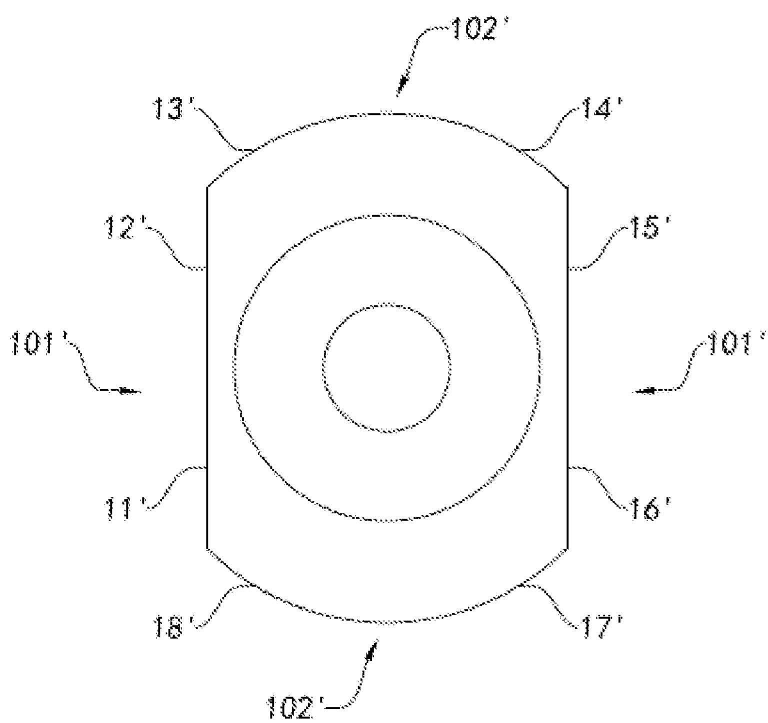
FIG. 60 is a schematic top view of another modified implementation of the optical lens of the camera module according to the above preferred embodiment of the present disclosure.

FIG. 60 shows a top view state of another modified implementation of the optical lens 10' of the camera module 100, wherein the first lens side surface 11' and the second lens side surface 12' are each a planar surface, and the plane where the first lens side surface 11' is located and the plane where the second lens side surface 12' is located are the same plane, so that the optical lens 10' forms a planar surface side 101' at the corresponding positions of the first lens side surface 11' and the second lens side surface 12'; wherein the fifth lens side surface 15' and the sixth lens side surface 16' are each a planar surface, and the plane where the fifth lens side surface 15' is located and the plane where the sixth lens side surface 16' is located are the same plane, so that the optical lens 10' forms a planar surface side 101' at the corresponding positions of the fifth lens side surface 15' and the sixth lens side surface 16'; and wherein the third lens side surface 13', the fourth lens side surface 14', the seventh lens side surface 17' and the eighth lens side surface 18' are each an arc surface, so that the optical lens 10' forms an arc surface side 102' at the corresponding positions of the third lens side surface 13' and the fourth lens side surface 14', and forms an arc surface side 102' at the corresponding positions of the seventh lens side surface 17' and the eighth lens side surface 18'. That is, the optical lens 10' has two planar surface sides 101' and two arc surface sides 102', and the two planar surface sides 101' of the optical lens 10' are symmetrical to each other, the two arc surface sides 102' are symmetrical to each other.

Figure 61:
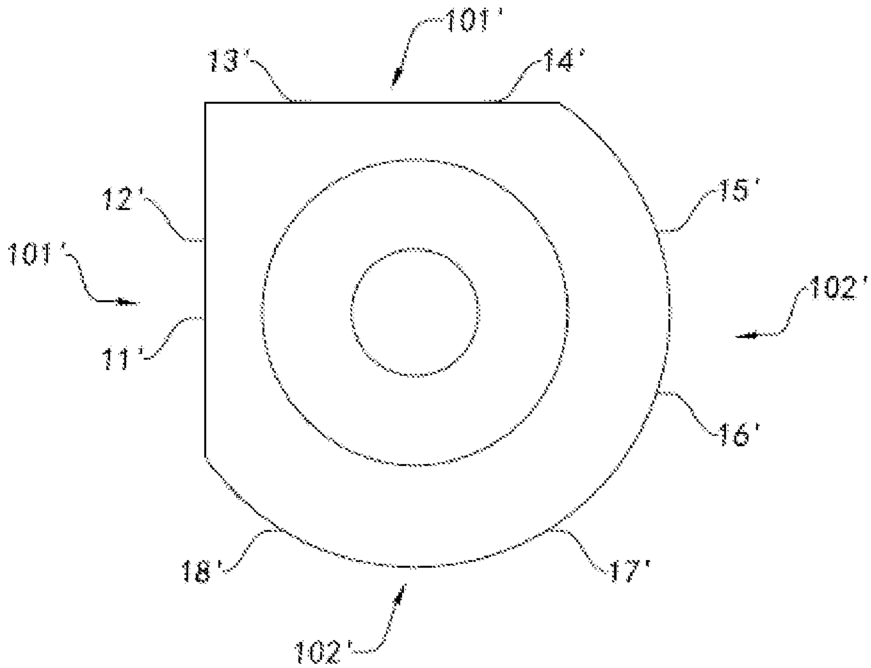
FIG. 61 is a schematic top view of another modified implementation of the optical lens of the camera module according to the above preferred embodiment of the present disclosure.

FIG. 61 shows a top view state of another modified implementation of the optical lens 10' of the camera module 100, wherein the first lens side surface 11', the second lens side surface 12', the third lens side surface 13', and the fourth lens side surface 14' are each a planar surface, and the plane where the first lens side surface 11' is located and the plane where the second lens side surface 12' is located are the same plane, and the plane where the third lens side surface 13' is located and the plane where the fourth lens side surface 14' is located are the same plane, so that the optical lens 10' forms respectively a planar surface side 101' at the corresponding positions of the first lens side surface 11' and the second lens side surface 12', and at the corresponding positions of the third lens side surface 13' and the fourth lens side surface 14', and the second lens side surface 12' and the third lens side surface 13' are perpendicular to each other; and wherein the fifth lens side surface 15', the sixth lens side surface 16', the seventh lens side surface 17' and the eighth lens side surface 18' are each an arc surface, so that the optical lens 10' forms an arc surface side 102' at the corresponding positions of the third lens side surface 13' and the fourth lens side surface 14', and forms an arc surface side 102' at the corresponding positions of the seventh lens side surface 17' and the eighth lens side surface 18'. That is, the optical lens 10' has two planar surface sides 101' and two arc surface sides 102', and the two planar surface sides 101' are adjacent, and the two arc surface sides 102' are adjacent.

Figure 62:
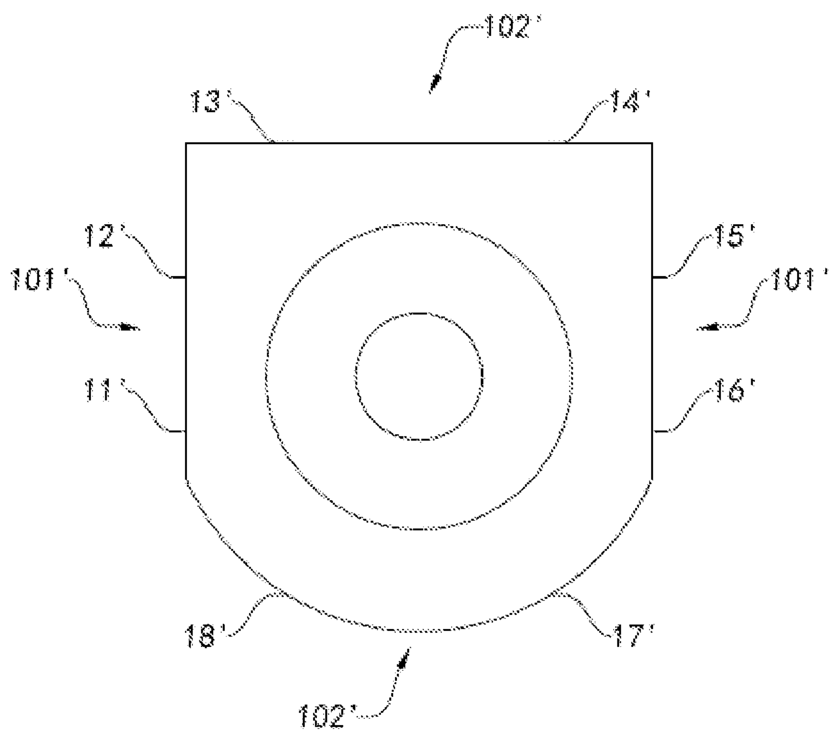
FIG. 62 is a schematic top view of another modified implementation of the optical lens of the camera module according to the above preferred embodiment of the present disclosure.

FIG. 62 shows a top view state of another modified implementation of the optical lens 10' of the camera module 100, wherein the first lens side surface 11', the second lens side surface 12', the third lens side surface 13', the fourth lens side surface 14', the fifth lens side surface 15', and the sixth lens side surface 16' are each a planar surface, and the plane where the first lens side surface 11' is located and the plane where the second lens side surface 12' is located are the same plane, the plane where the third lens side surface 13' is located and the plane where the fourth lens side surface 14' is located are the same plane, and the plane where the fifth lens side surface 15' is located and the plane where the sixth lens side surface 16' is located are the same plane; wherein the second lens side surface 12' is perpendicular to the third lens side surface 13', and the fourth lens side surface 14' is perpendicular to the fifth lens side surface 15', so that the optical lens 10' forms respectively a planar surface side 101' at the corresponding positions of the first lens side surface 11' and the second lens side surface 12', at the corresponding positions of the third lens side surface 13' and the fourth lens side surface 14', and at the corresponding positions of the fifth lens side surface 15' and the sixth lens side surface 16'; and wherein the seventh lens side surface 17' and the eighth lens side surface 18' are each an arc surface, so that the optical lens 10' forms an arc surface side 102' at the corresponding positions of the seventh lens side surface 17' and the eighth lens side surface 18'. That is, the optical lens 10' has three planar surface sides 101' and one arc surface side 102'.

Figure 63:
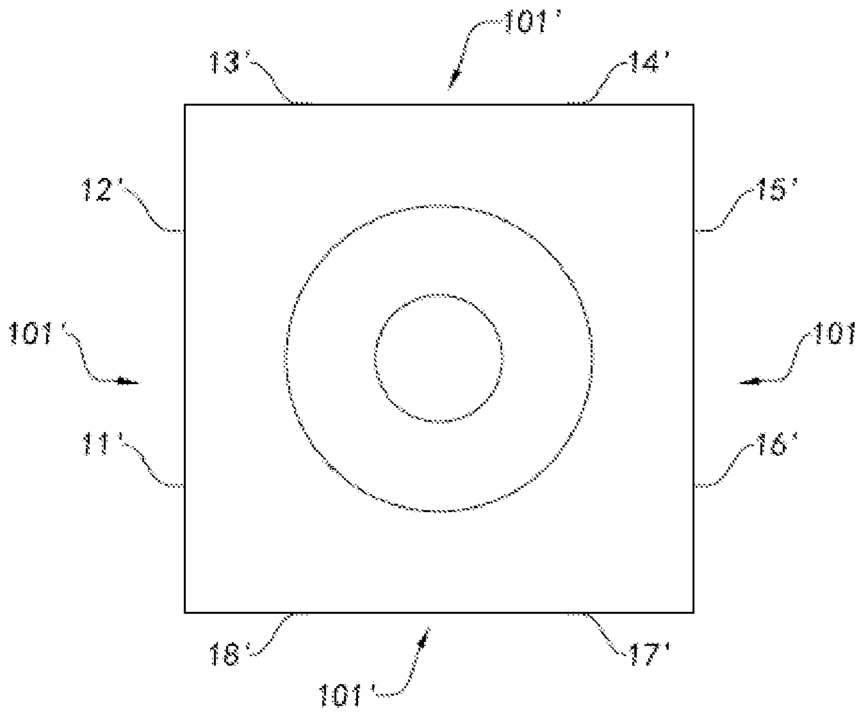
FIG. 63 is a schematic top view of another modified implementation of the optical lens of the camera module according to the above preferred embodiment of the present disclosure.

FIG. 63 shows a top view state of another modified implementation of the optical lens 10' of the camera module 100, wherein the first lens side surface 11', the second lens side surface 12', the third lens side surface 13', the fourth lens side surface 14', the fifth lens side surface 15', the sixth lens side surface 16', the seventh lens side surface 17' and the eighth lens side surface 18' are each a planar surface, and the plane where the first lens side surface 11' is located and the plane where the second lens side surface 12' is located are the same plane, the plane where the third lens side surface 13' is located and the plane where the fourth lens side surface 14' is located are the same plane, the plane where the fifth lens side surface 15' is located and the plane where the sixth lens side surface 16' is located are the same plane, and the plane where the seventh lens side surface 17' is located and the plane where the eighth lens side surface 18' is located are the same plane; wherein the second lens side surface 12' is perpendicular to the third lens side surface 13', the fourth lens side surface 14' is perpendicular to the fifth lens side surface 15', the sixth lens side surface 16' is perpendicular to the seventh lens side surface 17', and the eighth lens side surface 18' is perpendicular to the first lens side surface 11', so that the optical lens 10' forms respectively a planar surface side 101' at the corresponding positions of the first lens side surface 11' and the second lens side surface 12', at the corresponding positions of the third lens side surface 13' and the fourth lens side surface 14', at the corresponding positions of the fifth lens side surface 15' and the sixth lens side surface 16', and at the corresponding positions of the seventh lens side surface 17' and the eighth lens side surface 18'. That is, the optical lens 10' has four planar surface sides 101'.

Figure 64:
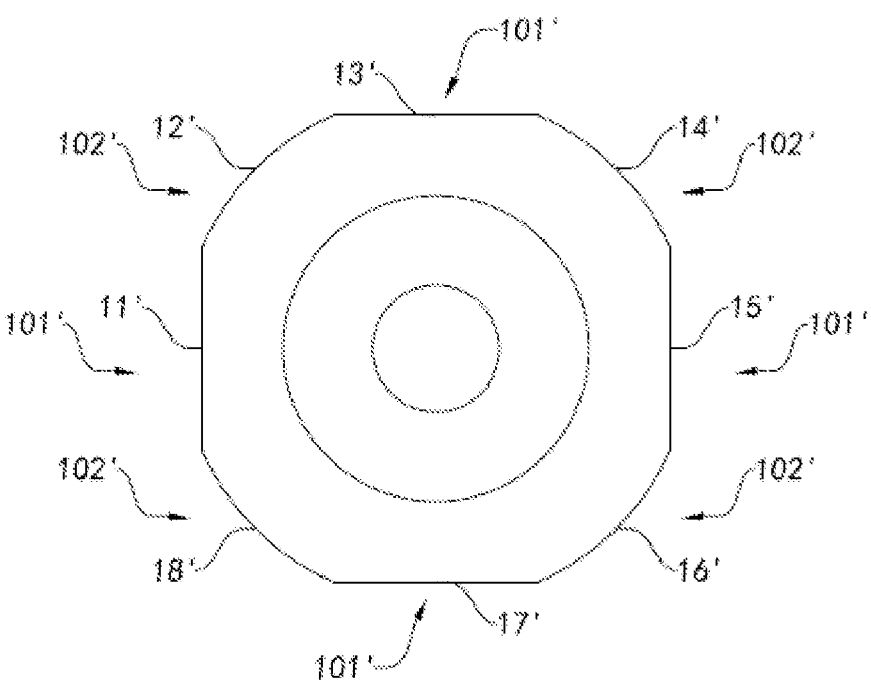
FIG. 64 is a schematic top view of another modified implementation of the optical lens of the camera module according to the above preferred embodiment of the present disclosure.

FIG. 64 shows a top view state of another modified implementation of the optical lens 10' of the camera module 100, wherein the first lens side surface 11', the third lens side surface 13', the fifth lens side surface 15', and the seventh lens side surface 17' are each a planar surface, so that the optical lens 10' forms respectively a planar surface side 101' at the corresponding positions of the first lens side surface 11', the third lens side surface 13', the fifth lens side surface 15', and the seventh lens side surface 17', and the first lens side surface 11' and the fifth lens side surface 15' are symmetrical to each other, and the third lens side surface 13' and the seventh lens side surface 17' are symmetrical to each other; and wherein the second lens side surface 12', the fourth lens side surface 14', the sixth lens side surface 16', and the eighth lens side surface 18' are each an arc surface, so that the optical lens 10' forms respectively an arc surface side 102' at the corresponding positions of the second lens side surface 12', the fourth lens side surface 14', the sixth lens side surface 16', and the eighth lens side surface 18', the second lens side surface 12' and the sixth lens side surface 16' are symmetrical to each other, and the fourth lens side surface 14' and the eighth lens side surface 18' are symmetrical to each other. That is, the optical lens 10' has four planar surface sides 101' and four arc surface sides 102', and each of the planar surface sides 101' and each of the arc surface sides 102' are at intervals. In other words, there is one arc surface side 102' between adjacent planar surface sides 101' and there is one planar surface side 101' between adjacent arc surface sides 102'.

With reference to FIGS. 65 to 77 in the accompanying drawings of the present disclosure, an array camera module 100A according to a preferred embodiment of the present disclosure and an application of the array camera module 100A are set forth in the following description, wherein at least one array camera module 100A can be assembled on a device body 200A, so that the device body 200A and the at least one array camera module 100A disposed in the device body 200A form an electronic device with reference to FIG. 77.

In other words, the electronic device includes the device body 200A and the at least one array camera module 100A disposed in the device body 200A, wherein the array camera module 100A is used to obtain a photographed product (e.g. a video or an image).

Figure 77:
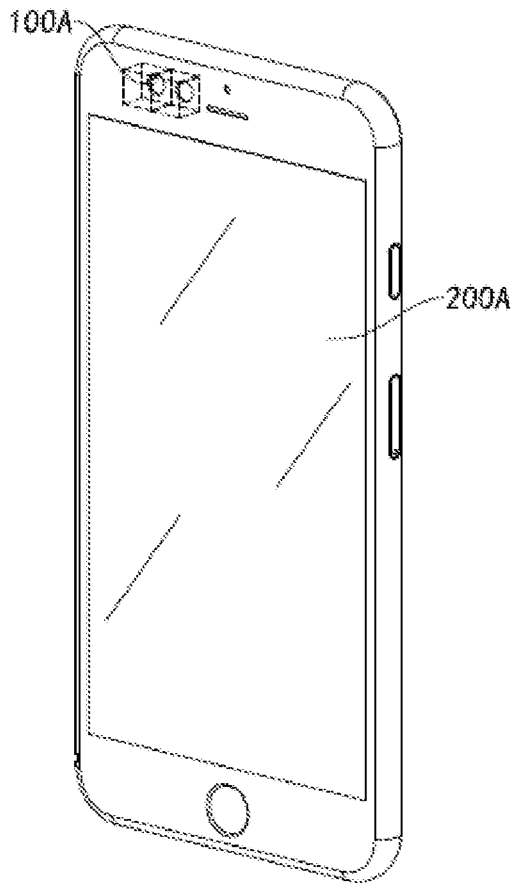
FIG. 77 is a schematic view of an application state of the camera module according to the above preferred embodiment of the present disclosure.

It is worth mentioning that, although in an example of the electronic device shown in FIG. 77, the array camera module 100A is disposed on the back side of the device body 200A (a side facing away from the display screen of the device body 200A), it will be understood that the array camera module 100A may also be disposed on the front side (the side where the display screen of the device body 200A is located) of the device body 200A, or at least one array camera module 100A is disposed on the back side of the device body 200A and at least one array camera module 100A is disposed on the front side of the device body 200A, that is, the front side and the back side of the device body 200A are each provided with at least one array camera module 100A. Nevertheless, it will be understood by those skilled in the art that in other examples of the electronic device, it is also possible that one or more array camera module 100A is disposed on the side surface of the device body 200A.

It is also worth mentioning that, although in the example of the electronic device shown in FIG. 77, the array camera module 100A is implemented as a dual-lens camera module, in other examples, the array camera module 100A may also be implemented as but not limited to, a three-lens camera module, a four-lens camera module or a camera module with more lenses. Further, although in the example of the electronic device shown in FIG. 77, the length direction of the array camera module 100A is consistent with the width direction of the device body 200A, it will be understood that, in other examples of the electronic device, the length direction of the array camera module 100A may also be consistent with the length direction of the device body 200A, and the electronic device of the present disclosure is not limited in this regard.

Further, although the device body 200A of the electronic device shown in FIG. 77 is a smart phone, in other examples, the device body 200A may also be implemented as but not limited to, a tablet, a electronic book, an MP3/4/5, a personal digital assistant, a camera, a television set, a washing machine, a refrigerator, or any electronic product that can be configured with the array camera module 100A.

Figure 75:
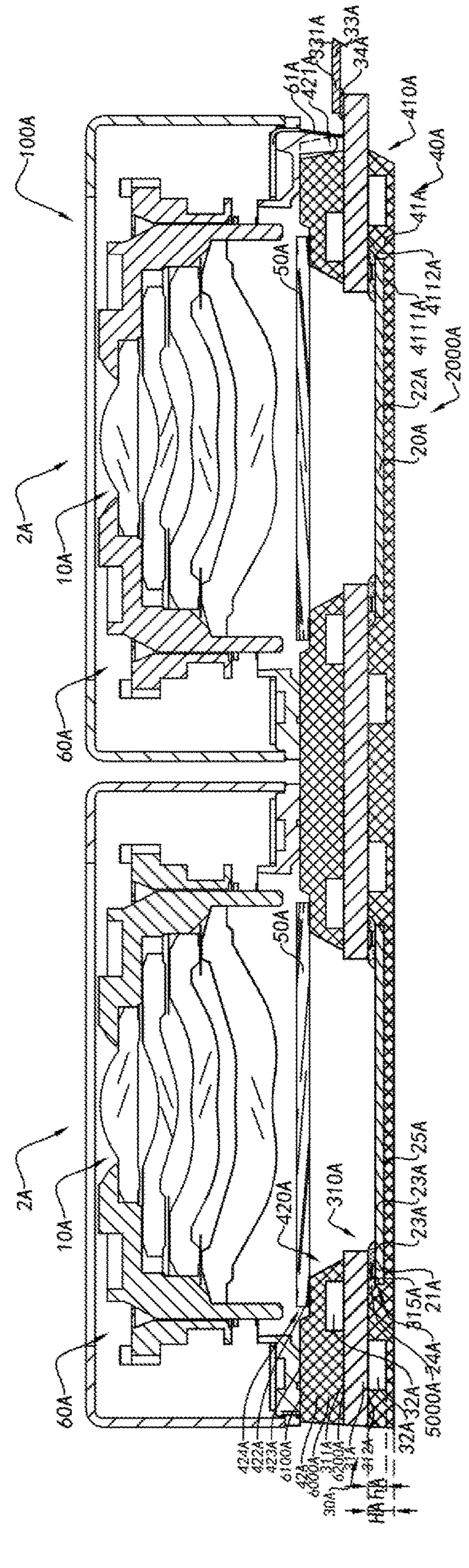
FIG. 75 is a schematic view of the internal structure cut along the intermediate position of the camera module according to the above preferred embodiment of the present disclosure.
Figure 76:
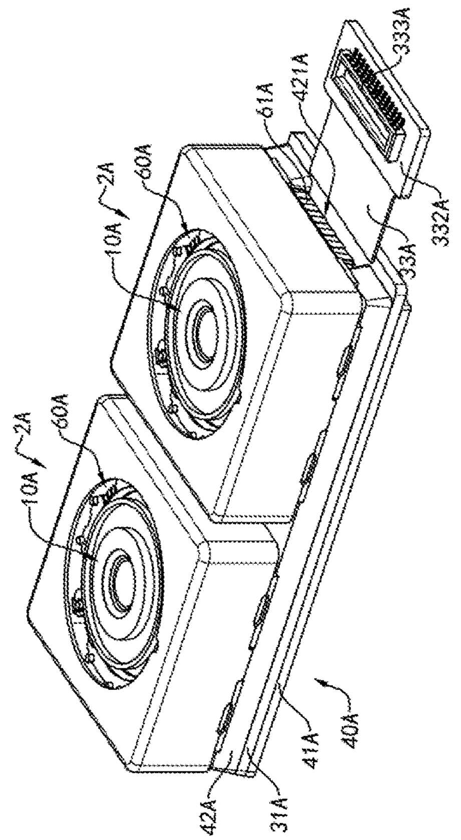
FIG. 76 is a perspective schematic view of the camera module according to the above preferred embodiment of the present disclosure.

With reference to FIGS. 75 and 76 in the accompanying drawings of the present disclosure, the array camera module 100A includes at least two optical lenses 10A, at least two photosensitive elements 20A and at least one circuit board 30A, wherein each of the photosensitive elements 20A is conductively connected to the circuit board 30A, respectively, and each of the optical lenses 10A is held in a photosensitive path of each of the photosensitive elements 20A, respectively.

Light reflected by an object enters the interior of the array camera module 100A from each of the optical lenses 10A, respectively, and then is received by each of the photosensitive elements 20A, respectively, and forms an image by photoelectric conversion. An electrical signal associated with the image of the object obtained by photoelectric conversion of each of the photosensitive elements 20A can be transmitted by the circuit board 30A. For example, the circuit board 30A may transmit the electric signal associated with the image of the object to the device body 200A connected to the circuit board 30A. That is, the circuit board 30A can be conductively connected to the device body 200A to assemble the array camera module 100A to the device body 200A to form the electronic device.

It will be understood that one photosensitive element 20A and one optical lens 10A held in the photosensitive path of the photosensitive element 20A may form one imaging unit 2A. That is, the array camera module 100A includes at least two imaging units 2A, wherein each of the imaging units 2A is capable of imaging separately.

With continued reference to FIG. 75, the circuit board 30A further includes at least one substrate 31A and at least one electronic component 32A, wherein each of the electronic components 32A is conductively connected to a substrate 31A, respectively. In the following description, a case where the circuit board 30A includes one substrate 31A is taken as an example to continue to set forth the features of the array camera module 100A of the present disclosure. Nevertheless, it will be understood by those skilled in the art that, in other examples of the array camera module 100A, the circuit board 30A may also include two or more than two substrates 31A.

Specifically, the substrate 31A has a substrate front substrate 311A, a substrate back surface 312A and at least one substrate channel 310A, wherein the substrate front surface 311A and the substrate back surface 312A correspond to each other, and each of the substrate channels 310A extends from the substrate front surface 311A to the substrate back surface 312A of the substrate 31A, respectively. That is, each of the substrate channels 310A can communicate with the substrate front surface 311A and the substrate back surface 312A of the substrate 31A. In other words, each of the substrate channels 310A is implemented as a perforation, so that each of the substrate channels 310A can communicate with the substrate front surface 311A and the substrate back surface 312A of the substrate 31A. Preferably, each of the substrate channels 310A is disposed at intervals in the substrate 31A. Optionally, the substrate 31A may also have one substrate channel 310A.

In general, the substrate 31A is plate-like, and the substrate front surface 311A and the substrate back surface 312A of the substrate 31A are parallel to each other, so that a distance between the substrate front surface 311A and the substrate back surface 312A of the substrate 31A can be used to define the thickness of the substrate 31A. Nevertheless, it will be understood by those skilled in the art that in other examples of the array camera module 100A of the present disclosure, at least one of the substrate front surface 311A and the substrate back surface 312A of the substrate 31A may be provided with a raised structure or a groove, and the array camera module 100A of the present disclosure is not limited in this regard.

In addition, the substrate channel 310A of the substrate 31A is generally square-shaped, e.g. square or rectangular. However, it will be understood by those skilled in the art that in other examples of the array camera module 100A, the substrate channel 310A of the substrate 31A may also have any other possible shape, such as but not limited to a circular shape. Nevertheless, in order to reduce the length and width sizes of the array camera module 100A, the shape and size of the substrate channel 310A of the substrate 31A are set to correspond to the shape and size of the photosensitive element 20A.

It is worth mentioning that the type of the substrate 31A is not limited in the array camera module 100A of the present disclosure. For example, the substrate 31A may be selected as but not limited to, a rigid board, a flex board, a rigid-flex board, a ceramic plate or the like.

With continued reference to FIG. 75, in this specific example of the array camera module 100A of the present disclosure, at least one electronic components 32A is conductively connected to the substrate 31A on the substrate front surface 311A of the substrate 31A, and a further electronic component 32A is conductively connected to the substrate 31A on the substrate back surface 312A of the substrate 31A. It will be understood that, at least one electronic components 32A is each conductively connected to the substrate front surface 311A and the substrate back surface 312A of the substrate 31A in such a manner that the layout of the electronic components 32A can become more flexible.

Figure 78:
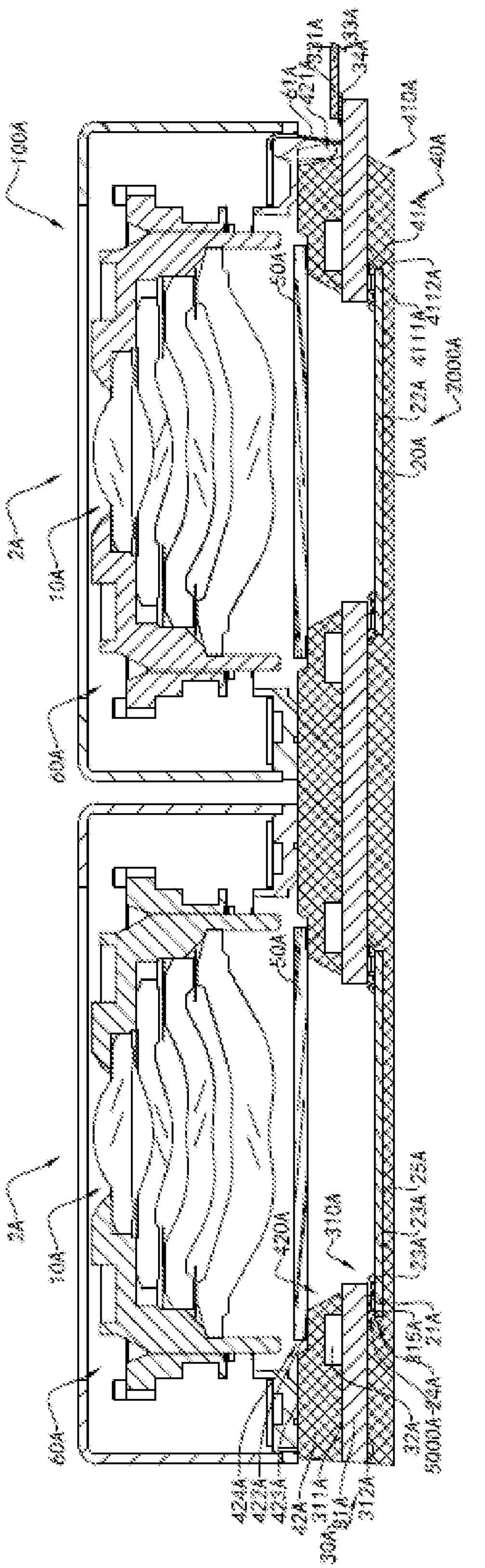
FIG. 78 is a schematic view of the internal structure cut along the intermediate position of a modified implementation of the camera module according to the above preferred embodiment of the present disclosure.

Nevertheless, it will be understood by those skilled in the art that, in some examples of the array camera module 100A, all of the electronic components 32A may also be conductively connected to the substrate 31A on the substrate front surface 311A of the substrate 31A with reference to FIG. 78. In other examples of the array camera module 100A, all of the electronic components 32A may also be conductively connected to the substrate 31A on the substrate back surface 312A of the substrate 31A with reference to FIG. 79.

It is worth mentioning that the type of the electronic component 32A is not limited in the array camera module 100A of the present disclosure. For example, the electronic component 32A may be implemented as but not limited to, a processor, a relay, a memory, a driver, an inductor, a resistor, a capacitor or the like.

Further, in one specific example of the array camera module 100A of the present disclosure, the electronic component 32A may be conductively connected to the substrate 31A by way of being attached to the substrate front surface 311A and/or the substrate back surface 312A of the substrate 31A. It will be understood that after the electronic component 32A is attached to the substrate front surface 311A and/or the substrate back surface 312A of the substrate 31A, the electronic component 32A is protruded from the substrate front surface 311A and/or the substrate back surface 312A of the substrate 31A.

In another specific example of the array camera module 100A of the present disclosure, the electronic component 32A may be half buried in the substrate 31A on the substrate front surface 311A and/or the substrate back surface 312A of the substrate 31A, and the electronic component 32A is conductively connected to the substrate 31A. It will be understood by those skilled in the art that, although the electronic component 32A is half buried in the substrate 31A on the substrate front surface 311A and/or the substrate back surface 312A of the substrate 31A in such a manner that the electronic component 32A is conductively connected to the substrate 31A, the electronic component 32A is protruded from the substrate front surface 311A and/or the substrate back surface 312A of the substrate 31A, but the height size of the electronic component 32A protruded from the substrate front surface 311A and/or the substrate back surface 312A of the substrate 31A may be reduced, thereby facilitating the further reduction of the height size of the array camera module 100A. Optionally, the electronic components 32A may also be completely buried inside the substrate 31A.

With continued reference to FIG. 75, the circuit board 30A further includes at least one connecting plate 33A, wherein each of the connecting plates 33A is conductively connected to the substrate 31A, respectively. For example, in this preferred example of the array camera module 100A shown in FIGS. 75 and 76, the number of the connecting plates 33A may be implemented as two, wherein each of the connecting plates 33A is conductively connected to the substrate 31A on a side portion of the substrate 31A, respectively. For example, each of the connecting plates 33A may be conductively connected to the substrate 31A on the same side portion of the substrate 31A, or may be conductively connected to the substrate 31A on opposite sides of the substrate 31A, respectively. Nevertheless, it will be understood that, in other examples of the array camera module 100A, each of the connecting plates 33A may also be conductively connected to the substrate 31A on two end portions of the substrate 31A, respectively, or one of the connecting plates 33A is conductively connected to the substrate 31A on an end portion of the substrate 31A, and the other of the connecting plates 33A is conductively connected to the substrate 31A on a side portion of the substrate 31A.

Further, each of the connecting plates 33A has a module connecting side 331A and a device connecting side 332A, wherein the module connecting side 331A of each of the connecting plates 33A is respectively connected to the substrate front surface 311A of the substrate 31A, for example, the module connecting side 331A of each of the connecting plates 33A is respectively connected to the substrate front surface 311A of the substrate 31A by way of being attached to the substrate front surface 311A of the substrate 31A; and wherein the device connecting side 332A of each of the connecting plates 33A can be conductively connected to the device body 200A, respectively. For example, the device connecting side 332A of each of the connecting plates 33A may be provided or formed with a connector 333A of the connecting plate 33A for being connected to the device body 200A.

Optionally, the device connecting side 332A of each of the connecting plates 33A is provided or formed with one connector 333A. Still optionally, the device connecting side 332A of each of the connecting plates 33A may be connected to the same connector 333A.

Preferably, the module connecting side 331A of each of the connecting plates 33A may be conductively connected to the substrate front surface 311A of the substrate 31A via a connecting portion 34A, respectively, wherein the connecting portion 34A may be but not limited to anisotropic conductive glue or an anisotropic conductive glue tape.

It is worth mentioning that the connecting plates 33A is deformable, so that when the array camera module 100A is arranged on the device body 200A via the connector 333A of each of the connecting plates 33A, the device connecting side 332A of each of the connecting plates 33A may buffer the displacement of the array camera module 100A caused by the vibration of the electronic device in the process of being used, thereby ensuring the reliability of the electronic device when used.

Further, the substrate 31A has at least one group of substrate connecting members 315A, wherein the substrate connecting member 315A of the substrate 31A is provided on and protruded from the substrate back surface 312A of the substrate 31A. Preferably, the substrate connecting member 315A of the substrate 31A surrounds at the edges of the substrate channel 310A. In one specific example of the array camera module 100A, the substrate 31A has at least two groups of substrate connecting members 315A, wherein at least one group of substrate connecting members 315A surrounds at the edges of one substrate channel 310A. Optionally, the substrate 31A may also have only one group of substrate connecting members 315A, wherein the substrate connecting members 315A are held at the middle position of two substrate channels 310A. Each of the photosensitive elements 20A has at least one group of chip connecting members 21A and a photosensitive area 22A, and a non-photosensitive area 23A surrounding around the photosensitive area 22A, wherein the chip connecting member 21A is provided on and protruded from the non-photosensitive area 23A of the photosensitive element 20A.

Each of the photosensitive elements 20A is attached to the substrate back surface 312A of the substrate 31A, so that the chip connecting member 21A of each of the photosensitive elements 20A is conductively connected to the substrate connecting member 315A of the substrate 31A, and the photosensitive area 22A of each of the photosensitive elements 20A corresponds to each of the substrate channels 310A of the substrate 31A. Preferably, a part of the non-photosensitive area of each of the photosensitive elements 20A also corresponds to each of the substrate channels 310A of the substrate 31A. For example, in one specific example of the array camera module 100A of the present disclosure, a part of the non-photosensitive area 23A of each of the photosensitive elements 20A is attached to the substrate back surface 312A of the substrate 31A, and the photosensitive area 22A and a part of the non-photosensitive area 23A of each of the photosensitive elements 20A correspond to each of the substrate channels 310A of the substrate 31A.

It is worth mentioning that, in this example of the array camera module 100A of the present disclosure, while each of the photosensitive elements 20A is respectively attached to the substrate back surface 312A of the substrate 31A, the chip connecting member 21A of each of the photosensitive elements 20A is conductively connected to the substrate connecting member 315A of the substrate 31A, respectively. By this way, the manufacturing steps of the array camera module 100 can be reduced, thereby facilitating reducing the manufacturing cost of the array camera module 100A and improving the productivity of the array camera module 100A.

It is also worth mentioning that the shape and arrangement of the chip connecting member 21A of each of the photosensitive elements 20A and the shape and arrangement of the substrate connecting member 315A of the substrate 31A are not limited in the array camera module 100A of the present disclosure. For example, the chip connecting member 21A of each of the photosensitive elements 20A may be disk-shaped, spherical or the like, and accordingly, the substrate connecting member 315A of the substrate 31A may be disk-shaped, spherical or the like.

Preferably, in a thickness direction of the substrate 31A, at least one part of at least one of the electronic components 32A located on the substrate front surface 311A of the substrate 31A can correspond to at least one part of the area of the non-photosensitive area 23A of the photosensitive element 20A. That is to say, from a top view perspective, at least one part of at least one of the electronic components 32A located on the substrate front surface 311A of the substrate 31A and at least one part of the area of the non-photosensitive area 23A of the photosensitive element 20A can be overlapped with each other. By this way, the layout of the respective members of the array camera module 100A can be more compact, thereby facilitating the reduction of the length and width sizes of the array camera module 100A, so that the array camera module 100A is particularly suitable for the electronic device that is seeking for lightening and thinning.

It will be understood by those skilled in the art that the substrate connecting member 315A of the substrate 31A is protruded from the substrate back surface 312A of the substrate 31A, and the chip connecting member 21A of each of the photosensitive elements 20A is protruded from the non-photosensitive area 23A of the photosensitive element 20A, so that after one part of the non-photosensitive area 23A of each of the photosensitive elements 20A is attached to the substrate back surface 312A of the substrate 31A and the chip connecting member 21A of each of the photosensitive elements 20A is conductively connected to the substrate connecting member 315A of the substrate 31A, at least one gap 24A is formed between the non-photosensitive area 23A of each of the photosensitive elements 20A and the substrate back surface 312A of the substrate 31A, respectively. In the array camera module 100A of the present disclosure, the array camera module 100A further includes at least one filler 5000A, wherein the filler 5000A is filled in the gap 24A, and the filler 5000A is held between the non-photosensitive area 23A of each of the photosensitive elements 20A and the substrate back surface 312A of the substrate 31A.

In one example of the array camera module 100A of the present disclosure, after one part of the non-photosensitive area 23A of each of the photosensitive elements 20A is attached to the substrate back surface 312A of the substrate 31A, and a gap 24A is formed between the non-photosensitive area 23A of each of the photosensitive elements 20A and the substrate back surface 312A of the substrate 31A, respectively, and the filler 5000A is filled in the gap 24A formed between the non-photosensitive area 23A of each of the photosensitive elements 20A and the substrate back surface 312A of the substrate 31A. For example, a fluid-like filling medium, such as but not limited to glue, may be filled in the gap 24A formed between the non-photosensitive area 23A of each of the photosensitive elements 20A and the substrate back surface 312A of the substrate 31A, and form the filler 5000A held between the non-photosensitive area 23A of each of the photosensitive elements 20A and the substrate back surface 312A of the substrate 31A after the filling medium is cured.

In another example of the array camera module 100A of the present disclosure, it is also possible that the filling medium is first disposed on the substrate back surface 312A of the substrate 31A and/or at least one part of the non-photosensitive area 23A of each of the photosensitive elements 20A, and then a part of the non-photosensitive area 23A of the photosensitive element 20A is attached to the substrate back surface 312A of the substrate 31A, so that the filling medium disposed on the substrate back surface 312A of the substrate 31A and/or at least one part of the non-photosensitive area 23A of each of the photosensitive elements 20A can form the filler 5000A after being cured, and be held between the non-photosensitive area 23A of each of the photosensitive elements 20A and the substrate back surface 312A of the substrate 31A, to fill the gap 24A formed between the non-photosensitive area 23A of each of the photosensitive elements 20A and the substrate back surface 312A of the substrate 31A. It will be understood that, when the filler 5000A fills the gap 24A formed between the non-photosensitive area 23A of each of the photosensitive elements 20A and the substrate back surface 312A of the substrate 31A, the filler 5000A can seal the gap 24A.

Preferably, the filler 5000A can also embed the substrate connecting member 315A of the substrate 31A and the chip connecting member 20A of each of the photosensitive elements 21A, so that the filler 5000A can avoid the substrate connecting member 315A of the substrate 31A from being oxidized by way of preventing the substrate connecting member 315A of the substrate 31A from contacting with the external environment, and avoid the chip connecting member 20A of each of the photosensitive elements 21A from being oxidized by way of preventing the chip connecting member 20A of each of the photosensitive elements 21A from contacting with the external environment. By this way, it can not only ensure the good electrical properties of the substrate connecting member 315A of the substrate 31A and ensure the good electrical properties of the chip connecting member 20A of each of the photosensitive elements 21A, but also can ensure the reliability of the connecting position of the substrate connecting member 315A of the substrate 31A and the chip connecting member 20A of each of the photosensitive elements 21A.

With continued reference to FIGS. 75 and 76, the array camera module 100A includes at least one molded unit 40A, wherein the molded unit 40A further includes at least one back surface molded portion 41A and at least one molded base 42A, and wherein the back surface molded portion 41A is integrally bonded to at least one part of the area of the substrate back surface 312A of the substrate 31A, and the molded base 42A is integrally bonded to at least one part of the area of the substrate front surface 311A of the substrate 31A.

In this specific example of the camera module array 100A shown in FIG. 75, the back surface molded portion 41A is integrally bonded to the substrate back surface 312A of the substrate 31A, and embeds the entire area of a chip back surface 25A of each of the photosensitive elements 20A, so that the back surface molded portion 41A, the substrate 31A and each of the photosensitive elements 20A are integrally bonded. Nevertheless, it will be understood by those skilled in the art that in other examples of the array camera module 100A, the back surface molded portion 41A can embed at least one part of an area of the chip back surface 25A of at least one of the photosensitive elements 20A.

The molded base 42A has at least one light window 420A, wherein in this specific example of the array camera module 100A of the present disclosure, a case where the molded base 42A has two light windows 420A is taken an example to continue to set forth the features and advantages of the array camera module 100A of the present disclosure, but it will be understood by those skilled in the art that, the molded base 42A having two light windows 420A should not be regarded as a limitation of the content and scope of the array camera module 100A of the present disclosure.

The molded base 42A is integrally bonded to at least one part of the area of the substrate front surface 311A of the substrate 31A, wherein the molded base 42A surrounds around the photosensitive area 22A of each of the photosensitive elements 20A, so that the photosensitive area 22A and a part of the non-photosensitive areas 23A of each of the photosensitive elements 20A correspond to each of the light windows 420A of the molded base 42A, respectively. Each of the optical lenses 10A is held in the photosensitive path of each of the photosensitive elements 20A, respectively, to form a light passage between each of the optical lenses 10A and each of the photosensitive elements 20A by means of each of the light windows 420A of the molded base 42A, respectively. That is to say, light reflected by an object enters the interior of the array camera module 100A from each of the optical lenses 10 and passes through each of the light windows 420A of the molded base 42A, and then can be received by each of the photosensitive elements 20A for photoelectric conversion.

It will be understood that the back surface molded portion 41A, the molded base 42A, each of the photosensitive elements 20A, the substrate 31A and each of the electronic components 32A are integrally bonded to form a molded circuit board assembly 2000A.

That is to say, according to another aspect of the present disclosure, the present disclosure further provides the molded circuit board assembly 2000A, wherein the molded circuit board assembly 2000A includes at least one substrate 31A, at least one electronic component 32A, at least two photosensitive elements 20A, at least one back surface molded portion 41A and at least one molded base 42A; wherein each of the electronic components 32A is conductively connected to the substrate 31A, respectively, and a part of the non-photosensitive area 23A of each of the photosensitive elements 20A is attached to the substrate back surface 312A of the substrate 31A, respectively, so that the photosensitive area 20A and another part of the non-photosensitive area 23A of each of the photosensitive elements 20A correspond to each of the substrate channels 310A of the substrate 31A; wherein the back surface molded portion 41A is integrally bonded to at least one part of the area of the substrate back surface 312A of the substrate 31A, the molded base 42A is integrally bonded to at least one part of the area of the substrate front surface 311A of the substrate 31A, and the molded base 42A surrounds around the photosensitive area 20A of each of the photosensitive elements 20A, so that the photosensitive area 20A and a part of the non-photosensitive area 23A of each of the photosensitive elements 20A correspond to each of the light windows 420A of the molded base 42A.

Preferably, the back surface molded portion 41A further embeds at least one part of the area of the chip back surface 25A of at least one of the photosensitive elements 20A. More preferably, the back surface molded portion 41A embeds at least one part of the area of the chip back surface 25A of each of the photosensitive elements 20A. That is, the back surface molded portion 41A can embed at least one part of the attaching position of each of the photosensitive elements 20A and the substrate 31A.

By way of the back surface molded portion 41A embedding at least one part of the attaching position of each of the photosensitive elements 20A and the substrate 31A, each of the photosensitive elements 20A can be prevented from falling off from the substrate back surface 312A of the substrate 31A, thereby ensuring the reliability of the array camera module 100A. Further, by way of the back surface molded portion 41A embedding the attaching position of each of the photosensitive elements 20A and the substrate 31A, it is also possible to isolate the chip connecting member 20A of each of the photosensitive elements 21A from the external environment and isolate the substrate connecting member 315A of the substrate 31A from the external environment, thereby avoiding the chip connecting member 20A of each of the photosensitive elements 21A, the substrate connecting member 315A of the substrate 31A, and the external environment as well as the connecting position of the chip connecting member 20A of each of the photosensitive elements 21A and the substrate connecting member 315A of the substrate 31A from being oxidized, thus ensuring the reliability of the connecting position of the chip connecting member 20A of each of the photosensitive elements 21A and the substrate connecting member 315A of the substrate 31A.

Further, by way of the back surface molded portion 41A embedding at least one part of the attaching position of each of the photosensitive elements 20A and the substrate 31A, and by means of the back surface molded portion 41A, the strength of the substrate 31A can also be reinforced and the flatness of the substrate 31A can also be ensured. Preferably, by way of the back surface molded portion 41A embedding at least one part of the attaching position of each of the photosensitive elements 20A and the substrate 31A, the flatness of each of the photosensitive elements 20A can also be ensured by means of the back surface molded portion 41A, so that the flatness of each of the photosensitive elements 20A is limited to the back surface molded portion 41A, and is no longer limited to the substrate 31A. In this way, on the one hand, the flatness of each of the photosensitive elements 20A can be ensured, and on the other hand, the substrate 31A may be selected as a thinner sheet, to facilitate reducing the height size of the array camera module 100A.

The back surface molded portion 41A is not deformed when heated, so that when the array camera module 100A is used for a long time, the heat generated by each of the photosensitive elements 20A conducts and acts on the back surface molded portion 41A, and the back surface molded portion 41A is not deformed, to facilitate ensuring the flatness of each of the photosensitive elements 20A. Preferably, the back surface molded portion 41A has a good heat dissipation capacity, wherein the back surface molded portion 41A can quickly radiate the heat generated by each of the photosensitive elements 20A to the external environment of the array camera module 100A, thereby ensuring the reliability of the array camera module 100A when used for a long time.

Further, by way of the back surface molded portion 41A being integrally bonded to at least one part of the area of the substrate back surface 312A of the substrate 31A, the substrate back surface 312A of the substrate 31A can be avoided from being exposed, so that when the array camera module 100A is assembled on the device body 200A to form the electronic device, other assembled members of the device body 200A may not scratch the substrate back surface 312A of the substrate 31A due to touching with the substrate back surface 312A of the substrate 31A, thereby facilitating ensuring the good electrical properties of the substrate 31A.

With reference to FIG. 75, the back surface molded portion 41A can embed at least one part of at least one of the electronic components 32A of the substrate back surface 312A of the substrate 31A. For example, the back surface molded portion 41A can embed all of the electronic components 32A protruded from the substrate back surface 312A of the substrate 31A. By this way, in an aspect, the back surface molded portion 41A can isolate the surface of the electronic component 32A from the external environment, to ensure the good electrical properties of the electronic component 32A by way of avoiding the surface of the electronic component 32A from being oxidized. In another aspect, the back surface molded portion 41A can prevent adjacent electronic components 32A from the occurrence of undesirable phenomena such as mutual interference by way of isolating the adjacent electronic components 32A, so that a larger number and larger size of electronic components 32A can be conductively connected on a limited area on the substrate back surface 312A of the substrate 31A, to facilitate improving the performance and imaging quality of the array camera module 100A. In still another aspect, by way of the back surface molded portion 41A embedding the electronic component 32A, the electronic component 32A is avoided from being exposed, so that in the process of the array camera module 100A attached to the device body 200A, there is no need to worry that the electronic component 32A is scratched or the electronic component 32A is caused to fall off from the substrate 31A due to the collision of the electronic component 32A with the other assembled members of the device body 200A, to ensure the reliability of the array camera module 100A when assembled and used. Then, the electronic component 32A can prevent the back surface molded portion 41A from falling off from the substrate back surface 312A of the substrate 31A, to ensure that the back surface molded portion 41A is firmly bonded to the substrate back surface 312A of the substrate 31A.

With continued reference to FIG. 75, in this preferred example of the array camera module 100A of the present disclosure, the height size parameter of the back surface molded portion 41A protruded from the substrate back surface 312A of the substrate 31A is greater than or equal to the height of the electronic component 32A protruded from the substrate back surface 312A of the substrate 31A. Specifically, the back surface molded portion 41A has a free side surface 4111A and a bonding side surface 4112A, wherein the free side surface 4111A and the bonding side surface 4112A of the back surface molded portion 41A correspond to each other, and the bonding side surface 4112A of the back surface molded portion 41A is integrally bonded to at least one part of the area of the substrate back surface 312A of the substrate 31A and at least one part of the chip back surface 25A of the photosensitive element 20A.

It is assumed that the height size parameter of the back surface molded portion 41A protruded from the substrate back surface 312A of the substrate 31A is H, that is, the distance parameter between the free side surface 4111A and the bonding side surface 4112A of the back surface molded portion 41A is H, and it is assumed that the height size parameter of the electronic component 32A protruded from the substrate back surface 312A of the substrate 31A is h, where the value of the parameter H is greater than or equal to the value of the parameter h. In this way, when the array camera module 100A is assembled to the device body 200A, other assembled members of the device body 200A can be prevented from touching the electronic component 32A, to ensure the reliability of the array camera module 100A.

With continued reference to FIG. 75, the molded base 42A embeds at least one part of at least one of the electronic components 32A protruded from the substrate front surface 311A of the substrate 31A. Preferably, the molded base 42A embeds all of the electronic components 32A protruded from the substrate front surface 311A of the substrate 31A.

The molded base 42A can isolate the surface of the electronic component 32A from the external environment by way of embedding the electronic component 32A and ensure the good electrical properties of electronic components 32A by way of avoiding the surface of the electronic component 32A from being oxidized. Moreover, the molded base 42A can prevent the occurrence of shedding on the surface of the electronic component 32A, and prevent the occurrence of shedding on the surfaces of the electronic component 32A and the substrate front surface 311A of the substrate 31A, to avoid the shedding from contaminating the photosensitive area 22A of each of the photosensitive elements 20A, thereby ensuring the product yield and reliability of the array camera module 100A.

Further, the molded base 42A causes adjacent electronic components 32A to be isolated from each other by way of embedding the electronic components 32A, thereby avoiding an undesirable phenomenon that the adjacent electronic components 32A are interfered with each other. Moreover, a larger number and larger size of electronic components 32A may also be conductively connected on a limited area of the substrate front surface 311A of the substrate 31A, to facilitate improving the performance of the array camera module 100A.

Further, it is unnecessary to reserve a safety distance between the molded base 42A and the electronic component 32A, thereby facilitating the reduction of the length and width sizes of the array camera module 100A and the reduction of the height size of the array camera module 100A.

The array camera module 100A further includes at least one filter element 50A. For example, in this specific example of the camera module array 100A shown in FIG. 75, the number of the optical elements 50A may be implemented as two, wherein each of the filter elements 50A is held between each of the optical lenses 10A and each of the photosensitive elements 20A, so that the filter element 50A forms one part of the imaging unit 2A, wherein light reflected by an object enters the interior of the array camera module 100A from each of the optical lenses 10 and then passes through each of the filter elements 50A, and then is received by the photosensitive area 22A of each of the photosensitive elements for photoelectric conversion. By this way, the imaging quality of the array camera module 100A can be ensured.

Specifically, each of the filter elements 50A can filter stray light in the light entering the interior of the array camera module 100A from each of the optical lenses 10A. By this way, the imaging quality of the array camera module 100A can be improved. It is worth mentioning that the type of each of the filter elements 50A is not limited in the array camera module 100A of the present disclosure. For example, each of the filter elements 50A may be but not limited to, an infrared cut filter element, a visible spectrum filter element or the like.

With reference to FIG. 75, each of the filter elements 50A is attached to the top surface of the molded base 42A, so that each of the filter elements 50A is held between each of the optical lenses 10A and each of the photosensitive elements 20A, respectively.

Optionally, in other possible examples of the array camera module 100A, the number of the filter elements 50A may be implemented as one, wherein the filter element 50A is attached to the top surface of the molded base 42A, so that different portions of the filter element 50A are each held between each of the optical lenses 10A and each of the photosensitive elements 20A, respectively.

The array camera module 100A further includes at least one driver 60A. For example, in this specific example of the camera module array 100A shown in FIG. 75, the number of driver 60A may be implemented but not limited to two, wherein each of the optical lenses 10A is drivably disposed on each of the drivers 60A, respectively, and each of the drivers 60A is respectively attached to the top surface of the molded base 42A, so that each of the optical lenses 10A is held in the photosensitive path of each of the photosensitive elements 20A by means of each of the drivers 60A, respectively. Moreover, each of the drivers 60A can drive each of the optical lenses 10A to move relative to each of the photosensitive elements 20A along the photosensitive path of each of the photosensitive elements 20A, respectively, so that the array camera module 100A achieves the autofocus and the automatic zoom of the array camera module 100A by way of adjusting the relative position of each of the optical lenses 10A and each of the photosensitive elements 20A.

Optionally, the number of drivers 60A may also be implemented as one, wherein each of the optical lenses 10A is drivably disposed on the driver 60A, respectively, so that the driver 60A can simultaneously drive each of the optical lenses 10A to move relative to each of the photosensitive elements 20A along the photosensitive path of each of the photosensitive elements 20A.

It is worth mentioning that the type of each of the drivers 60A is not limited in the array camera module 100A of the present disclosure, as long as it can drive each of the optical lenses 10A to move relative to each of the photosensitive elements 20A along the photosensitive path of each of the photosensitive elements 20A. For example, in a specific example of the array camera module 100A of the present disclosure, the driver 60A may be implemented as but not limited to a voice coil motor.

Further, each of the drivers 60A has at least one driving pin 61A, wherein the driving pin 61A is electrically connected to the substrate 31A. Preferably, the molded base 42A has at least one pin groove 421A, wherein the pin groove 421A of the molded base 42A extends from the top surface of the molded base 42A to the substrate front surface 311A of the substrate 31A. In this way, when each of the drivers 60A is attached to the top surface of the molded base 42A, the driving pin 61A of each of the drivers 60A can extends from the top surface of the molded base 42A to the substrate front surface 311A of the substrate 31A in the pin groove 421A, and the driving pin 61A of each of the drivers 60A can be electrically connected to the substrate 31A.

Preferably the pin groove 421A extends along an outer surface of the molded base 42A from the surface of the molded base 42A to the substrate front surface 311A of the substrate 31A, so that after each of the drivers 60A is attached to the top surface of the molded base 42A, the driving pin 61A of each of the drivers 60A is then electrically connected to the substrate 31A. It will be understood that the driving pin 61A of each of the drivers 60A accommodated in the pin groove 421A of the molded base 42A is not protruded from the outer surface of the molded base 42A. In this way, it not only ensures the appearance of the array camera module 100A, but also prevents occurrence of an undesirable phenomenon that the driving pin 61A of each of the drivers 60A is touched when the array camera module 100A is assembled to the device body 200A, to ensure the reliability and product yield of the array camera module 100A.

Further, the top surface of the molded base 42A has at least one inner side surface 422A and at least one outer side surface 423A, wherein each of the drivers 60A is attached to the outer side surface 423A of the molded base 42A, so that each of the optical lenses 10A is held in the photosensitive path of each of the photosensitive elements 20A; and wherein each of the filter elements 50A is attached to each of the inner side surfaces 422A of the molded base 42A, respectively, so that each of the filter elements 50A is held between each of the optical lenses 10A and each of the photosensitive elements 20A, respectively.

In some examples of the array camera module 100A of the present disclosure, the plane where the inner side surface 422A of the molded base 42A is located is flush with the plane where the outer side surface 423A is located. In other examples of the array camera module 100A of the present disclosure, the plane where the inner side surface 422A of the molded base 42A is located and the plane where the outer side surface 423A is located have a height difference. For example, in this specific example of the array camera module 100A shown in FIG. 75, the plane where the inner side surface 422A of the molded base 42A is located is lower than the plane where the outer side surface 423A is located, so that the molded base 42A is formed with at least one attaching groove 424A, for example, the number of attaching grooves 424A may be two, and each of the attaching grooves 424A of the molded base 42A communicates with each of the light windows 420A, respectively, wherein each of the filter elements 50A attached to each of the inner side surfaces 422A of the molded base 42A is accommodated in each of the attaching grooves 424A, respectively, to further reduce the height size of the array camera module 100A.

It will be understood that the molded base 42A may be a holder 6000A, wherein the holder 6000A has an upper holding portion 6100A and a lower holding portion 6200A; and wherein each of the filter elements 50A and each of the drivers 60A are respectively held in the upper holding portions 6100A of the holders 6000A and the substrate 31A is held in the lower holding portion 6200A of the holder 6000A, so that each of the optical lenses 10A is held in the photosensitive path of each of the photosensitive elements 20A, respectively, and each of the filter elements 50A is held between each of the optical lenses 10A and each of the photosensitive elements 20A, respectively. It will be understood that each of the light window 420A of the molded base 42A extends from the upper holding portion 6100A of the holder 6000A to the lower holding portion 6200A, so that each of the light windows 420A forms a light path between each of the optical lenses 10A and each of the photosensitive elements 20A, respectively.

The lower holding portion 6200A of the holder 6000A is integrally bonded to the substrate front surface 311A of the substrate 31A in such a manner that the substrate 31A is held in the lower holding portion 6200A of the holder 6000A. Each of the filter element 50A and each of the drivers 60A are respectively attached to the upper holding portion 6100A of the holder 6000A in such a manner that they are each held in the upper holding portion 6100A of the holder 6000A.

FIGS. 65 to 75 show a manufacturing flow of the array camera module 100A.

Figure 65:
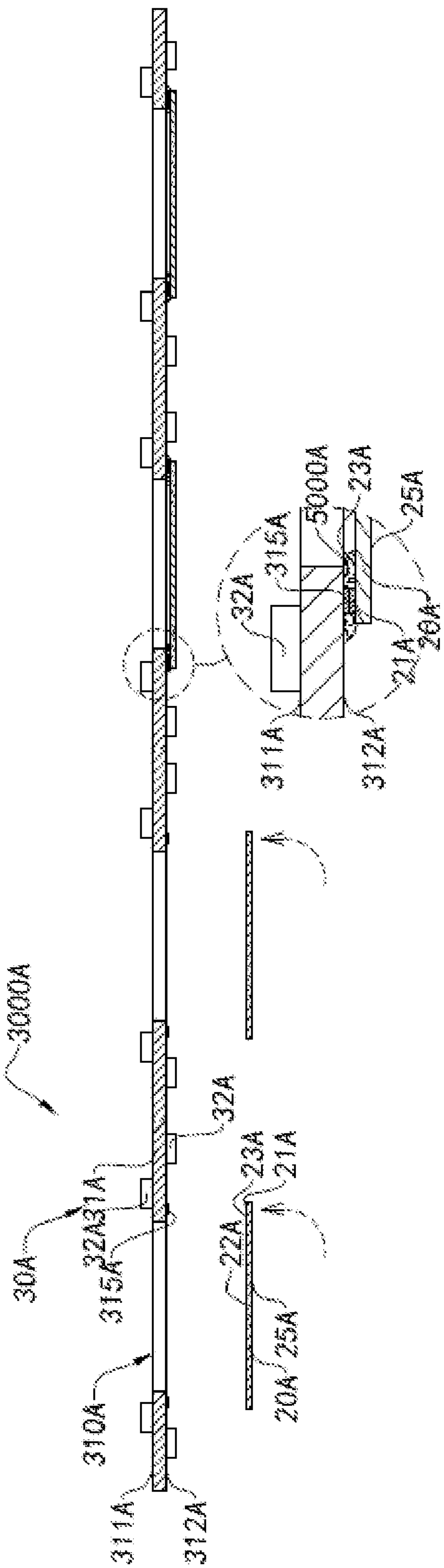
FIG. 65 is a schematic cross-sectional view of the first one of the manufacturing steps of a camera module according to a preferred embodiment of the present disclosure.

At a stage shown in FIG. 65, at least one electronic component 32A is conductively connected to the substrate 31A on the substrate front surface 311A of the substrate 31A, and a further electronic component 32A is conductively connected to the substrate 31A on the substrate back surface 312A of the substrate 31A, wherein two or more of the substrate 31A are arranged to form a splicing unit 3000A. It is worth mentioning that the arrangement of a plurality of the substrates 31A forming the splicing unit 3000A is not limited in the array camera module 100A of the present disclosure, and it is selected as needed.

Further, in this example of the array camera module 100A of the present disclosure, after the substrate 31A is provided or made, at least one of the electronic components 32A may be attached to the substrate front surface 311A of the substrate 31A, so that these electronic components 32A attached to the substrate front surface 311A of the substrate 31A are conductively connected to the substrate 31A on the substrate front surface 311A of the substrate 31A, and the further electronic components 32A are attached to the substrate back surface 312A of the substrate 31A, so that these electronic components 32A attached to the substrate back surface 312A of the substrate 31A are conductively connected to the substrate 31A on the substrate back surface 312A of the substrate 31A.

It is worth mentioning that the electronic components 32A attached to the substrate front surface 311A of the substrate 31A are protruded from the substrate front surface 311A of the substrate 31A, and the electronic components 32A attached to the substrate back surface 312A of the substrate 31A are protruded from the substrate back surface 312A of the substrate 31A.

Further, the positions of the electronic components 32A being attached to the substrate front surface 311A and the substrate back surface 312A of the substrate 31A are not limited, and are selected and adjusted according to the specific application of the array camera module 100A. For example, in some examples of the array the camera module 100A according to the present disclosure, a plurality of the electronic component 32A may be arranged on the entire area of the substrate front surface 311A and/or the substrate back surface 312A of the substrate 31A, while in other examples of the present disclosure the array camera module 100A, the plurality of the electronic component 32A may also be arranged in a particular area of the substrate front surface 311A and/or the substrate back surface 312A of the substrate 31A, such as but not limited to a corner or one side or both sides or the like.

Figure 79:
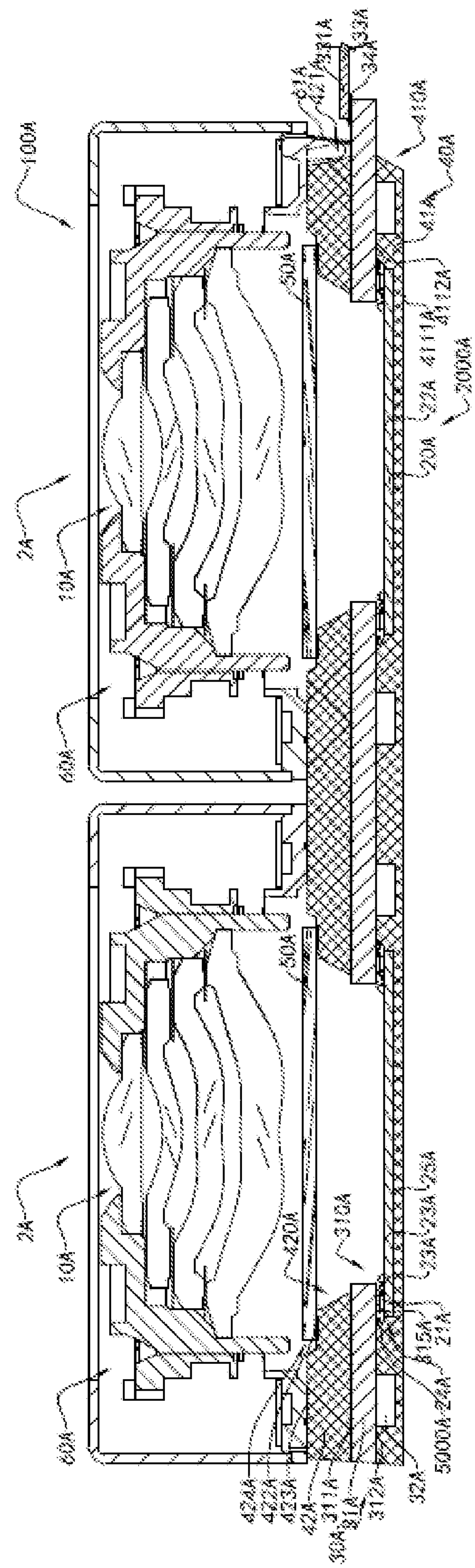
FIG. 79 is a schematic view of the internal structure cut along the intermediate position of another modified implementation of the camera module according to the above preferred embodiment of the present disclosure.

It is worth mentioning that, in other examples of the array camera module 100A of the present disclosure, it is also possible that the electronic component 32A is only attached to the substrate front surface 311A of the substrate 31A, as shown in FIG. 78, or the electronic component 32A is only attached to the substrate back surface 312A of the substrate 31A, as shown in FIG. 79.

With reference to FIG. 65, a part of the non-photosensitive area 23A of each of the photosensitive elements 20A is attached to the substrate 31A on the substrate back surface 312A of the substrate 31A, respectively, and the chip connecting member 21A provided on the non-photosensitive area 23A of each of the photosensitive elements 20A is conductively connected to the substrate connecting member 315A provided on the substrate back surface 312A of the substrate 31A, and the photosensitive area 22A and another part of the non-photosensitive area 23A of each of the photosensitive elements 20A correspond to each substrate channel 310A of the substrate 31A, respectively, so that each of the photosensitive elements 20A is conductively connected to the substrate 31A, respectively.

it will be understood by those skilled in the art that after the non-photosensitive area 23A of each of the photosensitive elements 20A is attached to the substrate back surface 312A of the substrate 31A, respectively, and the chip connecting member 21A provided on the non-photosensitive area 23A of each of the photosensitive elements 20A is conductively connected to the substrate connecting member 315A provided on the substrate back surface 312A of the substrate 31A, a gap 24A is formed between the non-photosensitive area 23A of each of the photosensitive elements 20A and the substrate back surface 312A of the substrate 31A. Then, a filling medium is used to be filled in the gap 24A, so that the filling medium forms the filler 5000A held between the non-photosensitive area 23A of each of the photosensitive elements 20A and the substrate back surface 312A of the substrate 31A, to prevent the photosensitive area 20A of each of the photosensitive elements 20A from communicating with the substrate back surface 312A of the substrate 31A via the gap 24A, so that in a subsequent molding process, the filler 5000A can prevent a fluid medium 400A from entering the photosensitive area 22A of each of the photosensitive elements 20A from the substrate back surface 312A of the substrate 31A via the gap 24A, to avoid the photosensitive area 22A of each of the photosensitive elements 20A from being contaminated.

It will be understood that the substrate 31A can isolate at least one of the electronic components 32A from the photosensitive area 22A of each of the photosensitive elements 20A, to avoid shedding of a surface of each of the electronic components 32A and shedding of the connecting position of each of the electronic components 32A and the substrate 31A from contaminating the photosensitive area 22A of each of the photosensitive elements 20A. For example, in an example where each of the electronic components 32A are all arranged on the substrate back surface 312A of the substrate 31A, the substrate 31A can isolate all of the electronic components 32 from the photosensitive area 22A of each of the photosensitive elements 20A, so that in the process of manufacturing the array camera module 100A, the shedding of the surface of the electronic components 32A and the shedding of the connecting position of the electronic components 32A and the substrate 31A can be avoided from contaminating the photosensitive area 22A of each of the photosensitive elements 20A.

It is worth mentioning that, in some examples of the array camera module 100A of the present disclosure, the electronic component 32A may be first conductively connected to the substrate 31A, and then each of the photosensitive elements 20A is conductively connected to the substrate 31A. In other examples of the array camera module 100 of the present disclosure, it is also possible that each of the photosensitive elements 20A is first conductively connected to the substrate 31A, and then each of the electronic components 32A is conductively connected to the substrate 31A. Nevertheless, it will be understood by those skilled in the art that, in further other examples of the array camera module 100A of the present disclosure, it is also possible that the electronic component 32A located on the substrate back surface 312A of the substrate 31A is first conductively connected to the substrate 31A and each of the photosensitive elements 20A is conductively connected to the substrate 31A, and then the electronic component 32A located on the substrate front surface 311A of the substrate 31A is conductively connected to the substrate 31A; or the electronic component 32A located on the substrate front surface 311A of the substrate 31A is first conductively connected to the substrate 31A, and then the electronic component 32A located on the substrate back surface 312A of the substrate 31A is conductively connected to the substrate 31A and each of the photosensitive elements 20A is conductively connected to the substrate 31A. The array camera module 100A of the present disclosure is not limited in this regard.

Figure 66A:
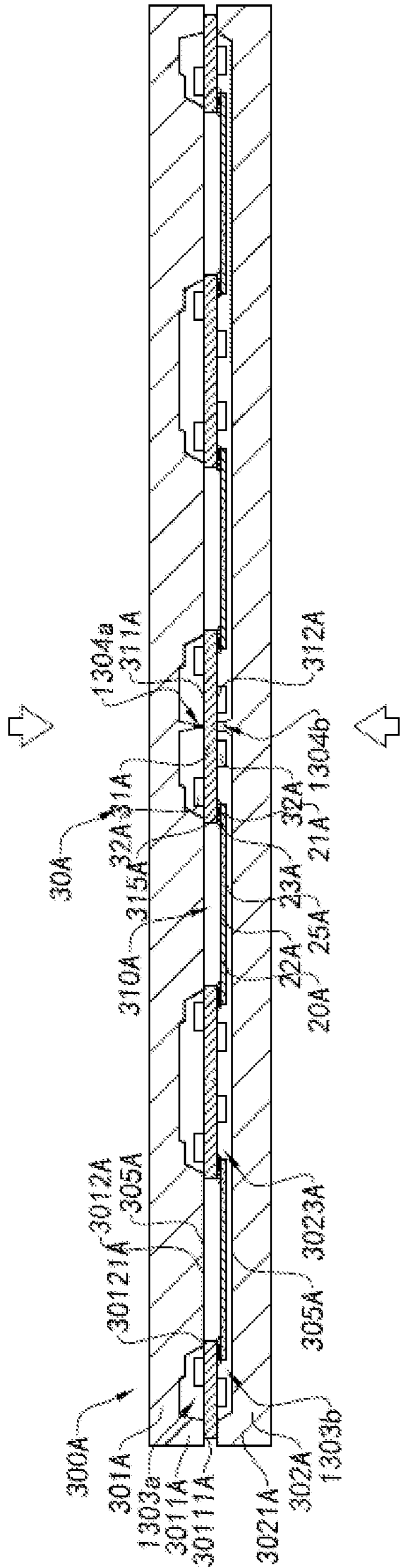
FIGS. 66A and 66B are schematic cross-sectional views of the second one of the manufacturing steps of the camera module according to the above preferred embodiment of the present disclosure.
Figure 66B:
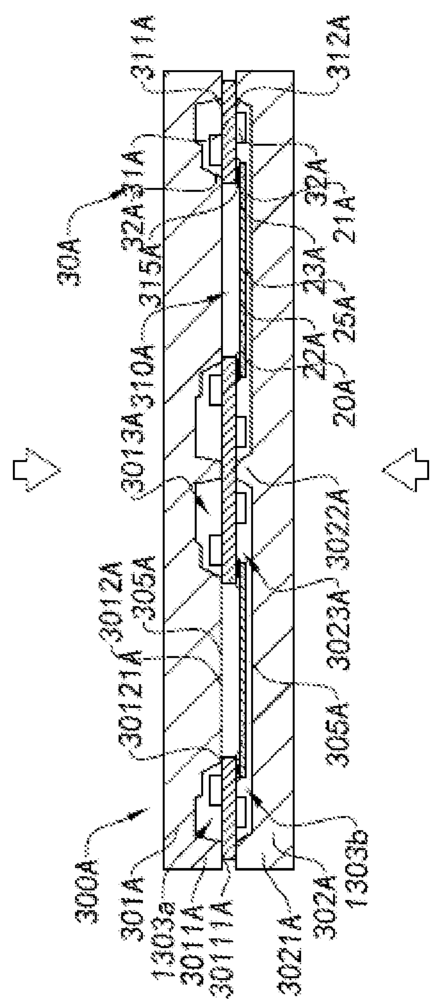

At a stage shown in FIGS. 66A and 66B, the splicing unit 3000A is placed into a molding die 300A to perform a molding process by means of the molding die 300A.

Specifically, the molding die 300A includes an upper die 301A and a lower die 302A, wherein at least one die of the upper die 301A and the lower die 302A can be operated, so that clamping and drafting operations can be performed on the molding die 300A. For example, in one example, after the splicing unit 3000A is placed in the lower die 302A and the clamping operation is performed on the molding die 300A, at least one first molding space **1303*a* is formed between the upper die 301A and the substrate front surface 311A of the substrate 31A, and at least one second molding space 1303*b* is formed between the lower die 302A and the substrate back surface 312A of the substrate 31**A.

In one optional example of the present disclosure, the at least one first molding space **1303*a* and the at least one second molding space 1303*b* communicate with each other, to subsequently allow the fluid medium 400A to fill up the first molding space 1303*a* and the second molding space 1303*b*, and simultaneously form the molded base 42A integrally bonded to at least one part of the area of the substrate front surface 311A of the substrate 31A and the back surface molded portion 41A integrally bonded to at least one part of the area of the substrate back surface 312A of the substrate 31A. Preferably, the back surface molded portion 41A further embeds at least one part of the area of the chip back surface 25A of each of the photosensitive elements 20A. Optionally, the first molding space 1303*a* and the second molding space 1303*b* may also not communicate with each other, so that in a subsequent molding process, the fluid medium 400A is separately added to the first molding space 1303*a* and the second molding space 1303*b*, to fill up the first molding space 1303*a* and the second molding space 1303*b* by means of the fluid medium 400**A.

Preferably, when the number of the first molding space **1303*a* is two or more than two, at least one first communicating channel 1304*a* may further be formed between the upper die 301A and the substrate front surface 311A of the substrate 31A for adjacent first molding space 1303*a* to communicate. Accordingly, when the number of the second molding space 1303*b* is two or more than two, at least one second communicating channel 1304*b* may further be formed between the lower die 302A and the substrate back surface 312A of the substrate 31A for adjacent second molding space 1303***b* to communicate.

With continued reference to FIGS. 66A and 66B, the upper die 301A further includes an upper molding guide portion 3011A and at least one light window molding portion 3012A, and has at least one upper molding guide groove 3013A, wherein the light window molding portion 3012A integrally extends to the upper molding guide portion 3011A, to form the upper molding guide groove 3013A between the light window molding portion 3012A and the upper molding guide portion 3011A or form the upper molding guide groove 3013A between adjacent light window molding portion 3012A.

Further, the upper molding guide portion 3011A has a first upper pressing portion 30111A, and the light window molding portion 3012A has a second upper pressing portion 30121A, so that after a clamping process is performed on the molding die 300A, the first upper pressing portion 30111A of the upper molding guide portion 3011A and the second upper pressing portion 30121A of the light window molding portion 3012A press against different positions of the substrate front surface 311A of the substrate 31A, respectively, and the first molding space 1303*a* is formed at a position corresponding to the upper molding guide groove 3013A. Preferably, the electronic component 32A located on the substrate front surface 311A of the substrate 31A is accommodated in the first molding space 1303*a*, so that after a subsequent molding process is complete, the molded base 42A formed to be integrally bonded to the substrate front surface 311A of the substrate 31A can embed the electronic component 32A. More preferably, the height size of the first molding space 1303*a* is larger than the height size of the electronic component 32A protruded from the substrate front surface 311A of the substrate 31A, so that when the molding die 300A is clamped, an inner surface of the upper die 301A is avoided from contacting with the electronic component 32A, thereby avoiding the surface of the electronic component 32A from being scratched by the inner surface of the upper die 301A and avoiding the electronic component 32A from being pressed.

Further, the molding die 300A further includes at least one film layer 305A, wherein the film layer 305A is overlappedly disposed on the inner surface of the upper die 301A. For example, the film layer 305A may be overlappedly disposed on the inner surface of the upper die 301A by way of attaching to the inner surface of the upper die 301A. After the molding die 300A is clamped, the film layer 305A is located between the first upper pressing portion 30111A of the upper die 301A and the substrate front surface 311A of the substrate 31A, and is located between the second upper pressing portion 30121A of the upper die 301A and the substrate front surface 311A of the substrate 31A. By this way, in an aspect, the film layer 305A can absorb an impact force generated when the molding die 300A is clamped by way of deformation to avoid the impact force from directly acting on the substrate 31A. In another aspect, the film layer 305A can isolate the first upper pressing portion 30111A of the upper die 301A from the substrate front surface 311A of the substrate 31A, and isolate the second upper pressing portion 30121A from the substrate front surface 311A of the substrate 31A, to avoid the first upper pressing portion 30111A and the second upper pressing portion 30121A of the upper die 301A from scratching the substrate front surface 311A of the substrate 31A. In still another aspect, the film layer 305A can prevent a gap from forming between the first upper pressing portion 30111A of the upper die 301A and the substrate front surface 311A of the substrate 31A and prevent a gap from forming between the second upper pressing portion 30121A and the substrate front surface 311A of the substrate 31A, in particular can prevent a gap from forming between the second upper pressing portion 30121A and the substrate front surface 311A of the substrate 31A, by way of deformation, so that in a subsequent molding process, it can not only prevent the fluid medium 400A from flowing from the first molding space 1303*a* to the substrate channel 310A of the substrate 31A to contaminate the photosensitive area 22A of each of the photosensitive elements 20A, but also can prevent the occurrence of undesirable phenomena such as "flash".

With continued reference to FIGS. 66A and 66B, the lower die 302A further includes a lower molding guide portion 3021A and at least one support portion 3022A, and has at least one lower molding guide groove 3023A, wherein the support portion 3022A integrally extends to the lower molding guide portion 3021A, to form the lower molding guide groove 3023A between the support portion 3022A and the lower molding guide portion 3021A or form the lower molding guide groove 3023A between adjacent support portions 3022A.

When the clamping operation is performed on the molding die 300A, the second molding space 1303*b* is formed at a position of the lower die 302A corresponding to the lower molding guide groove 3023A. Moreover, the lower molding guide portion 3021A of the lower die 302A can press against the substrate back surface 312A of the substrate 31A, and the support portion 3022A of the lower die 302A can press against the substrate back surface 312A of the substrate 31A. Preferably, the electronic component 32A protruded from the substrate back surface 312A of the substrate 31A is accommodated in the second molding space 1303*b*. It will be understood that at least one part of the connecting position of the photosensitive element 20A and the substrate back surface 312A of the substrate 31A may be accommodated in the second molding space 1303*b*.

Preferably, the height size of the second molding space 1303*b* of the lower die 302A is larger than the height size of the electronic component 32A protruded from the substrate back surface 312A of the substrate 31A. By this way, when the lower die 302A presses against the substrate back surface 312A of the substrate 31A, there is a safety distance between the electronic component 32A protruded from the substrate back surface 312A of the substrate 31A and the inner surface of the lower die 302A, to protect the surface of the electronic components 32A from being scratched and avoid the electronic components 32A from being pressed by way of avoiding the surface of the electronic components 32A from contacting with the inner surface of the lower die 302A. Further, by way of having the safety distance between the surface of the electronic component 32A and the inner surface of the lower die 302A, the back surface molded portion 41A integrally bonded to the substrate back surface 312A of the substrate 31A can also be subsequently caused to embed the electronic component 32A.

Further preferably, the film layer 305A may be overlappedly disposed on the inner surface of the lower die 302A. For example, the film layer 305A may be overlappedly disposed on the inner surface of the lower die 302A by way of attaching to the inner surface of the lower die 302A. After the molding die 300A is clamped, the film layer 305A is located between the lower molding guide portion 3021A of the lower die 302A and the substrate back surface 312A of the substrate 31A, and between the support portion 3022A and the substrate back surface 312A of the substrate 31A. By this way, in an aspect, the film layer 305A can absorb an impact force generated when the molding die 300A is clamped by way of deformation to avoid the impact force from directly acting on the substrate 31A. In another aspect, the film layer 305A can isolate the lower molding guide portion 3021A of the lower die 302A from the substrate back surface 312A of the substrate 31A and isolate the support portion 3022A from the substrate back surface 312A of the substrate 31A, to avoid the lower molding guide portion 3021A and the support portion 3022A of the lower mold 302A from scratching the substrate back surface 312A of the substrate 31A.

Further, it will be understood that the film layer 305A may also facilitate the drafting of the upper die 301A and the lower die 302A of the molding die 300A, and in this process, the molded base 42A and the back surface molded portion 41A are avoided from being damaged, and in particular, the light window 420A of the molded base 42A is avoided from being damaged, thereby ensuring the reliability of the array camera module 100.

Figure 67:
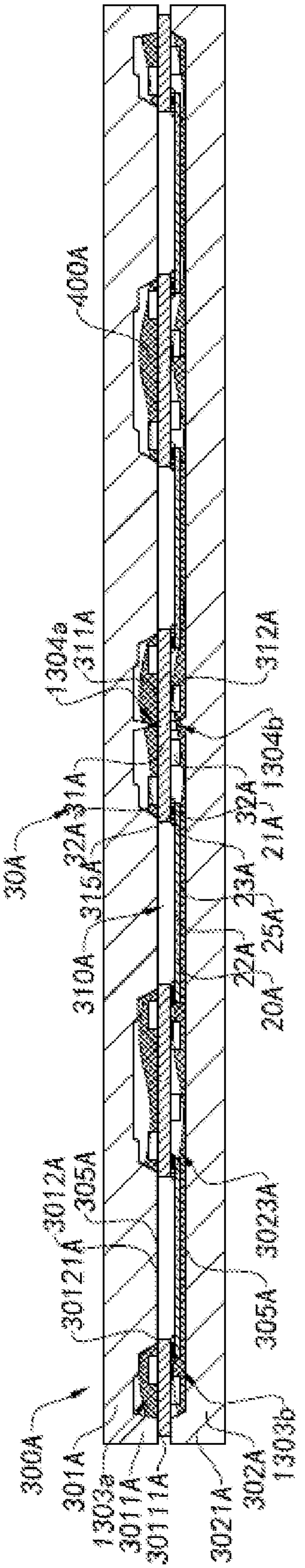
FIG. 67 is a schematic cross-sectional view of the third one of the manufacturing steps of the camera module according to the above preferred embodiment of the present disclosure.
Figure 68:
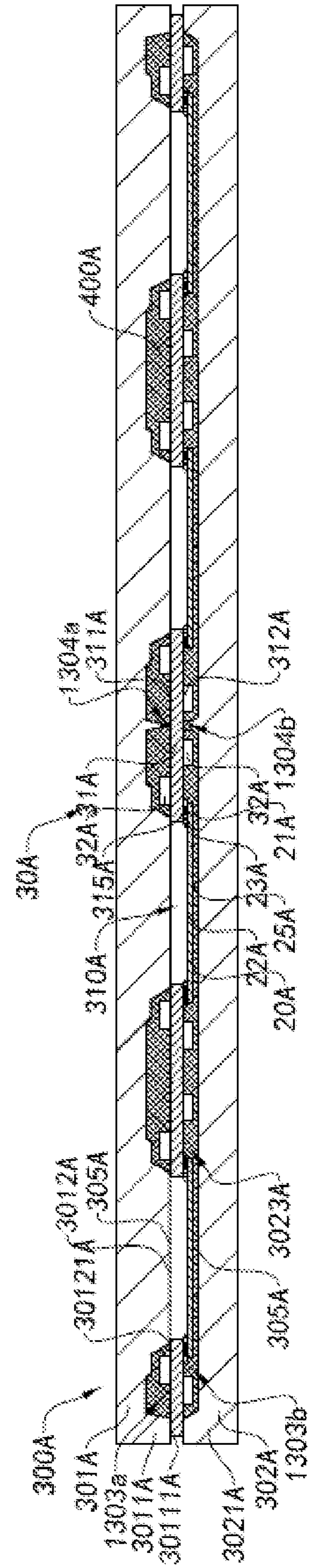
FIG. 68 is a schematic cross-sectional view of the fourth one of the manufacturing steps of the camera module according to the above preferred embodiment of the present disclosure.

At a stage shown in FIGS. 67 and 68, the fluid medium 400A is added to at least one of the first molding spaces 1303*a*, or the fluid medium 400A is added to at least one of the second molding spaces 1303*b*, or the fluid medium 400A is separately added to the first molding space 1303*a* and the second molding space 1303*b*. Since adjacent first molding spaces 1303*a* communicate with each other via the first communication channel 1304*a*, and adjacent second molding spaces 1303*b* communicate with each other via the second communication channel 1304*b*, the fluid medium 400A may fill up all of the first molding spaces 1303*a* and all of the second molding spaces 1303*b*.

It is worth mentioning that the fluid medium 400A may be a liquid, a solid, a mixture of a solid and a liquid, or the like, so that the fluid medium 400A can flow. Further, the fluid medium 400A may be implemented as but not limited to a thermoset material. Of course, it will be understood by those skilled in the art that, in other possible examples, it is also possible that the fluid medium 400A is implemented as a light-curable material or a self-curable material.

Figure 69:
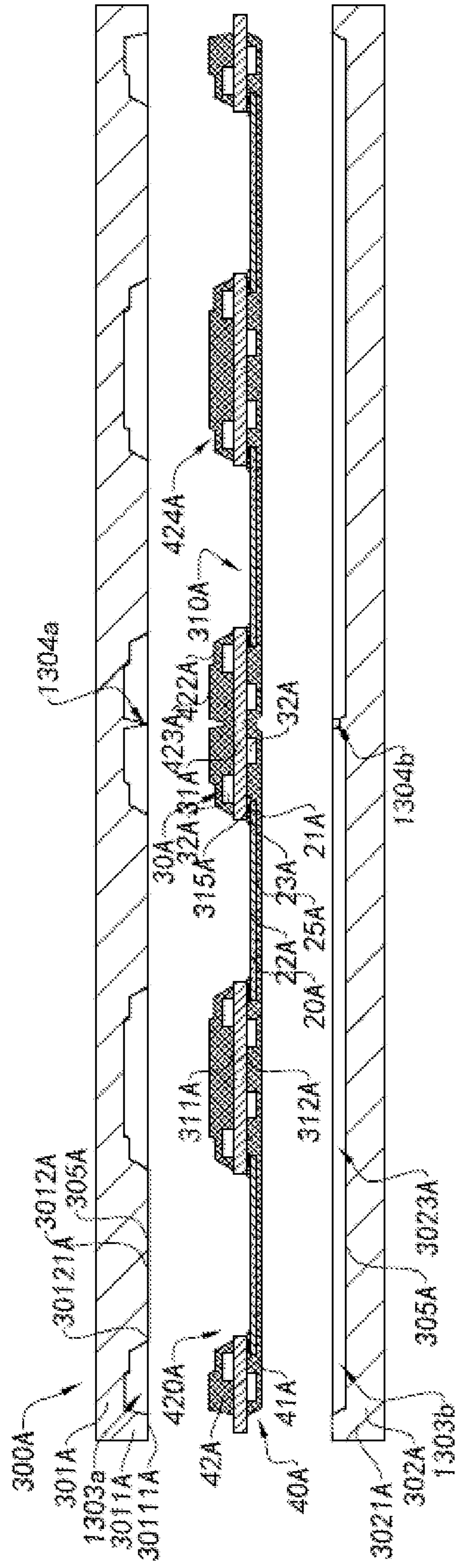
FIG. 69 is a schematic cross-sectional view of the fifth one of the manufacturing steps of the camera module according to the above preferred embodiment of the present disclosure.

After the fluid medium 400A fills up the first molding space 1303*a* and the second molding space 1303*b*, the fluid medium 400A may be cured within the first molding space 1303*a* and the second molding space 1303*b* by way of heating, and the drafting operation may be subsequently performed on the molding die 300A, with reference to the stage shown in FIG. 69, wherein the fluid medium 400A cured within the first molding space 1303*a* forms the molded base 42A integrally bonded to the substrate front surface 311A of the substrate 31A, and forms the light window 420A of the molded base 42A at a position of the upper die 301A corresponding to the light window molding portion 3012A, and the photosensitive area 22A and a part of the non-photosensitive area 23A of the photosensitive element 20A correspond to the light window 420A of the molded base 42A; and wherein the fluid medium 400A cured within the second molding space 1303*b* may form the back surface molded portion 41A integrally bonded to the substrate back surface 312A of the substrate 31A. Preferably, the back surface molded portion 41A embeds the electronic component 32A protruded from the substrate back surface 312A of the substrate 31A. More preferably, the back surface molded portion 41A embeds the chip back surface 25A of the photosensitive element 20A.

Figure 70:
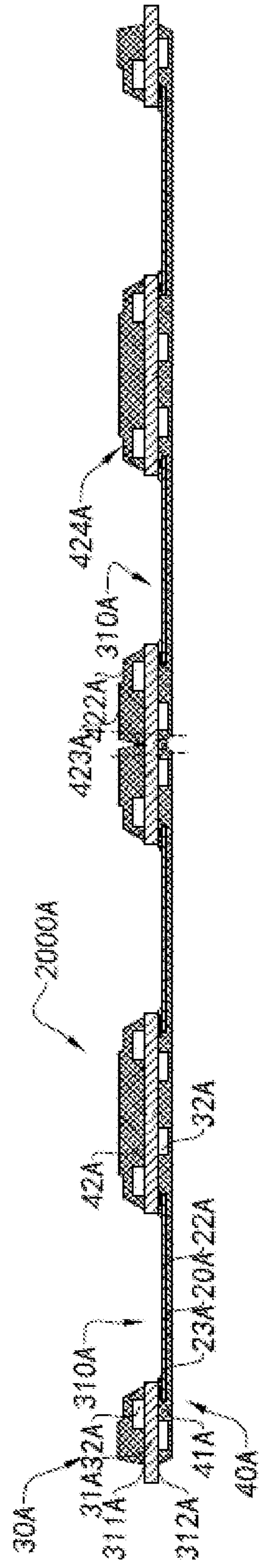
FIG. 70 is a schematic cross-sectional view of the sixth one of the manufacturing steps of the camera module according to the above preferred embodiment of the present disclosure.

At a stage shown in FIG. 70, after the drafting operation is performed on the molding die 300A, a semi-finished product of the molded circuit board assembly 2000A may be formed. Then, in FIGS. 71A and 71B, the semi-finished product of the molded circuit board assembly 2000A may be divided to form the molded circuit board assembly 2000A. A way of dividing the semi-finished product of the molded circuit board assembly 2000A is not limited in the array camera module 100A of the present disclosure. For example, the semi-finished product of the molded circuit board assembly 2000A may be divided by way of cutting to form the molded circuit board assembly 2000A, or the semi-finished product of the molded circuit board assembly 2000A may be divided by way of etching to form the molded circuit board assembly 2000A.

Figure 71A:
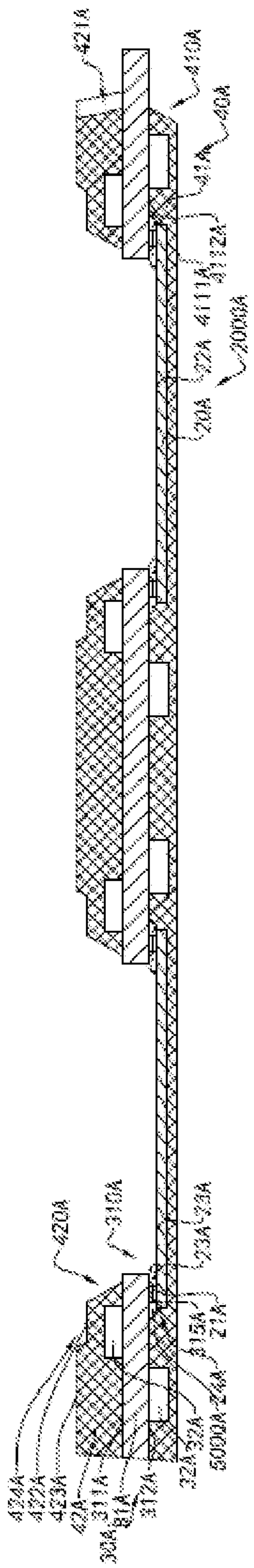
FIGS. 71A and 71B are schematic cross-sectional views of the seventh one of the manufacturing steps of the camera module according to the above preferred embodiment of the present disclosure.

In other examples of the array camera module 100 of the present disclosure, as shown in FIG. 71A, when the semi-finished product of the molded circuit board assembly 2000A is divided, the division direction may also be from a direction where the substrate front surface 311A of the substrate 31A is located to a direction where the substrate back surface 312A is located. In other examples of the array camera module 100 of the present disclosure, as shown in FIG. 71B, when the semi-finished product of the molded circuit board assembly 2000A is divided, the division direction may also be from a direction where the substrate back surface 312A of the substrate 31A is located to a direction where the substrate front surface 311A is located.

Figure 72:
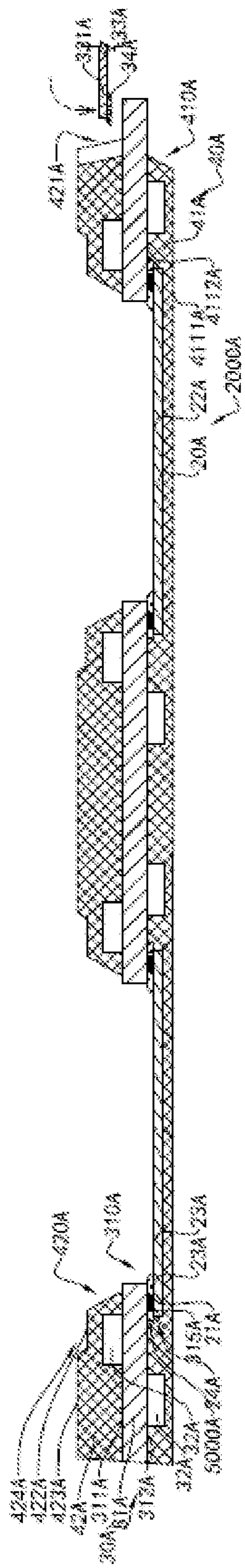
FIG. 72 is a schematic cross-sectional view of the eighth one of the manufacturing steps of the camera module according to the above preferred embodiment of the present disclosure.

At this stage shown in FIG. 72, the module connecting side 331A of the connecting plate 33A is attached to the substrate front surface 311A of the substrate 31A via the connecting portion 34A to conductively connect the connecting plate 33A and the substrate 31A.

Figure 71B:
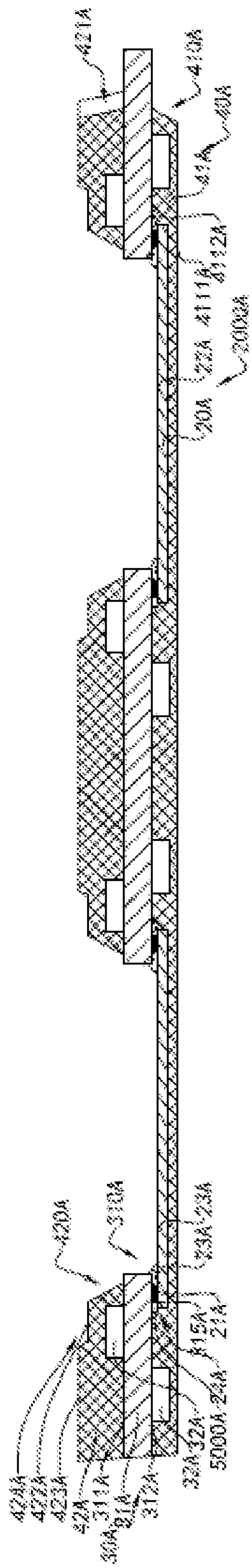

Optionally, the stage shown FIG. 72 may also before the stage shown in FIGS. 71A and 71B, so that the module connecting side 331A of the connecting plate 33A is first attached to the substrate front surface 311A of the substrate 31A via the connecting portion 34A, and then the semi-finished product of the molded circuit board assembly 2000A is divided to form the molded circuit board assembly 2000A.

Figure 73:
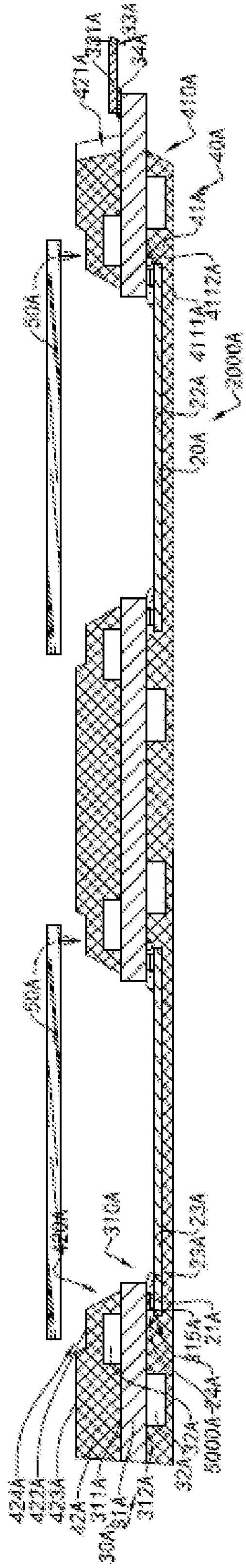
FIG. 73 is a schematic cross-sectional view of the ninth one of the manufacturing steps of the camera module according to the above preferred embodiment of the present disclosure.
Figure 74:
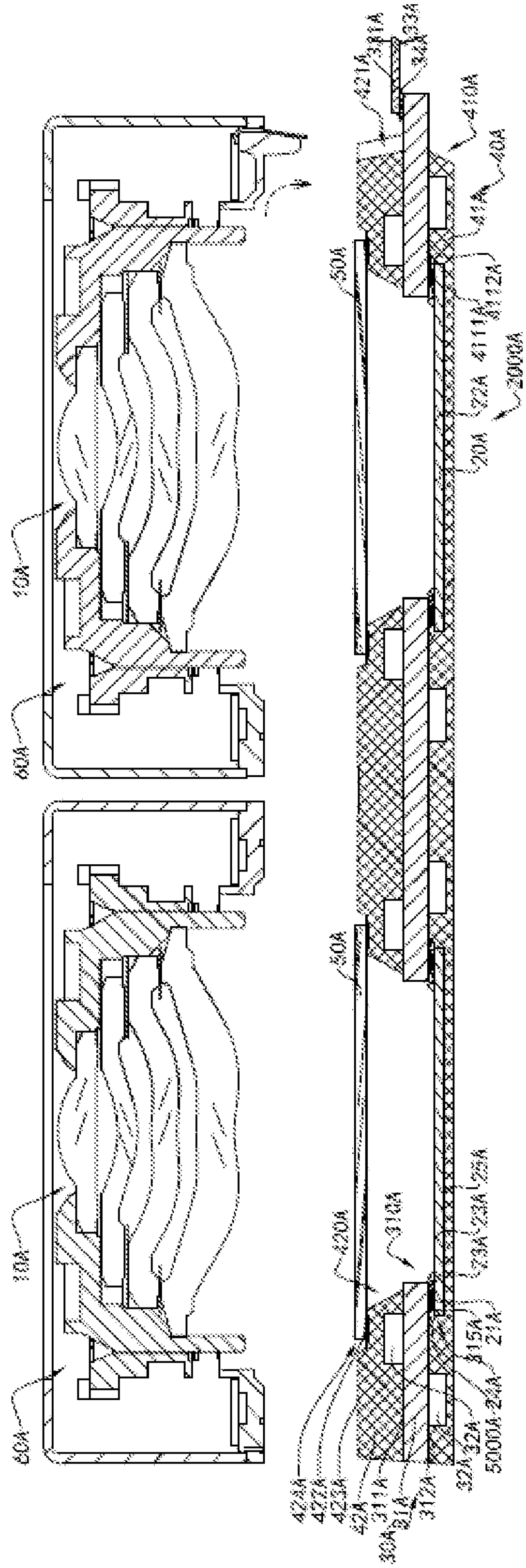
FIG. 74 is a schematic cross-sectional view of the tenth one of the manufacturing steps of the camera module according to the above preferred embodiment of the present disclosure.

At a stage shown in FIG. 73, the filter element 50A is attached to the inner side surface 422A of the molded base 42A, and at a stage shown in FIG. 74, the driver 60A assembled with the optical lens 10A is attached to the outer side surface 423A of the molded base 42A, and the driving pin 61A of the driver 60A is conductively connected to the substrate 31A, so that the optical lens 10A is held in the photosensitive path of the photosensitive element 20A, and the filter element 50A is held between the optical lens 10A and the photosensitive element 20A, thereby obtaining the array camera module 100A shown in FIG. 75.

It is worth mentioning that, although it is shown in the above example of the present disclosure that the back surface molded portion 41A and the molded base 42A are simultaneously integrally bonded to the substrate back surface 312A and the substrate front surface 311A of the substrate 31A, in other examples of the array camera module 100, it is also possible that the back surface molded portion 41A is first integrally bonded to the substrate back surface 312A of the substrate 31A, and then the molded base 42A is integrally bonded to the substrate front surface 311A of the substrate 31A; or the molded base 42A is first integrally bonded to the substrate front surface 311A of the substrate 31A, and then the back surface molded portion 41A is integrally bonded to the substrate front surface 311A of the substrate 31A, that is, the back surface molded portion 41A and the molded base 42A are separately formed by different molding process. The array camera module 100 of the present disclosure is not limited in this regard.

According to another aspect of the present disclosure, the present disclosure further provides a manufacturing method for an array camera module 100A, wherein the manufacturing method includes steps of:

(A) conductively connecting at least one electronic component 32A to a substrate 31A;

(B) attaching at least two photosensitive element 20A to the substrate back surface 312A of the substrate 31A and causing a photosensitive area 22A and one part of a non-photosensitive areas 23A surrounding around the photosensitive area 22A of each of the photosensitive elements 20A to correspond to each of substrate channels 310A of the substrate 31A;

(C) integrally bonding a back surface molded portion 41A to at least one part of the area of the substrate back surface 312A of the substrate 31A by a molding process; and (D) holding each optical lens 10A in the photosensitive path of each of the photosensitive elements, respectively, to obtain the array camera module 100A.

It is worth mentioning that the step (B) may also be performed before the step (A), whereby each of the photosensitive elements 20A is first attached to the substrate back surface 312A of the substrate 31A, and then each of the electronic components 32A is conductively connected to the substrate 31A.

Preferably, in the step (A), the electronic component 32A is conductively connected to the substrate 31A on the substrate front surface 311A and/or the substrate back surface 312A of the substrate 31A.

Further, after the step (C), the manufacturing method further includes a step of: (E) integrally bonding a molded base 42A to at least one part of the area of the substrate front surface 311A of the substrate 31A by a molding process, so that the molded base 42A surrounds around the photosensitive area 22A of each of the photosensitive elements 20A, and the photosensitive area 22A and a part of the non-photosensitive area 23A of each of the photosensitive elements 20A correspond to each of the light windows 420A of the molded base 42A, respectively.

Optionally, the step (E) may also be performed before the step (C), so that the molded base 42 is first integrally bonded to at least one part of the area of the substrate front surface 311A of the substrate 31A, and then the back surface molded portion 41A is integrally bonded to at least one part of the area of the substrate back surface 312A of the substrate 31A.

Still Optionally, the step (C) and the step (E) may be completed together, that is, at the same time when the back surface molded portion 41A is integrally bonded to at least one part of the area of the substrate back surface 312A of the substrate 31A, the molded base 42A is integrally bonded to at least one part of the area of the substrate front surface 311A of the substrate 31A.

Figure 80:
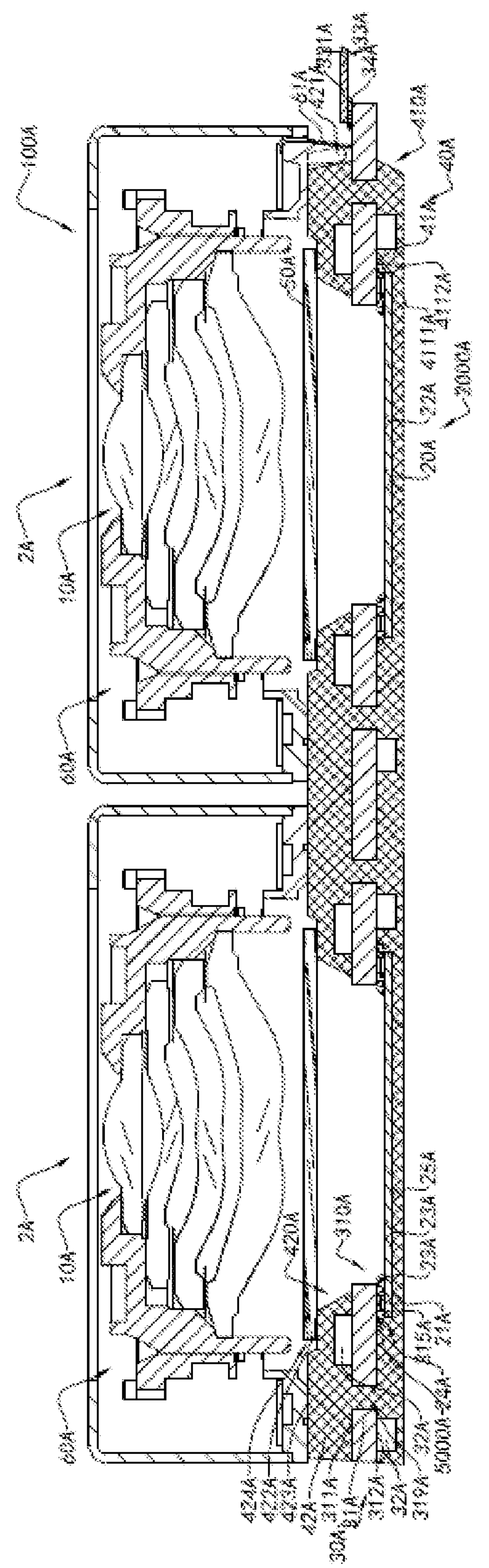
FIG. 80 is a schematic view of the internal structure cut along the intermediate position of another modified implementation of the camera module according to the above preferred embodiment of the present disclosure.

FIG. 80 shows a modified implementation of the array camera module 100A. The substrate 31A further has at least one molding channel 319A, wherein the molding channel 319A extends from the substrate front surface 311A to the substrate back surface 312A of the substrate 31A, that is, the molding channel 319A communicates with the substrate front surface 311A and the substrate back surface 312A of the substrate 31A. In the molding process, the molding channel 319A can communicate with the first molding space 1303*a* and the second molding space 1303*b*, so that when the fluid medium 400A is added to the first molding space 1303*a* and/or the second molding space 1303*b*, the fluid medium 400A may likewise be filled in the molding channel 319A, and may be subsequently cured in the molding channel 319A. It will be understood that the molded base 42A and the back surface molded portion 41A may be integrally formed by the molding channel 319A of the substrate 31A, to avoid the molded base 42A and/or the back surface molded portion 41A from falling off from the substrate 31A, thereby ensuring the reliability of the molded circuit board assembly 2000A and ensuring the reliability of the array camera module 100A.

It will be understood that the molded base 42A and the back surface molded portion 41A are simultaneously integrally formed in at least one part of the area of the substrate front surface 311A of the substrate 31A and at least one part of the area of the substrate back surface 312A, so that at least one part of the substrate 31A can be held between the molded base 42A and the back surface molded portion 41A. By this way, it can not only reinforce the strength of the substrate 31A and cause the substrate 31A to remain flat, so that the substrate 31A may be selected as a thinner sheet to facilitate further reduce the height size of the array camera module 100A, and but also can cause the substrate 31A not to be deformed even when heat generated by each of the photosensitive elements 20A is transmitted to the substrate 31A, thereby ensuring the good electrical properties of the substrate 31A.

Figure 81:
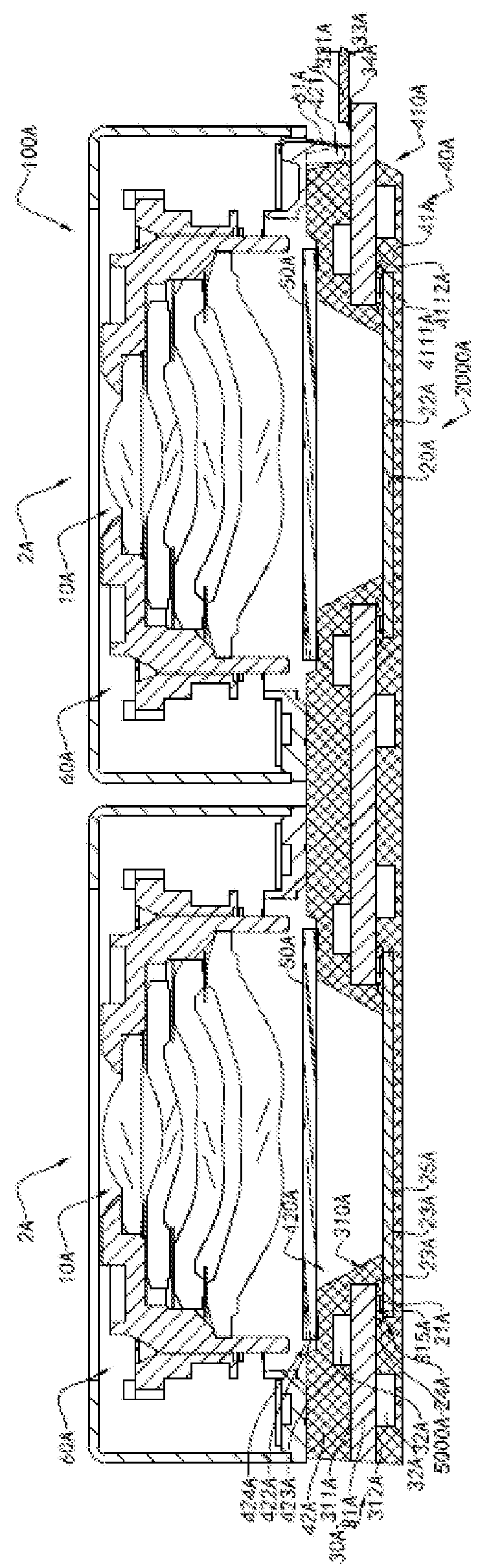
FIG. 81 is a schematic view of the internal structure cut along the intermediate position of another modified implementation of the camera module according to the above preferred embodiment of the present disclosure.

FIG. 81 shows another modified implementation of the array camera module 100A, the molded base 42A further embeds a part of the non-photosensitive area 23A of each of the photosensitive elements 20A, so that the molded base 42A, each of the photosensitive elements 20A, the circuit board 30A and the back surface molded portion 41A are integrally bonded, thereby further ensuring the stability and reliability of the camera module array 100A.

That is, the molded base 42A can extend upwardly from the substrate back surface 312A of the substrate 31A and a part of the non-photosensitive area 23A of each of the photosensitive elements 20A, to form at least one of the inner side surfaces 422A and the outer side surfaces 423A on the top surface of the molded base 42A, and a position corresponding to the photosensitive area 22A and a part of the non-photosensitive areas 23A of each of the photosensitive elements 20A forms each of the light windows 420A of the molded base 42A.

Further, the back surface molded portion 41A is integrally bonded to at least one part of the chip back surface 25A of each of the photosensitive elements 20A, and the molded base 42A is integrally bonded to a part of the non-photosensitive area 23A of each of the photosensitive elements 20A, so that the back surface molded portion 41A and the molded base 42A sandwich each of the photosensitive elements 20A on both sides of each of the photosensitive elements 20A, respectively. By this way, the molded unit 40A can not only ensure the flatness of each of the photosensitive elements 20A, but also can ensure the concentricity of each of the photosensitive elements 20A, to further improve the imaging quality of the array camera module 100A.

Further, the heat generated by each of the photosensitive elements 20A can be directly conducted to the back surface molded portion 41A and the molded base 42A of the molded unit 40A, to quickly dissipate the heat by means of the back surface molded portion 41A and the molded base 42A, thereby ensuring the reliability of the array camera module 100A when used for a long time.

Figure 82A:
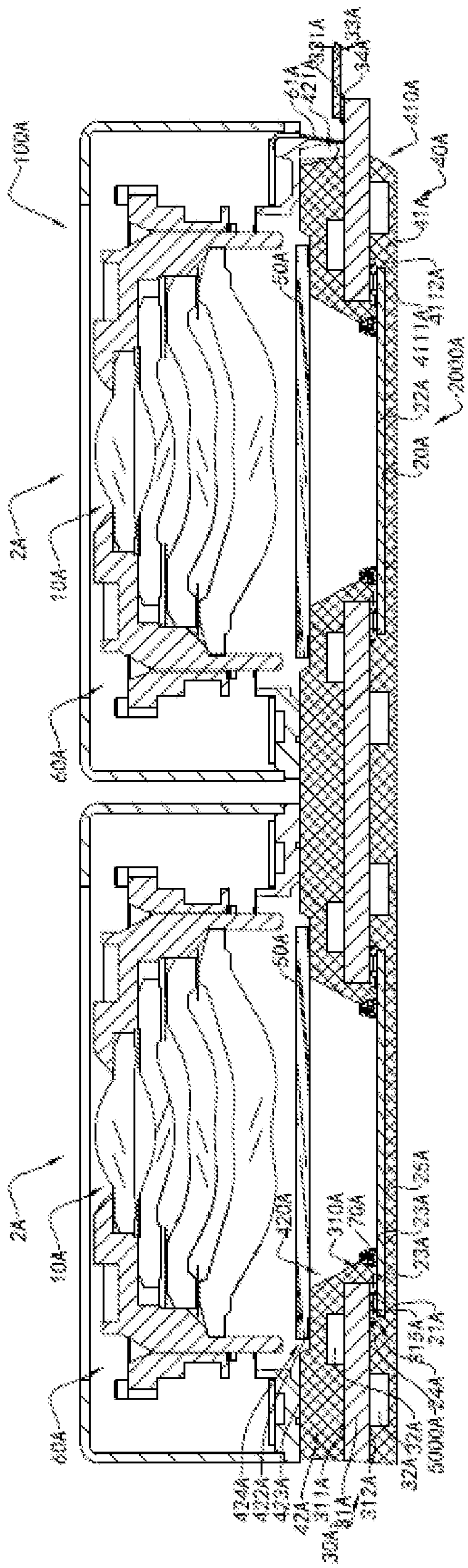
FIG. 82A is a schematic view of the internal structure cut along the intermediate position of another modified implementation of the camera module according to the above preferred embodiment of the present disclosure.

FIG. 82A shows another modified implementation of the array camera module 100A. The array camera module 100A further includes at least one frame-shaped support element 70A, wherein the support element 70A is disposed on the non-photosensitive area 23A of each of the photosensitive elements 20A, or the support element 70A may be formed on the non-photosensitive area 23A of each of the photosensitive elements 20A, and the molded base 42A embeds a part of the support element 70A, so that the molded base 42A, the support element 70A, each of the photosensitive elements 20A, the substrate 30A and the back surface molded portion 41A are integrally bonded.

Preferably, the support element 70 is protruded from the substrate front surface 311A of the substrate 31A. In this way, in the molding process, the second upper pressing portion 30121A of the upper die 301A can directly press against the support element 70A to prevent the second upper pressing portion 30121A of the upper die 301A from directly contacting with the substrate front surface 311A of the substrate 31A.

More preferably, the support element 70A has elasticity. For example, the support element 70A may be formed by curing a medium such as glue or resin. In this way, on the one hand, the support element 70A can absorb an impact force generated when the molding die 300A is clamped, and on the other hand, the support element 70A can prevent a gap from forming between the second upper pressing portion 30121A of the upper die 301A and the support element 70A by way of deformation, so that when the fluid medium 400A is added to the first molding space 1303*a*, the fluid medium 400A can be prevented from flowing from the first molding space 1303*a* into the substrate channels 310A of the substrate 31A, to avoid the photosensitive area 22A of each of the photosensitive elements 20A from being contaminated, and the occurrence of undesirable phenomena such as "flash" can be prevented.

Figure 82B:
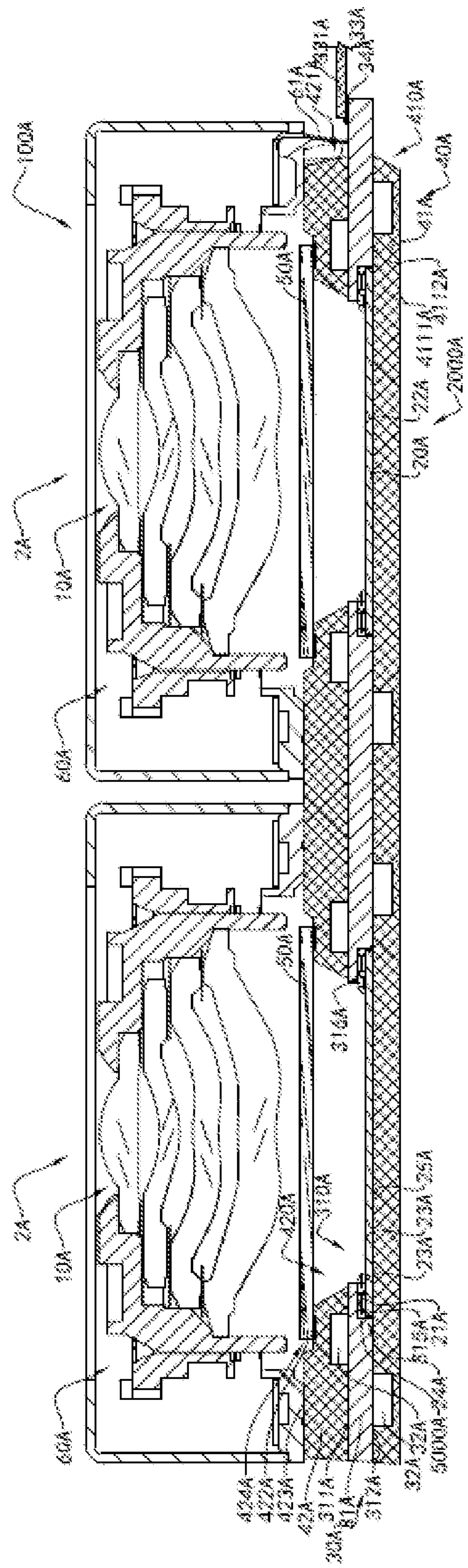
FIG. 82B is a schematic view of the internal structure cut along the intermediate position of another modified implementation of the camera module according to the above preferred embodiment of the present disclosure.

FIG. 82B shows a schematic view of another modified implementation of the array camera module 100A. The substrate 31A has at least one accommodating space 316A, wherein each of the accommodating spaces 316A is communicated to each of the channel substrates 310A, respectively, and each of the accommodating spaces 316A extends from the substrate back surface 312A towards the substrate front surface 311A of the substrate 31A, respectively; and wherein the photosensitive elements 20A attached to the substrate back surface 312A of the substrate 31A can be accommodated in the accommodating space 316A. In this way, the height size of the array camera module 100A can be further reduced.

Figure 83:
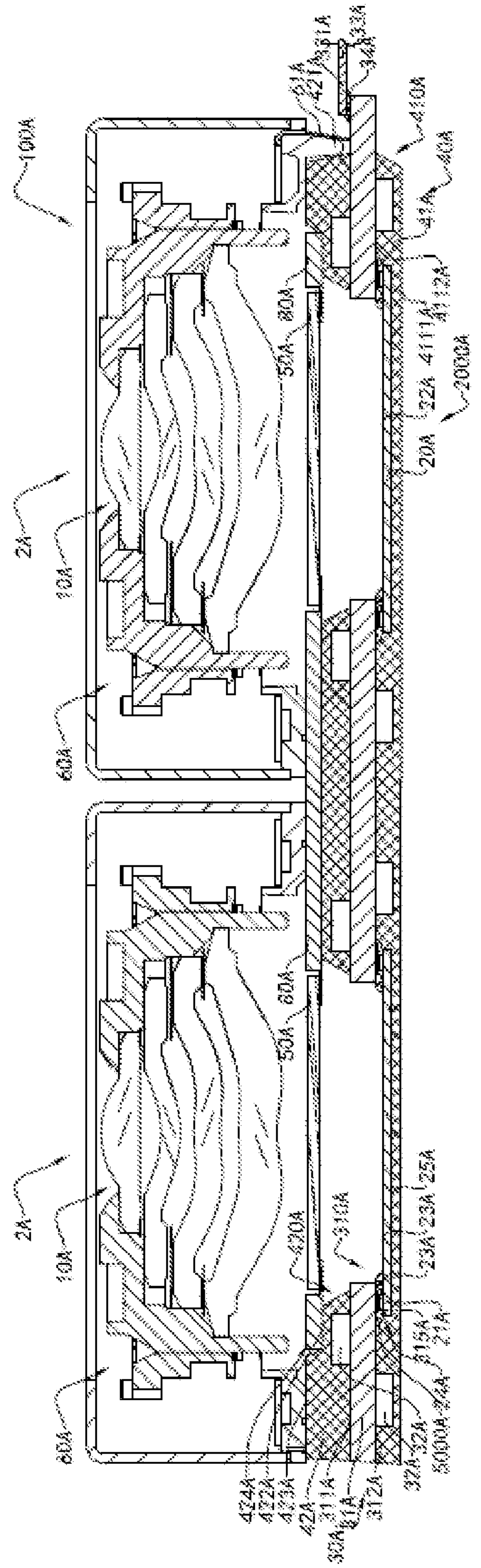
FIG. 83 is a schematic view of the internal structure cut along the intermediate position of another modified implementation of the camera module according to the above preferred embodiment of the present disclosure.

FIG. 83 shows another modified implementation of the array camera module 100A. The array camera module 100A further includes at least one frame-shaped bracket 80A, wherein in this specific example of the array camera module 100A shown in FIG. 83, a case where the array camera module 100A includes one bracket 80A is taken as an example to set forth the features of the array camera module 100A of the present disclosure, but it does not constitute an limitation of the scope and content of the array camera module 100A of the present disclosure.

Specifically, each of the filter elements 50A is attached to the bracket 80A, and the bracket 80A is attached to the inner side surface 422A of the molded base 42A, so that each of the filter elements 50A is held between each of the optical lenses 10A and each of the photosensitive elements 20A, respectively. Preferably, the bracket 80A is held in the attaching groove 424A of the molded base 42A.

The bracket 80A holds each of the filter elements 50A between each of the optical lenses 10A and each of the photosensitive elements 20A, respectively, in such a manner that the area of the filter element 50A can be reduced, to facilitate reducing the manufacturing cost of the array camera module 100A.

Optionally, the number of brackets 80A is the same as that of the filter elements 50A, so that each of the filter elements 50A is individually attached to one of the brackets 80A. Each of the brackets 80A is attached at different positions of the inner side surface 422A of the molded base 42A, respectively, so that each of the filter elements 50A is held between each of the optical lenses 10A and each of the photosensitive elements 20A, respectively.

Figure 84:
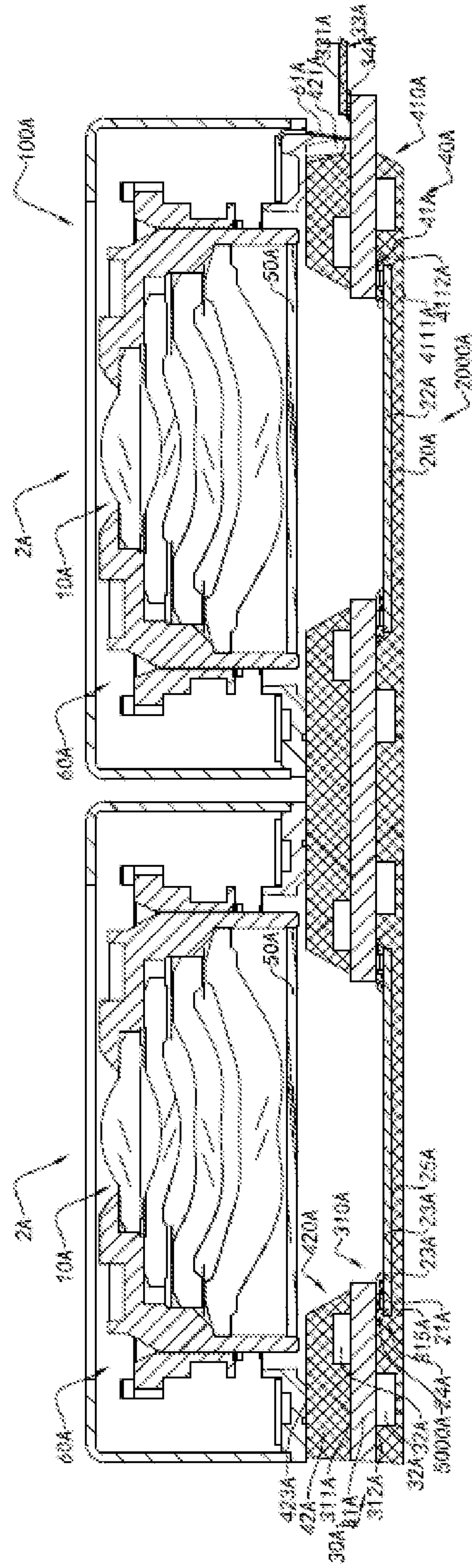
FIG. 84 is a schematic view of the internal structure cut along the intermediate position of another modified implementation of the camera module according to the above preferred embodiment of the present disclosure.

FIG. 84 shows another modified implementation of the array camera module 100A. Each of the filter elements 50A may be directly attached to each of the optical lenses 10A, so that each of the filter elements 50A is held between each of the optical lenses 10A and each of the photosensitive elements 20A, respectively.

Figure 85:
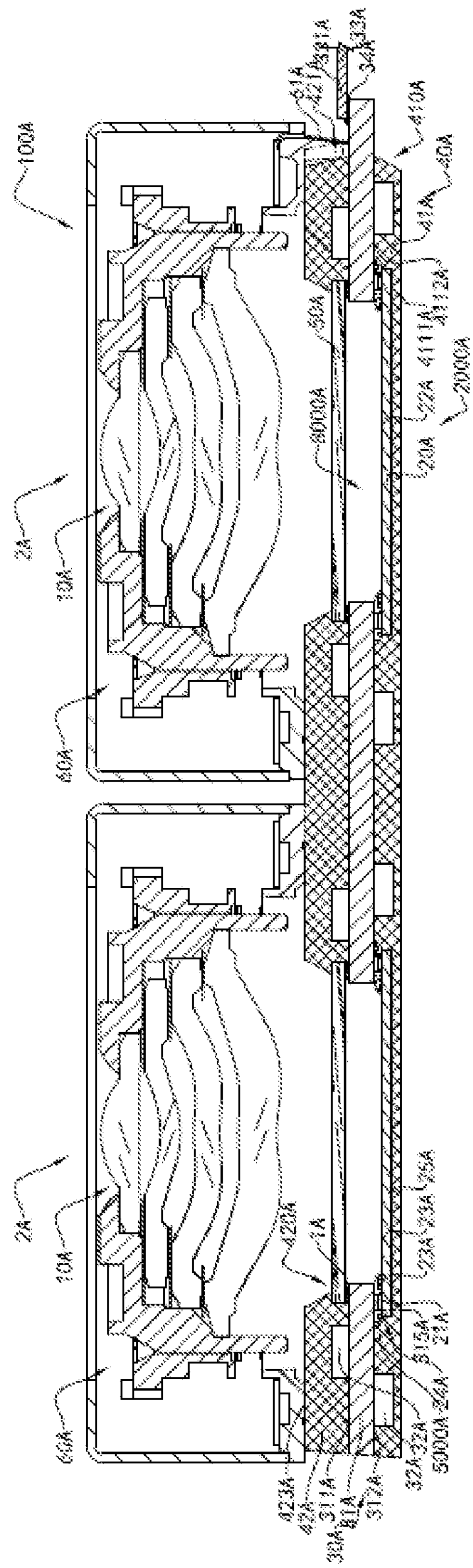
FIG. 85 is a schematic view of the internal structure cut along the intermediate position of another modified implementation of the camera module according to the above preferred embodiment of the present disclosure.

FIG. 85 shows another modified implementation of the array camera module 100A. Each of the filter elements 50A is directly attached to the substrate front surface 311A of the substrate 31A, so that a sealed space 8000A is formed among the substrate 31A, each of the photosensitive elements 20A, and each of the filter elements 50A at a position corresponding to each of the substrate channels 310A of the substrate 31A, wherein the photosensitive area 22A and a part of the non-photosensitive areas 23A of each of the photosensitive elements 20 is held in each of the sealed spaces 8000A. By this way, in a subsequent molding process, by way of preventing the fluid medium 400A from entering each of the sealed spaces 8000A, the photosensitive area 22A of each of the photosensitive elements 20 is prevented from being contaminated, thereby improving the product yield of the array camera module 100A.

Preferably, the molded base 42A embeds the outer edge of each of the filter elements 50A, so that the molded base 42A, each of the filter elements 50A, the substrate 31A, each of the photosensitive elements 20A and the back surface molded portion 41A are integrally bonded.

Further, the array camera module 100A further includes at least one frame-shaped buffer portion 1A, wherein the buffer portion 1A is disposed between each of the filter elements 50A and the substrate front surface 311A of the substrate 31A, and the buffer portion 1A is used for attaching each of the filter elements 50A to the substrate front surface 311A of the substrate 31A, and for isolating each of the filter elements 50A from the substrate front surface 311A of the substrate 31A. Preferably, the buffer portion 1A has elasticity.

It is worth mentioning that the way of forming the buffer portion 1A is not limited in the array camera module 100A of the present disclosure. For example, it is possible that a substance such as but not limited to resin or glue is first applied on the substrate front surface 311A of the substrate 31A, and then each of the filter elements 50A is overlappedly disposed on the substrate front surface 311A of the substrate 31A, so that the resin or glue applied on the substrate front surface 311A of the substrate 31A may form the buffer portion 1A held between each of the filter elements 50A and the substrate front surface 311A of the substrate 31A. It will be understood by those skilled in the art that, it is also possible that the buffer portion 1A is first formed on each of the filter elements 50A, and then each of the filter elements 50A is attached to the substrate front surface 311A of the substrate 31A, so that the buffer portion 1A is held between each of the filter elements 50A and the substrate front surface 311A of the substrate 31A.

Figure 86:
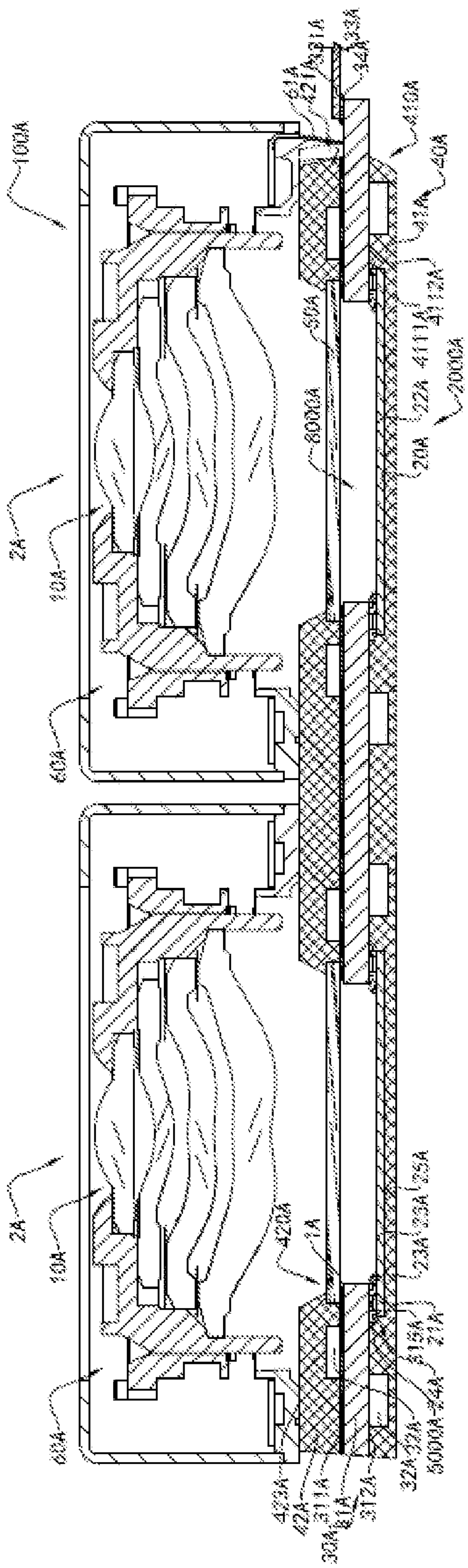
FIG. 86 is a schematic view of the internal structure cut along the intermediate position of another modified implementation of the camera module according to the above preferred embodiment of the present disclosure.

FIG. 86 shows another modified implementation of the array camera module 100A. The buffer portion 1A may also overlappedly cover at least one part of the area of the substrate front surface 311A of the substrate 31, so that after the molded base 42A is formed, the buffer portion 1A can be held between the molded base 42A and the substrate front surface 311A of the substrate 31A. For example, in one embodiment of the array camera module 100A of the present disclosure, it is possible that the substance such as resin or glue is applied to at least one part of the area of the substrate front surface 311A of the substrate 31A, to form the buffer portion 1A overlapped on the at least one part of the area of the substrate front surface 311A of the substrate 31A, and then each of the filter elements 50A is attached, so that a part of the buffer portion 1A is held between each of the filter elements 50A and the substrate front surface 311A of the substrate 31A, wherein the buffer portion 1A prevents a gap from forming between each of the filter elements 50A and the substrate front surface 311A of the substrate 31A, so that each of the sealed spaces 8000A is formed among the substrate 31A, each of the photosensitive elements 20A and each of the filter elements 50A. The buffer portion 1A overlappedly formed on the substrate front surface 311A of the substrate 31A can protect the substrate front surface 311A of the substrate 31A in the molding process, and in a subsequent baking process, the buffer portion 1A can also compensate for a difference of a deformation magnitude of the molded base 42A and a deformation magnitude of the substrate 31A by way of deformation, to improve the product yield of the array camera module 100A and ensure the reliability of the array camera module 100A.

Figure 87:
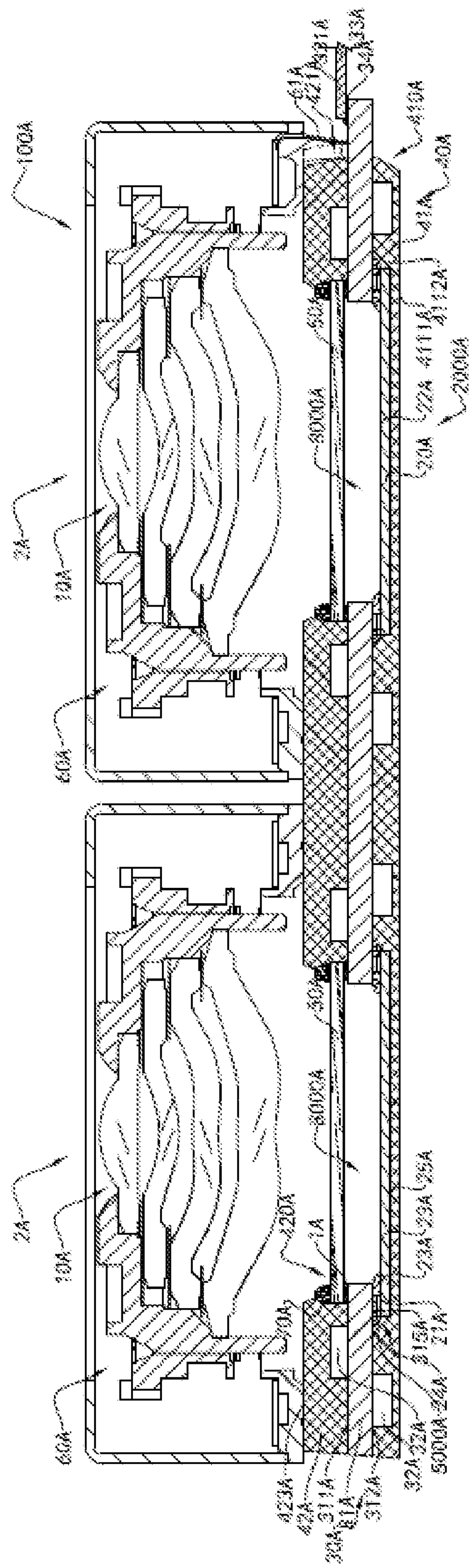
FIG. 87 is a schematic view of the internal structure cut along the intermediate position of another modified implementation of the camera module according to the above preferred embodiment of the present disclosure.

FIG. 87 shows another modified implementation of the array camera module 100A. The support element 70A may also be formed in the outer edge of each of the filter elements 50A, so that after the molding process is completed, the molded base 42A embeds at least one part of the support element 70A.

Figure 88:
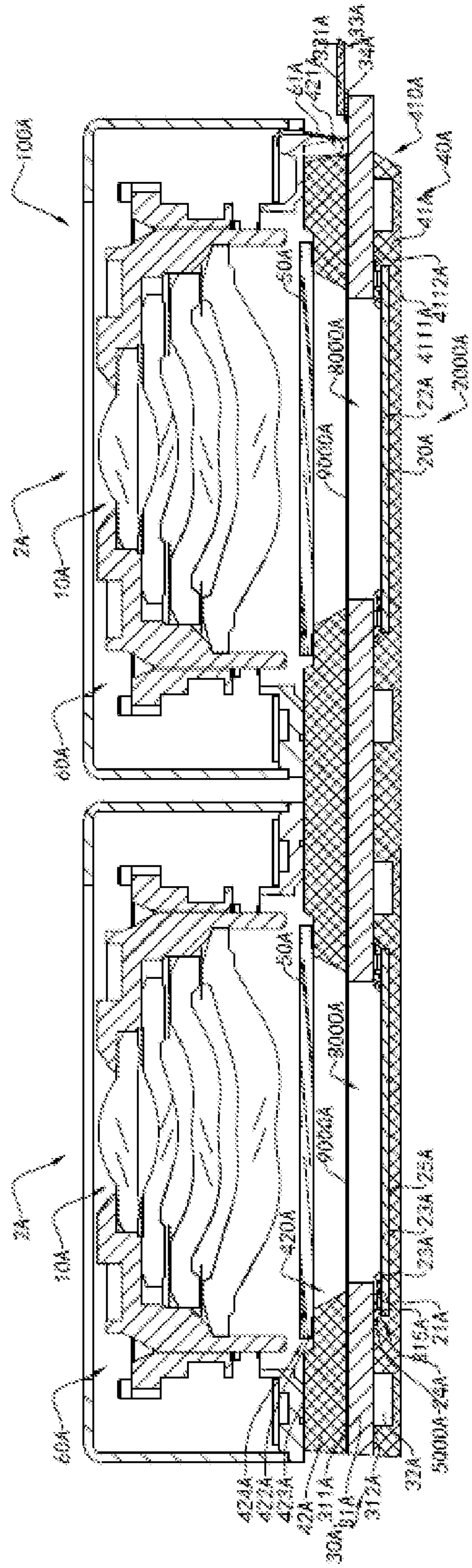
FIG. 88 is a schematic view of the internal structure cut along the intermediate position of another modified implementation of the camera module according to the above preferred embodiment of the present disclosure.

FIG. 88 shows another modified implementation of the array camera module 100A. The array camera module 100A further includes a transparent protective element 9000A, and before the molding process, the protective element 9000A is overlappedly disposed on the substrate front surface 311A of the substrate 31A, to avoid the substrate front surface 311A of the substrate 31A from being exposed. For example, after the substrate 31A is provided or made, the transparent protective element 9000A is overlappedly disposed on the substrate front surface 311A of the substrate 31A. For example, the protective element 9000A may be but not limited to a transparent film.

When each of the photosensitive elements 20A is attached to the substrate back surface 312A of the substrate 31A, respectively, each of the sealed space 8000A is formed among the substrate 31A, each of the photosensitive elements 20A and the protective element 9000A at the position of the substrate 31A corresponding to each of the substrate channels 310A, and the photosensitive area 22A and a part of the non-photosensitive area 23A of each of the photosensitive elements 20A are located in each of the sealed spaces 8000A, to avoid the photosensitive area 22A of each of the photosensitive elements 20A from being contaminated in the subsequent molding process.

Further, the protective element 9000A may also protect the substrate front surface 311A of the substrate 31A from being scratched, thereby ensuring the good electrical properties of the substrate 31A, to facilitate improving the product yield of the array camera module 100A.

Figure 89:
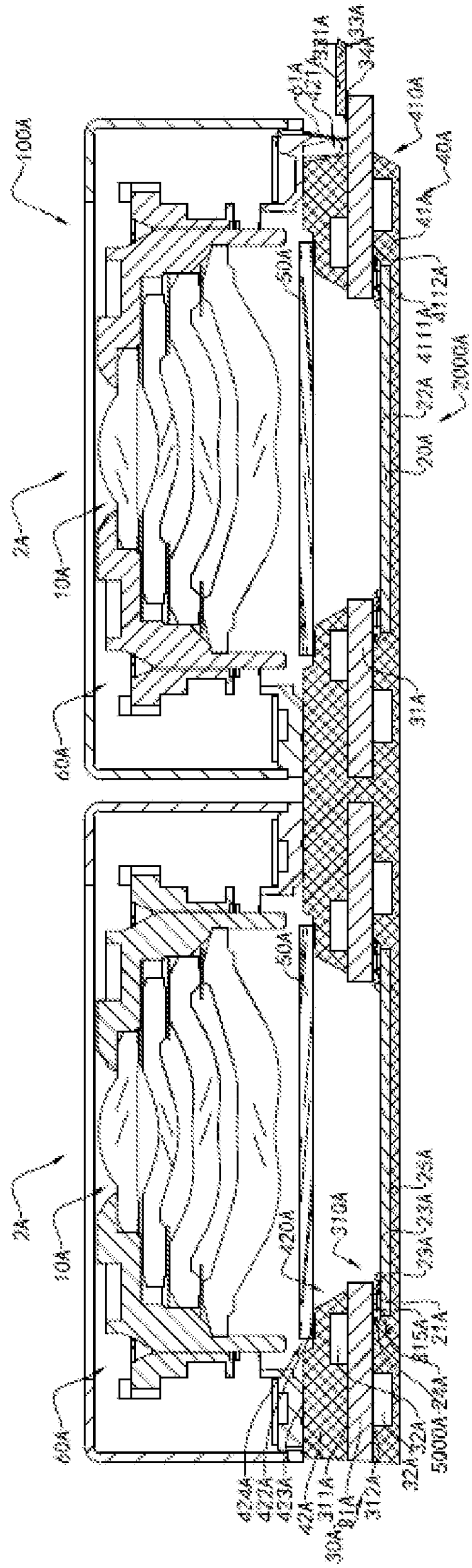
FIG. 89 is a schematic view of the internal structure cut along the intermediate position of another modified implementation of the camera module according to the above preferred embodiment of the present disclosure.

FIG. 89 shows another modified implementation of the array camera module 100A. The number of the substrates 31A of the circuit boards 30A may be multiple, and for example, the number of the substrates 31A may be the same as that of the photosensitive elements 20A. For example, in this specific example of the array camera module 100A shown in FIG. 89, the number of the substrates 31A may be implemented but not limited to two, wherein each of the substrates 31A has one of the substrate channels 310A, respectively, a part of the non-photosensitive area 23A of each of the photosensitive elements 20A is attached to the substrate back surface 312A of each of the substrates 31A, respectively, and the photosensitive area 22A and another part of the non-photosensitive areas 23A of each of the photosensitive elements 20A correspond to the substrate channel 310A of each of the substrates 31A, respectively.

In one specific example, the back surface molded portion 41A may be simultaneously integrally bonded to the substrate back surface 312A of each of the substrates 31A. In another specific example, the molded base 42A may be simultaneously integrally bonded to the substrate front surface 311A of each of the substrates 31A. In this specific example of the array camera module 100A shown in FIG. 89, the back surface molded portion 41A is simultaneously integrally bonded to the substrate back surface 312A of each of the substrates 31A and the molded base 42A is simultaneously integrally bonded to the substrate front surface 311A of each of the substrates 31A.

Figure 90:
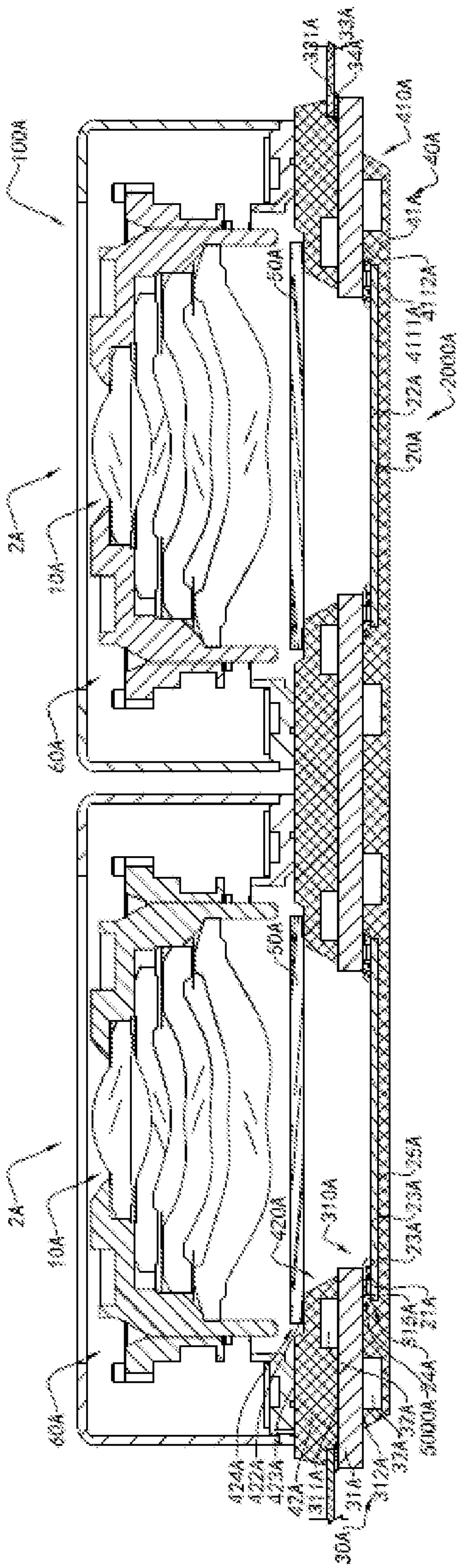
FIG. 90 is a schematic view of the internal structure cut along the intermediate position of another modified implementation of the camera module according to the above preferred embodiment of the present disclosure.

FIG. 90 shows another modified implementation of the array camera module 100A. The molded base 42A further embeds the module connecting side 331A of at least one of the connecting plates 33A. For example, In this specific example of the array camera module 100A shown in FIG. 90, the molded base 42A embeds the module connecting side 331A of each of the connecting plates 33A, to prevent each of the connecting plates 33A from falling off from the substrate front surface 311A of the substrate 31A, thereby ensuring the reliability and stability of the connecting position of each of the connecting plates 33A and the substrate 31A. That is to say, the molded base 42A can extend from the substrate 31A to each of the connecting plates 33A, to embed the module connecting side 331A of each of the connecting plates 33A.

Figure 91:
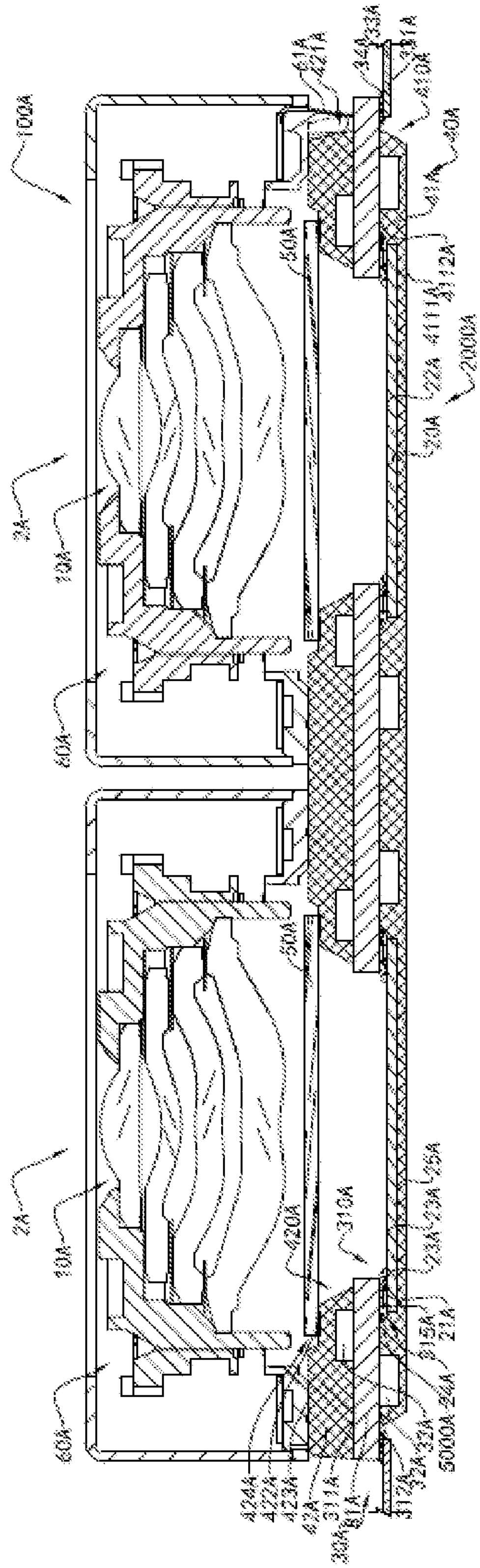
FIG. 91 is a schematic view of the internal structure cut along the intermediate position of another modified implementation of the camera module according to the above preferred embodiment of the present disclosure.

FIG. 91 shows another modified implementation of the array camera module 100A. The module connecting side 331A of each of the connecting plates 33A may also be attached to the substrate back surface 312A of the substrate 31A. For example, the module connecting side 331A of each of the connecting plates 33A may be attached to the substrate back surface 312A of the substrate 31A via the connecting plate 33A.

Figure 92:
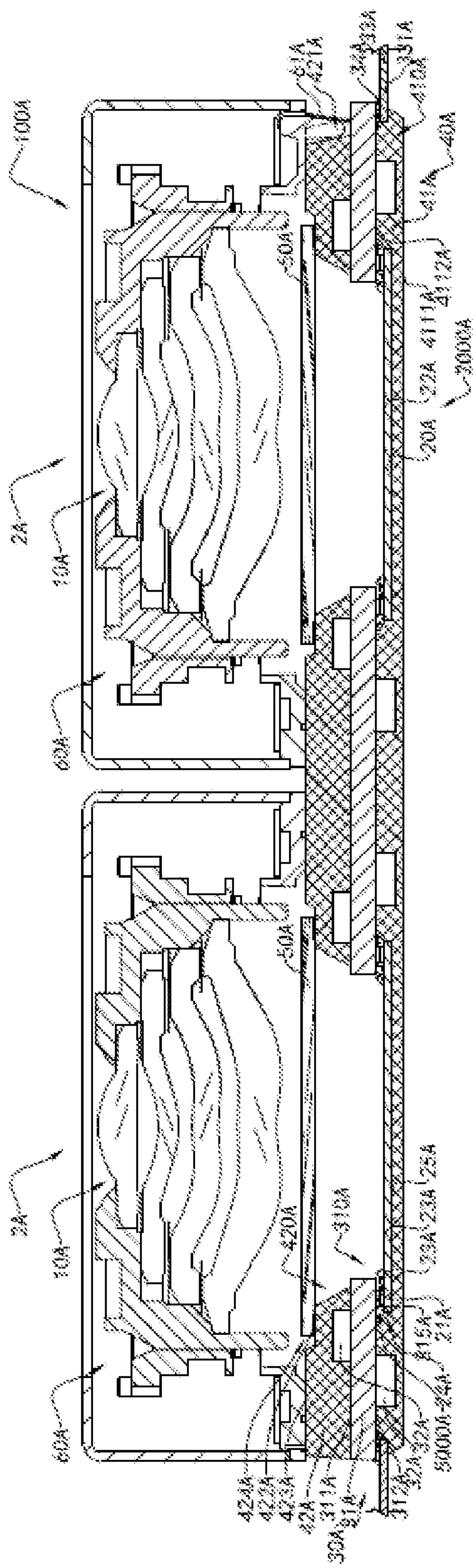
FIG. 92 is a schematic view of the internal structure cut along the intermediate position of another modified implementation of the camera module according to the above preferred embodiment of the present disclosure.

FIG. 92 shows another modified implementation of the array camera module 100A. The back surface molded portion 41A further embeds the module connecting side 331A of at least one of the connecting plates 33A. For example, In this specific example of the array camera module 100A shown in FIG. 92, the back surface molded portion 41A embeds the module connecting side 331A of each of the connecting plates 33A, to prevent each of the connecting plates 33A from falling off from the substrate back surface 312A of the substrate 31A, thereby ensuring the reliability of the connecting position of each of the connecting plates 33A and the substrate 31A. That is to say, the back surface molded portion 41A can extend from the substrate 31A to each of the connecting plates 33A, to embed the module connecting side 331A of each of the connecting plates 33A.

Figure 93:
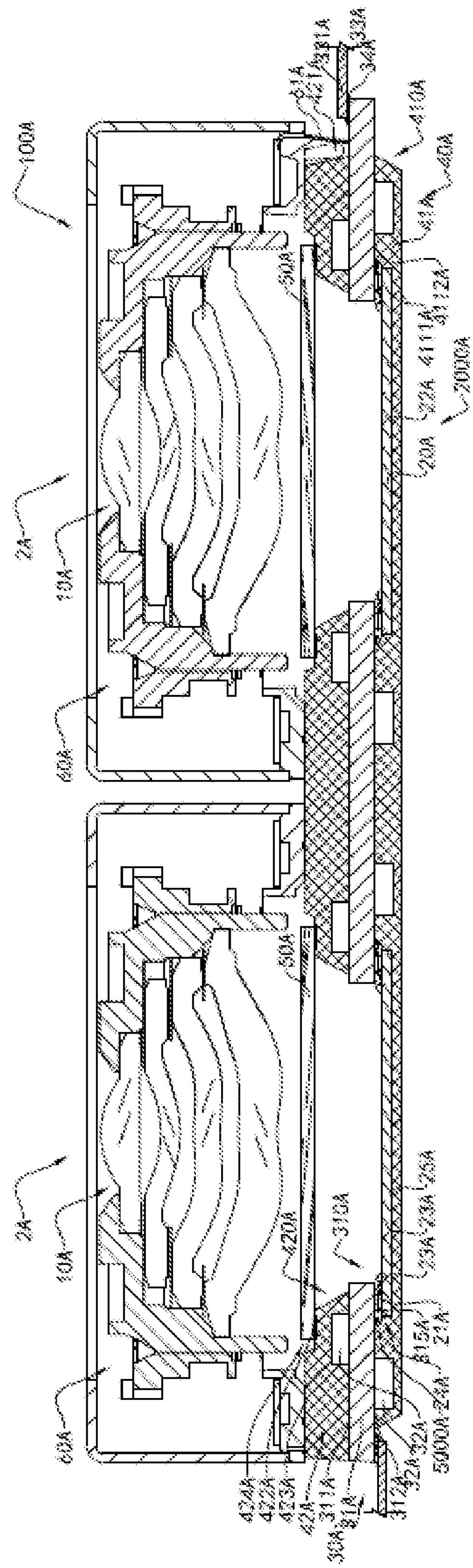
FIG. 93 is a schematic view of the internal structure cut along the intermediate position of another modified implementation of the camera module according to the above preferred embodiment of the present disclosure.

FIG. 93 shows another modified implementation of the array camera module 100A. The module connecting side 331A of at least one of the connecting plates 33A is attached to the substrate front surface 311A of the substrate 31A, and, the module connecting sides 331A of the other connecting plates 33A are attached to the substrate back surface 312A of the substrate 31A.

Figure 94:
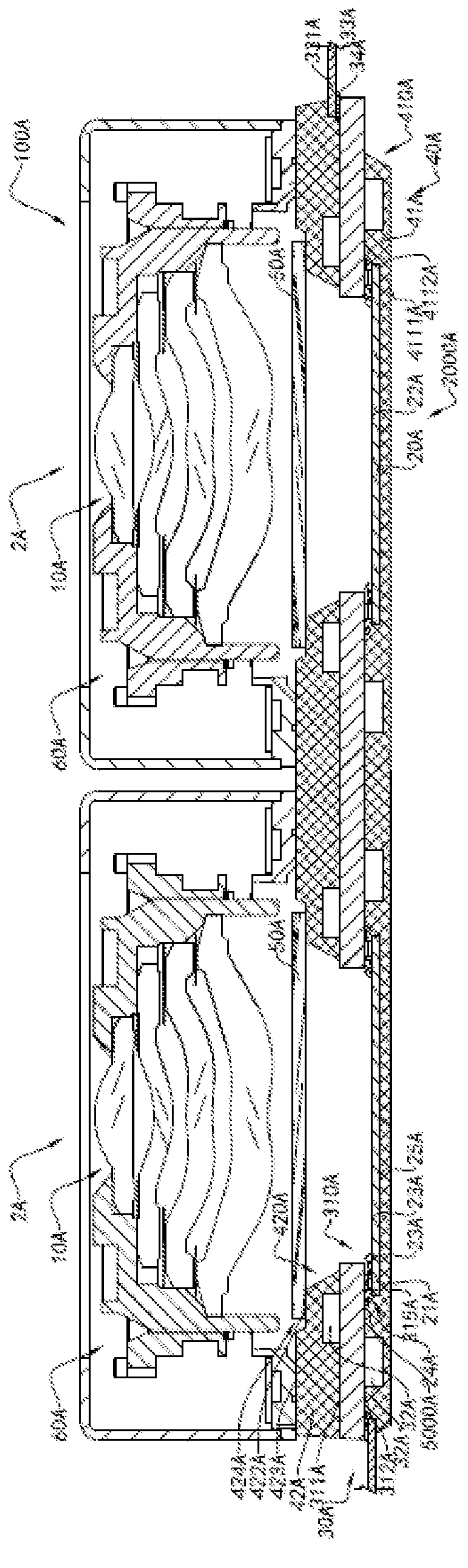
FIG. 94 is a schematic view of the internal structure cut along the intermediate position of another modified implementation of the camera module according to the above preferred embodiment of the present disclosure.

FIG. 94 shows another modified implementation of the array camera module 100A. The molded base 42A extends from the substrate front surface 311A of the substrate 31A to the connecting plate 33A, to embed the module connecting side 331A of the connecting plate 33A attached to the substrate front surface 311A of the substrate 31A, and the back surface molded portion 41A extends from the substrate back surface 312A of the substrate 31A to the connecting plate 33A, to embed the module connecting side 331A of the connecting plate 33A attached to the substrate back surface 312A of the substrate 31A.

Figure 95:
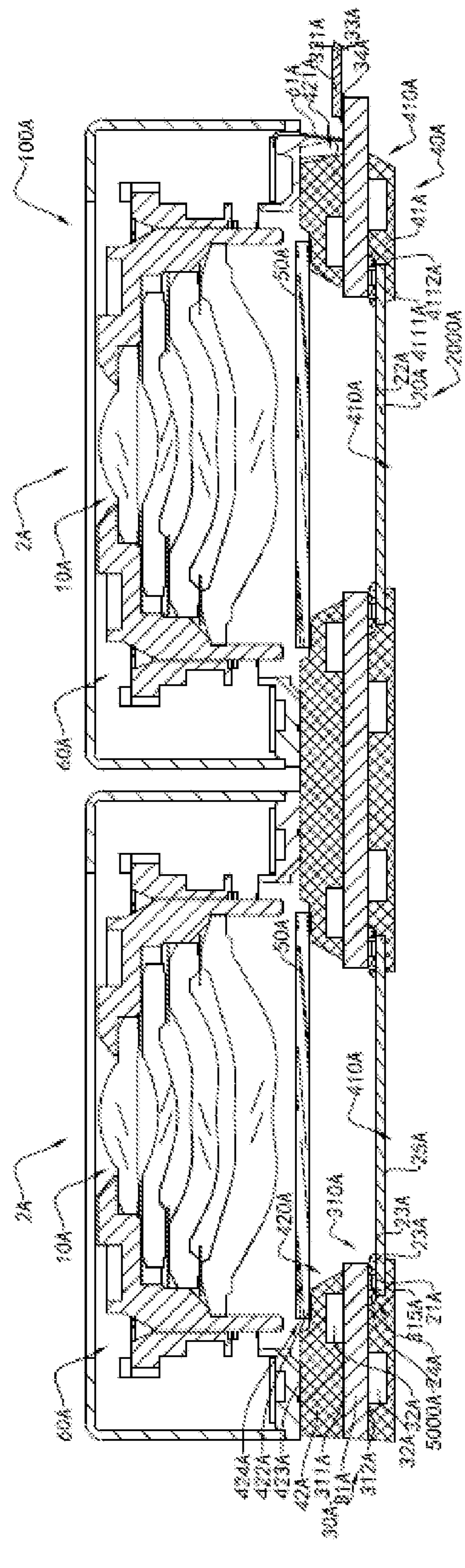
FIG. 95 is a schematic view of the internal structure cut along the intermediate position of another modified implementation of the camera module according to the above preferred embodiment of the present disclosure.

FIG. 95 shows another modified implementation of the array camera module 100A. The back surface molded portion 41A extends from the substrate back surface 312A of the substrate 31A to the edge of the chip back surface 25A of each of the photosensitive elements 20A, so that the back surface molded portion 41A only embed the edge of the chip back surface 25A of each of the photosensitive elements 20A, so that the middle portion of the chip back surface 25A of each of the photosensitive elements 20A is exposed, and the back surface molded portion 41A forms an assembling space 410A at a position corresponding to the middle portion of the chip back surface 25A of each of the photosensitive elements 20A. By this way, on the one hand, it is advantageous to quickly dissipate heat for each of the photosensitive elements 20A, and on the other hand, when the array camera module 100A is assembled to the device body 200A, the assembling space 410A can also accommodate other assembled components of the device body 200A, to facilitate the lightweight and thinning of the electronic device.

It will be understood that the back surface molded portion 41A may form at least one of the assembling spaces 410A at other positions. For example, the assembling space 410A may also be formed in the middle portion or edge of the back surface molded portion 41A. Preferably, the number, position, shape and size of the assembling spaces 410 are not limited in the array camera module 100A of the present disclosure, and they may be selected as needed.

Figure 96:
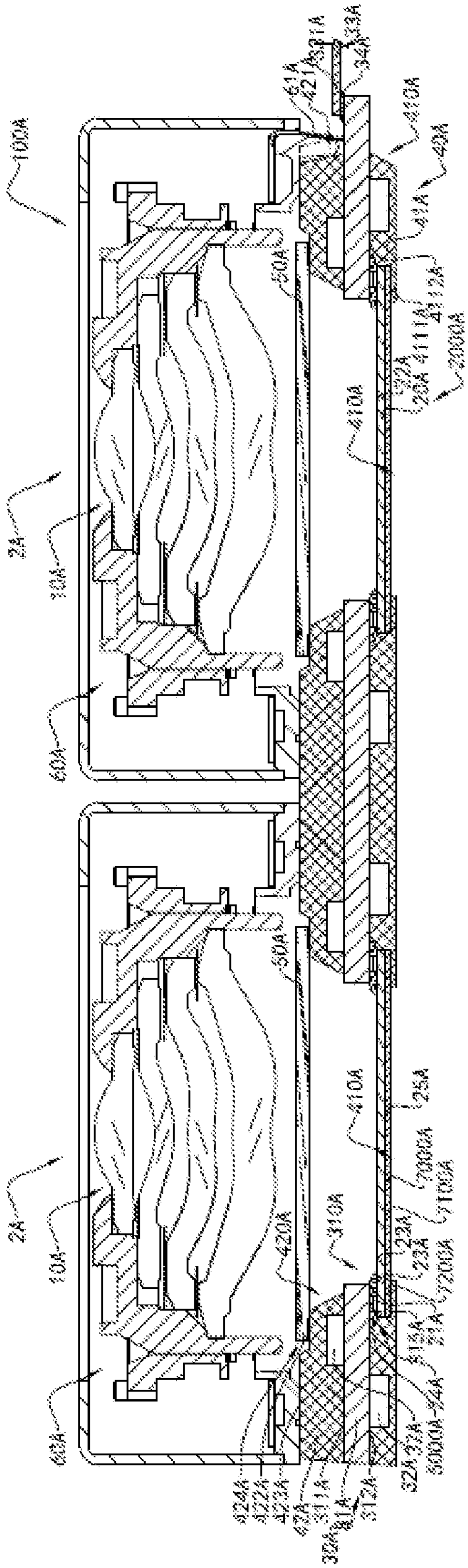
FIG. 96 is a schematic view of the internal structure cut along the intermediate position of another modified implementation of the camera module according to the above preferred embodiment of the present disclosure.

FIG. 96 shows another modified implementation of the array camera module 100A. The array camera module 100A further includes at least one protective element 7000A, wherein each of the protective elements 7000A may be overlappedly disposed on the chip back surface 25A of each of the photosensitive elements 20As; wherein each of the protective elements 7000A has an exposed area 7100A and an embedded area 7200A surrounding around the exposed area 7100A; and wherein the back surface molded portion 41 embeds at least one part of the area of the substrate back surface 312A of the substrate 31A and the embedded area 7200A of each of the protective elements 7000A, so that the back surface molded portion 41A, the circuit board 30A, each of the photosensitive elements 20A, each of the protective elements 7000A and the molded base 42A are integrally bonded. That is, the back surface molded portion 41A may be frame-shaped to form the assembling space 410A in the back surface molded portion 41A, wherein the exposed area 7100A of each of the protective elements 7000A corresponds to each of the assembling spaces 410A of the back surface molded portion 41A.

In one example of the array camera module 100A of the present disclosure, the protective element 7000A may be but not limited to a layer of ink or a layer of a protective film for protecting the chip back surface 25A of each of the photosensitive elements 20A. In another example of the array camera module 100 of the present disclosure, the protective element 7000A may be implemented as a heat dissipating element. For example, the protective element 7000A may be implemented as, but not limited to, an aluminum sheet, a copper sheet or the like, and it is overlappedly disposed on the chip back surface 25A of each of the photosensitive elements 20. In this way, the heat generated by each of the photosensitive elements 20A can be quickly transferred to each of the protective element 7000A and is heat dissipated by each of the protective elements 7000A, to ensure the reliability of the array camera module 100A when used for a long time.

Figure 97:
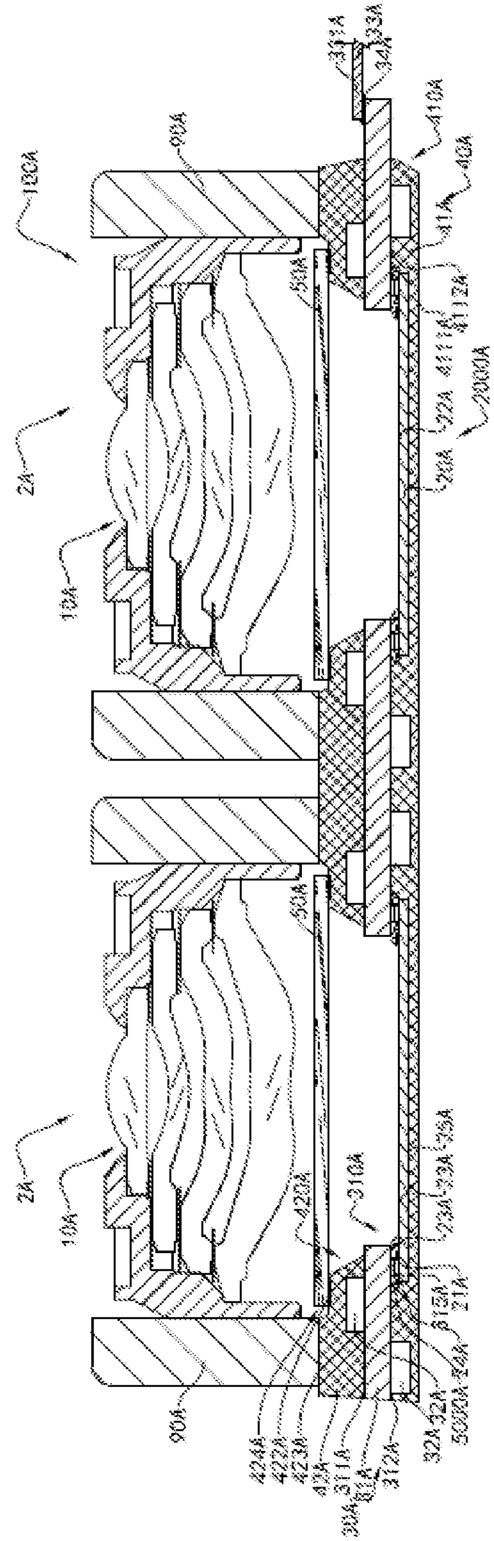
FIG. 97 is a schematic view of the internal structure cut along the intermediate position of another modified implementation of the camera module according to the above preferred embodiment of the present disclosure.
Figure 98:
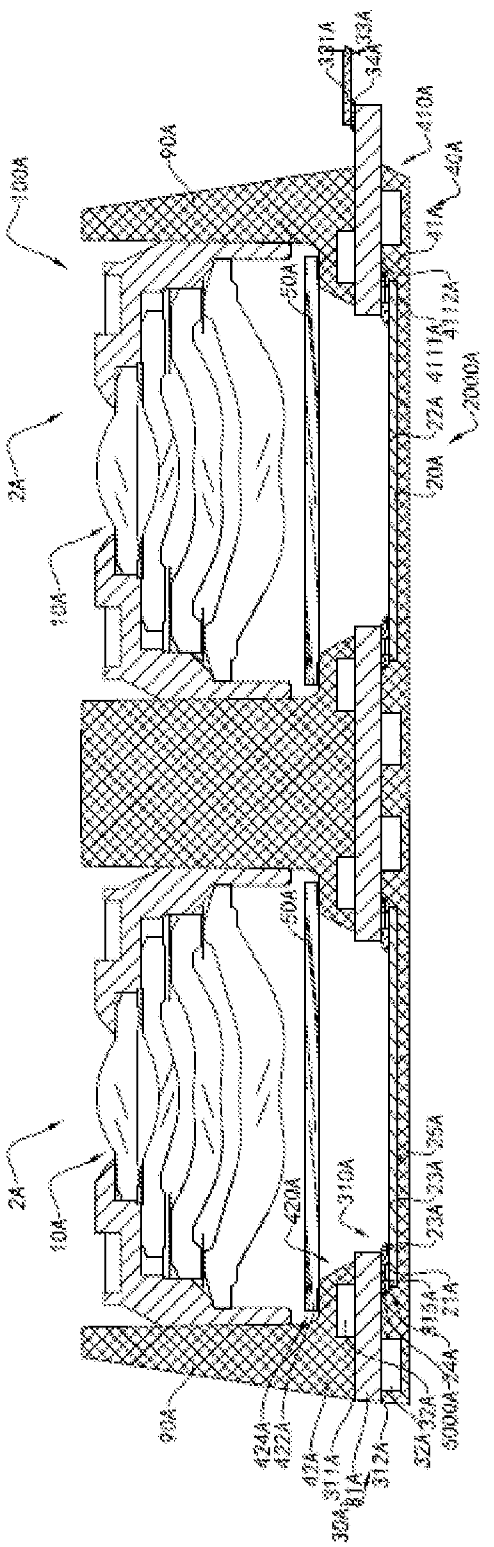
FIG. 98 is a schematic view of the internal structure cut along the intermediate position of another modified implementation of the camera module according to the above preferred embodiment of the present disclosure.
Figure 99:
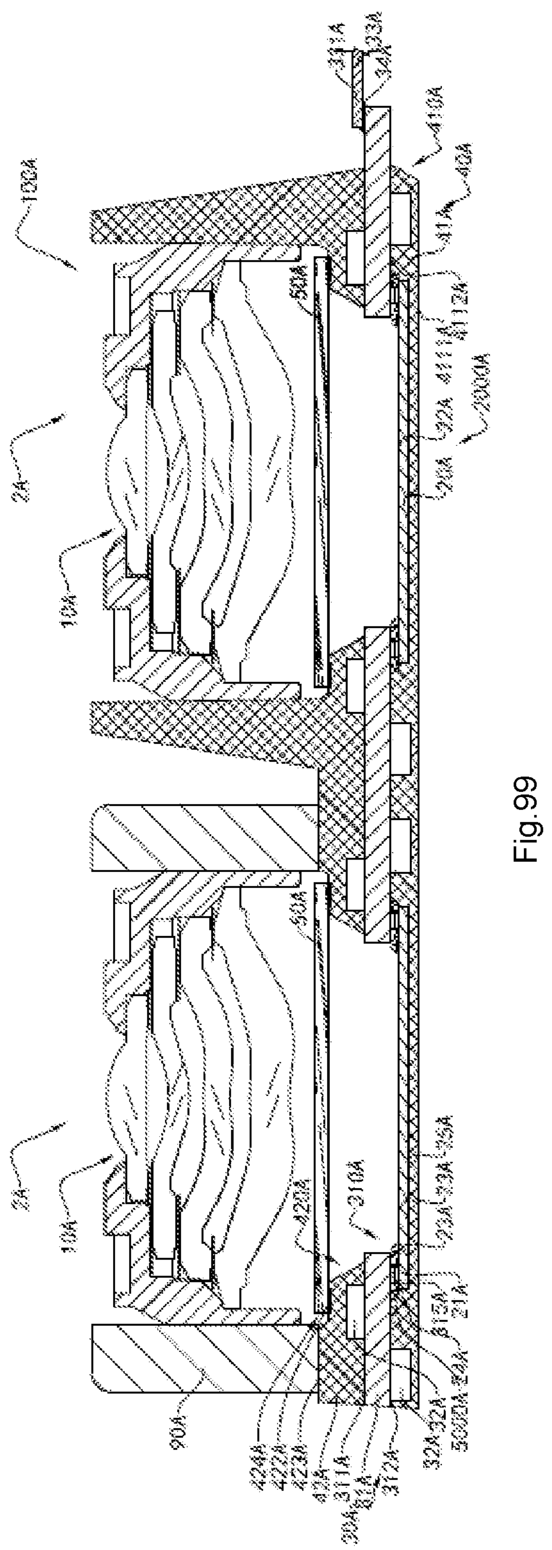
FIG. 99 is a schematic view of the internal structure cut along the intermediate position of another modified implementation of the camera module according to the above preferred embodiment of the present disclosure.

FIG. 97 shows another modified implementation of the array camera module 100A. The array camera module 100A further includes at least one lens barrel 90A, each of the optical lenses 10A is assembled to each of the lens barrels 90A, respectively, and each of the lens barrels 90A is attached to the top surface of the molded base 42A, respectively, so that each of the optical lenses 10A is held in the photosensitive path of each of the photosensitive elements 20A, respectively. FIG. 98 shows another modified implementation of the array camera module 100A. Each of the lens barrels 90A may also be integrally extended to the top surface of the molded base 42A, that is, each of the lens barrels 90A and the molded base 42A may be integrally formed by a molding process. In this example of the array camera module 100A shown in FIG. 99, it is also possible that at least one of the lens barrels 90A is attached to the top surface of the molded base 42A, and the other lens barrels 90A integrally extends to the top surface of the molded base 42A. It will be understood that the array camera module 100A may be implemented as a fixed focus array camera module in some embodiments.

Figure 100:
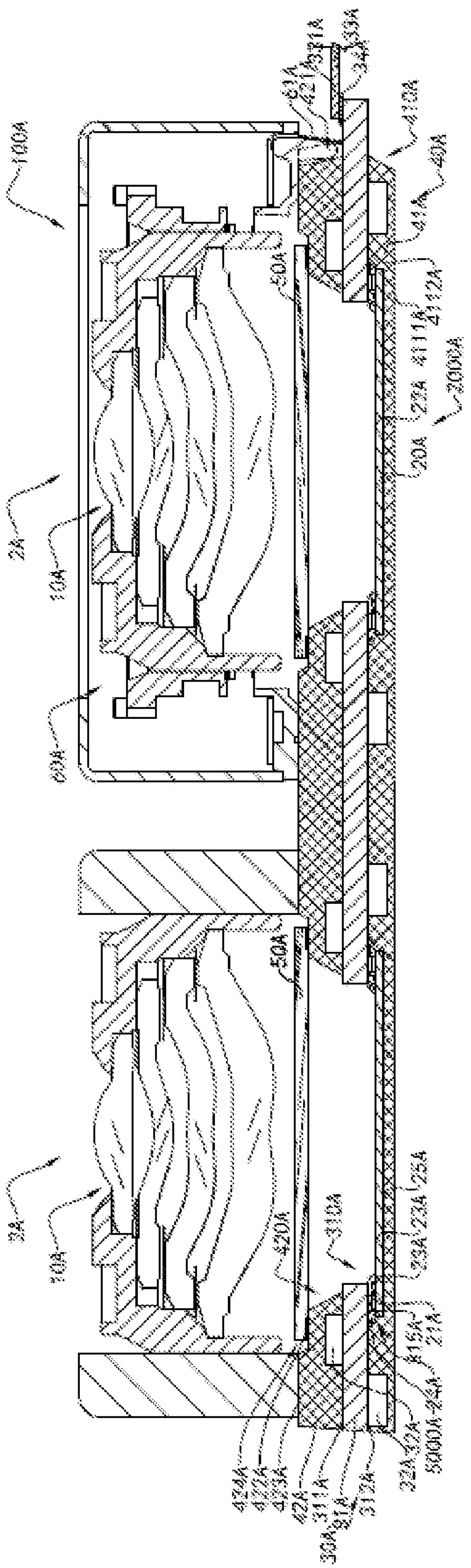
FIG. 100 is a schematic view of the internal structure cut along the intermediate position of another modified implementation of the camera module according to the above preferred embodiment of the present disclosure.
Figure 101:
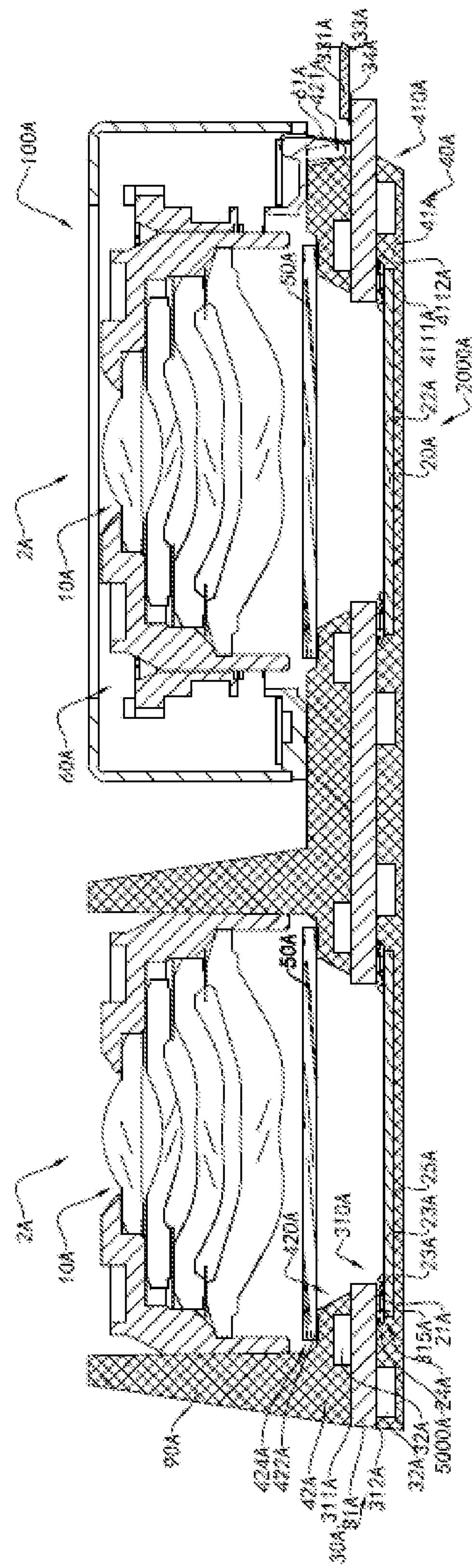
FIG. 101 is a schematic view of the internal structure cut along the intermediate position of another modified implementation of the camera module according to the above preferred embodiment of the present disclosure.

FIG. 100 shows another modified implementation of the array camera module 100A. The array camera module 100A includes at least one of the drivers 60A and at least one of the lens barrels 90A, wherein the driver 60A and the lens barrel 90A are each attached to the top surface of the molded base 42A, so that each of the optical lenses 10A is held in the photosensitive path of each of the photosensitive elements 20A by means of the driver 60A and the lens barrel 90A, respectively. In another modified implementation of the array camera module 100A shown in FIG. 101, the lens barrel 90A may be implemented as being integrally extended to the top surface of the molded base 42A.

Figure 102:
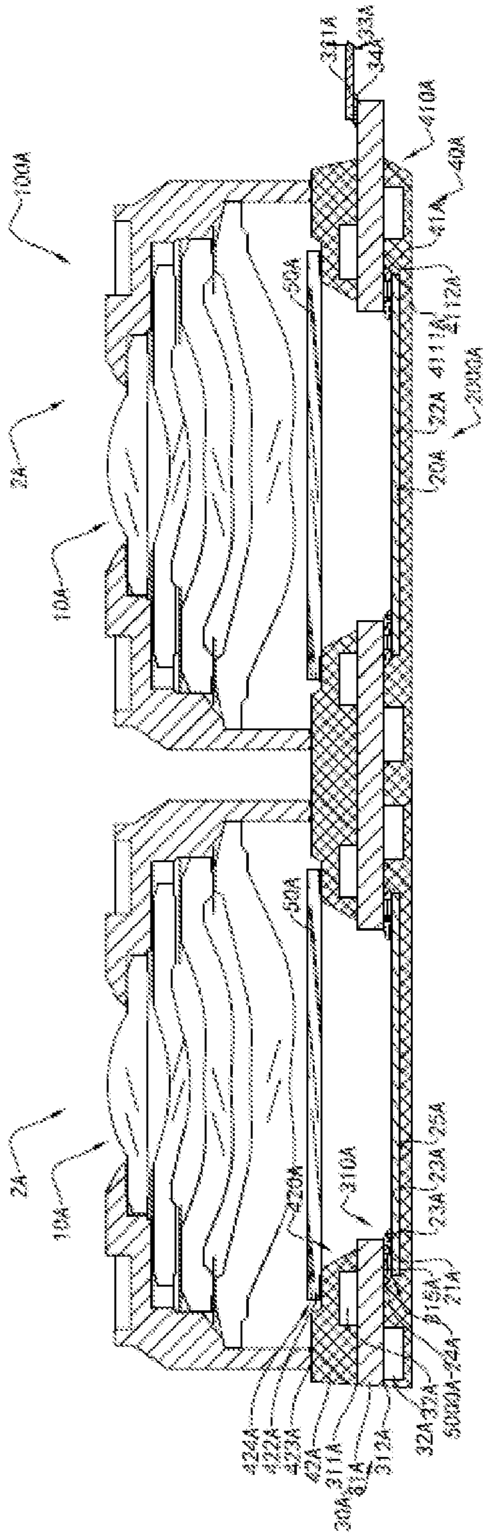
FIG. 102 is a schematic view of the internal structure cut along the intermediate position of another modified implementation of the camera module according to the above preferred embodiment of the present disclosure.
Figure 103:
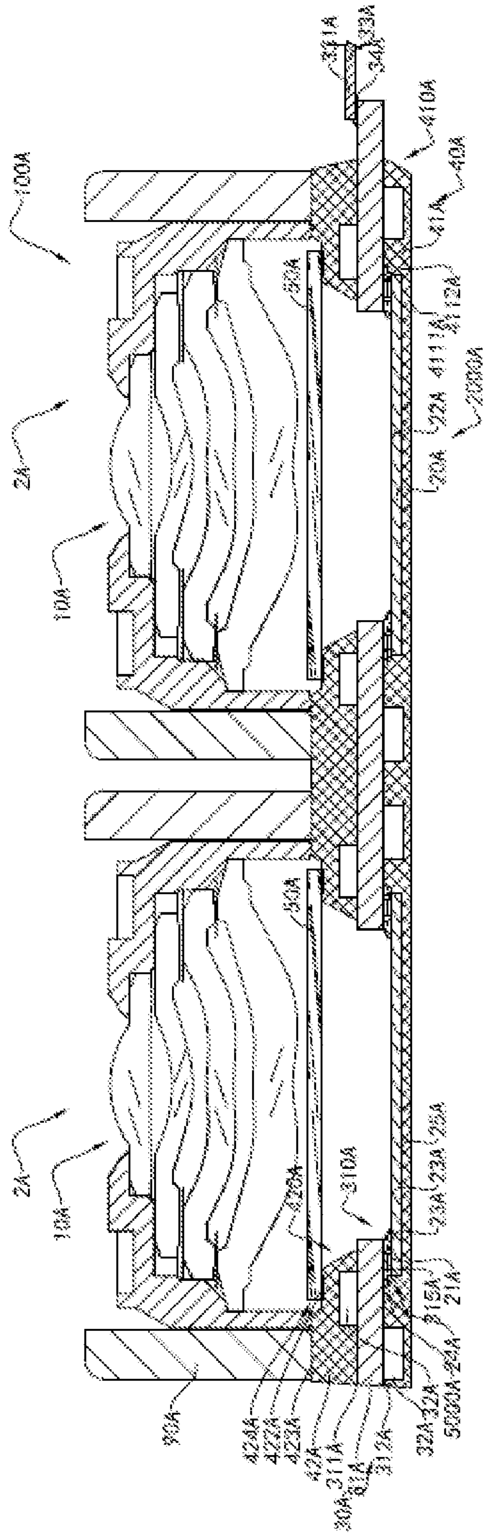
FIG. 103 is a schematic view of the internal structure cut along the intermediate position of another modified implementation of the camera module according to the above preferred embodiment of the present disclosure.

FIG. 102 shows another modified implementation of the array camera module 100. Each of the optical lenses 10A may also be directly attached to the top surface of the molded base 42A, so that each of the optical lenses 10A is held in the photosensitive path of each of the photosensitive elements 20A, respectively. In another modified implementation of the array camera module 100 shown in FIG. 103, each of the lens barrels 90A may also be attached to the top surface 90A of the molded base 42A, so that each of the lens barrels 90A surrounds the outside of each of the optical lenses 10A, respectively, and thereby each of the lens barrels 90A protects each of the optical lenses 10A by way of avoiding each of the optical lenses 10A from being exposed. Nevertheless, it will be understood by those skilled in the art that each of the lens barrels 90A may also integrally extend to the top surface of the molded base 42A, respectively, or at least one of the lens barrels 90A is attached to the top surface of the molded base 42A, and the other lens barrel 90A integrally extends to the top surface of the molded base 42A.

Figure 104:
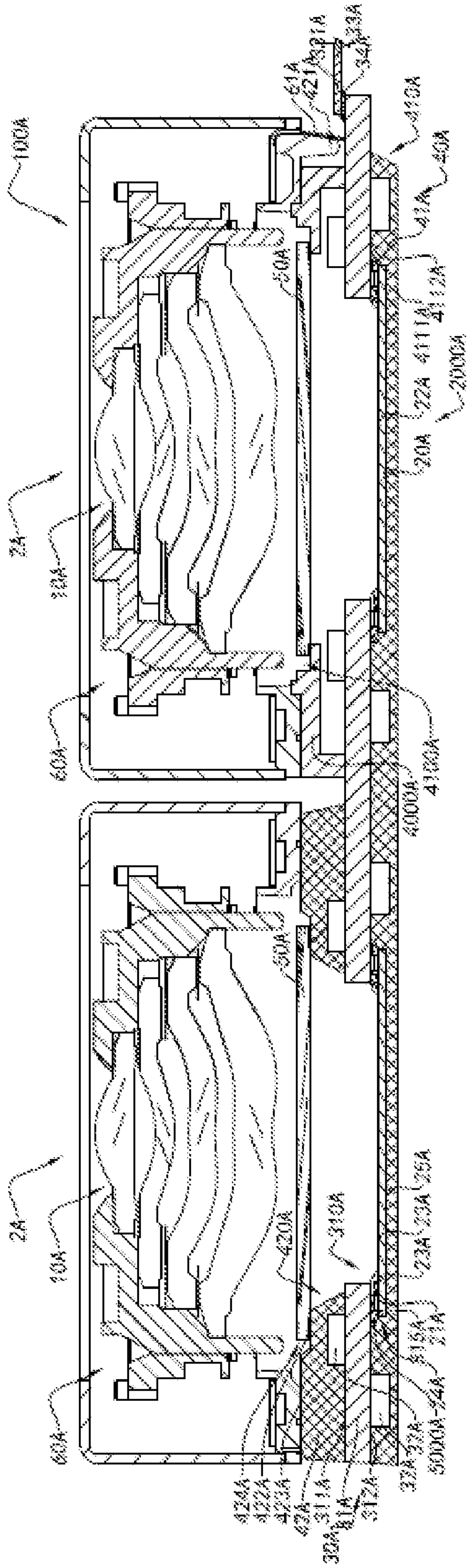
FIG. 104 is a schematic view of the internal structure cut along the intermediate position of another modified implementation of the camera module according to the above preferred embodiment of the present disclosure.

FIG. 104 shows another modified implementation of the array camera module 100A. The array camera module 100A further includes at least one bearing 4000A, wherein the bearing 4000A has at least one light passing hole 4100A; wherein the bearing 4000A is attached to the substrate front surface 311A of the substrate 31A, so that the bearing 4000A surrounds around the photosensitive area 22A of the photosensitive element 20A, and the photosensitive area 22A and a part of the non-photosensitive area 23A of the photosensitive element 20A correspond to the light passing hole 4100A of the bearing 4000A; and wherein the bearing 4000A is used to cause the optical lens 10A to be held in the photosensitive path of the photosensitive element 20A, to form a light passage of the optical lens 10A and the photosensitive element 20A by means of the light passing hole 4100A of the bearing 4000A.

Specifically, in this specific example of the array camera module 100A shown in FIG. 104, the substrate front surface 311A of the substrate 31A is integrally bonded to the molded base 42A and is attached with one bearing 4000A, wherein the molded base 42A surrounds around the photosensitive area 22A of one photosensitive element 20A, and the photosensitive area 22A and a part of the non-photosensitive area 23A of the one photosensitive element 20A correspond to the light window 420A of the molded base 42A; and wherein the bearing 4000A surrounds around the photosensitive area 22A of another photosensitive element 20A, and the photosensitive area 22A and a part of the non-photosensitive area 23A of the another photosensitive element 20A correspond to the light passing hole 4100A of the bearing 4000A.

Figure 105:
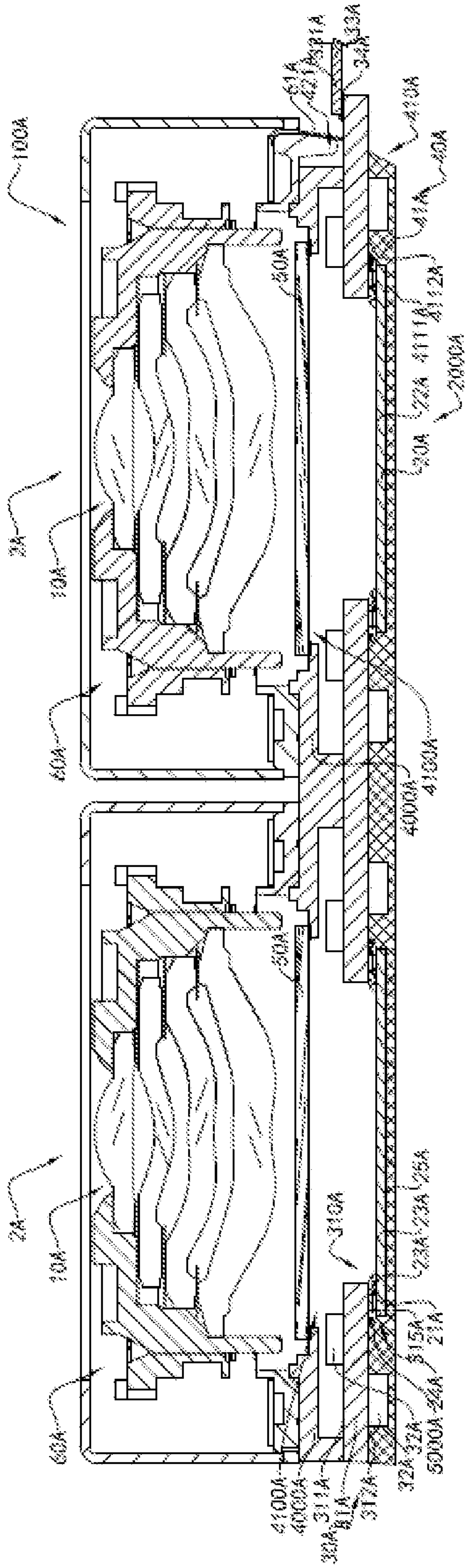

In this specific example of the array the camera module 100A shown in FIG. 105, the substrate front surface 311A of the substrate 31A may also not be bonded with the molded base 42A. Specifically, after the back surface molded portion 41A is integrally bonded to at least one part of the area of the substrate back surface 312A of the substrate 31A by a molding process, the bearing 4000A is then attached to the substrate front surface 311A of the substrate 31A, wherein the bearing 4000A surrounds around the photosensitive area 22A of each of the photosensitive elements 20A, so that the photosensitive area 22A and a part of the non-photosensitive area 23A of each of the photosensitive elements 20A correspond to the light passing hole 4100A of the bearing 4000A; and wherein the bearing 4000A is used to cause each of the optical lenses 10A to be held in the photosensitive path of each of the photosensitive elements 20A, respectively.

For example, in this specific example of the array camera module 100A shown in FIG. 105, each of the drivers 60A assembled with the optical lens 10A is attached to the top surface of the bearing 4000A, respectively, so that each of the optical lenses 10A is held in the photosensitive path of each of the photosensitive elements 20A by means of the bearing 4000A and each of the drivers 60A, respectively.

Figure 106:
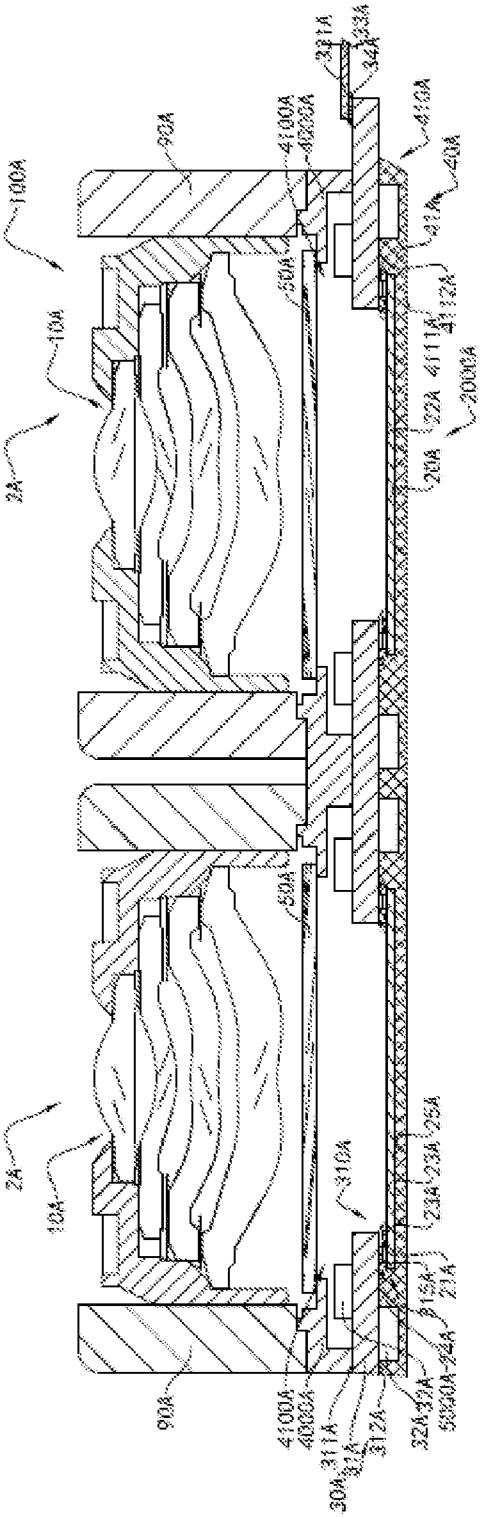
Figure 107:
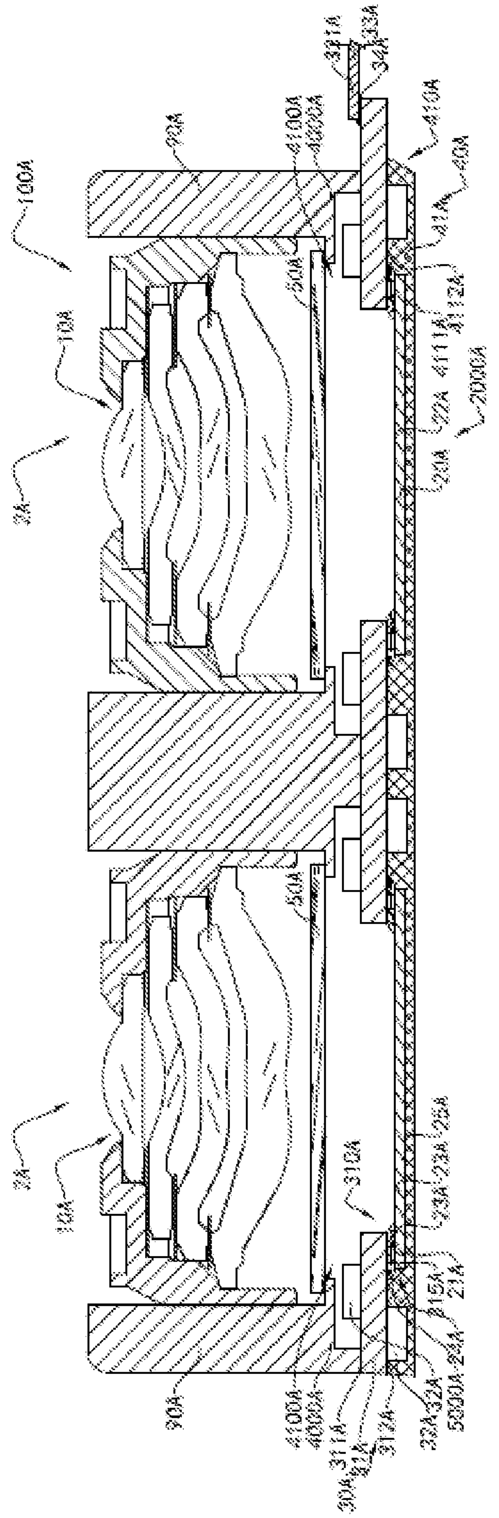

In this specific example of the array camera module 100A shown in FIG. 106, each of the optical lenses 10A may also be assembled to each of the lens barrels 90A, and each of the lens barrels 90A is attached to the top surface of the bearing 4000A, respectively, so that each of the optical lenses 10A is respectively held in the photosensitive path of each of the photosensitive elements 20A by means of the bearing 4000A and each of the lens barrels 90A. In this specific example of the array camera module 100A shown in FIG. 107, each of the lens barrels 90A may also integrally extend to the top surface of the bearing 4000A. Nevertheless, it will be understood by those skilled in the art that, it is also possible that at least one of the lens barrels 90A integrally extends to the top surface of the bearing 4000A, the other lens barrels 90A are attached to the top surface of the bearing 4000A, or each of the optical lenses 10A is directly attached to the top surface of the bearing 4000A.

Figure 108:
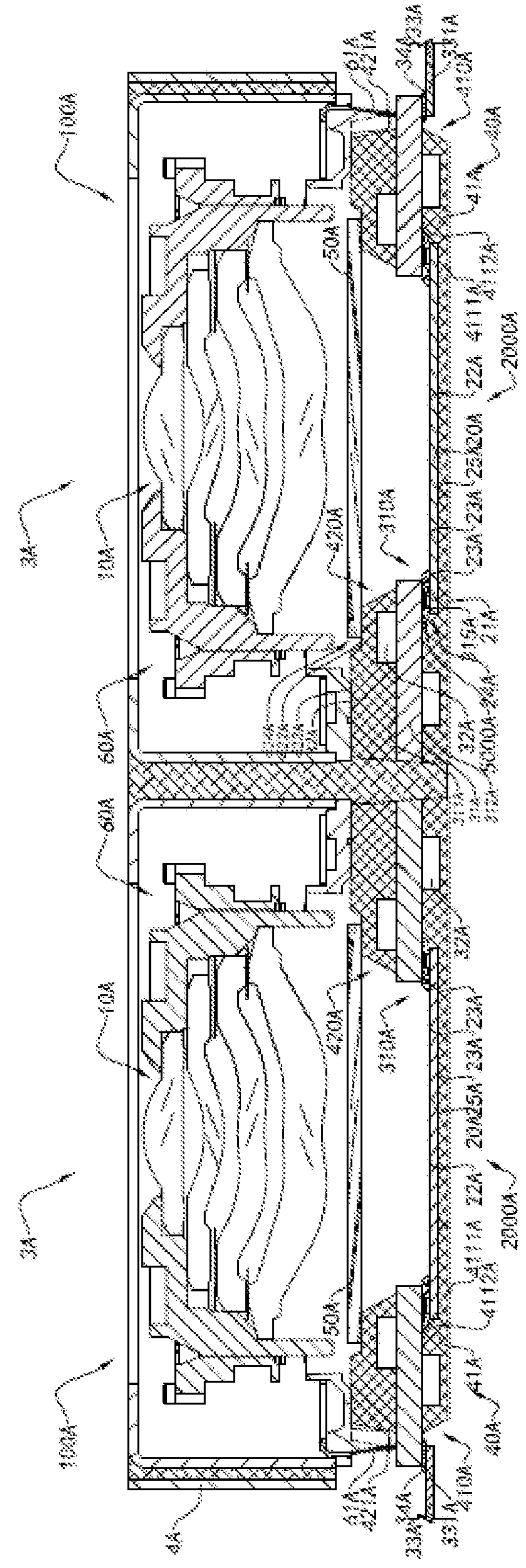

In another modified implementation of the array camera module 100A shown in FIG. 108, the array camera module 100A may be composed of at least two single-lens camera modules 3A, or may be composed of at least one single-lens camera module 3A and at least one array camera module 100A. Specifically, the array camera module 100A further includes at least one assembling housing 4A, wherein each of the single-lens camera modules 3A is assembled to the assembling housings 4A, so that each of the single-lens camera modules 3A is bonded into one body by means of the assembling housing 4A to form the array camera module 100A. Preferably, a substance such as glue may also be filled between adjacent single-lens camera modules 3A and between the single-lens camera module 3A and the assembling housing 4A, to ensure the concentricity of each of the single-lens camera modules 3A. It will be understood by those skilled in the art that the above embodiments are only exemplary, wherein features of different embodiments may be combined with each other to obtain implementations that are easily conceivable according to the contents of the present disclosure but not explicitly indicated in the accompanying drawings.

It should be understood by those skilled in the art that the embodiments of the present disclosure described in the above description and illustrated in the accompanying drawings are only exemplary and not limiting to the present disclosure. The objects of the present disclosure have been achieved completely and efficiently. The function and structural principles of the present disclosure have been presented and described in the embodiments, and the implementations of the present disclosure may be varied or modified without departing from the principles.

What is claimed is:

1. A molded circuit board assembly, comprising:

at least one molded unit, wherein the molded unit comprises a back surface molded portion;

at least one photosensitive element, wherein the photosensitive element has a photosensitive area and a non-photosensitive area surrounding around the photosensitive area; and a circuit board, wherein the circuit board comprises at least one substrate and at least one electronic component, the substrate has a substrate front surface, a substrate back surface and at least one substrate channel, the substrate front surface and the substrate back surface correspond to each other, and the substrate channel extends from the substrate front surface to the substrate back surface; wherein the electronic component is conductively connected to the substrate; wherein a part of the non-photosensitive area of the photosensitive element is attached to the substrate back surface of the substrate, and the photosensitive element is conductively connected with the substrate, and the photosensitive area and another part of the non-photosensitive area of the photosensitive element correspond to the substrate channel of the substrate; and wherein the back surface molded portion is integrally bonded to at least one part of the area of the substrate back surface of the substrate;

wherein the photosensitive element has a chip back surface, and the back surface molded portion further embeds at least one part of the area of the chip back surface of the photosensitive element, wherein the back surface molded portion embeds at least one part of at least one of the electronic components protruded from the substrate back surface of the substrate.

2. The molded circuit board assembly according to claim 1, wherein at least one of the electronic components is conductively connected to the substrate on the substrate back surface of the substrate, and the electronic component conductively connected to the substrate on the substrate back surface of the substrate protrudes from the substrate back surface of the substrate.

3. The molded circuit board assembly according to claim 1, wherein the molded unit further comprises at least one molded base located above the back surface molded portion, and the molded base has at least one light window; and wherein the molded base is integrally bonded to at least one part of the area of the substrate front surface of the substrate, and the substrate is between the molded base and the back surface molded portion, so that the molded base surrounds around the photosensitive area of the photosensitive element, and the photosensitive area and a part of the non-photosensitive area of the photosensitive element correspond to the light window of the molded base.

4. The molded circuit board assembly according to claim 3, further comprising at least one frame-shaped support element, wherein the support element is disposed in the non-photosensitive area of the photosensitive element.

5. The molded circuit board assembly according to claim 3, further comprising a filter element, wherein the filter element is overlappedly disposed on the substrate front surface of the substrate, to form a sealed space at a position corresponding to the substrate channel of the substrate among the filter element, the substrate, and the photosensitive element, and wherein the photosensitive area and a part of the non-photosensitive area of the photosensitive element are located in the sealed space.

6. The molded circuit board assembly according to claim 5, wherein the molded base embeds the outer edge of the filter element.

7. The molded circuit board assembly according to claim 6, further comprising at least one frame-shaped support element, wherein the support element is disposed at the outer edge of the filter element.

8. The molded circuit board assembly according to claim 6, further comprising at least one frame-shaped support element, wherein the support element is formed at the outer edge of the filter element, and the molded base embeds at least one part of the support element.

9. The molded circuit board assembly according to claim 6, further comprising at least one frame-shaped buffer portion, wherein at least one part of the buffer portion is held between the filter element and the substrate front surface of the substrate.

10. The molded circuit board assembly according to claim 9, wherein a part of the buffer portion is held between the molded base and the substrate front surface of the substrate.

11. The molded circuit board assembly according to claim 1, further comprising a transparent protective element, wherein the protective element is overlappedly disposed on the substrate front surface of the substrate, to form a sealed space at a position corresponding to the substrate channel of the substrate among the protective element, the substrate, and the photosensitive element, and wherein the photosensitive area and a part of the non-photosensitive area of the photosensitive element are located in the sealed space.

12. The molded circuit board assembly according to claim 11, wherein at least one of the electronic components is conductively connected to the substrate on the substrate front surface of the substrate, and the electronic component conductively connected to the substrate on the substrate front surface of the substrate protrudes from the substrate front surface of the substrate.

13. The molded circuit board assembly according to claim 12, wherein the molded unit further comprises a molded base, wherein the molded base is integrally bonded to at least one part of the area of the substrate front surface of the substrate, and the molded base embeds at least one part of at least one of the electronic components protruded from the substrate front surface of the substrate.

14. The molded circuit board assembly according to claim 1, wherein the circuit board comprises a connecting plate, wherein the connecting plate has a module connecting side, and the module connecting side of the connecting plate is attached to the substrate back surface of the substrate.

15. The molded circuit board assembly according to claim 1, wherein the circuit board comprises a connecting plate, wherein the connecting plate has a module connecting side, and the module connecting side of the connecting plate is attached to the substrate front surface of the substrate.

16. The molded circuit board assembly according to claim 1, wherein the circuit board comprises a connecting plate, the connecting plate has a module connecting side, and the molded unit embeds the module connecting side of the connecting plate.

17. A molded circuit board assembly, comprising:

at least one molded unit, wherein the molded unit comprises a back surface molded portion;

at least one photosensitive element, wherein the photosensitive element has a photosensitive area and a non-photosensitive area surrounding around the photosensitive area; and a circuit board, wherein the circuit board comprises at least one substrate and at least one electronic component, the substrate has a substrate front surface, a substrate back surface and at least one substrate channel, the substrate front surface and the substrate back surface correspond to each other, and the substrate channel extends from the substrate front surface to the substrate back surface; wherein the electronic component is conductively connected to the substrate; wherein a part of the non-photosensitive area of the photosensitive element is attached to the substrate back surface of the substrate, and the photosensitive element is conductively connected with the substrate, and the photosensitive area and another part of the non-photosensitive area of the photosensitive element correspond to the substrate channel of the substrate; and wherein the back surface molded portion is integrally bonded to at least one part of the area of the substrate back surface of the substrate;

wherein the molded circuit board assembly further comprises a filler, wherein the filler is held between the substrate back surface of the substrate and the non-photosensitive area of the photosensitive element, to fill the gap formed between the substrate back surface of the substrate and the non-photosensitive area of the photosensitive element.

18. A semi-finished product of a molded circuit board assembly, comprising:

at least one protective element;

at least one molded unit, wherein the molded unit comprises a back surface molded portion;

at least one photosensitive element, wherein the photosensitive element has a photosensitive area and a non-photosensitive area surrounding around the photosensitive area; and a circuit board, wherein the circuit board comprises at least one substrate and at least one electronic component conductively connected to the substrate; wherein the substrate has a substrate front surface, a substrate back surface and at least one substrate channel, the substrate front surface and the substrate back surface correspond to each other, and the substrate channel extends from the substrate front surface to the substrate back surface; wherein the protective element is overlappedly attached to the substrate front surface of the substrate to close the opening of the substrate channel on the substrate front surface by means of the protective element; wherein the non-photosensitive area of the photosensitive element is attached to the substrate back surface of the substrate, so that the photosensitive element is conductively connected to the substrate, and the photosensitive element closes the opening of the substrate channel on the substrate back surface, to form at least one sealed space among the substrate, the photosensitive element, and the protective element; wherein the photosensitive area of the photosensitive element is held in the sealed space; and wherein the back surface molded portion is integrally bonded to at least one part of the area of the substrate back surface of the substrate;

wherein the photosensitive element has a chip back surface, and the back surface molded portion further embeds at least one part of the area of the chip back surface of the photosensitive element, wherein the back surface molded portion embeds at least one part of at least one of the electronic components protruded from the substrate back surface of the substrate.

* * * * *